United States Patent [19]

Yoshimura et al.

[11] Patent Number: 5,444,811

[45] Date of Patent: Aug. 22, 1995

[54] ORGANIC FUNCTIONAL OPTICAL THIN FILM, FABRICATION AND USE THEREOF

[75] Inventors: Tetsuzo Yoshimura; Ei Yano; Satoshi Tatsuura; Wataru Sotoyama, all of Kawasaki, Japan

[73] Assignee: Fujitsu Limited, Kawasaki, Japan

[21] Appl. No.: 858,074

[22] Filed: Mar. 26, 1992

[30] Foreign Application Priority Data

Mar. 26, 1991 [JP] Japan .................................. 3-132448
Sep. 19, 1991 [JP] Japan .................................. 3-239559

[51] Int. Cl.$^6$ .......................... G02B 6/12; B05D 5/06
[52] U.S. Cl. .................................. 385/141; 385/129; 385/130; 385/131; 385/122; 385/143; 385/145; 427/162; 427/163.2; 427/166; 427/167
[58] Field of Search ............... 385/123, 122, 128, 129, 385/130, 131, 141, 143, 145, 14; 359/321, 326, 332; 427/162, 164, 166, 167, 248.1, 255.6, 269, 407.1, 410, 412.4, 163.2

[56] References Cited

U.S. PATENT DOCUMENTS

| | | | |
|---|---|---|---|
| 4,657,832 | 4/1987 | Pfeifer | 430/18 |
| 4,775,820 | 10/1988 | Eguchi et al. | 313/504 |
| 4,792,208 | 12/1988 | Ulman et al. | 385/122 X |
| 4,816,383 | 3/1989 | Taguchi et al. | 430/322 |
| 4,855,078 | 8/1989 | Leslie | 359/326 |
| 5,064,264 | 11/1991 | Ducharme et al. | 385/130 |
| 5,075,738 | 12/1991 | Matsuda et al. | 357/6 |
| 5,080,832 | 1/1992 | Etter et al. | 385/122 X |

FOREIGN PATENT DOCUMENTS

| | | | |
|---|---|---|---|
| 0215683 | 3/1987 | European Pat. Off. | 359/321 X |
| 0430143 | 6/1991 | European Pat. Off. | 385/130 X |
| 0482779 | 4/1992 | European Pat. Off. | 385/130 X |

OTHER PUBLICATIONS

Yoshimura et al., "Quantum wire and dot formation by chemical vapor deposition and molecular layer deposition of one-dimensional conjugated polymer", *Applied Physics Letters*, vol. 60, No. 3, pp. 268–270, Jan. 20, 1992, USA.

Tatsuura et al., "Epoxy-amine polymer waveguide containing nonlinear optical molecules fabricated by chemical vapor deposition", *Applied Physics Letters*, vol. 60, No. 10, pp. 1158–1160, Mar. 9, 1992, USA.

Salem et al., "Solventless polyimide films by vapor deposition", *Journal of Vacuum Science and Technology*, vol. 4, No. 3, pp. 369–374, Jun. 5, 1986, USA.

Iida et al., "Preparation of Polyimide Films by Vapor Deposition Polymerization and Their Photocurrents", *Proceedings of the Twenty-First Symposium on Electrical Insulating Materials*, pp. 227–230, Sep. 26–28, 1988, Tokyo, Japan.

Baumert et al., "Temperature dependence of the third-order nonlinear optical susceptibilities in polysilanes and polygermanes", *Applied Physics Letters*, vol. 53, No. 13, pp. 1147–1149, Sep. 26, 1988, USA.

Nguyen et al., "Plasma Organosilicon Polymers; Deposition, Characterization, and Application in Multilayer Resist", *Journal of the Electrochemical Society; Solid State Science and Technology*, vol. 132, No. 8, pp. 1925–1932, Aug. 1985, USA.

(List continued on next page.)

*Primary Examiner*—Brian Healy

[57] ABSTRACT

An organic functional thin film is comprised of a polymer of a molecule having two or more identical or different groups selected from the group consisting of a carbonyloxycarbonyl group, a carboxylic acid group, a carboxylic acid halide group, a carboxyl group, a —COCl group, an —NCO group, a —CHO group and an epoxy group and a molecule having two or more identical or different groups selected from the group consisting of an amino group, groups containing at least one amino proton, an alkylamino group, a silylated alkylamino group, a carboxylic acid group and a hydroxyl group, formed by vapor-phase deposition, the polymer-forming molecules having at least partially one or more donor and/or acceptor groups. Similar organic thin films are also disclosed. These organic thin films are useful for various electronic applications.

88 Claims, 74 Drawing Sheets

OTHER PUBLICATIONS

Yoshimura et al., "One-dimensional conjugated polymer film and quantum well fabrication by molecular layer deposition (MLD) and chemical vapor deposition", *Proceedings of Fifth Toyota Conference on Nonlinear Optical Materials,* Oct. 6-9, 1991, Aichi-Chen, Japan.

Takahashi et al., "Synthesis of aromatic polymide film by vacuum deposition polymerization," J. Vac. Sci. Technol. A 5(4), Jul./Aug. 1987, © 1987 American Vacuum Society, pp. 2253-2256.

R. J. Twieg et al., "Selection, Fabrication and Applications of Organic Nonlinear Optical Materials," IBM Almaden Research Laboratory, San Jose, Calif., Nov. 1989, pp. 262-277.

Iijima et al., Nikkei New Materials, Dec. 11, 1989, pp. 93-101.

D. Jungbauer et al., "Highly efficient and stable nonlinear optical polymers via chemical crosslinking under electric field," Appl. Phys. Lett. 56(26), Jun. 25, 1990, © 1990 American Institute of Physics, pp. 2610-2612.

A. Kubono et al., "Highly oriented polyamide thin films prepared by vapor deposition polymerization," Thin Solid Films, 199 (1991) pp. 385-393 (Elsevier Sequoia/-Printed in The Netherlands).

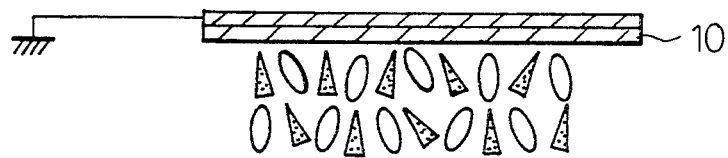
Fig.1(A)
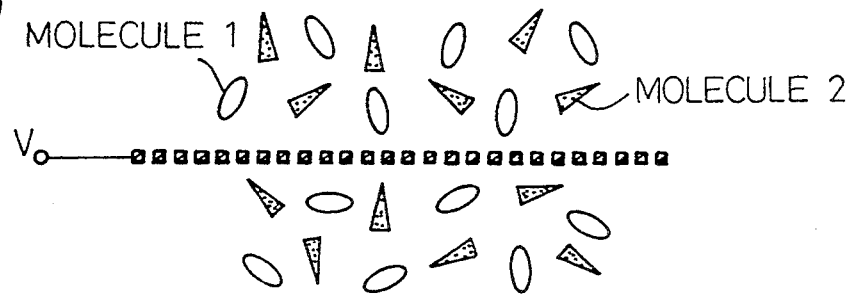
Fig.1(B)
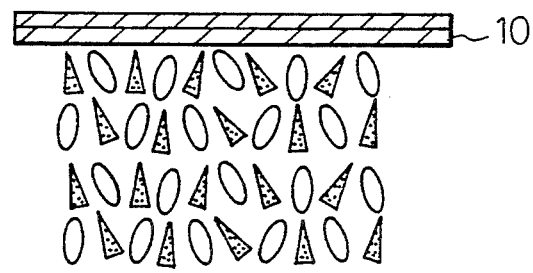
Fig.1(C)
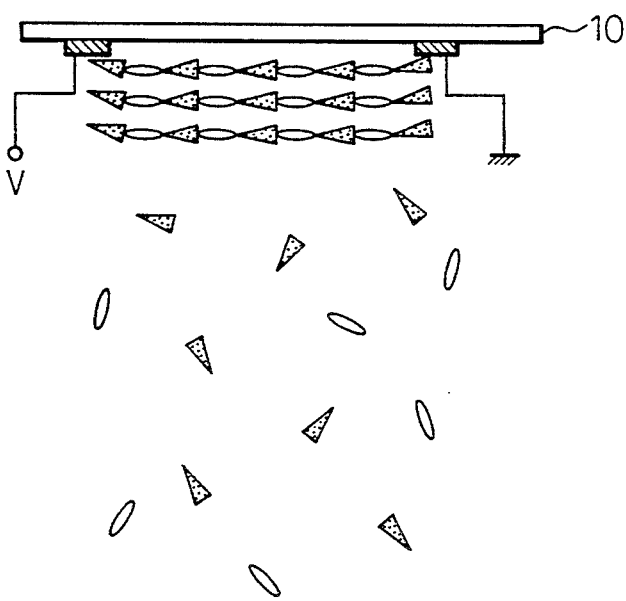

K, l, m, n = 0.1.2.3···
Me = METHYL

K.l.m.n = 0.1.2.3 - - -
Me = METHYL
Fig.9(A)  Fig.9(B)  Fig.9(D)
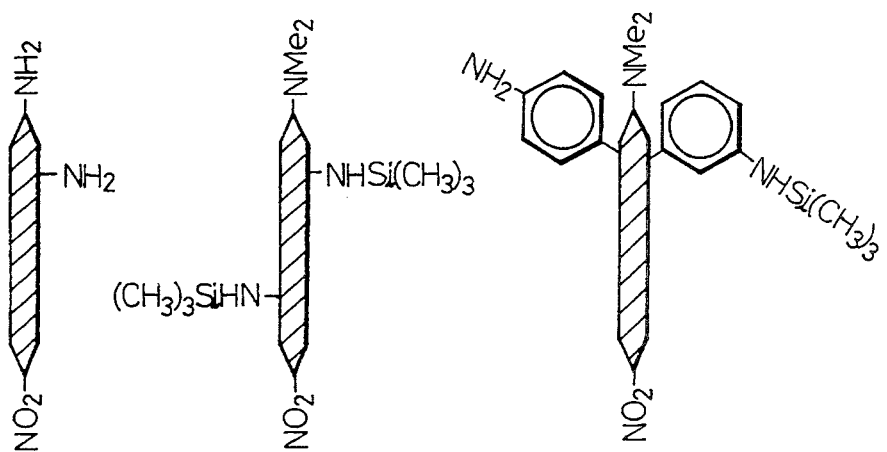
Fig.9(C)   Fig.9(E)
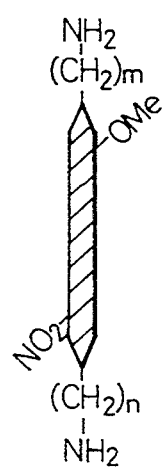
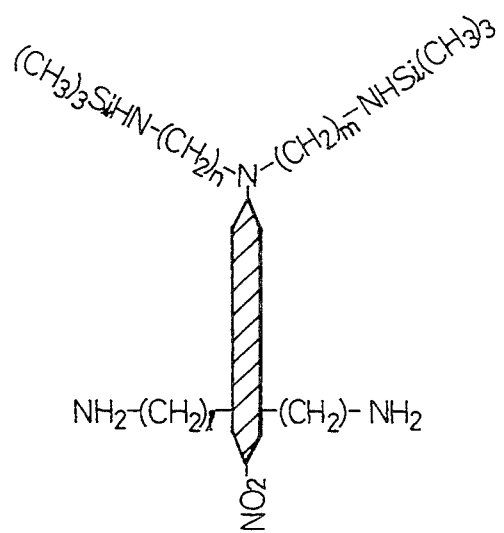

k, l, m, n = 0, 1, 2, 3 ---
Me = METHYL

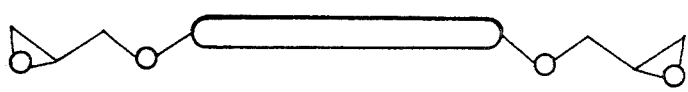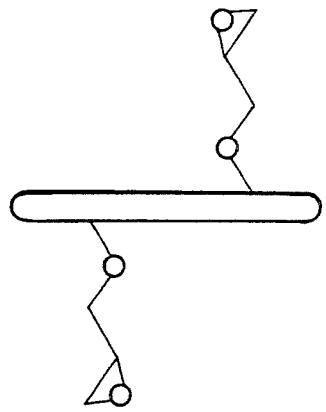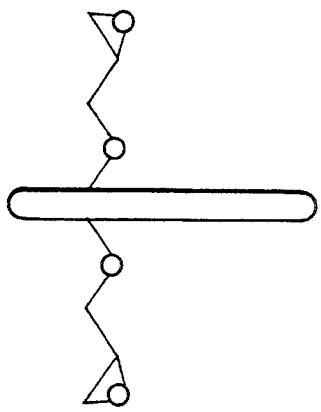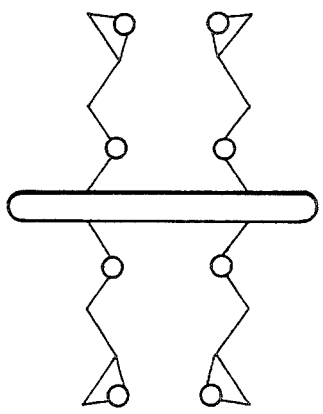

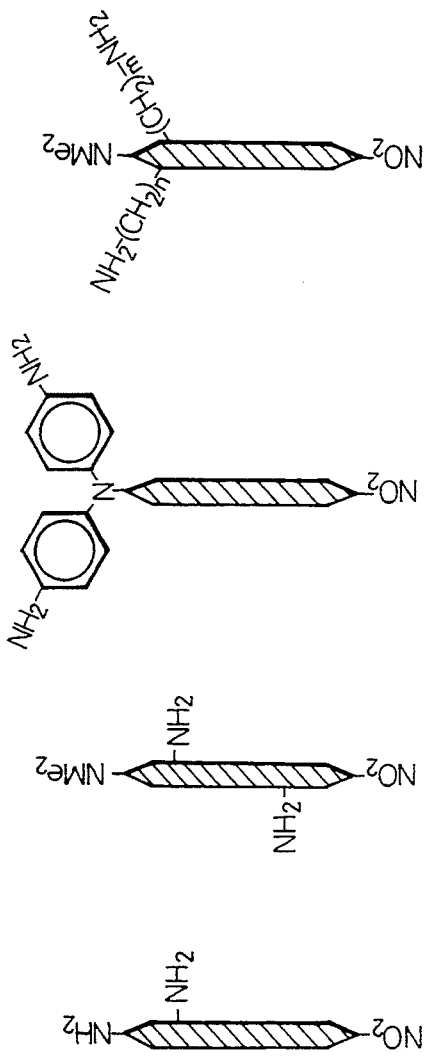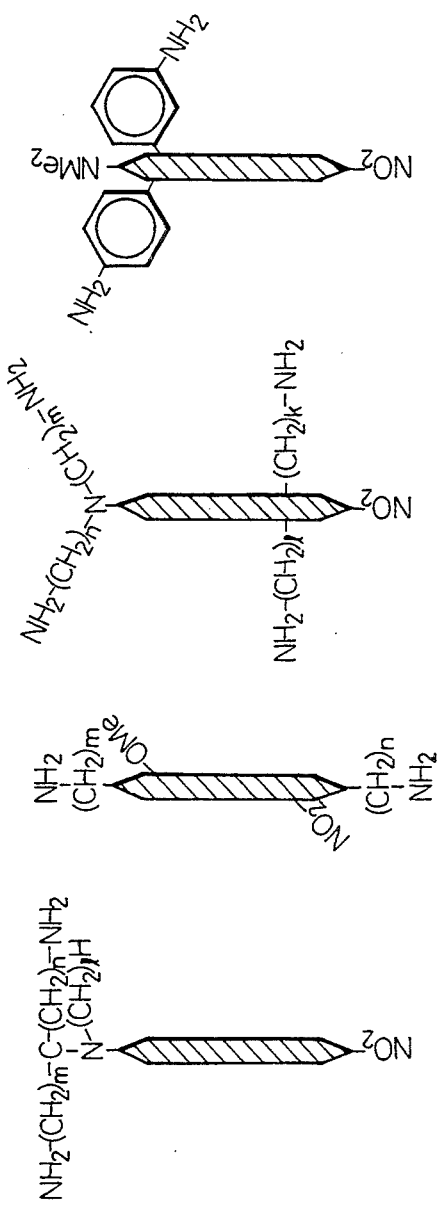

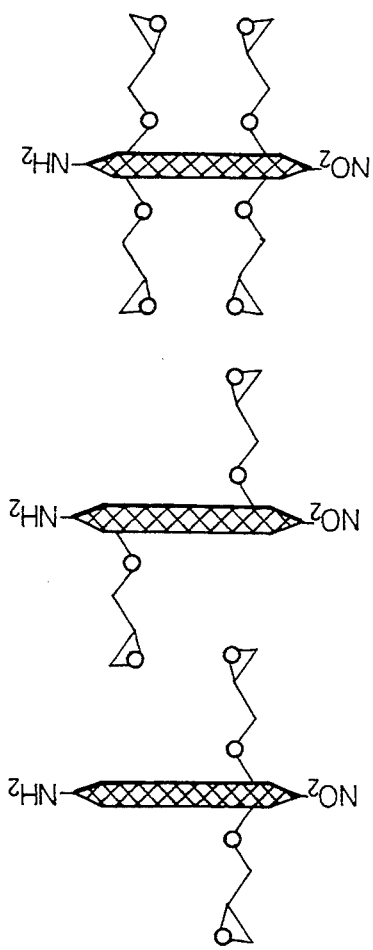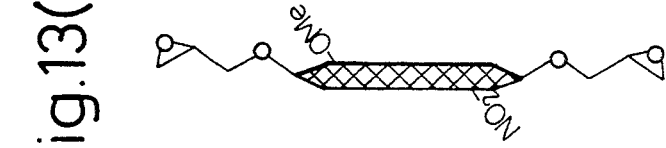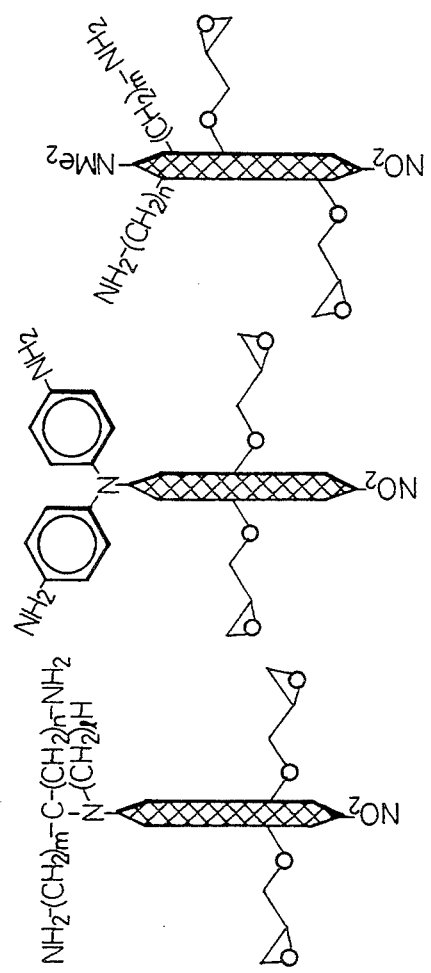
Fig.13(A) Fig.13(C) Fig.13(E) Fig.13(G)
Fig.13(B) Fig.13(D) Fig.13(F)
k, l, m, n = 0, 1, 2, 3 ---

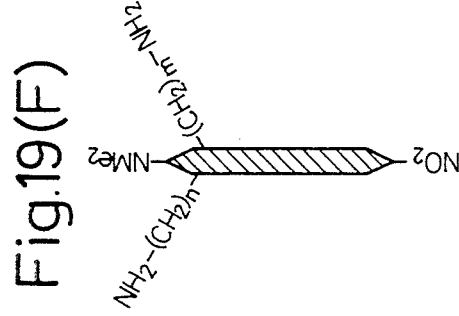
Fig.19(A)   Fig.19(B)
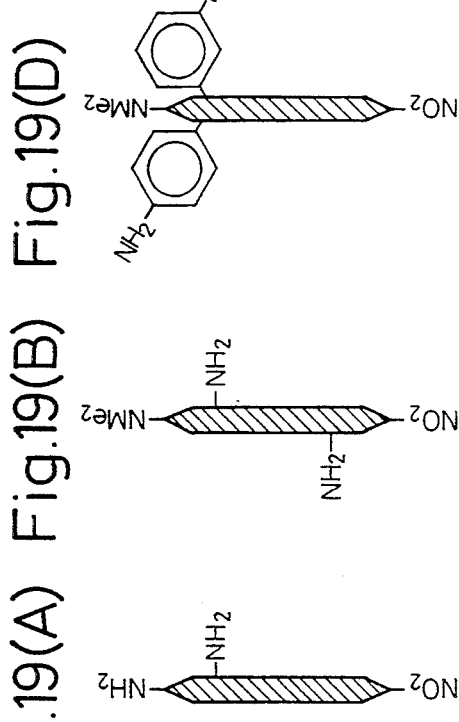
Fig.19(C)
Fig.19(D)   Fig.19(F)
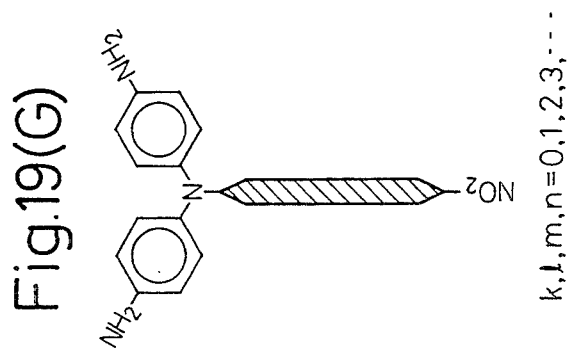
Fig.19(E)   Fig.19(G)
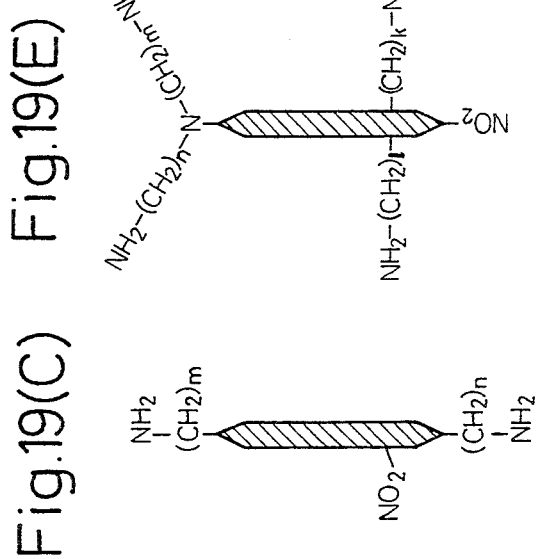
k, l, m, n = 0, 1, 2, 3, ···

$k, l, m, n = 0, 1, 2, 3, \cdots$

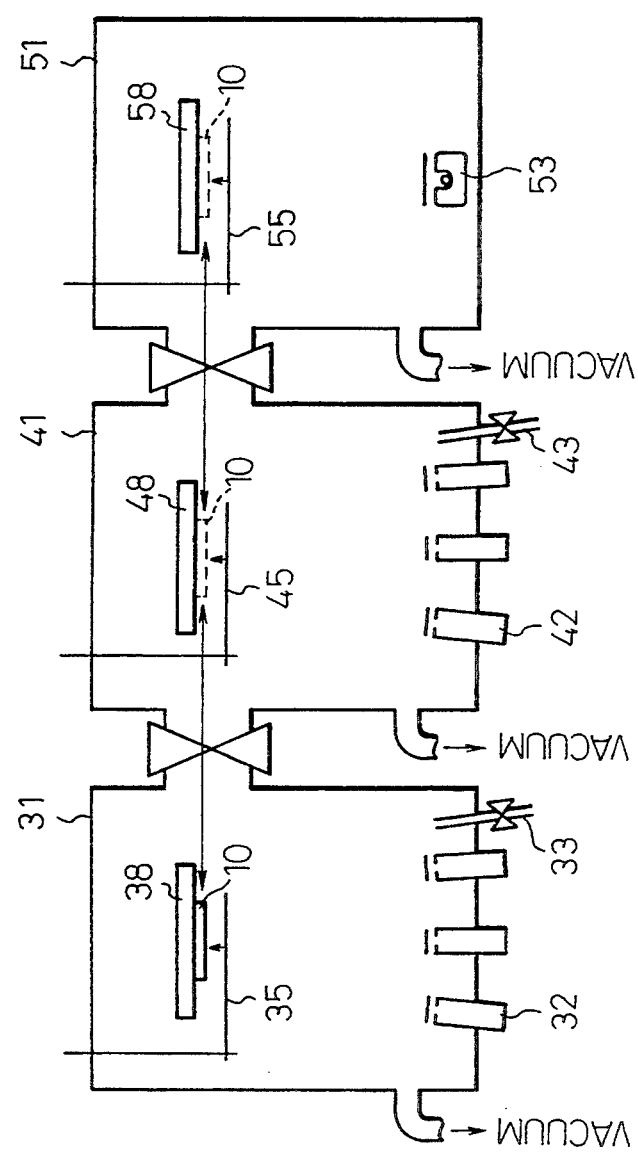

STRUCTURE OF MOLECULE (i)

SCHEMATIC ILLUSTRATION OF MOLECULE

MECHANISM OF DEPOSITION

Fig.47(A)
—C≡C—
Fig.47(B)
Fig.47(C)
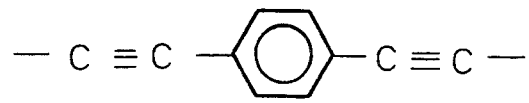
Fig.47(D)
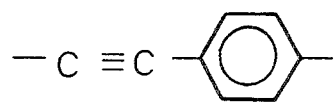
Fig.47(E)
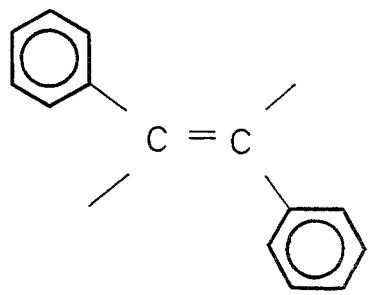

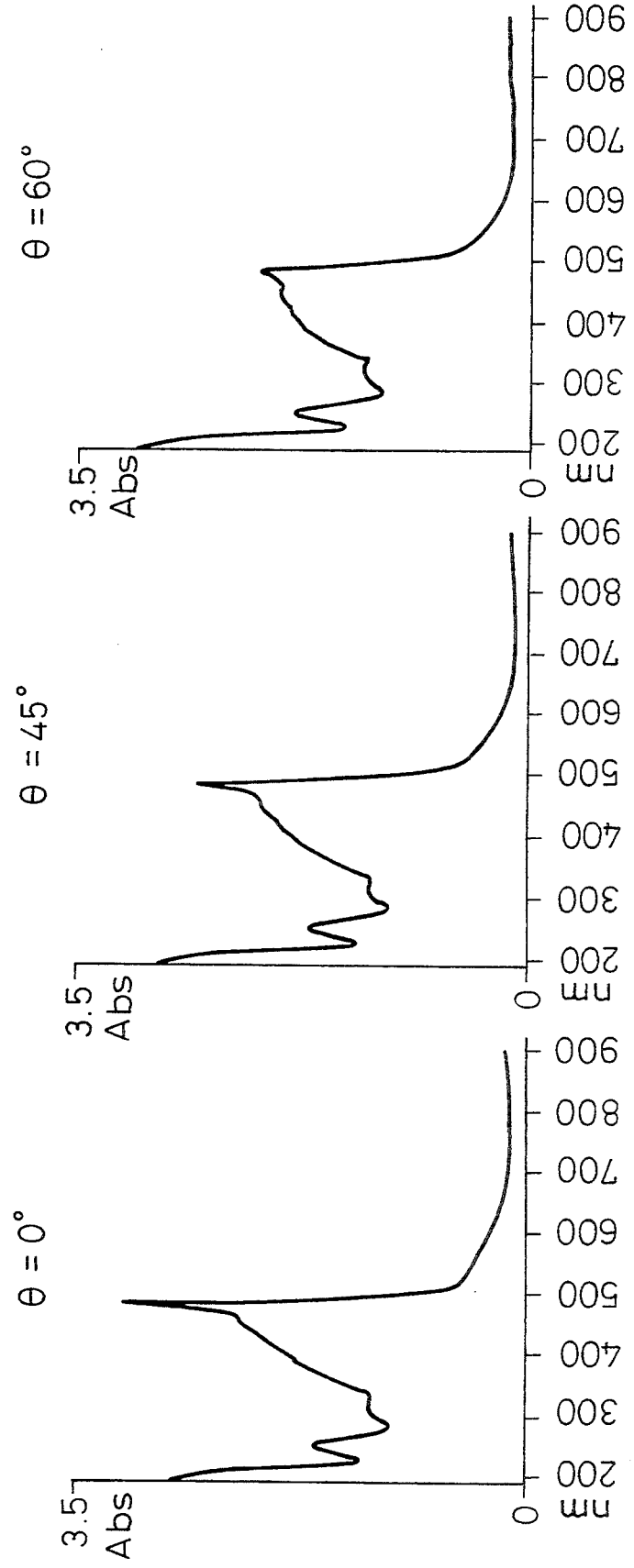

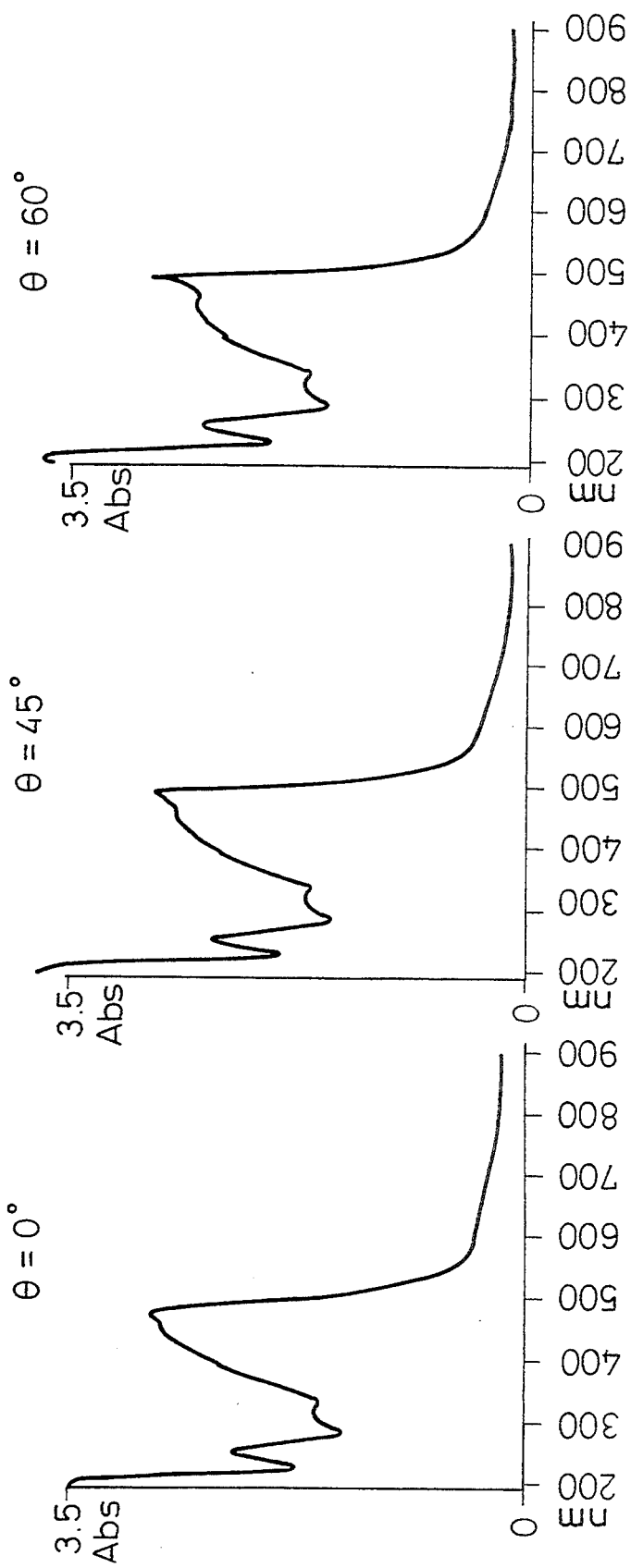
Fig.51(a) θ = 0°
Fig.51(b) θ = 45°
Fig.51(c) θ = 60°

θ = 0°

θ = 60°

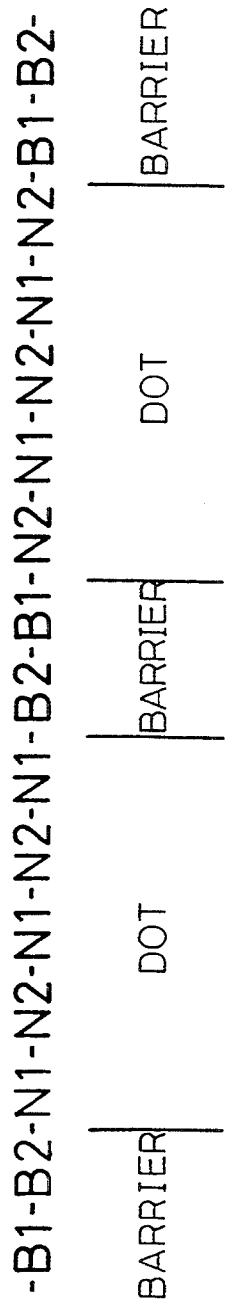

◌ ELECTRON BLOCKING MOLECULE
◌ p-TYPE MOLECULE
● n-TYPE MOLECULE

Fig. 76(f)
1. 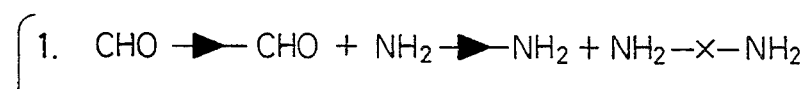
2. 
3. 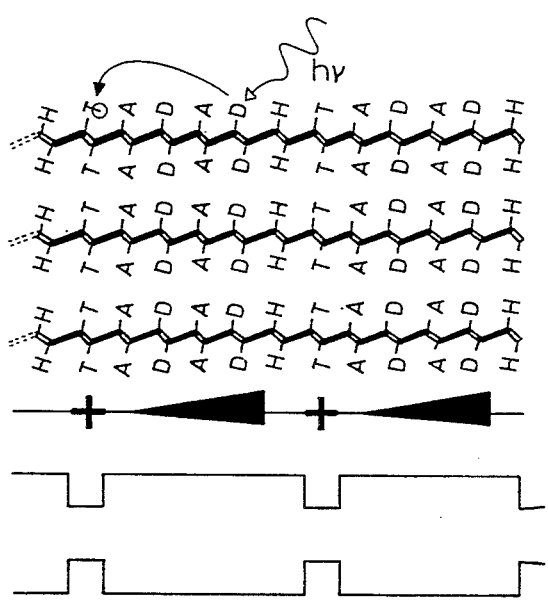

ORGANIC FUNCTIONAL OPTICAL THIN FILM, FABRICATION AND USE THEREOF

BACKGROUND OF THE INVENTION

1. Field of the Invention

The present invention relates to an organic functional thin film and a process for the fabrication thereof. The organic functional thin film according to the present invention can be advantageously used as a non-linear material and organic semiconductor material in particular.

2. Description of the Related Art

As is widely known, non-linear optical materials are materials which demonstrate second- or third-order non-linear optical effects in the presence of an applied voltage or a strong electric field of laser light. In addition, in terms of phenomena, as such materials demonstrate functions of numerous devices such as optical frequency conversion, optical modulation, optical switching, optical memory and optical amplification, such materials have attracted considerable attention as fundamental materials in fields such as optical communications, optical interconnections and optical computers. Typical non-linear optical materials of the prior art are materials of inorganic systems, with widely known examples of such including crystals of $KD_2PO_4$(KDP), $LiNbO_3$, $KNbO_3$ and $LiTaO_3$. Development and research of organic non-linear optical materials came to be actively conducted starting around 1983. Representative examples of such optical non-linear optical materials include MNA, DAN, MNMA and NPP. More recently, organic non-linear organic materials have appeared that have attracted the attention of the industry featuring electro-optical effects 10–100 times greater than that of $LiNbO_3$ (usually referred to as LN) while also being able to be easily formed into a thin film.

Pendant-attached polymers are one type of organic non-linear optical material that is expected to be actively used as a material for electro-optic devices. Pendant-attached polymers are polymers in which non-linear optical molecules are introduced to the main chain of the polymer in the form of pendant groups (side chain groups). These are normally fabricated by forming into a film by spin coating. In other words, pendant-attached addition polymers are fabricated by forming film 7 of a polymer containing non-linear optical molecules (process A), and then applying a voltage between electrodes arranged above and below film 7, rotating those molecules and performing poling processing to orient the molecules in film 7 (process B) as is indicated schematically in FIG. 48. In process B, poling process can be performed by generating a charge on the film by corona discharge without forming the upper electrode. As is indicated in FIG. 48 (C), polymer film 7 exhibiting non-linear properties is obtained in this manner. However, in the case of the film formation method of the prior art, the characteristics of the resulting film are low due to being unable to attain a high level of orientation caused by thermal disturbance. In addition, due to considerable relaxation degradation resulting from the initial stable molecular state being random, decreases in characteristics over time are remarkable. Moreover, since this film formation method achieves orientation starting from a random molecular state, in the case of attempting to lengthen the size of the non-linear molecules and improve non-linear characteristics, the non-linear molecules are subjected to greater resistance with respect to rotation by the surrounding polymer. Since the molecule does not rotate satisfactorily, the orientation factor becomes excessively low thus allowing only low characteristics to be obtained similar to the case described previously.

Recently, a technique has been reported by the IBM Corporation in which an organic non-linear optical material is fabricated by mixing epoxy monomers and molecules containing amino groups followed by bonding and polymerization (R. J. Twieg et al., Preprints of CGOM (1989) V-05; D. Jungbauer el al., Appl. Phys. Lett. 56, 2610 (1990)). In this method, relaxation degradation is suppressed by formation of a network structure. Despite this, in the case of applying this method, film formation is performed by a coating process such as spin coating, thus resulting in problems including control of film thickness and film uniformity. In addition, the method also has problems that must be solved including unavoidable mixing of residual solvent and impurity molecules, and inadequate molecular orientation due to having to perform poling processing following film formation.

Moreover, organic functional thin films, which include non-linear optical materials, are normally fabricated using methods such as spin coating or dip coating. However, these methods also have problems that must be solved including difficulty in fabricating multi-functional and highly functional films since the hyperfine structure within the organic film that is obtained cannot be controlled.

Conjugate polymers are one type of material considered to be promising for use as organic functional materials such as non-linear optical materials and organic semiconductor materials. In order to improve the performance of such materials, it is necessary to develop long, conjugated $\pi$-electron systems having minimal disorder. In addition, it is also necessary to selectively add donor or acceptor groups to conjugate polymers, perform doping or control the length of the conjugate chain. Various types of polymers have been developed as conjugate polymers, examples of which include polydiacetylene and polyphenylene-vinylene. However, in the case of the former, the obtaining of a high-performance film with minimal light-scattering has been difficult, and film formation has been difficult using MLD (molecular layer deposition). With respect to the latter, in addition to film formation being difficult using MLD, difficulty in controlling conjugate chain length, and difficulty in controlling donor groups and acceptor groups are involved.

On the other hand, it is known that double bonds (azomethin bonds) are formed by reaction of —CHO groups and —$NH_2$ groups as indicated in the following formula.

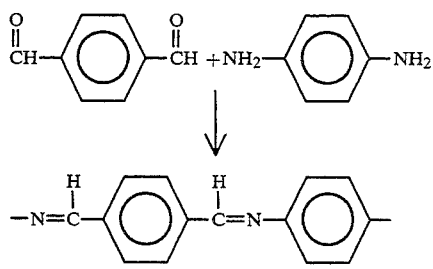

For example, Iijima et al. successfully formed a polymer thin film by means of deposition polymerization using the above-mentioned reaction (Nikkei New Materials, December 11, 1989, pp. 93–101).

SUMMARY OF THE INVENTION

The above-mentioned various problems can be solved by the organic functional thin film of the present invention.

According to one aspect of the present invention, there is provided an organic functional thin film comprised of a polymer of a molecule having two or more identical or different groups selected from the group consisting of a carbonyloxycarbonyl group, a carboxylic acid group, a carboxylic acid halide group, a carboxyl a —COCl group, an —NCO group and an epoxy group and a molecule having two or more identical or different groups selected from the group consisting of an amino group, groups containing at least one amino proton, an alkyl amino group, a silylated alkylamino group, a carboxylic acid group and a hydroxyl group, formed by vapor-phase deposition, the polymer-forming molecules having at least partially one or more donor and/or acceptor groups.

The present invention has also additional various aspects, and those aspects of the present invention will become apparent from the descriptions hereinbelow.

The present invention has also additional various aspects, and those aspects of the present invention will become apparent from the descriptions hereinbelow.

BRIEF DESCRIPTION OF THE DRAWINGS

FIGS. 1 (A)–(C) are schematic diagrams of the deposition process of the present invention.

FIGS. 11 (A)–(D) are schematic diagrams of molecule A.

FIGS. 12 (A)–(H) are schematic diagrams of molecule B.

FIGS. 13 (A)–(G) are schematic diagrams of molecule C.

FIGS. 19 (A)–(G) are schematic diagrams of molecule B.

FIG. 28 is a cross-sectional view indicating the composition of a deposition system.

FIGS. 47 (A)–(E) are schematic diagrams of a molecular framework.

FIGS. 50 (a)–(c) are diagrams of the absorption spectra of another example of the film related to the present invention.

FIGS. 51 (a)–(c) are diagrams of the absorption spectra of another example of the film related to the present invention.

FIG. 53 is a schematic diagram indicating an example of the polymer of the present invention in which potential wells (or quantum dots) are formed.

DESCRIPTION OF THE PREFERRED EMBODIMENTS

Figure 2A:
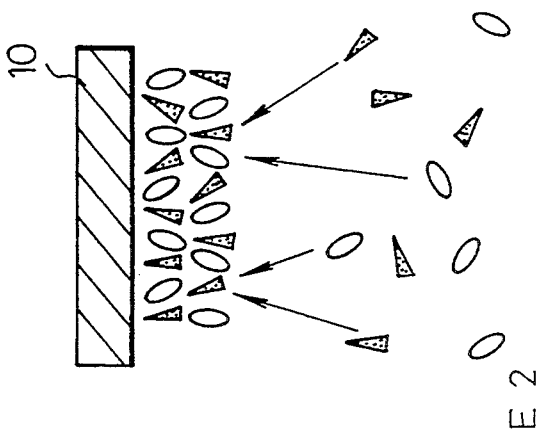
FIGS. 2 (A)–(C) are schematic diagrams explaining the addition of molecules to a substrate.

In the organic functional thin film according to the first aspect of the present invention, a portion or all of the units of the above-mentioned molecules have a donor group (electron donating group) and/or an acceptor group (electron accepting group). Examples of suitable donor groups D and acceptor groups A are indicated in Table 1.

TABLE 1

| Donor Group | Acceptor Group A |
|---|---|
| —NH$_2$ | —NO$_2$ |
| 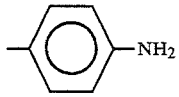—NH$_2$ | 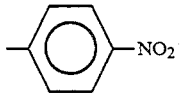—NO$_2$ |
| —NMe$_2$ | —CN |
| 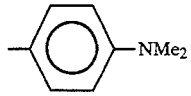—NMe$_2$ | 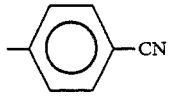—CN |
| —OCH$_3$ | —CF$_3$ |
| 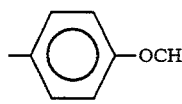—OCH$_3$ | 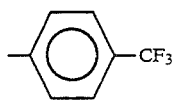—CF$_3$ |
| —C≡C—OCH$_3$ |  |
| —C≡C—NH$_2$<br>—C≡C—NMe$_2$ | —C≡C—NO$_2$<br>—C≡C—CN<br>—C≡C—CF$_3$ |
|  H NMe | —F |

Me = methyl

At least one of the groups added as a donor group D may be a group other than an amino group not participating in bonding such as —N(CH$_3$)$_2$, —OCH$_3$ or —OH.

In addition, at least one portion of the groups contained in a molecule may be separated from a conjugated π electron system which composes the framework of that molecule by two more single bonds such as —(CH$_2$)$_n$—.

The organic functional thin film of the present invention can have various modes. Typical examples of those modes are indicated as follows:

(1) An organic functional thin film formed by bonding an epoxy monomer having two or more epoxy rings with a non-linear optical molecule having two or more amino protons which may be provided by one or more amino groups. In this case, the organic non-linear optical molecule may also have acceptor form A.

(2) An organic functional thin film formed by bonding a dianhydride of a tetravalent carboxylic acid (having 6 or more carbon atoms) or a halide of a divalent carboxylic acid (having 4 or more carbon atoms), with a molecule having at least two amino groups and/or alkylamino groups (having 1–10 carbon atoms) and a donor and/or acceptor group. In this film, a molecule having three or more amino groups wherein two or more of those groups may be separated from a conjugated $\pi$ electron system which forms the molecule framework by two or more single bonds may be used for the molecule having at least two amino groups and/or alkylamino groups and a donor and/or acceptor group.

According to another aspect of the present invention, there is provided an organic functional thin film comprised of a polymer of a molecule having one or more groups selected from the group consisting of a carbonyloxycarbonyl group, a carboxylic acid group, a carboxylic acid halide group, a carboxyl group, a —COCl group, an —NCO group and an epoxy group, and one or more groups selected from the group consisting of an amino group, groups containing at least one amino proton, an alkyl amino group, a silylated alkylamino group, a carboxylic acid group and a hydroxyl group, formed by chemical vapor deposition, the polymer-forming molecules having at least partially one or more donor and/or acceptor groups.

Similar to the above-mentioned first organic functional thin film, in the case of this organic functional thin film, at least one portion of the units of the molecules have a donor group and/or acceptor group, and at least one of the groups added as a donor group may be a group other than an amino group. In addition, at least one portion of the groups contained in the molecule may preferably be separated from a conjugated $\pi$ electron system which composes the framework of that molecule by two or more single bonds.

Typical examples of such an organic functional thin film are indicated as follows:

(1) An organic functional thin film formed by mutually bonding a monomer having two or more epoxy rings, two or more amino protons and an acceptor group.

(2) An organic functional thin film formed by mutually bonding a molecule containing a dianhydride of a tetravalent carboxylic acid (having 6 or more carbon atoms) or an acid halide of a divalent carboxylic acid (having 4 or more carbon atoms) as its compositional unit, and also having at least two amino groups and/or alkylamino groups (having 1–10 carbon atoms) as well as a donor group and/or acceptor group.

The polymer of the organic functional thin film of the present invention may further have a hydrophilic and/or hydrophobic groups that have been added. In addition, the non-linear optical material of the present invention is preferably formed into a film by introduction of molecules in a vacuum or evaporation of molecules in a vacuum followed by bonding and/or polymerization of those molecules. In addition, molecules able to act as a hardening agent may be introduced at the time of film deposition.

Another aspect of the present invention is a manufacturing process for an organic functional thin film wherein molecules are either introduced in a vacuum or evaporated in a vacuum followed by bonding and/or polymerization to form a thin film.

The process of the present invention can be performed advantageously according to various techniques. Typical examples of those techniques are indicated as follows:

(1) Performing film deposition by introducing molecules in a vacuum which are able to act as a wring agent.

(2) Performing film deposition by alternately projecting different types of molecules onto a substrate in the case of using a plurality of types of molecules.

(3) Setting the substrate temperature during film deposition to a temperature such that the re-evaporation rate is higher than the molecule projection rate in the case of performing deposition with each of the molecules individually.

(4) Setting the substrate temperature during film deposition at or below room temperature.

(5) Performing film deposition while irradiating with light.

(6) Performing film deposition while irradiating with an electron beam.

(7) Polymerizing the molecules by heating or irradiation with light following deposition.

(8) Performing film deposition applying a voltage to pattern electrodes formed on a substrate.

(9) Performing film deposition while applying a voltage between an electrode provided on or in the vicinity of a substrate, and an electrode provided in opposition to the substrate.

(10) An electrode provided in opposition to a substrate has either a porous or mesh structure.

(11) An electrode provided on or in the vicinity of a substrate and/or an electrode provided in opposition to the substrate are formed into patterns.

(12) Performing film deposition in the presence of generated plasma, or in other words, while forming plasma.

Another aspect of the present invention is a fabrication process for an organic film wherein a plurality of types of molecules having two or more addition groups, in which addition groups of molecules of the same type have weak reaction bonding strength while addition groups of molecules of different types have reaction bonding strength greater than the reaction bonding strength between addition groups of molecules of the same type, are projected onto a substrate in a vacuum in a specified sequence; and, the substrate temperature at that time is set to a temperature such that the re-evaporation rate is higher than the molecule projection rate and a film is deposited on the substrate during formation of reaction bonds with different types of molecules in the case of performing deposition with each of the molecules individually. This process may be called as MLD (molecular layer deposition) process.

The fabrication process for an organic film of the present invention can be performed preferably using a molecule having two or more identical or different groups selected from a carbonyloxycarbonyl group, a carboxylic acid group, a carboxylic acid halide group, a carboxyl group, a —COCl group, an —NCO group, a —CHO group and an epoxy group, and a molecule having two or more identical or different groups selected from an amino group, groups containing at least one amino proton, an alkylamino group, a silated alkylamino group, a carboxylic acid group and a hydroxyl group, wherein two or more types of said molecules are used.

In addition, the fabrication process for an organic film of the present invention can be performed preferably using a molecule having two or more halogen groups, and a molecule having two or more groups selected from among a hydrogen atom, an alkali metal and copper, wherein two or more types of said molecules are used.

In the present invention, various types of functional molecules, including molecules which emit fluorescent light, molecules which demonstrate electroluminescence, and molecules which demonstrate electrochromic and photochromic effects, may be used as addition groups.

The organic functional thin film of the present invention is based on starting from specific molecules followed by the performing of film deposition of those molecules by vapor-phase deposition such as chemical vapor deposition. Through the use of vacuum deposition, a non-linear optical material can be realized having a low level of relaxation degradation and superior environmental resistance. In addition, this also allows the various problems of the prior art to be solved.

Figure 2B:
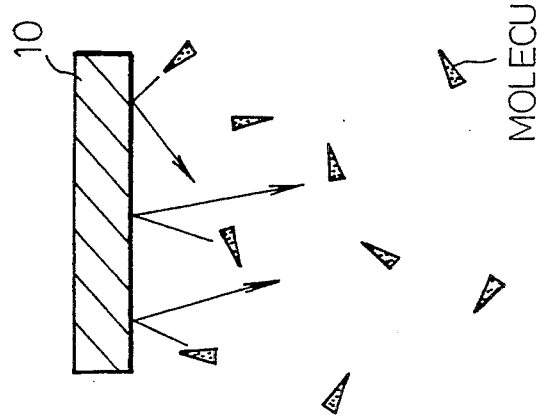
Figure 2C:
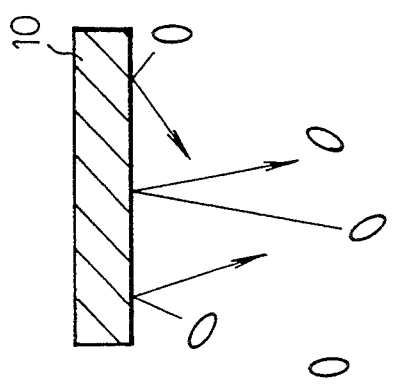

In order to understand the operation of the present invention, the deposition process of the present invention is schematically indicated in FIG. 1. In addition, the addition of molecules onto the substrate (formation of the molecular layer) is schematically indicated in FIG. 2. Furthermore, the molecules used in the deposition process shown in the diagrams are molecules 1 and 2 having the structures indicated below.

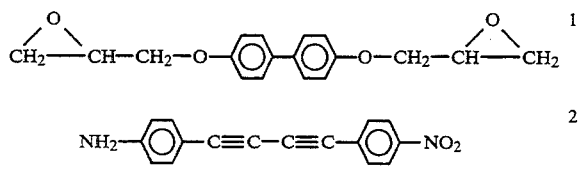

As is indicated in FIG. 2, although a film is not deposited by re-evaporation from substrate 10 (substrate temperature $T_s = 140°$ C.) in the case of one type of molecule, a film can be deposited by simultaneously or alternately projecting two types of molecules onto substrate 10 as is indicated in FIG. 2 (C). Furthermore, although a temperature of 140° C. is indicated here for the substrate temperature, a good-quality film having a favorable stoichiometric ratio can be formed by setting the substrate temperature to a suitable temperature. In addition, if the substrate temperature is maintained at or below the polymerization temperature (normally 100° C. or higher) during deposition, and polymerization is performed by heating or irradiation with light following deposition at a low temperature, thermal disturbance can be suppressed. This allows orientation by an electric field to be performed easily thus resulting in the achieving of a higher level of performance.

Referring again to FIG. 1, since the molecules of organic functional thin film (B), obtained by chemical vapor deposition via step (A), according to the present invention, are formed into a film while being oriented in the vapor phase or on a surface before those molecules are completely incorporated within that film, the initial state of the molecules is that of an orderly system. Thus, relaxation degradation is minimal and, since long molecules are able to rotate easily, a high degree of orientation is achieved. Moreover, in the case substrate cooling is performed, thermal disturbance is reduced thereby improving orientation characteristics even further.

Figure 3:
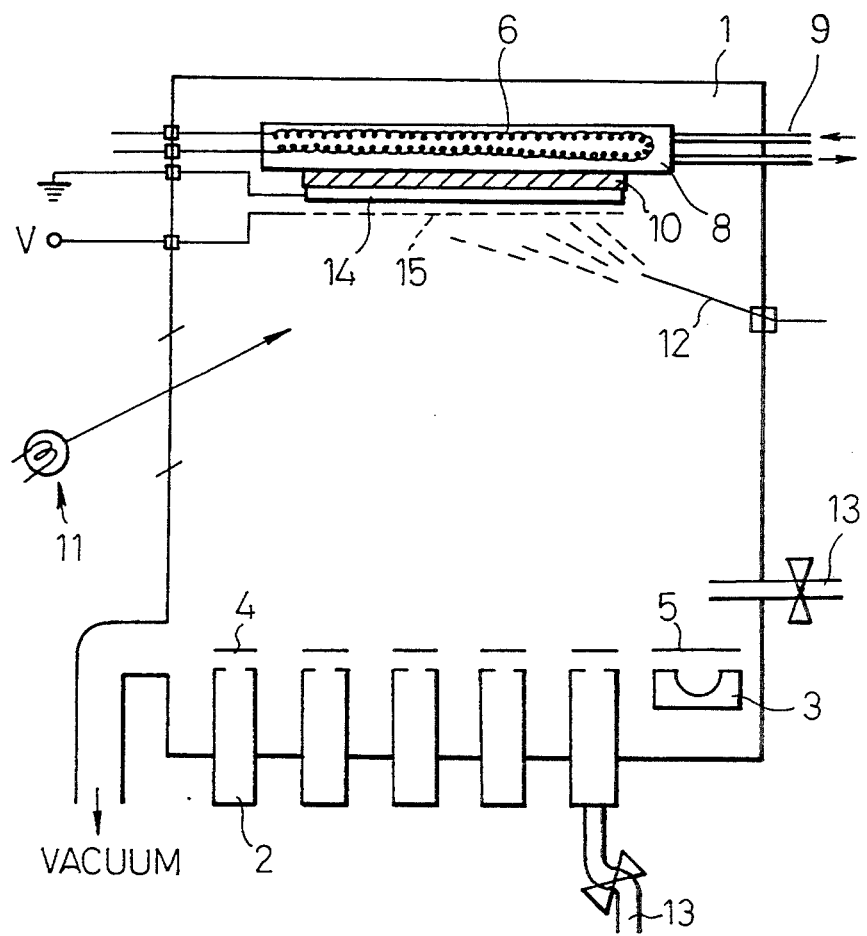
FIG. 3 is a cross-sectional view indicating the composition of a deposition system.

Various types of deposition systems can be used for the embodiments of the present invention. The MBD (Molecular Beam Deposition) system schematically shown in FIG. 3 is one example. This system possesses vacuum chamber 1 as the reaction chamber. Substrate 10 inside vacuum chamber 1 may be a substrate such as, for example, a silicon substrate or quartz substrate. Substrate 10 is held in position by substrate holder 8. As substrate holder 8 allows substrate 10 to be heated or cooled, in addition to housing heater 6, it is also equipped with pipe 9 for circulation of cooling medium. Substrate heating may be performed by a method such as irradiating the substrate with infrared light. Solid electrode 14 is provided on the substrate 10 and opposing electrode (grid) 15 is arranged to the front of substrate 10. Solid electrode may formed into a pattern as necessary, or above-mentioned substrate 10 itself may function as this electrode. In addition, in addition to grid 15 having a mesh structure as indicated in the drawing, it may also have a porous structure. Moreover, the deposition system indicated in the drawing is also equipped with an illumination system containing light source 11, an electron beam illumination system 12, reaction gas inlet 13, a plurality of cells for molecule evaporation (K cells) 2 and their shutters 4, crucible 3 for molecule evaporation and its shutter 5, and a plasma generator (not shown). A voltage can be applied between solid electrode 14 and grid 15. Furthermore, visible light or ultraviolet light can be used for the light from light source 11. Moreover, the control of the supply of molecules and the degree of vacuum can be improved by adsorbing the molecules by either providing a liquid nitrogen shroud, etc., around the K cells, etc. or cooling the shutters.

The organic functional thin film of the present invention can be manufactured in the following manner using the deposition system shown in FIG. 3: For example, molecules having two —NCO groups (molecule A) and molecules having two or more amino groups (molecule B) are evaporated separately from cell 2. The two types of molecules that are projected onto substrate 10 combine and polymerize on the substrate. In the case a donor group and acceptor group are added to the molecules, a film is obtained in which the molecules are oriented in the as-deposited state by deposition while applying a voltage between electrodes 14 and 15 formed on the substrate. Similarly, a film is obtained oriented in the direction of film thickness in the as-deposited state by deposition while applying a voltage between the electrode formed on substrate 10 and the opposing electrode (grid). In this case, a distance between the electrode and opposing electrode of 2 microns to 10 centimeters is desirable. When the distance between electrodes is particularly wide, it is desirable to efficiently apply voltage to the film by high-frequency generation of plasma by introduction of a gas such as Ar, or generation of an electron beam. As was mentioned previously, with respect to the electrode on the substrate, the substrate itself may be an electrode (such as a doped semiconductor substrate), or an electrode may be formed on the substrate. In addition, a UV cured resin or a buffer layer such as that of $SiO_2$, etc. may be formed on the substrate. Moreover, as is indicated in FIG. 2, a good-quality film having a favorable stoichiometric ratio can be obtained by setting the substrate temperature to a temperature such that although a film is not deposited by re-evaporation from the substrate in the case of only one type of molecule, a film is deposited when two types of molecules are either simultaneously or alternately projected onto the substrate.

In addition, curing can also be performed by heating or by illumination with light following deposition at a low temperature at or below room temperature. Since thermal disturbance can be suppressed in this case, orientation by an electric field becomes easy thus allowing the obtaining of a higher level of performance.

Figure 4:
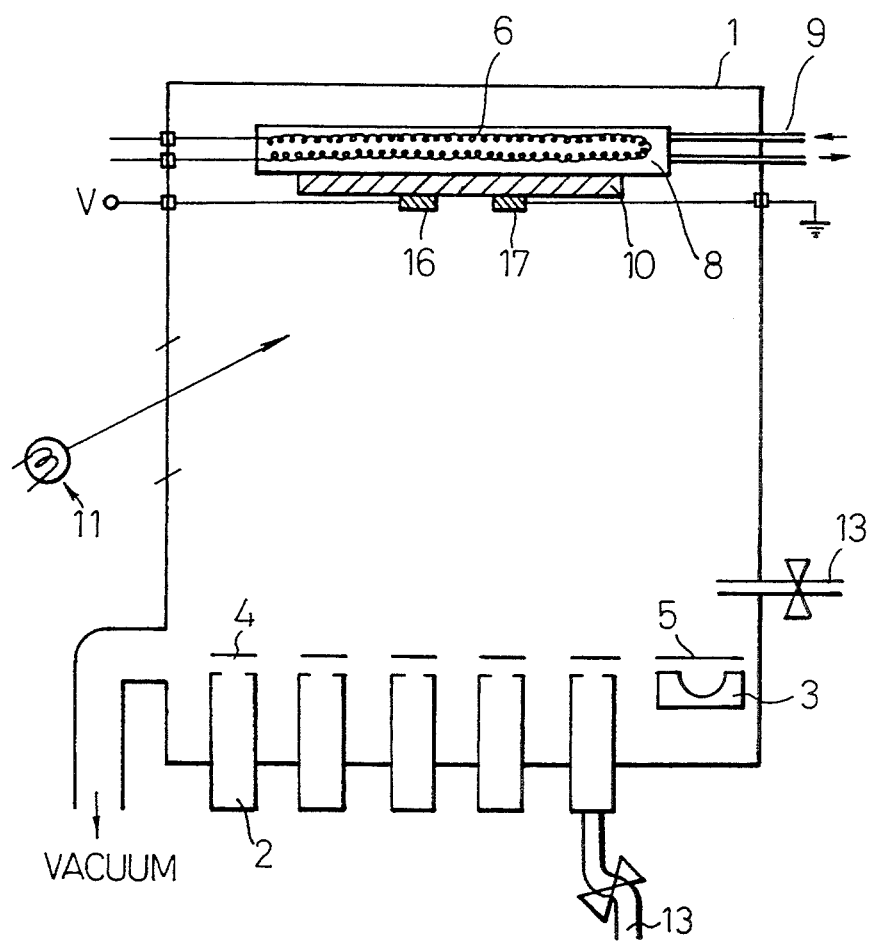
FIG. 4 is a cross-sectional view indicating the composition of a deposition system.

The deposition system FIG. 4 indicates an example in which pattern electrodes 16 and 17 are formed directly on substrate 10. Furthermore, other components of this deposition system are the same as the components of the above-mentioned deposition system shown in FIG. 3. The electrode composition of this deposition system can be further altered and modified in various ways. The following provides an explanation of one example of such an alteration or modification referring to FIG. 5. In addition to electrode 14 being formed in the form of a pattern on substrate 10, mask 19 of a conductive material is arranged on the front of substrate 10. Mask 19 possesses mesh-like holes 20 and is used in the manner of a grid. Buffer layer 18 is also shown in this example.

Figure 6:
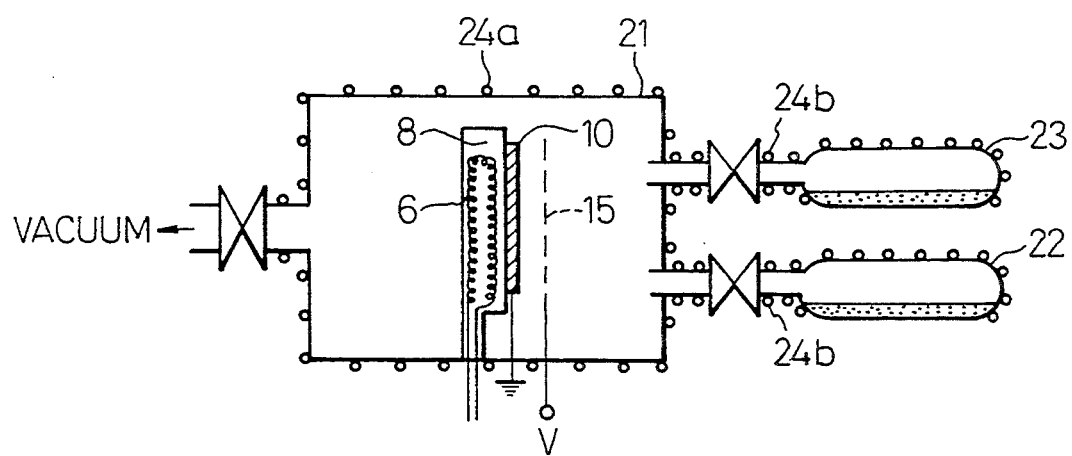
FIG. 6 is a cross-sectional view indicating the composition of a deposition system.

In addition to the composition of a vacuum evaporation system explained above, the deposition system usable for the present invention can also have the composition of a chemical vapor deposition (CVD) system. In other words, as is indicated in abbreviated form in FIG. 6, the deposition system of the present invention can be comprised of vacuum chamber (reaction chamber) 21 and monomer gas tanks (or monomer gas supply pipes) 22 and 23 which are connected to said vacuum chamber 21. Substrate holder 8 houses heater 6, and substrate 10, which is held in position by substrate holder 8, can also function as an electrode. Grid 15 is arranged in front of substrate 10. Where the gas pressure is more than $10^{-3}$ torr, an ordinary plate electrode can be used instead of the grid electrode. Reaction chamber 21 as well as monomer gas tanks 22 and 23 can each be heated by heaters 24a and 24b. In addition, although not shown, substrate holder 8 can be cooled.

This can be considered to be organic CVD in the monomer gas.

According to the present invention, an organic non-linear optical material can be manufactured by evaporating (or introducing in a vacuum) molecule A and molecule B from separate cells as was mentioned previously. In addition, additional molecules such as molecule C, molecule D and so on may be allowed to be present as necessary in order to obtain the desired organic non-linear optical material.

For example, in the case the desired material is polyurea, said material can be manufactured from molecule A and molecule B shown in the following table according to the formation reaction formula also shown. This process is also depicted in Takahashi et al., IEE, J. Elect. Insul. Mater., EIM-85-49 (1985) and Iijima et al., Nikkei New Materials, Dec. 11, 1989, p. 93.

TABLE 2

Molecule A: $H_2N-Ar^1-NH_2$ + Molecule B: $OCN-Ar^2-NCO \longrightarrow$ $$-N(H)-Ar^1-N(H)-C(=O)-N(H)-Ar^2-N(H)-C(=O)-$$

$Ar^1$: ODA, MeMDA, MDA
$Ar^2$: MDI, MeBDI
Me = $-CH_3$

As can be understood from this table, a polymer film is formed in this case by bonding of an amino group of molecule B and with an —NCO group of molecule A.

In addition, in the case the desired material is a polyamide, it is also known that said material can be manufactured from molecule A and molecule B shown in the following table according to the various formation reaction formulae also shown.

TABLE 3

| Molecule A | Molecule B | Polyamide |
|---|---|---|
| TPC (Cl-C(=O)-Ar-C(=O)-Cl) | ODA (H-N(H)-Ar-O-Ar-N(H)-H) | -C(=O)-Ar-C(=O)-N(H)-Ar-O-Ar-N(H)- |
| TPC (ClC(=O)-Ar-C(=O)Cl) | Si—p-PDA ((CH$_3$)$_3$Si-N(H)-Ar-N(H)-Si(CH$_3$)$_3$) | -C(=O)-Ar-C(=O)-N(H)-Ar-N(H)- |
| | p-PDA (H-N(H)-Ar-N(H)-H) | |

In this case, a polymer film is formed by reaction of a —CClO group and an amino group, or a —CClO group and a silated amino group.

Moreover, it is also known that a polyamideimide film and polyazomethin film can be manufactured in a similar manner. Those polymerization reactions are indicated in the following tables.

TABLE 4

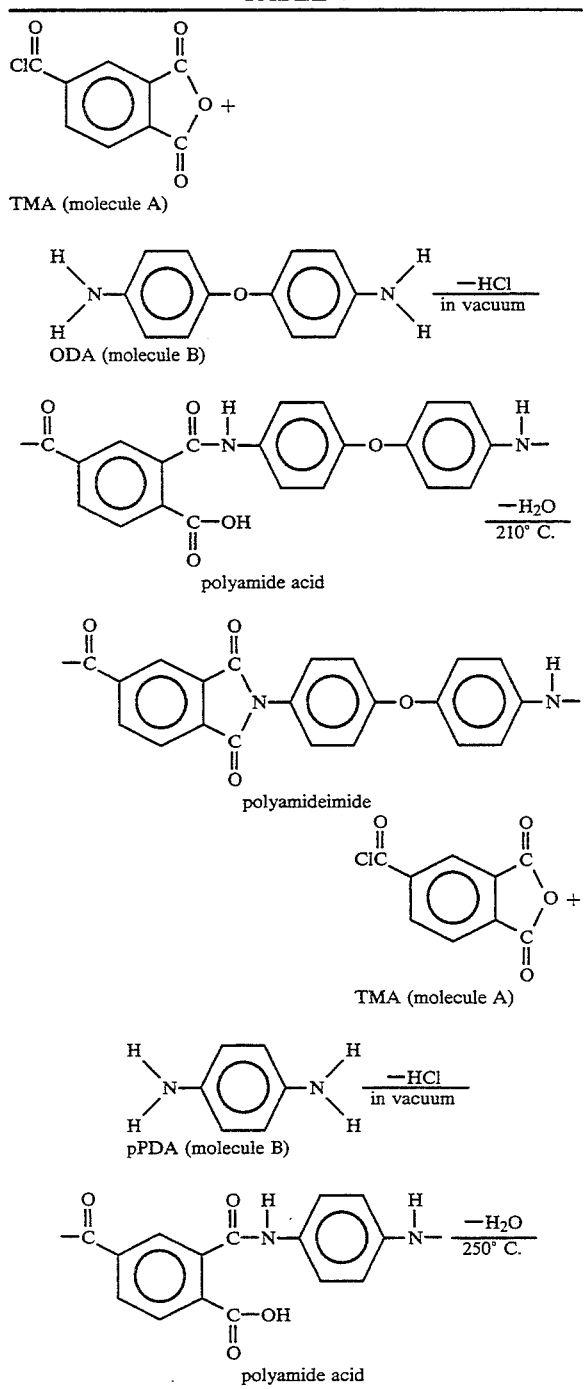

TABLE 4-continued

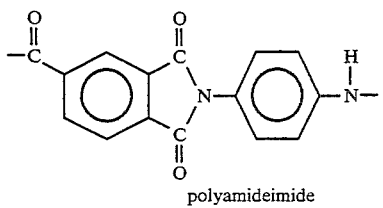

polyamideimide

TABLE 5

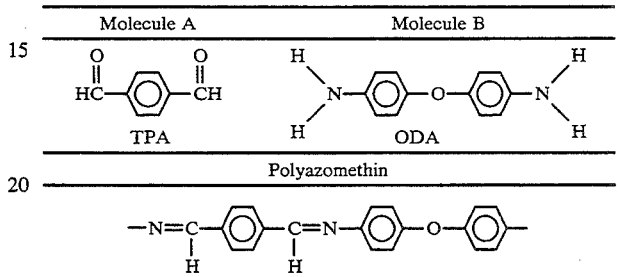

Polyazomethin in particular is a characteristic polymer because two molecules are combined through a double bond.

Figure 7:
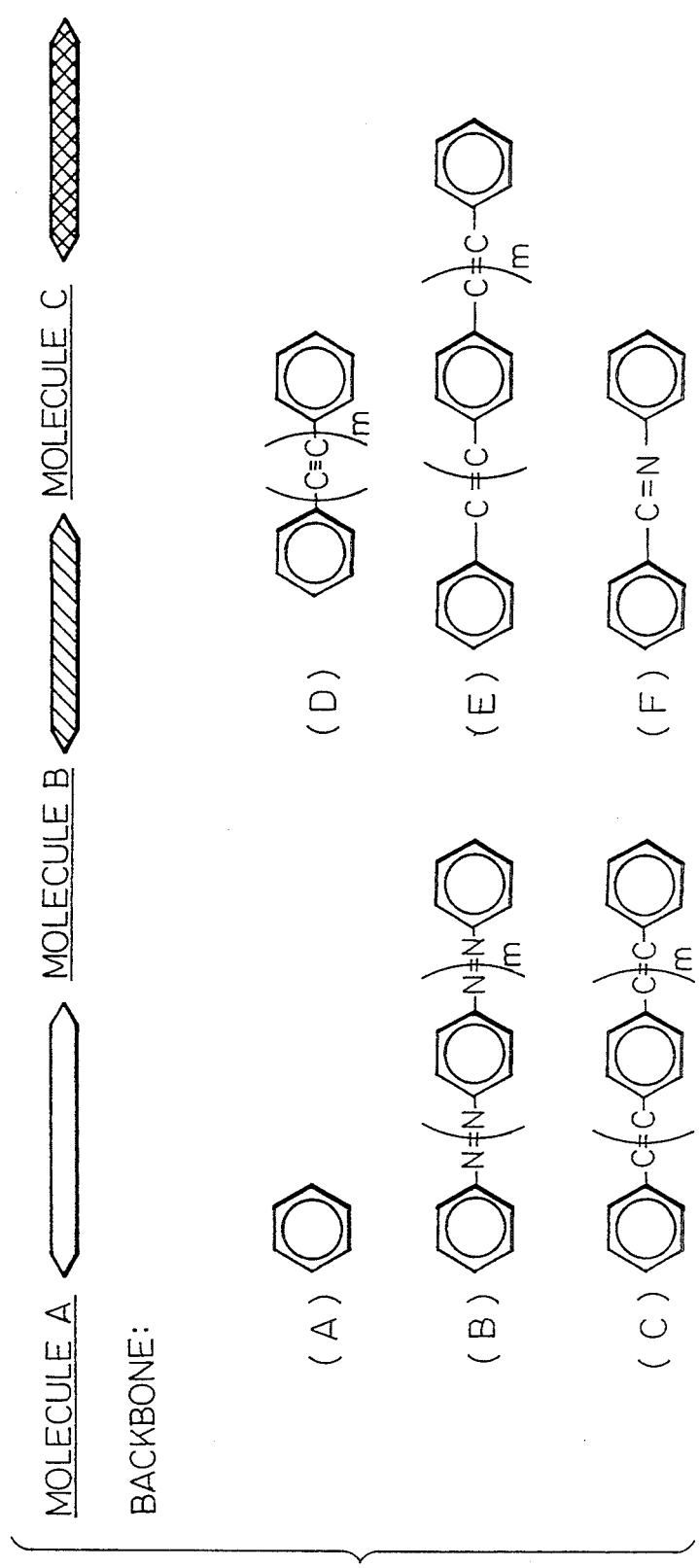
FIG. 7 is a schematic diagram indicating the frameworks of molecules.
Figure 8A:
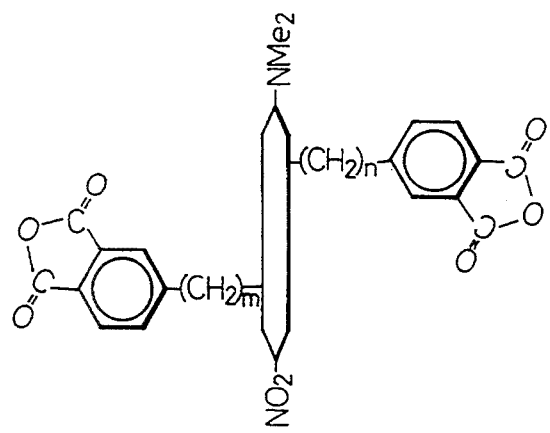
FIGS. 8 (A)–(H) are schematic diagrams of molecule A.
Figure 8C:
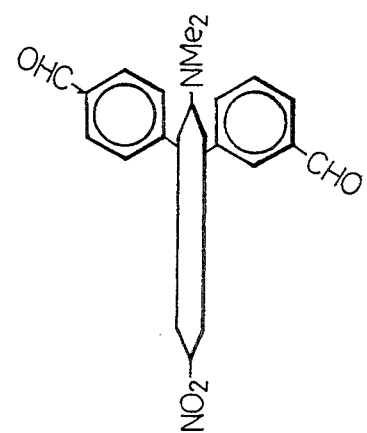
Figure 8B:
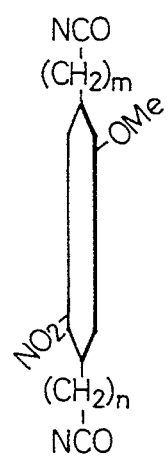
Figure 8D:
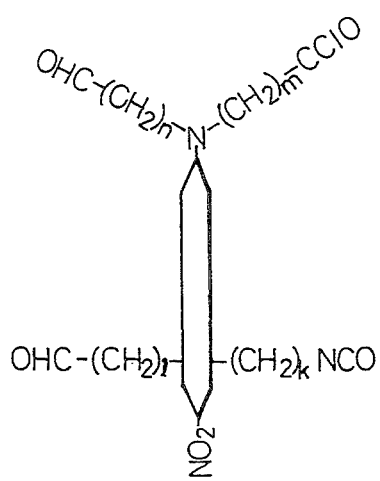
Figure 8E:
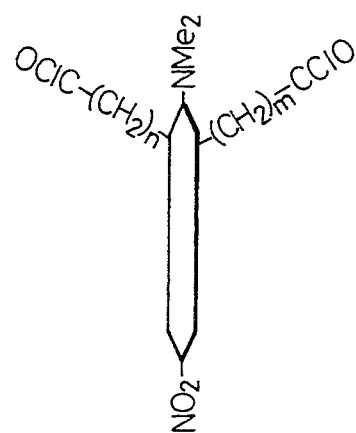
Figure 8G:
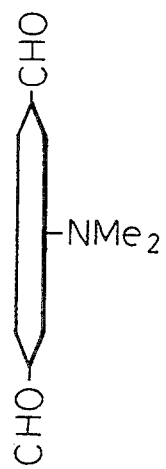
Figure 8F:
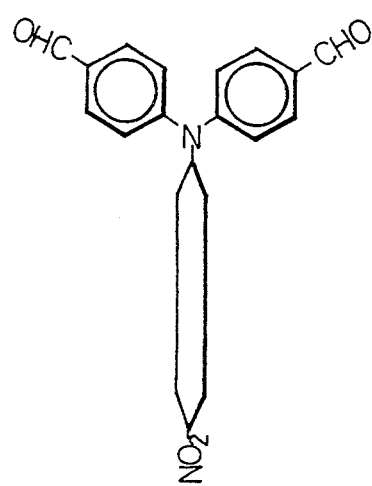
Figure 8H:
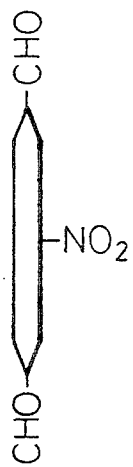
Figure 9F:
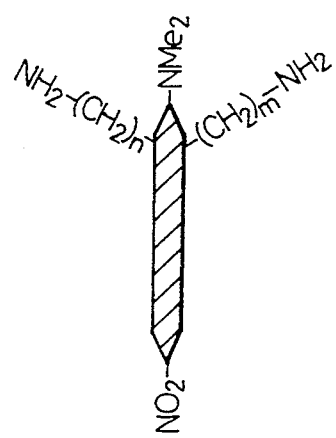
FIGS. 9 (A)–(I) are schematic diagrams of molecule B.
Figure 9H:
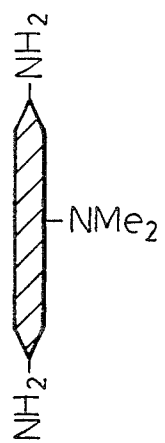
Figure 9G:
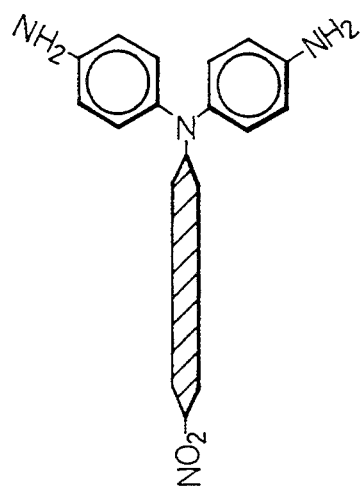
Figure 9I:
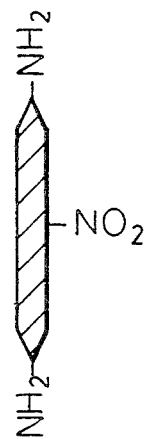
Figure 10A:
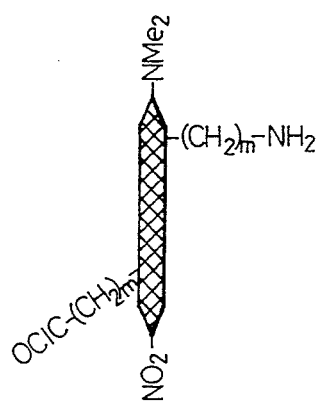
FIGS. 10 (A)–(D) are schematic diagrams of molecule C.
Figure 10C:
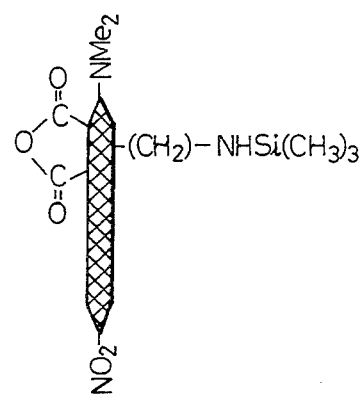
Figure 10D:
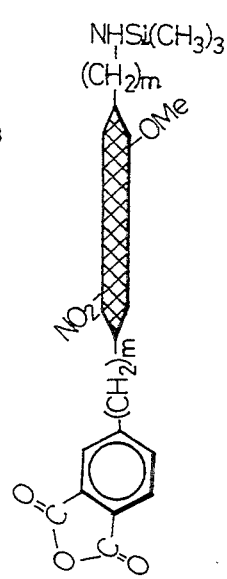
Figure 10B:
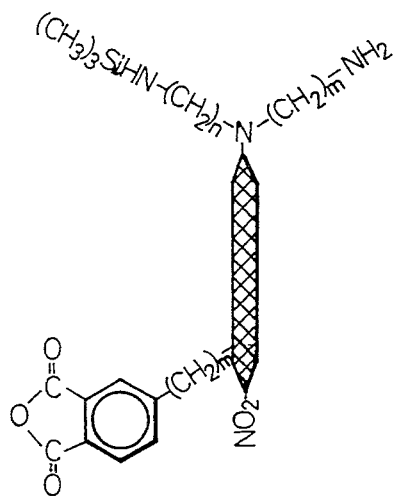

FIG. 8 provides a summary of preferable examples of molecule A that can be used in the present invention. In addition, FIG. 9 provides a summary of preferable examples of molecule B that can be used in the present invention. Molecule A is a molecule containing two or more groups selected from a carbonyloxycarbonyl group, an acid halide group of a carboxylic acid, an —NCO group and a —CHO group, while molecule B is a molecule containing two or more groups selected from an amino group, groups containing one or more amino protons, an alkylamino group having 1-10 carbon atoms and the silated forms of those groups. Molecule A containing an epoxy group may be reacted with molecule B having one amino group. Furthermore, the molecular backbones, for example, indicated in FIG. 7 can be used for the backbones of molecule A and molecule B (the backbone of molecule C to be described to follow is also indicated in FIG. 7).

In the present invention, the desired polymer film may be manufactured by polymerization after adding molecule C to molecules A and B, or the desired polymer film may be manufactured by polymerizing two identical or different molecules of molecule C. An example of the latter is indicated in the following table.

TABLE 6

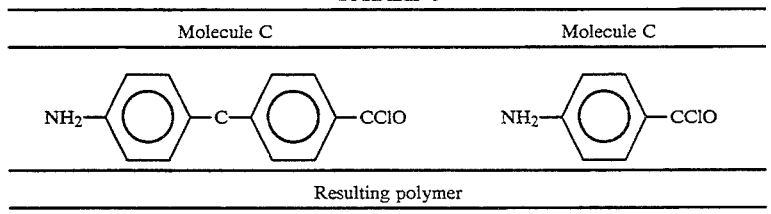

TABLE 6-continued

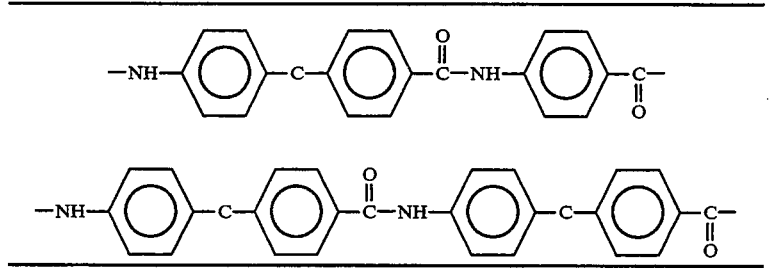

FIG. 10 provides a summary of preferable examples of molecule C that can be used in the present invention. This molecule contains a group selected from among a carbonyloxycarbonyl group, an acid halide group of a carboxylic acid, an —NCO group and a —CHO group, and a group selected from among an amino group, groups containing one or more amino protons, an alkylamino group having 1-10 carbon atoms and the silated forms of those groups. Thus, in the case of molecule C, in addition to it being possible to manufacture the desired polymer film by polymerizing with a plurality of types of molecules, such can also be manufactured by polymerization with only one type of molecule (see Table 6). The conceptual indications of molecules A, B and C are respectively indicated in FIGS. 8, 9 and 10. Specific examples of such molecules are indicated as follows.

Examples of Molecule A

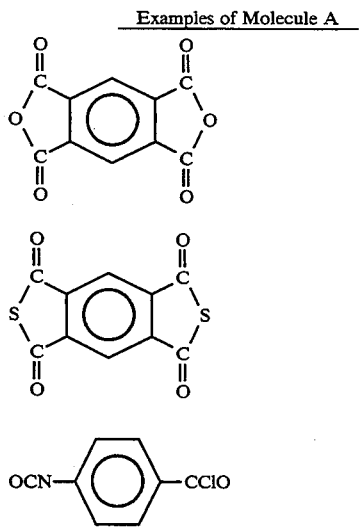

(A1)

(A2)

(A3)

-continued
Examples of Molecule A

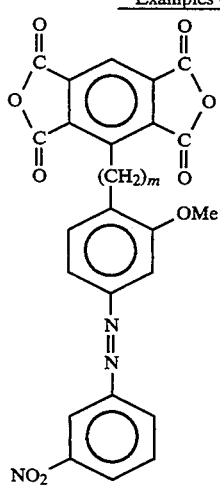

(A4)

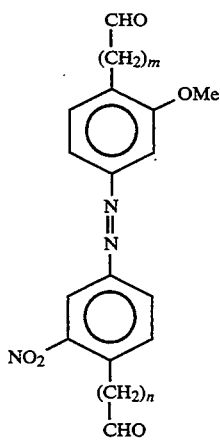

(A5)

Examples of Molecule A

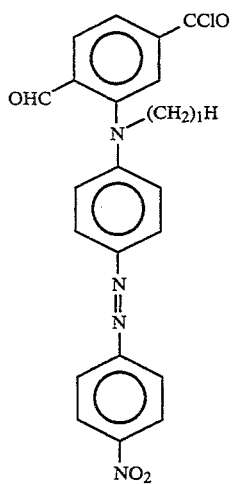
(A6)

Furthermore, in these molecules as well as other molecules indicated to follow, k, l, m and n represent the numbers 0, 1, 2, 3 and so on, while Me represents a methyl group.

In addition to the examples indicated above, molecule A also includes acid anhydrides, molecules having two or more —NCO groups, molecules having two or more —CHO groups and so on.

Examples of Molecule B

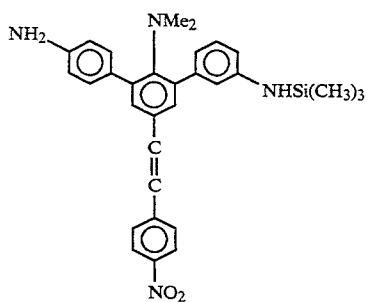
(B1)

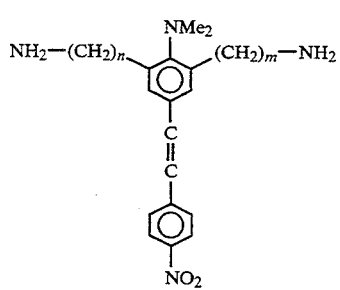
(B2)

Examples of Molecule B

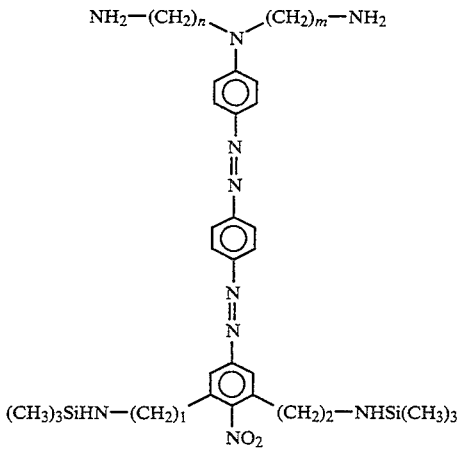
(B3)

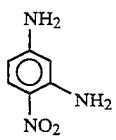
(B4)

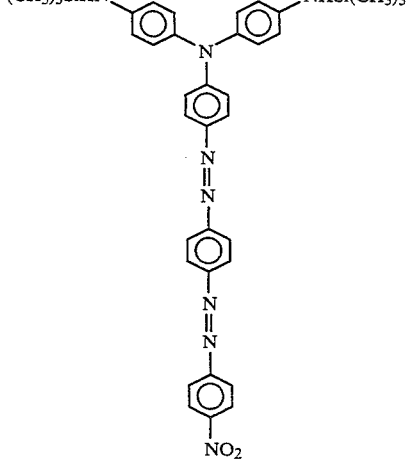
(B5)

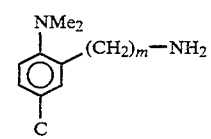
(B6)

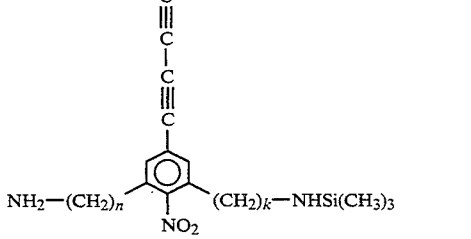

In addition to the examples indicated above, molecule B also includes the following type of molecule and so on.

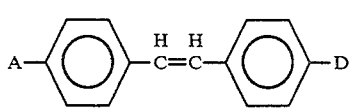
(B7)

-continued

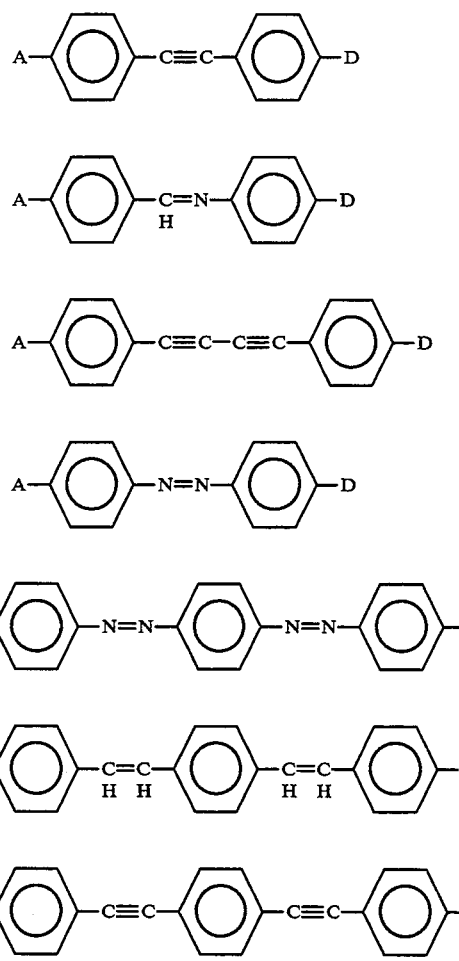

(B8)
(B9)
(B10)
(B11)
(B12)
(B13)
(B14)

In molecules B7–B14 indicated above, the letters D and A in the formulae represent donor groups and acceptor groups, respectively, and include those groups previously listed in Table 1. In addition, molecule B may also be that in which at least two or the hydrogen atoms of the phenylene ring portion of these molecules are substituted by amino groups and/or alkylamino groups having 1–10 carbon atoms.

Examples of Molecule C

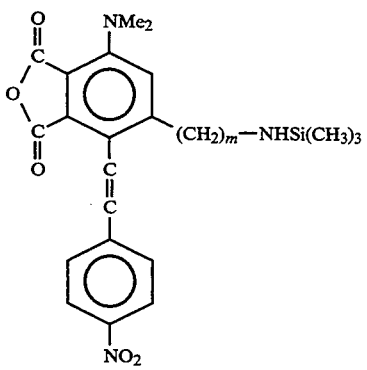

(C1)

-continued
Examples of Molecule C

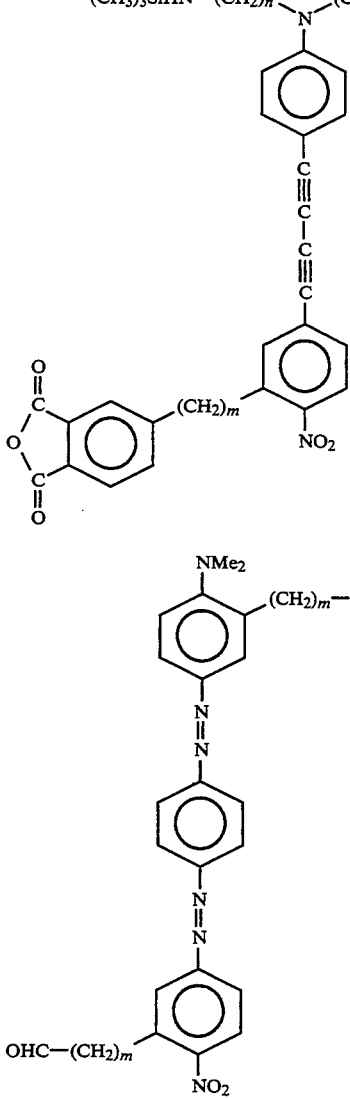

(C2)

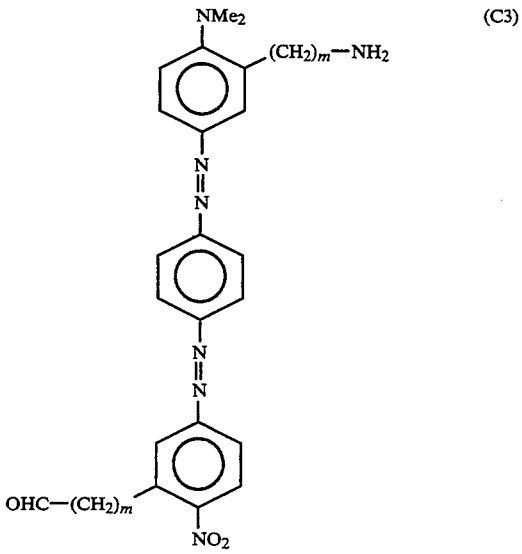

(C3)

According to the present invention, by forming a film while performing, for example, the above-mentioned electric field assist during film formation using molecules like those mentioned above, a polymer film can be obtained wherein molecules are oriented directly. A highly oriented film can be obtained by performing film formation while cooling the substrate temperature to a temperature at or below room temperature. If film formation is performed applying a voltage between pattern electrodes or between an electrode formed on the substrate and an electrode opposing said substrate, a polymer can be obtained wherein molecules are partially oriented.

Of course, it is possible to prepare third-order non-linear optical polymers without applying electric field. It is also possible to prepare second-order non-linear optical polymers by forming a film without applying electric field and then by subjecting the film to a poling process without applying electric field.

In the case of the electric field assist like that mentioned above, normal poling process can be performed after film formation, although not necessarily required.

In this case, although a direct orientation film cannot be obtained after film formation, a film can be obtained which has superior uniformity and a low level of impurities. Moreover, molecular orientation can be improved by the addition of hydrophilic or hydrophobic groups and performing hydrophilic or hydrophobic treatment of the substrate.

The following describes an example of an oriented film controlled during film formation.

Example A:
(1) Molecule A is deposited onto the substrate as the base layer.
(2) Molecule B is then deposited on the substrate. A bonding reaction takes place between base molecule A and molecule B resulting in the accumulation of molecule B.
(3) Molecule A is then deposited. A bonding reaction takes place between base molecule B and molecule A resulting in accumulation of molecule A.
(4) Molecule B is then deposited. A bonding reaction takes place between base molecule A and molecule B resulting in accumulation of molecule B.

Steps (3) and (4) are then repeated.

With respect to the conditions indicated in FIG. 2, a single molecular layer at a time of molecule A and molecule B are respectively adsorbed for each step of the process. Film growth beyond that point is stopped automatically. In other words, Molecular Layer Deposition (MLD), which resembles Atomic Layer Epitaxy (ALE) in the case of compound semiconductors, can be applied.

Example B:
(1) Molecule C is adsorbed onto the substrate.
(2) Molecule C is deposited.
(3) Molecule C is continued to be deposited.

Although there is a possibility of obtaining an oriented film without applying an electric field in the case of methods in which the deposition sequence of molecules is controlled as in the above example, an even higher oriented film can be obtained through the use of an electric field assist. In addition, by adding hydrophilic or hydrophobic groups to molecules A, B and C, the orientation of the molecules will be given directivity thus resulting in improved orientation characteristics.

Based on the present invention as described above, a non-linear optical material can be realized having a low level of relaxation degradation, ample environmental resistance, film thickness controllability and uniformity, minimum contamination by residual solvent and impurity molecules, and favorable orientation characteristics.

As was mentioned previously, the present invention relates to an organic non-linear optical material formed by either bonding an epoxy monomer having two or more epoxy rings and a non-linear optical molecule having two or more amino protons, or mutually bonding a monomer having two or more epoxy rings, two or more amino protons which may be provided by one or more amino groups, and an acceptor group. The following provides an explanation of this material.

In the case of this type of organic non-linear optical material as well, the deposition system like that previously indicated in FIGS. 3-6 can be used for the manufacturing of an organic film. In other words, non-linear optical molecules having an epoxy monomer and amino protons are evaporated from separate cells. The two types of molecules that are supplied onto the substrate are combined and polymerized by heating of the substrate or irradiation with UV light. By forming a film while applying a voltage between electrodes formed on the substrate, a film is obtained in which the molecules are oriented in the as-deposited state. Similarly, by forming a film while applying a voltage between an electrode formed on the substrate and an opposing electrode (grid), a film is obtained in which the molecules are oriented in the direction of film thickness in the as-deposited state. In this case, the distance between the electrode and opposing electrode is desirably from 2 microns to 10 centimeters. In the case the distance between electrodes is particularly wide, it is desirable to efficiently apply voltage to the film by high-frequency generation of plasma by introduction of a gas such as Ar. Similar effects can be anticipated by performing film formation while irradiating with an electron beam. Moreover, with respect to the electrode on the substrate, the substrate itself may be an electrode (such as a doped semiconductor substrate), or an electrode may be formed on the substrate. Although there are various other preferable modes, similar to the previously mentioned modes, these are the same as the modes of the invention previously described in reference to polymerization of a molecule having two —NCO groups (molecule A) and a molecule having two or more amino groups (molecule B) in the same manner as the above-mentioned modes.

The following table indicates polymerization reaction between molecule B having an amino proton and molecule A having an epoxy ring.

TABLE 7

| Molecule A | Molecule B |
|---|---|
| ![epoxy structure]—O—⟨O⟩—⟨O⟩—O—[epoxy structure] | NO₂—⟨O⟩—N=N—⟨O⟩—NH₂ |

Resulting Polymer

TABLE 7-continued

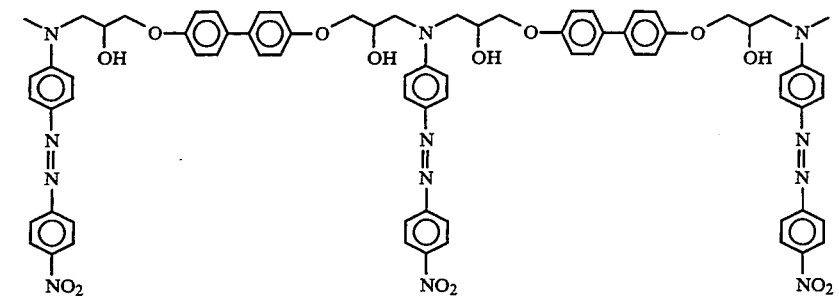

The above indicates one example of molecule A and molecule B. Other molecules can also be advantageously used in carrying out the present invention.

FIGS. 11 and 12 conceptually indicate molecule A and molecule B, respectively, which can be advantageously used in the present invention. In addition, although an explanation of the molecular frameworks of these molecules will not be given in particular with reference to drawings, it can be considered to be the same as the molecular framework indicated in FIG. 7 mentioned previously. Furthermore, the form of the molecular framework of molecule A is different from that in FIG. 7 for the sake of explanation.

In this case also, molecule C can be used as indicated in FIG. 13 either alone or in addition to the above-mentioned molecule A and molecule B. As molecule C has both amino protons and an epoxy ring as indicated in the diagram, polymerization can be performed with only one type of molecule.

Moreover, the following lists some specific examples of molecule A, molecule B and molecule C.

Examples of Molecule A

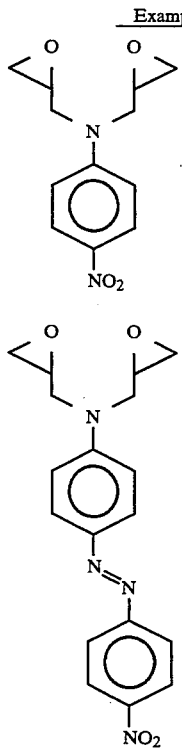

(A7)

(A8)

-continued
Examples of Molecule A

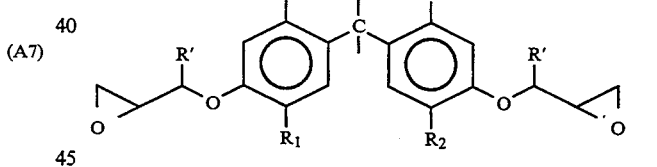

(A9)

R and R' each represents H, —OH, —NH₂, —NH-COCH₃, carboxyl or methoxy.

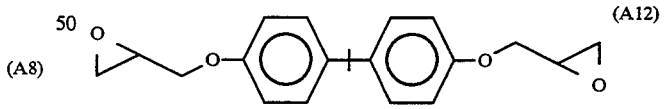

(A10)

(A11)

R and R' are as defined in formula A9, and R₁ and R₂ each represents methyl.

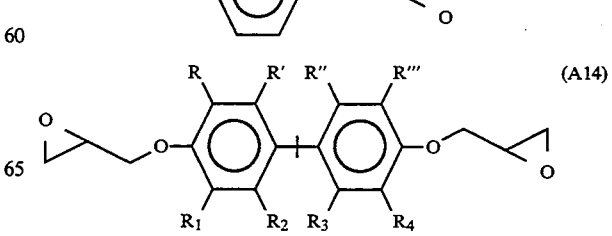

(A12)

(A13)

(A14)

R, R', R" and R'" each represents a significance of R or R' in formula A9, and $R_1$, $R_2$, $R_3$ and $R_4$ each represents a significance of $R_1$ or $R_2$ in formula A11.

In these examples of molecule A, donor groups and/or acceptor groups other than —$NH_2$ groups, such as $NMe_2$ groups or methoxy groups, may be contained in the molecules.

Examples of Molecule B

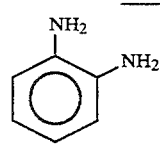
(B15)

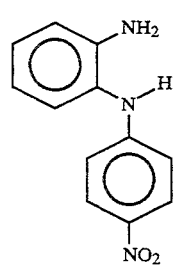
(B16)

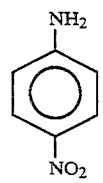
(B17)

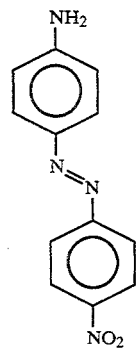
(B18)

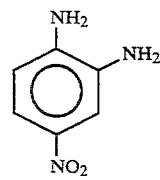
(B19)

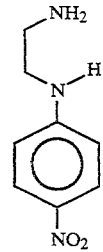
(B20)

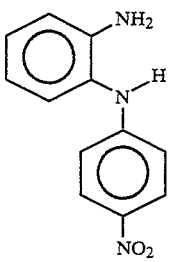
(B21)

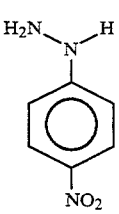
(B22)

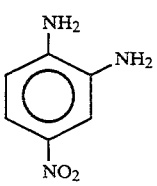
(B23)

Examples of Molecule C

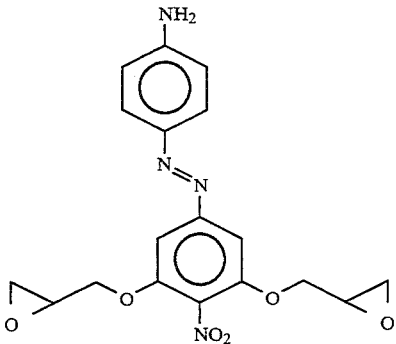
(C4)

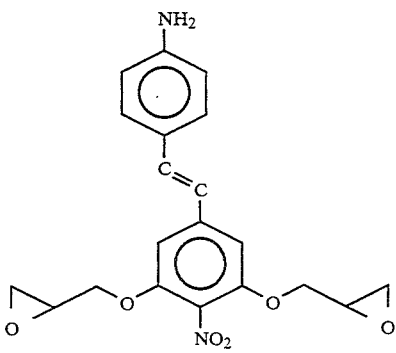
(C5)

-continued
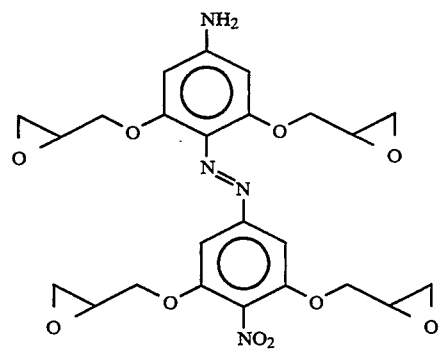
(C6)
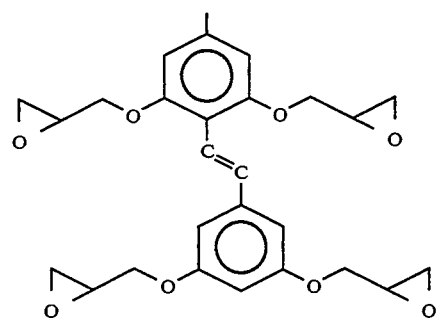
(C7)
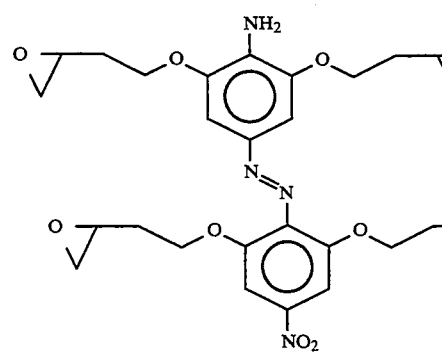
(C8)
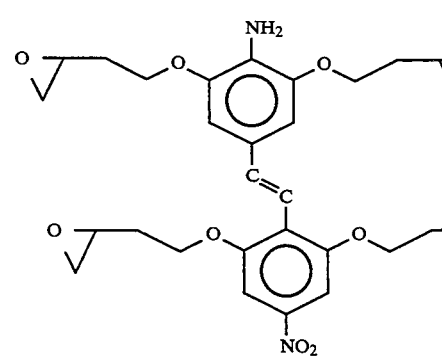
(C9)
-continued
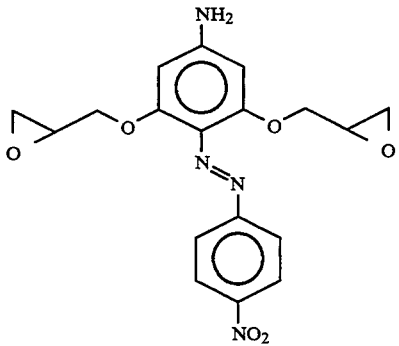
(C10)
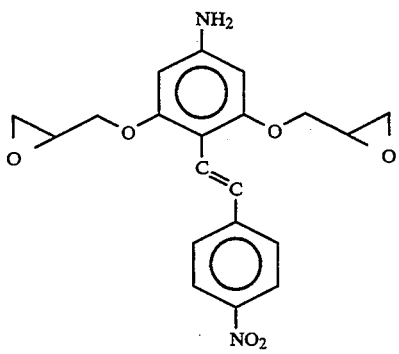
(C11)
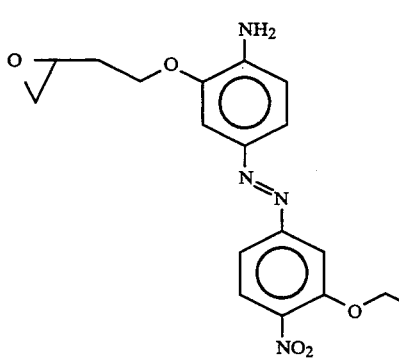
(C12)
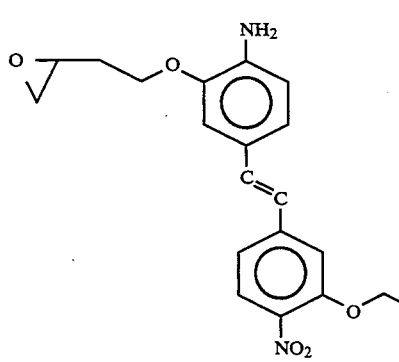
(C13)

-continued
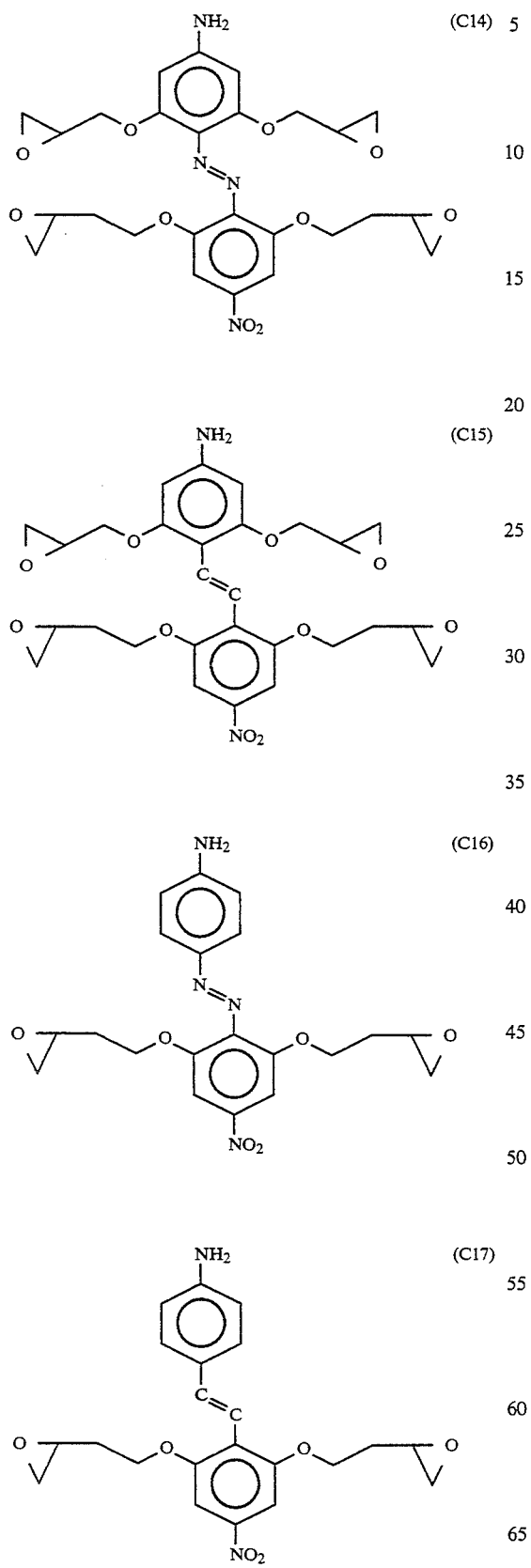
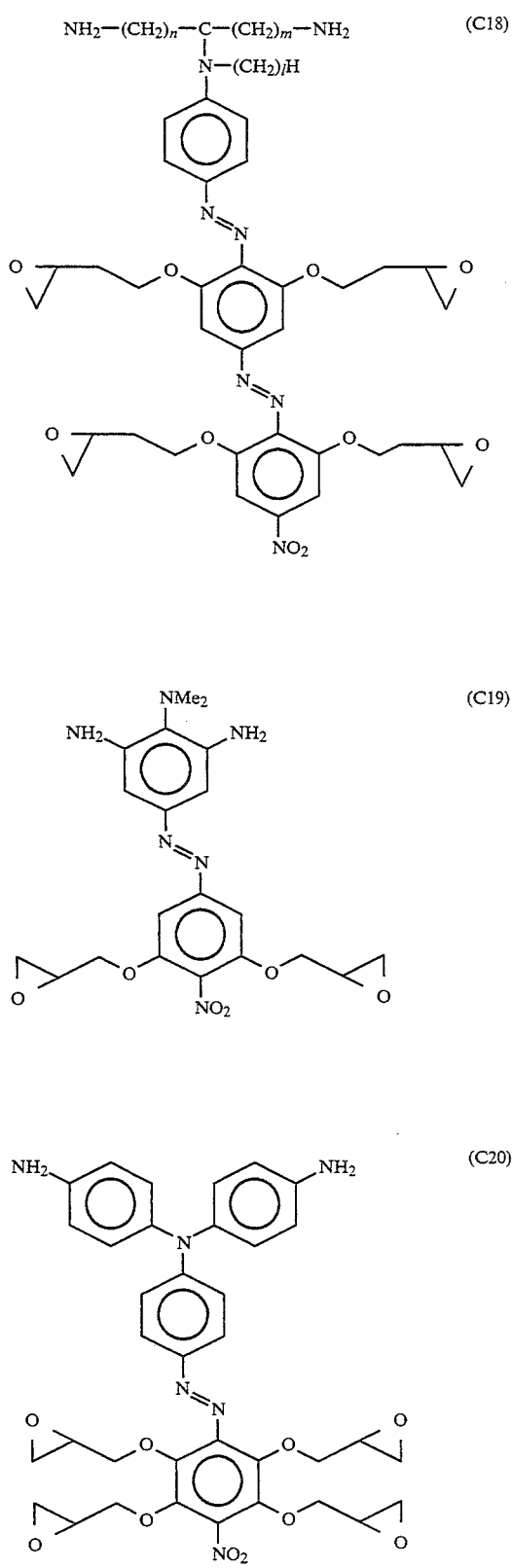

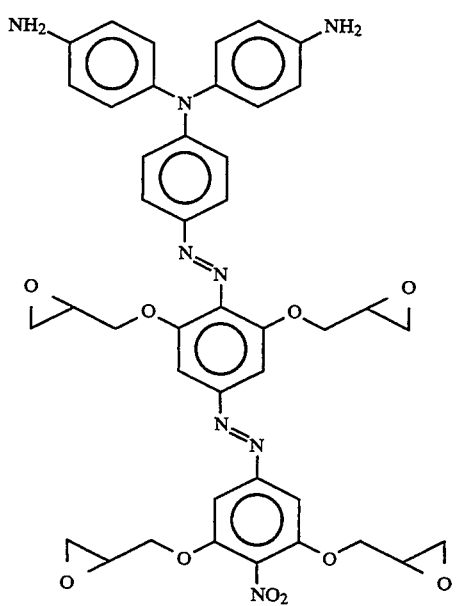
(C21)
Hydrophilic and/or hydrophobic groups may be added to the organic functional thin film of the present invention as was described previously. Examples of molecule A, molecule B and molecule C that can be advantageously used for preparation of said film are listed below.
Example of Molecule A
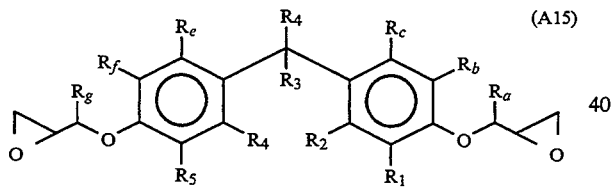
(A15)
Examples of Molecule B
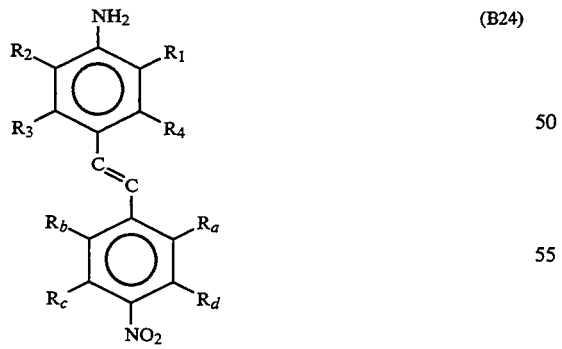
(B24)
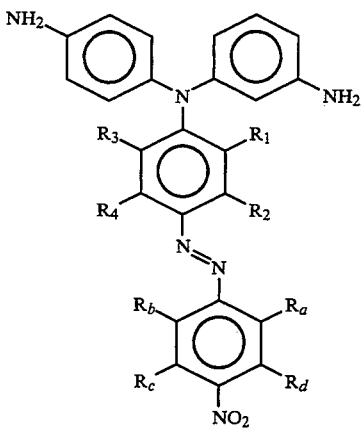
(B25)
Examples of Molecule C
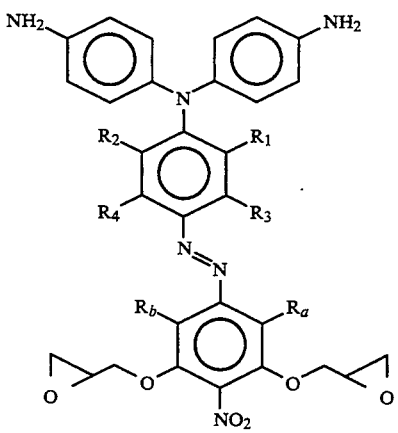
(C22)
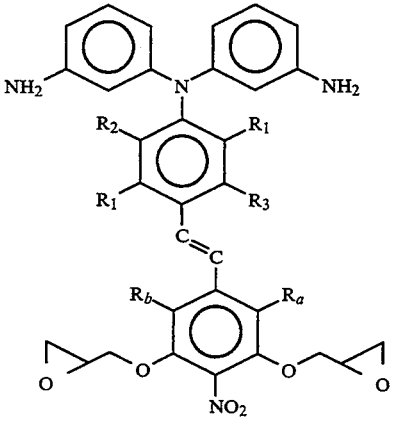
(C23)
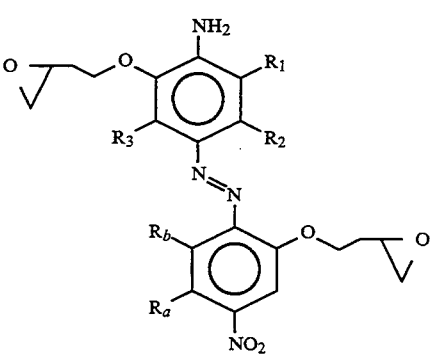
(C24)

-continued

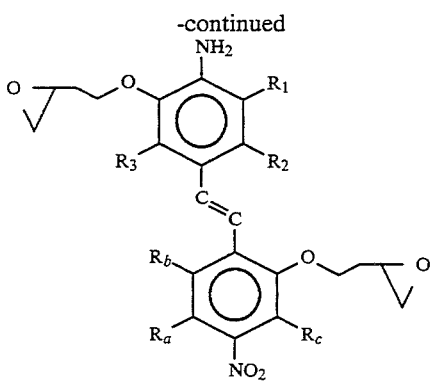
(C25)

In these molecules, substituent groups $R_a$–$R_c$ as well as $R_1$–$R_3$ can respectively be groups such as those indicated in the following table.

TABLE 8

| Combination | Substituent $R_a$–$R_c$ | Substituent $R_1$–$R_3$ |
|---|---|---|
| I | at least one hydrophilic group of H, —COOH, —OH, —NH$_2$, —OCH$_3$ or —NHCOCH$_3$ | not critical |
| II | at least one hydrophobic group of a hydrocarbyl | not critical |
| III | not critical | at least one hydrophilic group of H, —COOH, —OH, —NH$_2$, —OCH$_3$ or —NHCOCH$_3$ |
| IV | not critical | at least one hydrophobic group of a hydrocarbyl |
| V | hydrogen | hydrogen |

The combinations I–V may be concurrently present in a polymer molecule, and $R_a$–$R_c$ and $R_1$–$R_3$ may be a donor or acceptor group.

Examples of Molecule B or Molecule C

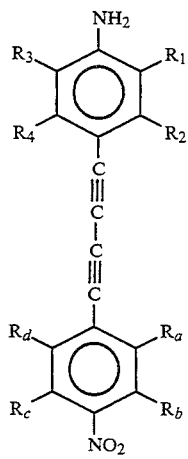
(BC1)

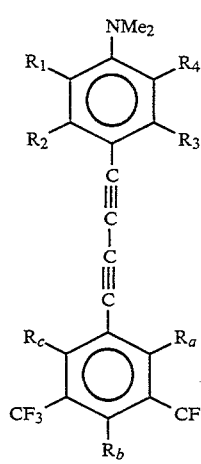
(BC2)

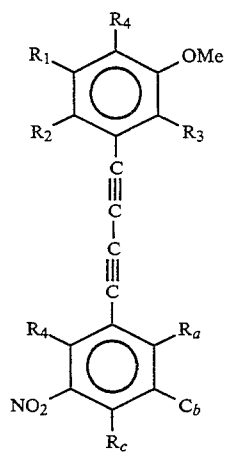
(BC3)

In these molecules, substituent groups $R_a$–$R_d$ as well as $R_1$–$R_4$ can respectively be groups such as those indicated in the following table.

TABLE 9

| Combination | Substituent $R_a$–$R_d$ | Substituent $R_1$–$R_4$ |
|---|---|---|
| I | at least one hydrophilic group of —COOH, —OH, —NH$_2$, —OCH$_3$ or —NHCOCH$_3$ | not critical |
| II | at least one hydrophobic group of a hydrocarbyl | not critical |
| III | not critical | at least one hydrophobic group of |

TABLE 9-continued

| Combination | Substituent $R_a$-$R_d$ | Substituent $R_1$-$R_4$ |
|---|---|---|
| IV | not critical | a hydrocarbyl at least one hydrophilic group of —COOH, —OH, —NH$_2$, —OCH$_3$ or —NHCOCH$_3$ |
| V | not critical | at least one $-(CH_2)_n NH_2$ or $-\bigcirc-NH_2$ (n = 0 or an integer) |
| VI | not critical | at least one $-O-(CH_2)_m CH \underset{O}{\overset{\diagdown\ \diagup}{-}} CH_2$ (m = 0 or an integer) |
| VII | at least one $-(CH_2)_n NH_2$ or $-\bigcirc-NH_2$ (n = 0 or an integer) | not critical |
| VIII | at least one $-O-(CH_2)_m -CH \underset{O}{\overset{\diagdown\ \diagup}{-}} CH_2$ (m = 0 or an integer) | not critical |
| IX | hydrogen | hydrogen |

The combinations I-IX may be concurrently present in a polymer molecule, and $R_a$-$R_d$ and $R_1$-$R_4$ may be a donor or acceptor group.

The molecular orientation within a film can be improved by performing hydrophilic or hydrophobic treatment of the substrate by introducing hydrophilic and/or hydrophobic groups into the molecule as described previously. Furthermore, it is only natural that in the molecules listed above, those molecules from which an epoxy ring is removed can become molecule B.

Figure 14:
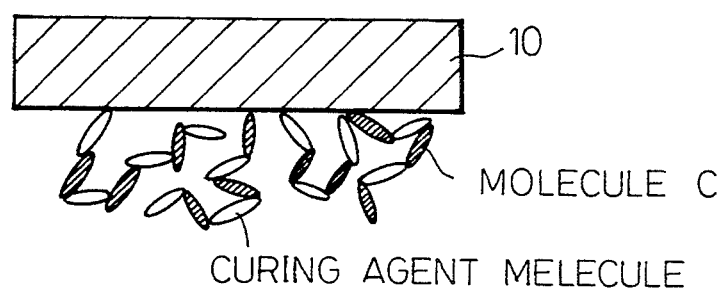
FIG. 14 is a cross-sectional view indicating deposition combining the use of a curing molecule.
Figure 15A:
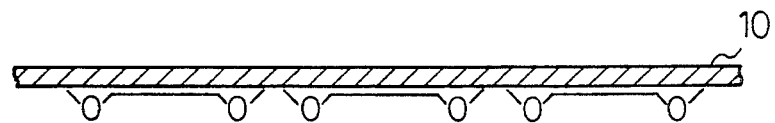
FIGS. 15 (A)–(D) are cross-sectional views indicating the formation of an oriented film.
Figure 15B:
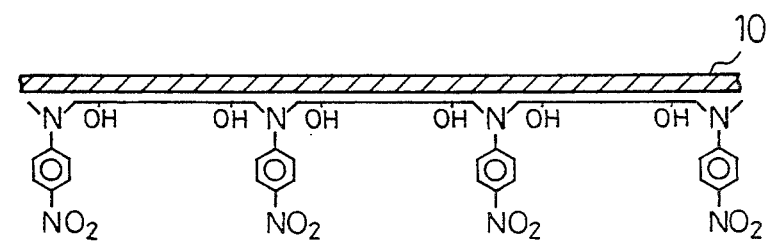
Figure 15C:
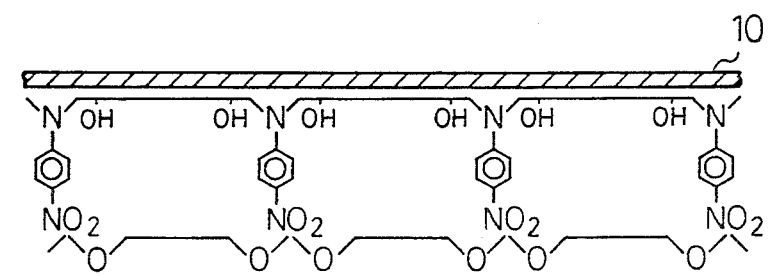
Figure 15D:
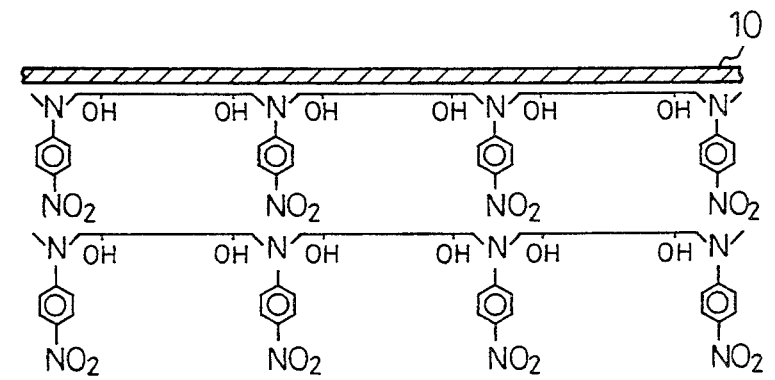

As was also described previously, in the case of the organic functional thin film of the present invention, deposition can be performed introducing a molecule which can function as a hardening agent in a vacuum. In other words, by simultaneously or alternately projecting a molecule that can function as a hardening agent (curing molecule) and a non-linear optical molecule having an epoxy ring (molecule C) as schematically indicated in FIG. 14, a polymer film is obtained. Examples of curing molecules are indicated below.

(I) Amines
  Metaxylilenediamine
  Polyetherdiamine
  Polymethylenediamine
  Diethylenetriamine
  Triethylenetetramine
  Menthenediamine
  Metaphenylenediamine
  Diaminodiphenylmethane
  Diaminodiphenylsulfone (II) Acid Anhydride + Promoter
  Acid Anhydrides:
    Phthalic anhydride
    Trimellitic anhydride
    Maleic anhydride
    Succinic anhydride
    Polycarboxylic acid anhydride
    Hydrohalogenic acid anhydride
  Promoters:
    Lewis acids
    Organometallic compounds (III) Polyamide Resins
(IV) Imidazoles According to the present invention, an oriented film can be formed while controlling the orientation state using molecules like those previously described. The following provides an explanation of this oriented film referring to FIGS. 15-18.

FIG. 15 is an example of deposition using molecule A and molecule B utilizing an electric field assist and the natural orientation characteristics of the molecules. Firstly, as is indicated in FIG. 15 (A), molecule A is deposited onto substrate 10 to serve as the base. Next, as is indicated in FIG. 15 (B), molecule B is projected and deposited onto substrate 10 followed by commencement of polymerization. Continuing, as is indicated in FIG. 15 (C), deposition of molecule A and deposition of molecule B as indicated in FIG. 15 (D) is repeated. As molecule A was deposited as the base during initial formation of the oriented film, orientation characteristics can be improved.

Figures 16A, 16B, 16C:
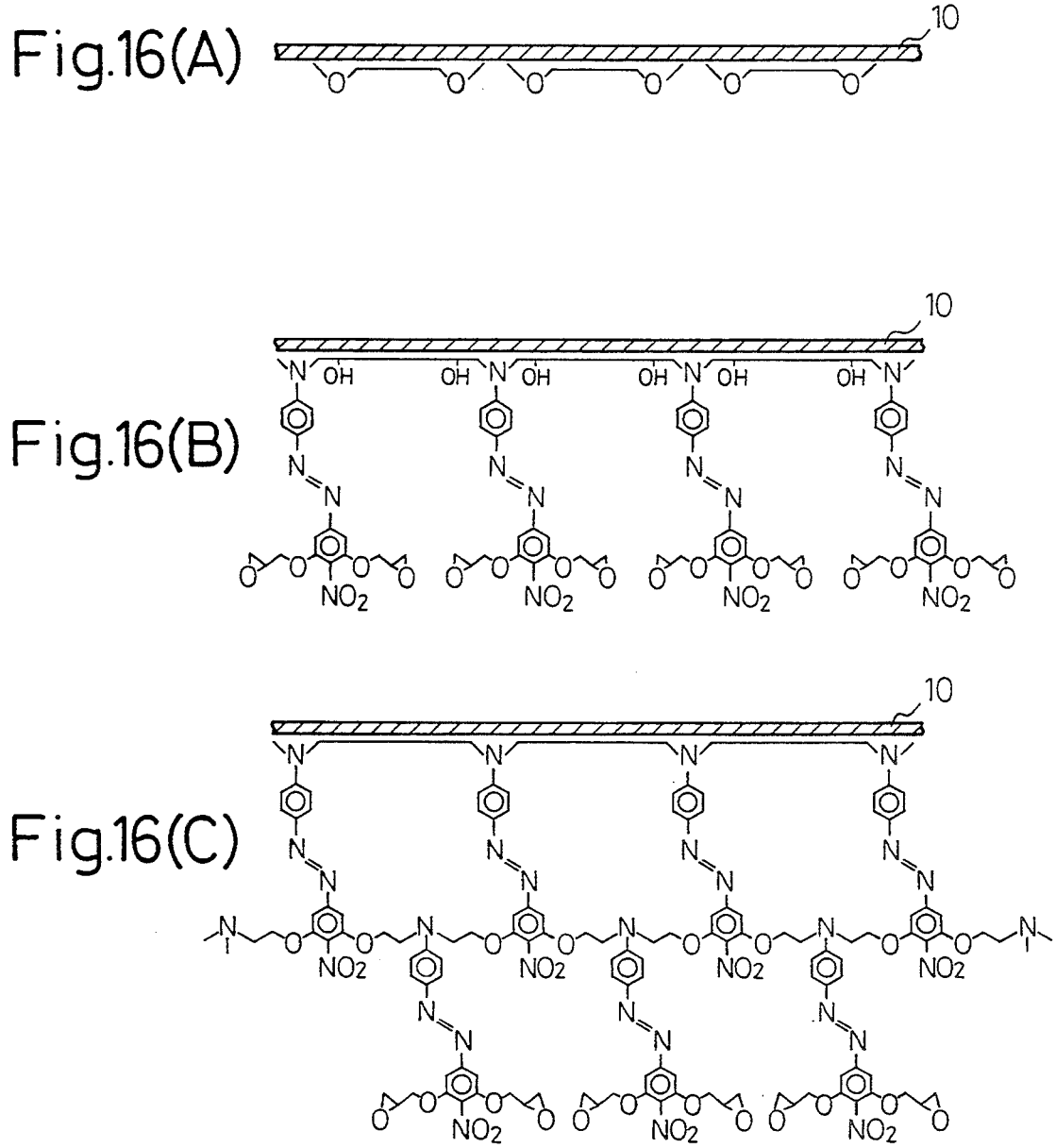
FIGS. 16 (A)–(C) are cross-sectional views indicating the formation of an oriented film.
Figure 17A:
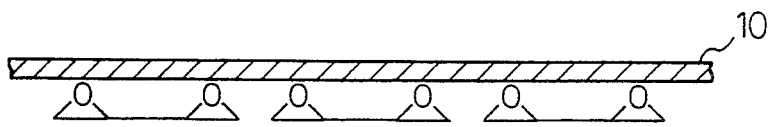
FIGS. 17 (A)–(D) are cross-sectional views indicating the formation of an oriented film.
Figure 17B:
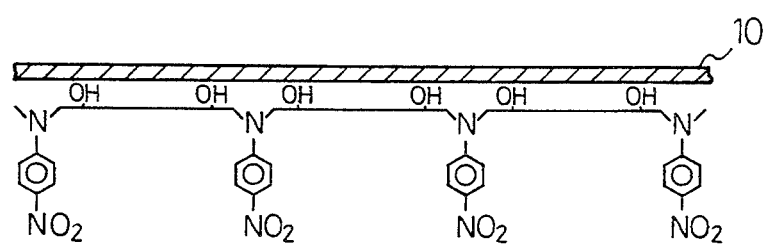
Figure 17C:
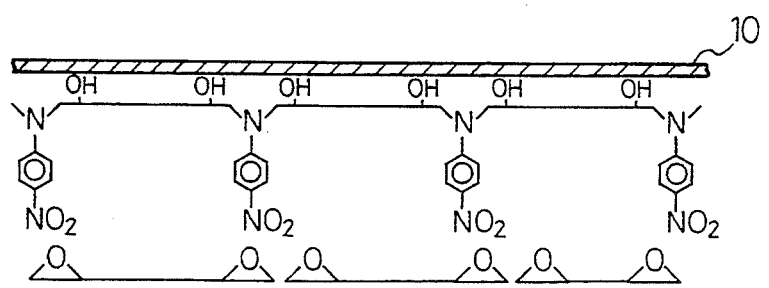
Figure 17D:
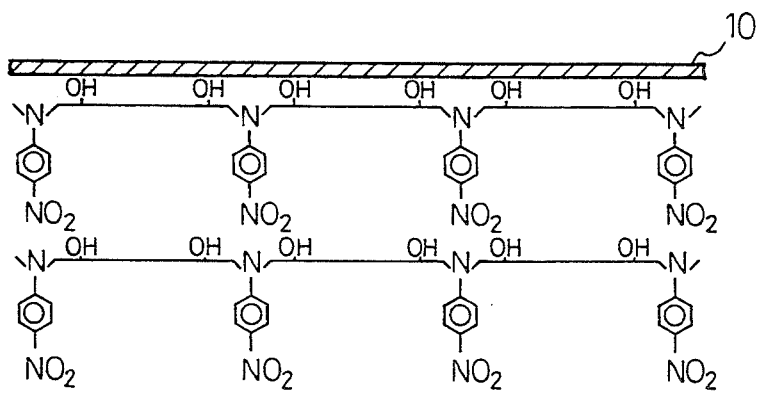

FIG. 16 is an example of deposition using molecule A and molecule C. Firstly, as is indicated in FIG. 16 (A), molecule A is deposited onto substrate 10 to serve as the base (this may also be molecule C). Next, as is indicated in FIG. 16 (B), molecule C is projected and deposited onto substrate 10 followed by commencement of polymerization. Continuing, molecule C is deposited as indicated in FIG. 16 (C). Improvement of orientation characteristics can also be improved by performing deposition in this form.

Figure 18A:
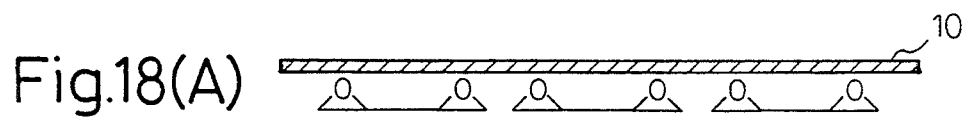
FIGS. 18 (A)–(C) are cross-sectional views indicating the formation of an oriented film.
Figure 18B:
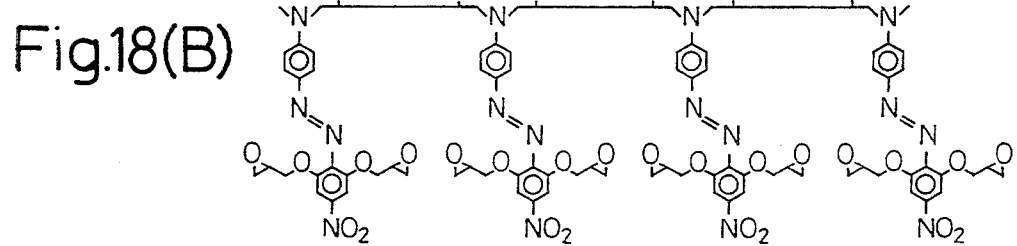
Figure 18C:
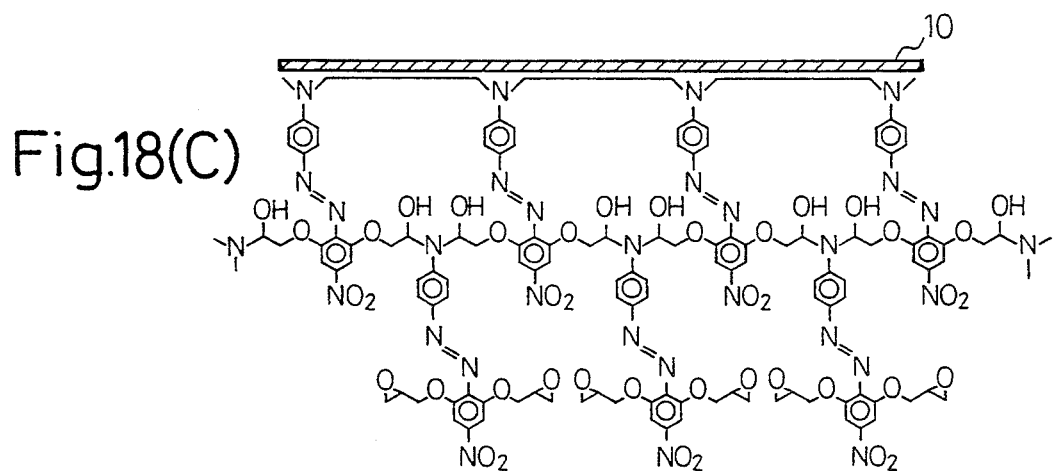
Figure 20A:
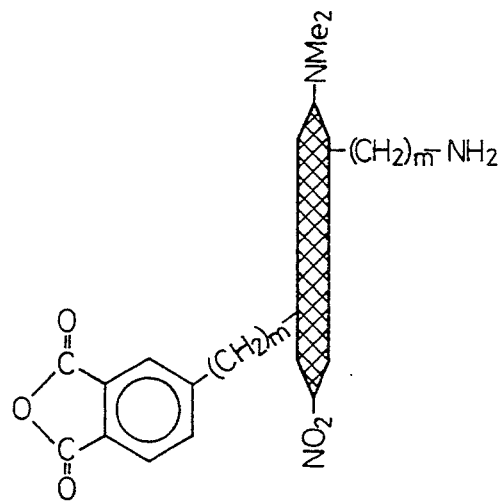
FIGS. 20 (A)–(D) are schematic diagrams of molecule C.
Figure 20C:
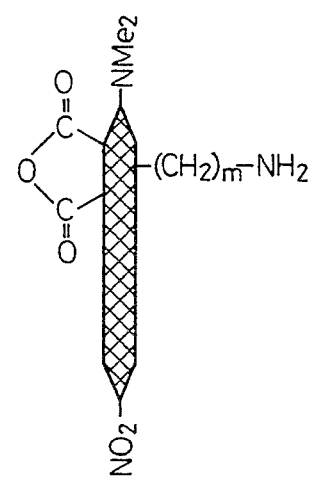
Figure 20B:
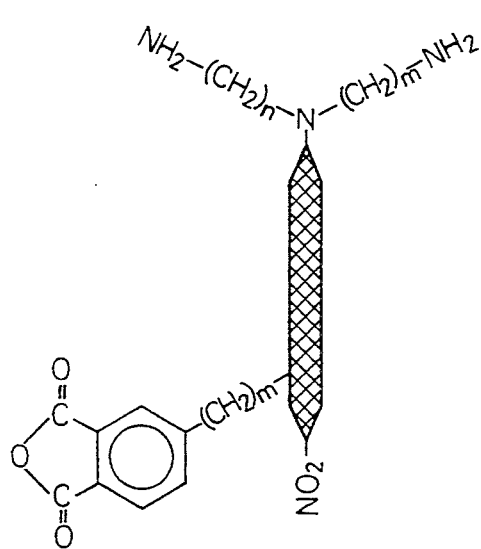
Figure 20D:
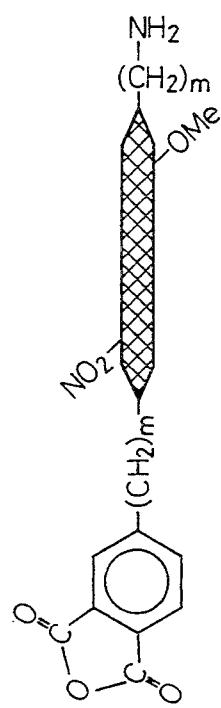

The examples of deposition of FIG. 17 and FIG. 18 correspond to the deposition examples of FIG. 15 and FIG. 16, respectively, differing by a change in the orientation of the molecules. The effects that are obtained are the same.

In the above-mentioned examples, although an oriented film can be obtained even without applying an electric field, a film having a higher degree of orientation can be obtained by electric field assist. In addition, the addition of hydrophilic and hydrophobic groups to molecules A, B and C gives directivity to the orientation of the molecules thus improving orientation characteristics.

According to the present invention as described above, a functional thin film can be realized having a low level of relaxation degradation, ample film thickness controllability and uniformity, minimum contamination by residual solvent and impurity molecules, and favorable orientation characteristics.

Moreover, as was also described previously, the present invention also relates to an organic functional thin film formed either by bonding a dianhydride of a tetravalent carboxylic acid (C=6 or more) or a halide of a divalent carboxylic acid (C=4 or more), with a molecule having at least two amino groups and/or alkylamino groups and a donor and/or acceptor group, or by mutually bonding a molecule containing a dianhydride of a tetravalent carboxylic acid or a halide of a divalent carboxylic acid as its compositional unit, and also having at least two amino groups and/or alkylamino groups as well as a donor group and/or acceptor group. The following provides an explanation of this material.

A deposition system like that previously indicated in FIGS. 3–6 can be used in the case of this type of organic non-linear optical material as well. In other words, a dianhydride of a tetravalent carboxylic acid having six or more carbon atoms, or an acid halide of a carboxylic acid having four or more carbon atoms (molecule A), and a molecule having at least two groups selected from among an amino group and an alkylamino group having 1–10 carbon atoms, as well as a donor group and/or acceptor group (such as —NO₂, —CN and —CF₃)

(molecule B) are evaporated from separate cells. The two types of molecules that are projected onto the substrate are then bonded and polymerized by heating of the substrate and irradiation with UV light. A film in which the molecules are oriented in the as-deposited state is then obtained by forming a film while applying a voltage between electrodes formed on the substrate. Similarly, by forming a film while applying a voltage between an electrode formed on the substrate and an opposing electrode (grid), a film is obtained in which the molecules are oriented in the direction of film thickness in the as-deposited state. In this case, a distance on the order of 2 microns to 10 centimeters is desirable for the distance between the electrode and the opposing electrode. When the distance between electrodes is particularly wide, it is desirable to efficiently apply voltage to the film by high-frequency generation of plasma by introduction of a gas such as Ar. Furthermore, as other similar preferred modes have been explained previously, their explanation will not be repeated here.

The following table indicates the formation of a polyimide film by the polymerization reaction of 4,4'-diaminophenyl ether (molecule B) [DDE] and pyromellitic dianhydride (molecule A) [PMDA], which is known based on the aforementioned publications by Takahashi et al. and Iijima et al.

TABLE 10

| Molecule B | Molecule A |
|---|---|
| $NH_2-\langle\bigcirc\rangle-O-\langle\bigcirc\rangle-NH_2$ | [pyromellitic dianhydride structure] |

| Polyamide Acid |
|---|
| [polyamide acid structure] |

| Polyimide |
|---|
| [polyimide structure] |

In addition, it is also known based on the same publications that a polyimide film can be formed using —C— in place of the bonding group of DDE (—O—) for molecule B (see following table).

TABLE 11

| Molecule B | Molecule A |
|---|---|

TABLE 11-continued

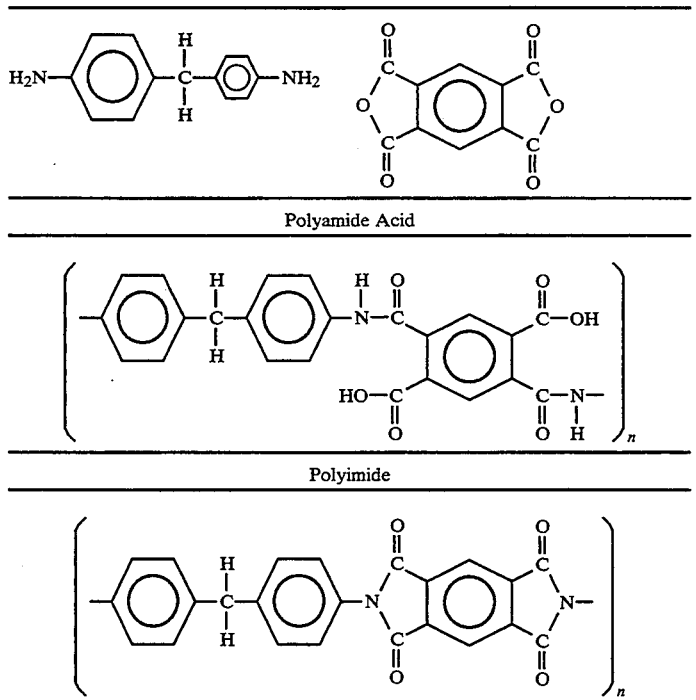

Polyamide Acid

Polyimide

Molecule A used in the present invention includes various molecules including the above-mentioned pyromellitic dianhydride (PMDA) (a dianhydride of a carboxylic acid having six or more carbon atoms, or a halide of a carboxylic acid having four or more carbon atoms).

R represents

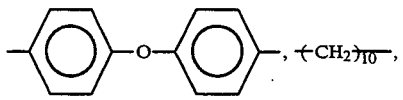

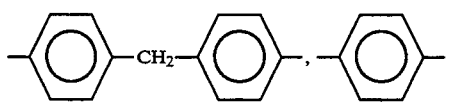

or the like.

Molecule B includes various molecules including 2,4-diaminonitrobenzene (DNB) previously indicated as molecule B4.

In addition, conceptual indications of these molecules are as shown in FIG. 19 (the molecular backbone is the same as in FIG. 7). Furthermore, a portion of molecule B indicated in this diagram is that which was already indicated in a previous explanation. The following lists some specific examples of molecule B.

Examples of Molecule B

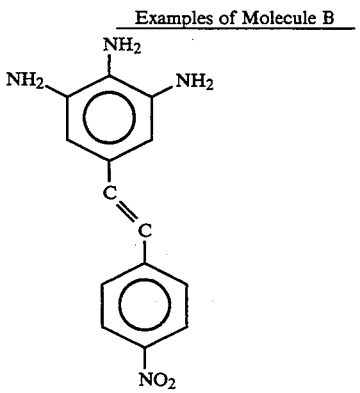
(B26)

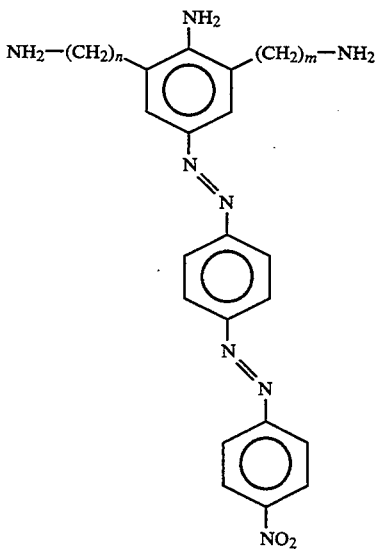
(B27)

-continued

Examples of Molecule B

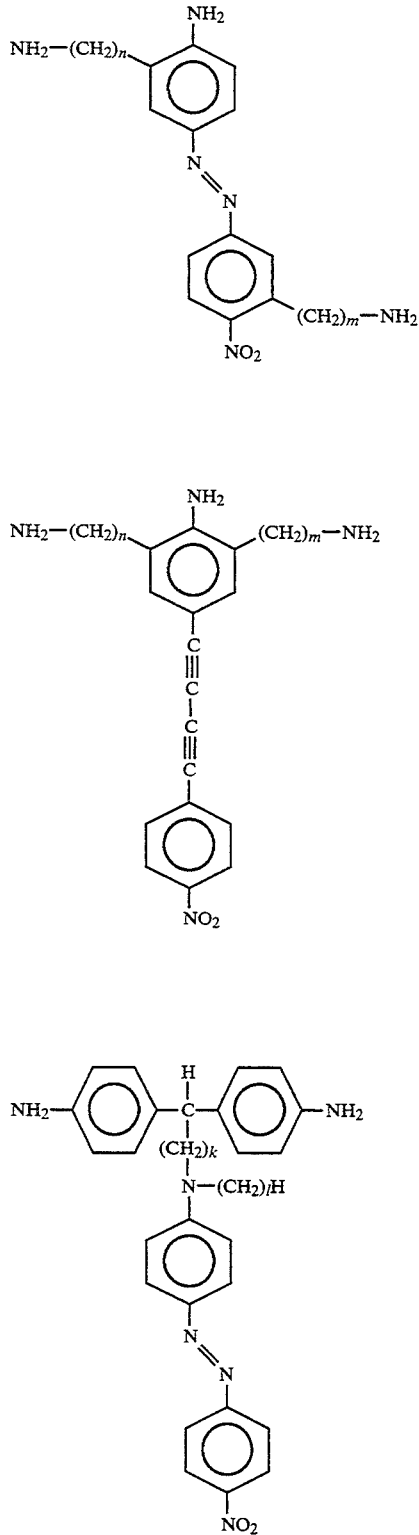

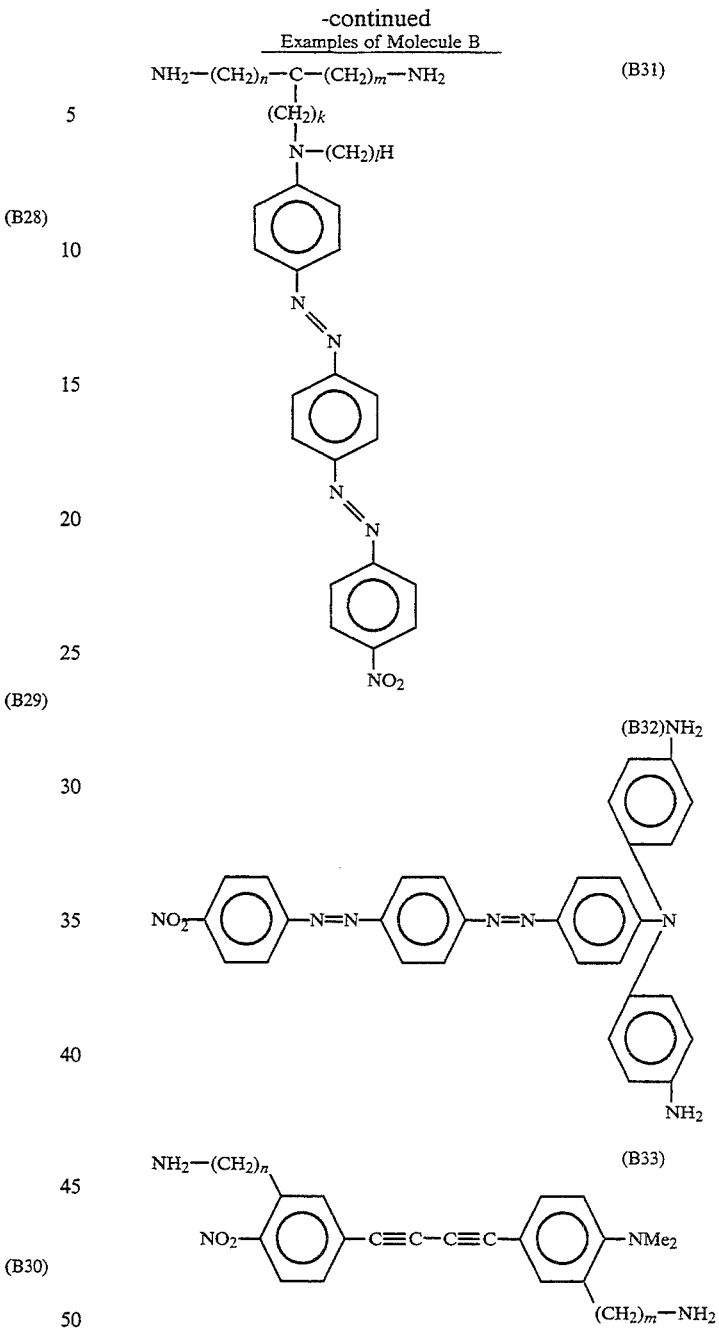

Other examples of molecule B include the above-mentioned molecules B1–B7 as well as molecules B7–B14. In these molecules, three amino groups are added to molecules B26–B28, and a portion is used in a polymerization reaction. The other amino groups acts as donor groups. In this example, $NO_2$ is used as an acceptor group. In the case of molecules B27–B29 in particular, two of the —$NH_2$ groups are added through —$(CH_2)_m$— single bonding, and are separated from a conjugated system. These —$NH_2$ groups are projecting from the molecule. Since they also have considerable flexibility, they easily participate in the polymerization reaction. In contrast, the —$NH_2$ group directly linked to the conjugated system has difficulty participating in the polymerization reaction due to steric hindrance. As such, it frequently has the role of a donor. Molecules B30 and B31 are examples of the addition of a non-linear optical molecule to a molecule having two amino groups. In addition, it is possible to secure a donor that does not participate in a reaction by adding a donor group other than —NH₂ such as —N(CH₃)₂ in the manner of molecules B32 and B33.

Molecule C can also be used here either alone or in addition to the above-mentioned molecule A and molecule B as is indicated in FIG. 20 (molecular framework the same as that in FIG. 7). As is indicated in this diagram, molecule C contains a dianhydride of a tetravalent carboxylic acid having 6 or more carbon atoms or an acid halide of a divalent carboxylic acid having 4 or more carbon atoms as its compositional unit, and also having at least two groups selected from among an amino group or an alkylamino group having 1–10 carbon atoms, as well as an acceptor group. Thus, in addition to a plurality of types of molecules being able to be polymerized, polymerization is also possible with only one type of molecule.

The following lists some specific examples of molecule C.

Examples of Molecule C

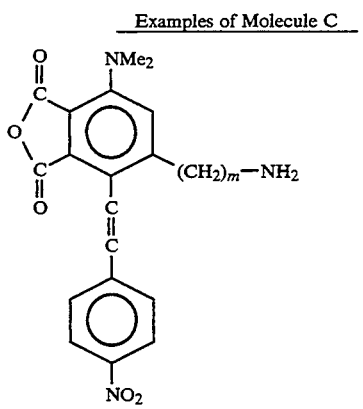
(C22)

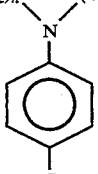

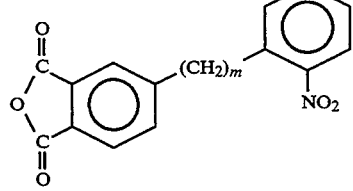
(C23)

-continued
Examples of Molecule C

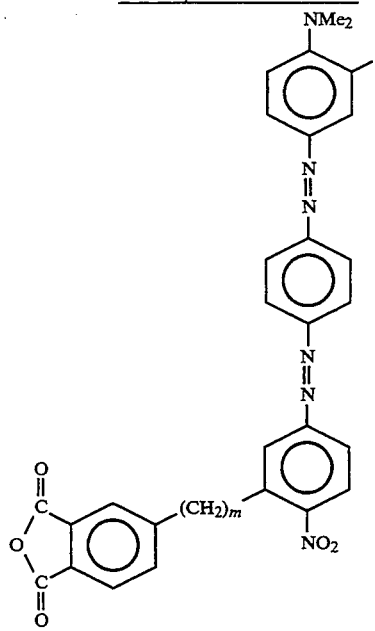
(C24)

According to the present invention, when a film is formed by, for example, setting the substrate temperature to 150° C.–250° C. while performing the above-mentioned electric field assist using molecules such as those described above, a polymer film is obtained in which the molecules are oriented directly. If film formation is formed while further lowering the substrate temperature, a polymer film is obtained consisting of the precursor a polyimide. A polyimide is then obtained by heating and curing. When film formation is performed by cooling the substrate temperature to a temperature at or below room temperature, a highly oriented polymer is obtained. If film formation is performed applying a voltage between pattern electrodes or between an electrode formed on the substrate and an opposing electrode, a partially oriented polymer is obtained.

Moreover, the orientation of molecules contained in a film can be improved by hydrophilic or hydrophobic treatment of the substrate due to the addition of hydrophilic or hydrophobic groups to said molecules.

The following lists examples in which the oriented film is controlled during film formation.

Example A:
(1) Molecule A is deposited onto a substrate as a base.
(2) A polymerization reaction occurs when molecule B is projected onto the substrate.
(3) Molecule A is deposited.
(4) Molecule B is deposited.

Example B:
(1) Molecule C is deposited onto a substrate.
(2) Molecule C is deposited.
(3) Molecule C is continued to be deposited.

In the process like that described above wherein the deposition sequence of the molecules is controlled, it is possible to obtain an oriented film even without applying an electric field. However, the use of electric field assist allows the obtaining of a film having higher orientation characteristics. In addition, the addition of hydrophilic groups and hydrophobic groups to molecules A, B and C gives directivity to the orientation of the molecules thereby improving orientation characteristics.

Figure 21A:
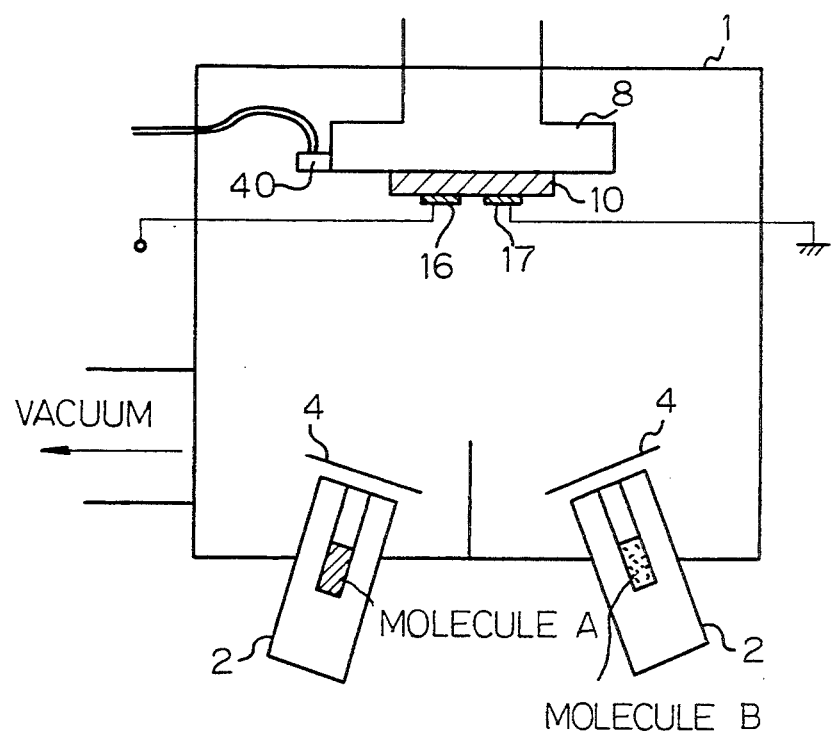
FIGS. 21 (A) and (B) are cross-sectional views indicating the composition of a deposition system.
Figure 21B:
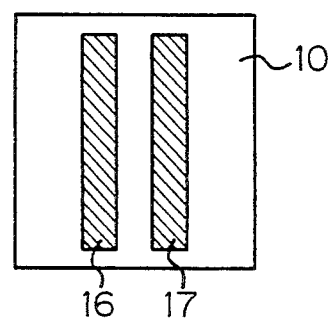

FIG. 21 is a schematic diagram indicating one embodiment of electric field assist deposition. The deposition system shown in the diagram has two K cells 2 for molecule evaporation (one for molecule A and one for molecule B), as well as pattern electrodes 16 and 17 formed directly on substrate 10 on substrate holder 8. As can be understood from the top view of FIG. 21 (B), pattern electrodes 16 and 17 are of the slit type, with the gap between electrodes being 10 μm. Quartz is used for the substrate with a pair of nichrome electrodes formed on top of said substrate (the gap is 10 μm as indicated above). In this system, molecule A (PMDA; pyromellitic dianhydride) and molecule B (DNB; 2,4-diaminonitrobenzene) are evaporated and supplied to the substrate while applying an electric field of 0.78 MV/cm. Pressure is reduced to $5 \times 10^{-8}$ Torr prior to deposition.

The substrate temperature ($T_s$), gas (molecule gas) pressure during deposition, deposition rate and appearance of the formed film are as follows:

| $T_s$ (°C.) | Gas Pressure (Torr) | Deposition Rate (Å/min) | Film Appearance |
|---|---|---|---|
| 25 | $6 \times 10^{-6}$ | 25 | Frosted |
| 65 | $3 \times 10^{-5}$ | 12 | Clear |
| 110 | $3 \times 10^{-5}$ | 5 | Clear |

As is evident from the above data, although a clear film is obtained at a temperature of 65° C. or greater, the film becomes frosted due to scattering of light at a substrate temperature of 25° C.

Figure 22:
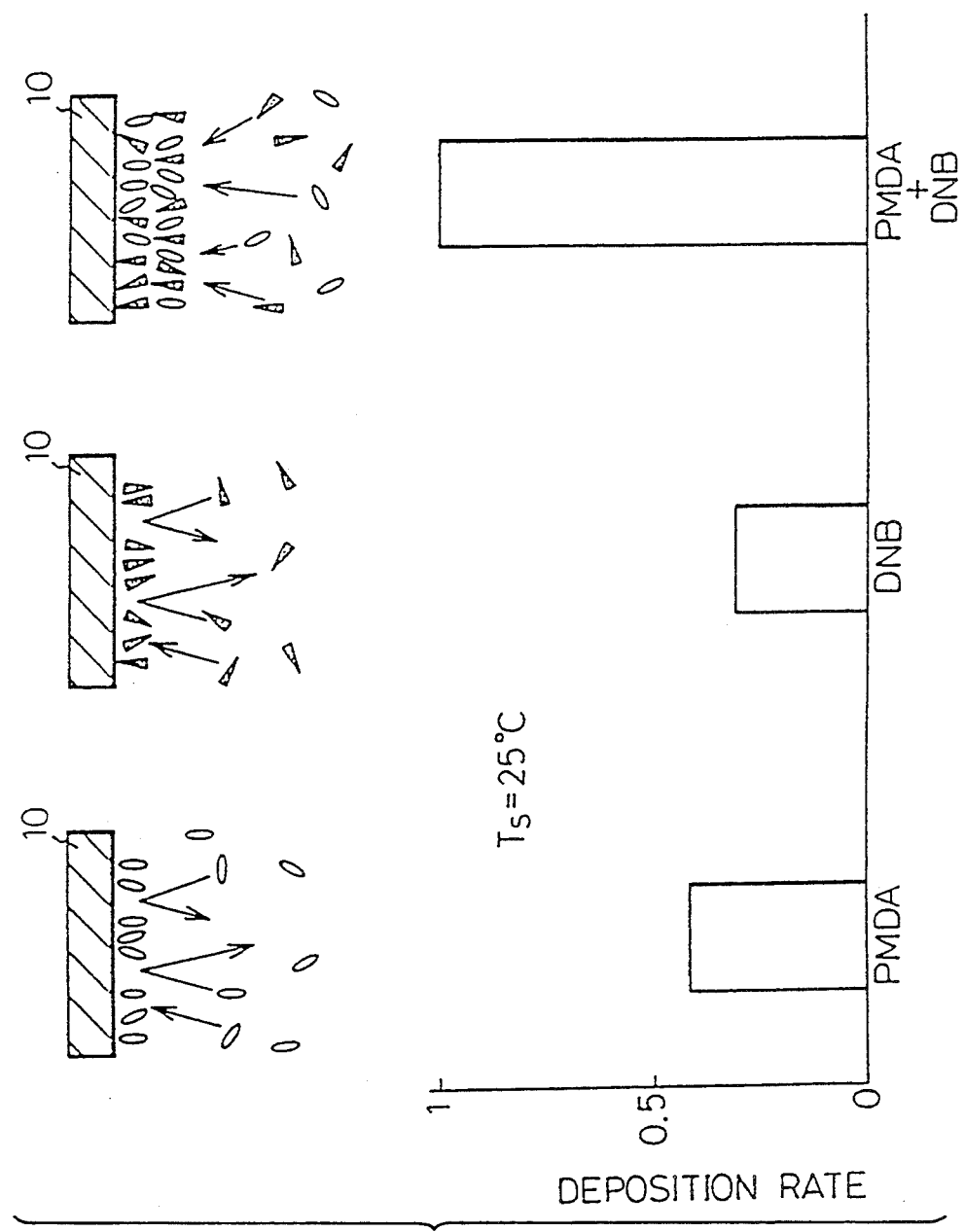
FIG. 22 is a schematic diagram indicating the temperature dependency of deposition rate.
Figure 23:
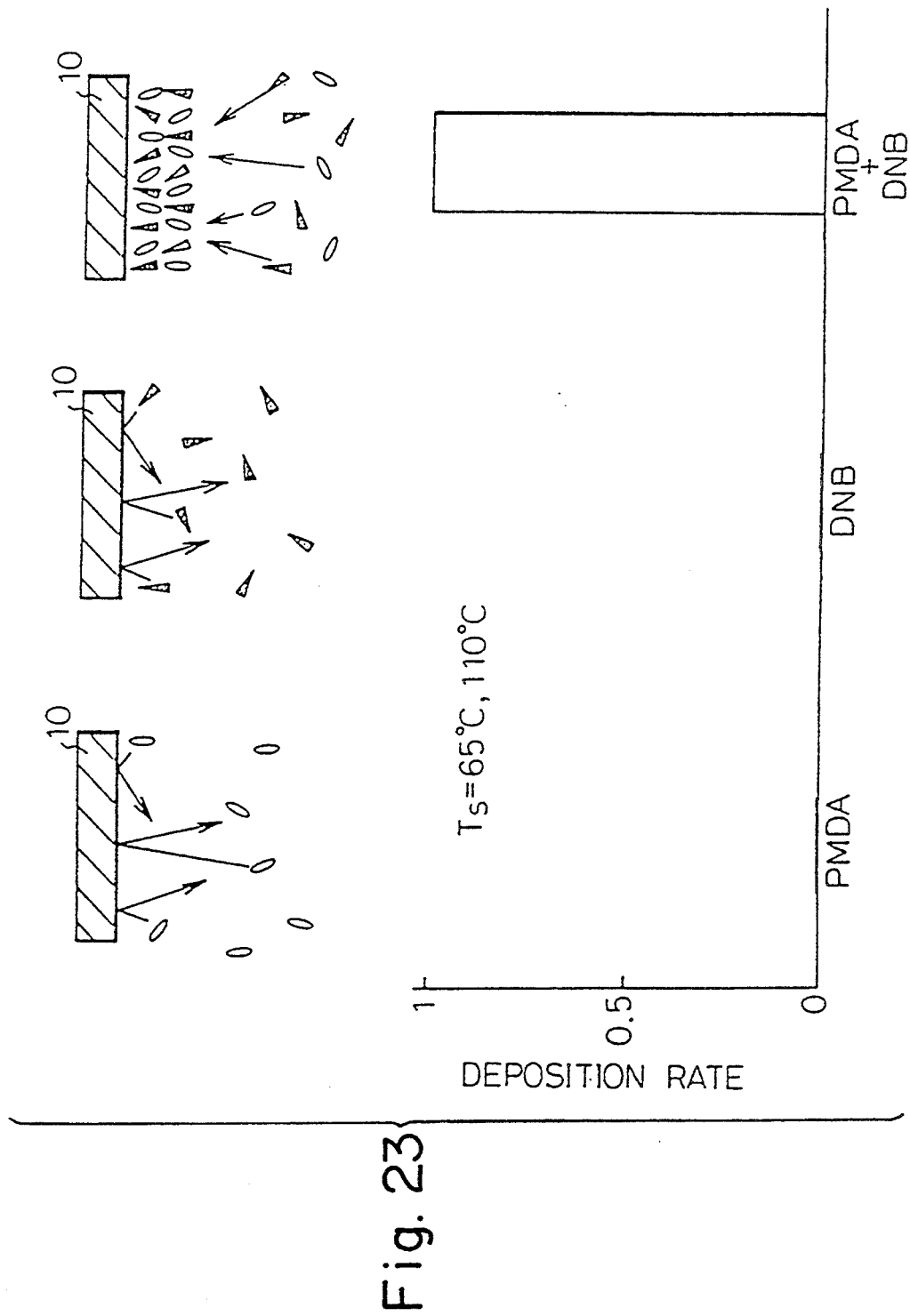
FIG. 23 is a schematic diagram indicating the temperature dependency of deposition rate.

As is indicated in FIGS. 22 and 23, film growth is remarkable even in the case of molecule A (PMDA) or molecule B (DNB) alone at $T_s=25°$ C. On the other hand, film growth in the case of independent molecules is hardly observed at all at $T_s=65°$ C. or 110° C. Remarkable film growth occurs only when molecule A and molecule B are present simultaneously. This indicates that at $T_s \geq 65°$ C., a stoichiometric favorable film is obtained due to surplus molecules not incorporated into the polymer chain being re-evaporated.

Figure 24:
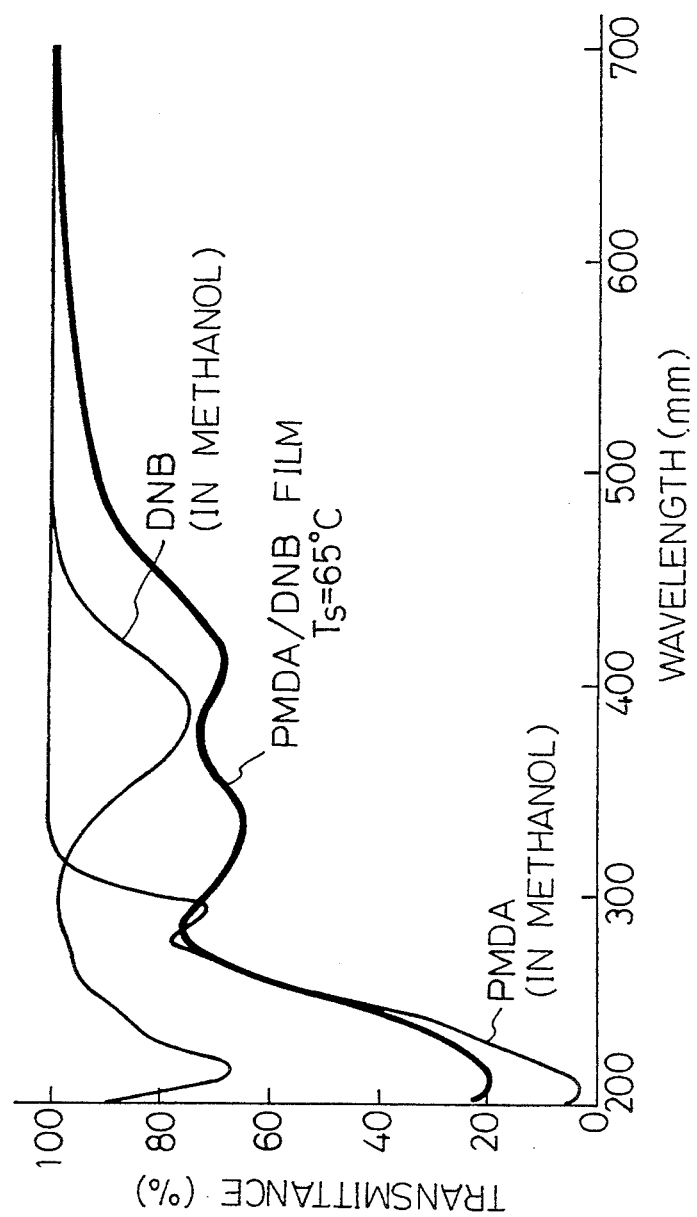
FIG. 24 is a graph indicating the optical transmission spectrum of a PMDA/DNB polymer film.

FIG. 24 indicates the optical transmission spectrum of a PMDA/DNB polymer film. It can be seen that DNB is incorporated into the polymer by comparison with the spectrum of methanol solutions of PMDA and DNB.

Figure 25:
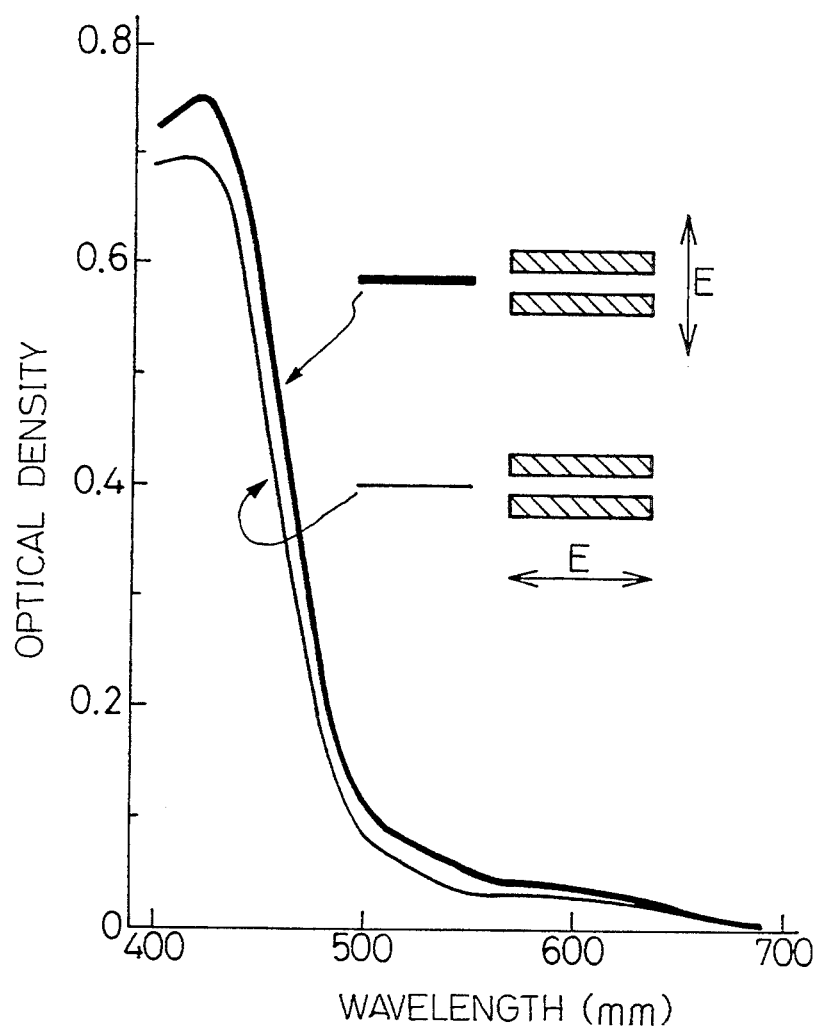
FIG. 25 is a graph indicating the optical absorption spectrum of a PMDA/DNB polymer film.

FIG. 25 indicates the optical absorption spectrum of a PMDA/DNB polymer film (film between slits) fabricated using electric field assist. It can be seen from the diagram that absorption with respect to polarized light in the direction of the field is greater than absorption with respect to polarized light perpendicular to the electric field. Thus, it was able to be confirmed that DNB is oriented according to the electric field during deposition.

Thus, according to the present invention as described above, a functional thin film can be realized having a low level of relaxation degradation, ample environmental resistance, film thickness controllability and uniformity, minimum contamination by residual solvent and impurity molecules, and favorable orientation characteristics.

The organic functional thin film and its manufacturing process of the present invention can be adequately understood by the above-mentioned detailed explanation. In addition, as the present invention includes various related preferable modes, the following provides an explanation of those modes.

According to the first mode of the present invention, a fabrication process for an organic film is provided wherein during fabrication of an organic non-linear optical device composed of an organic film having a plurality of layers, the second layer and beyond is formed without breaking the vacuum being applied.

In this fabrication process, if each layer of said organic film is to be formed with a different pattern, replacement of the patterning mask is performed in the vacuum during forming of each layer. In addition, in the case polling processing is required to be performed for the film, such is performed by placing a conductive mask in the form of a mesh containing holes having an aperture of approximately 5 μm–1 mm on the front of the substrate at a gap of approximately 5 μm–1 mm, or by applying a voltage of 1 kV or more between the substrate and the conductive mask. In addition, in the case the device to be fabricated consists of a non-linear optical film and a buffer layer, the non-linear optical film is composed of various types of organic non-linear optical materials like those described above, and the buffer layer is composed of a polymer of low polarization molecules containing epoxy monomers and amino groups, a polymer of low polarization molecules containing low polarization epoxy monomers and amino groups, a polymer consisting of epoxy monomers and curing molecules, polystyrene, polymethylmethacrylate (PMMA), or a low polarization polymer resulting from a chemical reaction between an epoxy monomer having a long chain and a curing molecule. Moreover, in the case of deposition of each of the layers of the organic film, it is recommended that each layer be deposited in separate chambers.

As is widely known, organic non-linear optical devices are normally composed of a plurality of layers such as an organic non-linear optical film, a buffer layer and an electrode layer. In the case of fabricating a device of such composition using routine spin coating, deposition must be performed while performing various forms of processing including drying and baking of each layer. In addition, there are cases in which polling processing is impaired due to moisture absorption and residual solvent. Although conditions can be improved considerably by forming each of the layers of the device in a vacuum chamber, as long as this is performed by forming the film after breaking the vacuum for each layer, it is impossible to completely solve the above-mentioned problems.

In order to completely solve the above-mentioned problems, the present invention provides the following fabrication process for an organic film. In other words, the present invention realizes a device having excellent characteristics by reducing the effects of moisture absorption and sufficiently performing polling processing by obtaining a clean interface as a result of continuously forming each of the layers without breaking the vacuum.

The following provides an explanation of the fabrication process for an organic film of the present invention with reference to the diagrams.

Figure 26:
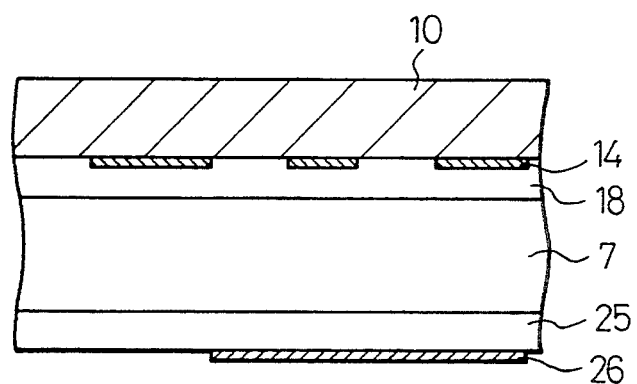
FIG. 26 is a cross-sectional view indicating device composition.

FIG. 26 is a cross-sectional view which schematically indicates one example of the composition of an organic non-linear optical device. The device consists of pattern electrode 14 on substrate 10, with buffer layer 18, non-linear optical film 7, buffer layer 25 and electrode 26 sequentially deposited on top of said substrate 10. Nonlinear optical film 7 along with buffer layer 18 and buffer layer 25 can be composed of, for example, the following materials:

Non-Linear Optical Film Materials
(1) Film comprised of an epoxy monomer and a non-linear optical molecule;
(2) Film comprised of a molecule wherein an epoxy ring is added to a non-linear optical molecule;
(3) Film comprised of an MMA/diacetylene copolymer;
(4) Polymer film resulting from a chemical reaction between reaction groups; and,
(5) A polymer comprised of a molecule containing two or more carbonyloxycarbonyl groups and a molecule containing two or more amino groups, which also contains a donor or acceptor.

Buffer Layer Materials
(1) Film consisting of a low polarization molecule resulting from an epoxy monomer and a non-linear optical molecule;
(2) Film consisting of a low polarization epoxy monomer resulting from an epoxy monomer used in a non-linear optical film, and a low polarization molecule resulting from a non-linear optical molecule;
(3) Film consisting of an epoxy monomer and a curing molecule;
(4) Film consisting of polystyrene or PMMA;
(5) Film consisting of an epoxy monomer having a lengthened chain length, for example:

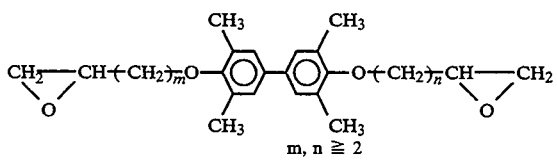

m, n ≧ 2

(6) Polymer film resulting from a chemical reaction between reaction groups (having a lower degree of polarization than (4)); and,
(7) Polymer consisting of a molecule containing two or more carbonyloxycarbonyl groups, and a molecule containing two or more amino groups.

This type of organic non-linear optical device can be advantageously manufactured using, for example, a vacuum deposition system previously explained in reference to FIGS. 3–6. In other words, in the case of the deposition system of FIG. 3, a thin film corresponding to each of the respective molecules can be formed on substrate 10 by introducing various molecules from K cell 2, evaporation crucible 3 and gas inlet 13 into vacuum chamber 11.

In addition, if various films are consecutively deposited with the device like the indicated in FIG. 3, there is the risk of film contamination. In such cases, the use of a system is recommended in which each of the chambers are separated and installed in parallel in the manner of the isolated chamber type deposition system indicated in FIG. 28. In the example shown in this diagram, the vacuum chambers consist of chambers 31, 41 and 51, with K cell 32 and gas inlet 33, K cell 42 and gas inlet 43, and evaporation crucible 53 arranged in each of the chambers. 35, 45 and 55 in the diagram represent masks or grids, respectively. Substrate 10 can be held in position by substrate holders 38, 48 and 58.

Figure 5:
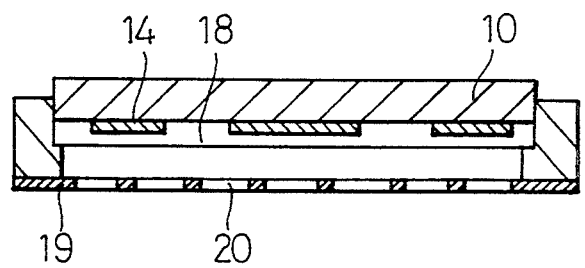
FIG. 5 is a cross-section view indicating an alteration in the vicinity of the grid.
Figure 27:
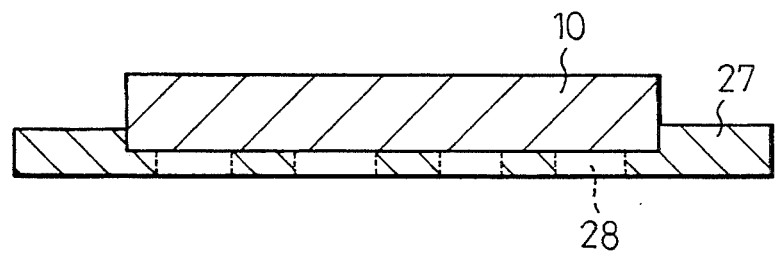
FIG. 27 is a cross-sectional view indicating mask composition.

Moreover, if the patterns of each layer are different, mask 27 containing holes 28 is placed on the substrate as is schematically shown in FIG. 27. In addition, if polling processing is required, deposition is performed while either applying a voltage between the pattern electrodes, or by applying a voltage between the substrate electrode and the grid. In this case, the grid is, for example, an electrode 19 in the form of a mesh containing holes 20 having an aperture of approximately 5 $\mu$m–1 mm, and placed at a gap of approximately 5 $\mu$m–1 mm from substrate 10 as is indicated in FIG. 5. A voltage of 1 kV or more is applied between this grid 19 and substrate electrode 14. As a result, molecules accumulate in oriented fashion on substrate 10.

Since polling can be sufficiently applied according to such a fabrication process for an organic film, a highly oriented non-linear optical film can be formed, and moreover, a favorable non-linear optical device can be realized having a low level of absorbed impurities and a clean interface.

According to the second mode, in the manufacturing of an organic non-linear optical material utilizing a reaction between adjacent molecules by adding a group possessing reactivity to an organic molecule, a manufacturing process is provided which uses a molecule containing at least one each of a donor group and acceptor group, and containing at least one group selected from among $H_2N$— and HO— and at least one group selected from among HOOC—, ClOC—, OHC— and OCN—, for the starting molecule.

In addition, in the manufacturing of an organic non-linear optical material utilizing a reaction between a plurality of types of molecules by adding a group possessing reactivity to an organic molecule, a manufacturing process is provided which uses at least one type of molecule containing at least one each of a donor group and acceptor group, as well as containing two or more groups selected from among $H_2N$—, HO—, HOOC—, ClOC—, OHC— and OCN—, and at least one type of molecule containing two or more groups selected from among $H_2N$—, HO—, HOOC—, ClOC—, OHC— and OCN—, as the starting molecules.

In these manufacturing processes, groups such as $H_2N$—, HO—, HOOC—, ClOC— and OHC— may be bonded directly to the molecule or alternatively, may be bonded through a buffer such as —$(CH_2)_m$— (where m is 0 or an integer). In addition, the framework of the molecules used may be similar to those of materials described thus far, such as diacetylene, stilbene or azo compounds. Moreover, hydrophilic and/or hydrophobic groups may be added to these molecules similar to that mentioned previously. Additional advantages in the carrying out of these manufacturing processes are as follows:

(1) The molecules listed are introduced in a vacuum and deposited on a substrate by a chemical reaction of like groups between molecules.
(2) The substrate temperature for (1) above is a temperature at which single molecules re-evaporate, but products in which intermolecular bonds have formed are deposited on the substrate.
(3) In the case of utilizing reactions between a plurality of types of molecules, each of the types of molecules are projected onto the substrate one type at a time.
(4) Light is irradiated onto the substrate or into the vacuum chamber during deposition.
(5) Deposition is performed while applying a voltage between pattern electrodes, or between a substrate electrode and a grid.

It was previously stated that known examples of organic non-linear optical materials used in the past include (1) molecular crystals, (2) pendant-attached polymers, and (3) conjugate polymers. Although material (1) has an electro-optical coefficient approximately 10 times greater than that of $LiNbO_3$, it has problems including difficulty in attaining a large surface area and poor processability. In addition, in contract to polymer materials containing material (2) being easy to form into a large surface area and having good processability, due to the inadequate orientation and density of the molecules, it has problems in terms of performance, having an electro-optical coefficient roughly only two times greater than that of $LiNbO_3$.

The object of the present invention is to solve these problems of the prior art. In other words, the orientation characteristics and density of non-linear optical molecules are improved by a polymerization reaction utilizing a chemical reaction between molecules. Thus, a polymer material is realized having superior non-linear optical characteristics.

In the practice of the present invention, basically various polymerization reactions like that indicated below are used. In other words, by reacting groups such as $H_2N-$ and $HO-$ with groups such as $HOOC-$, $ClOC-$, $OCN-$ and $OHC-$, these groups are added to a non-linear optical molecule resulting in the manufacturing of a non-linear optical polymer.

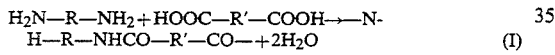 (I)

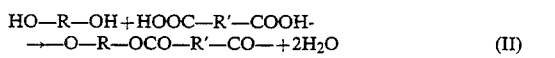 (II)

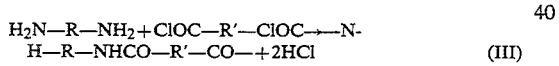 (III)

 (IV)

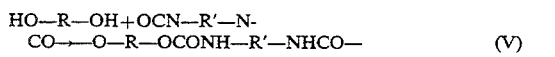 (V)

In addition, examples of molecules which can be advantageously used in the process of the present invention are listed below.

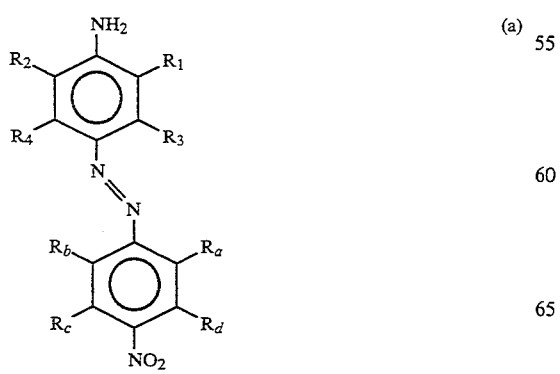 (a)

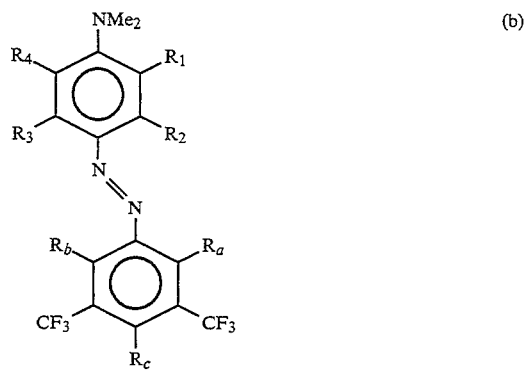 (b)

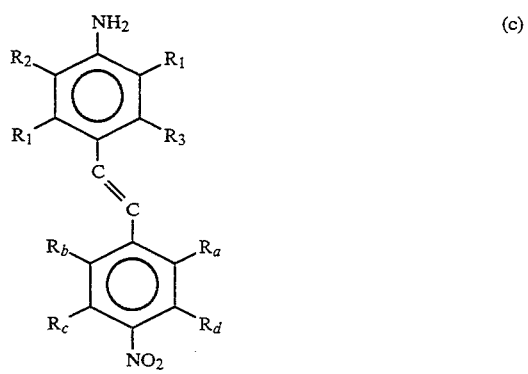 (c)

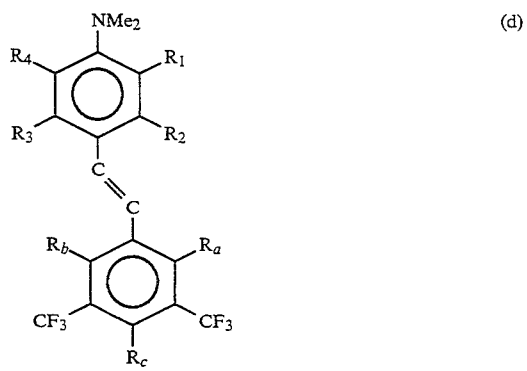 (d)

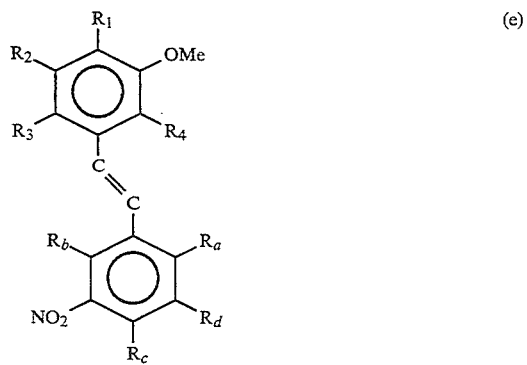 (e)

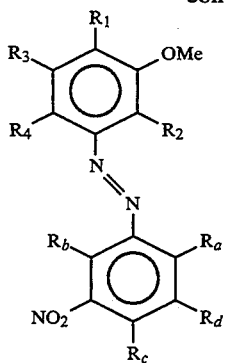
(f)

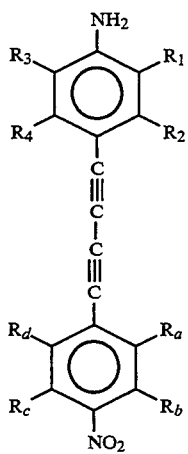
(g)

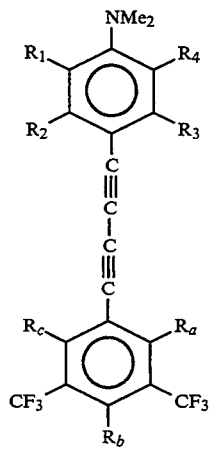
(h)

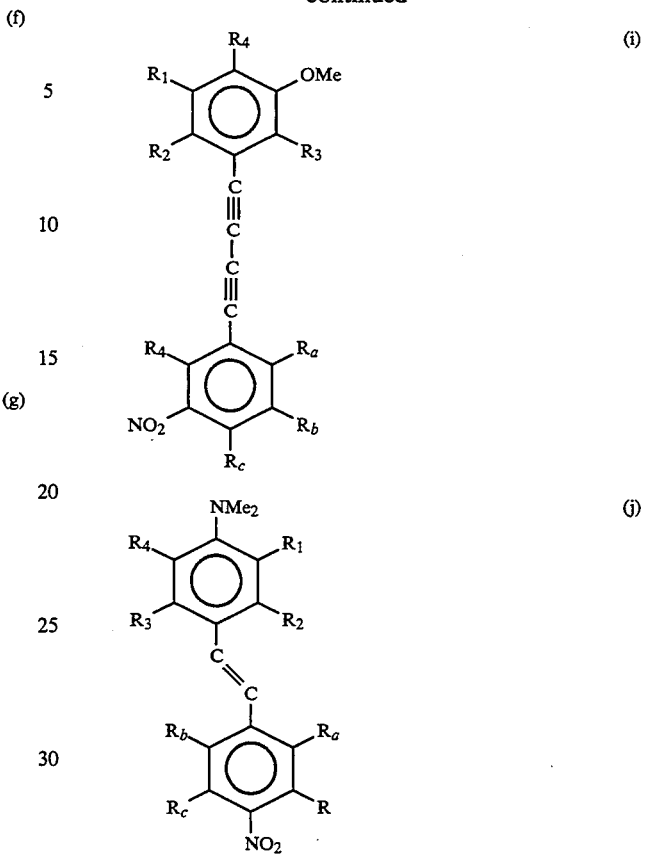

In these molecules (a)–(j), substituent groups $R_a$–$R_d$ can respectively be groups such as those indicated in the following table.

TABLE 12

| Combination | Substituent $R_a$–$R_d$ | Substituent $R_1$–$R_4$ |
|---|---|---|
| I | at least one of $H_2N\text{-}(CH_2)_m$ and $HO\text{-}(CH_2)_n$ (m,n = 0 or an integer) | not critical |
| II | at least one of $HOOC\text{-}(CH_2)_m$, $ClOC\text{-}(CH_2)_n$, and $OCH\text{-}(CH_2)_j$ (m,n,j = 0 or an integer) | not critical |
| III | not critical | at least one of $H_2N\text{-}(CH_2)_k$ and $HO\text{-}(CH_2)_l$ (k,l = 0 or an integer) |
| IV | not critical | at least one of $HOOC\text{-}(CH_2)_k$, $ClOC\text{-}(CH_2)_l$ and $OCH\text{-}(CH_2)_i$ (k,l,i = 0 or an integer) |

TABLE 12-continued

| Combination | Substituent $R_a$–$R_d$ | Substituent $R_1$–$R_4$ |
| --- | --- | --- |
| V | at least one hydrophilic group of —COOH, —OH, —NH$_2$, —OCH$_3$ or —NHCOCH$_3$ | not critical |
| VI | at least one hydrophobic group of a hydrocarbyl | not critical |
| VII | not critical | at least one hydrophilic group of —COOH, —OH, —NH$_2$, —OCH$_3$ or —NHCOCH$_3$ |
| VIII | not critical | at least one hydrophobic group of a hydrocarbyl |

The combinations I–VIII may be concurrently present in a polymer molecule, and $R_a$–$R_d$ and $R_1$–$R_4$ may be a donor or acceptor group.

As is clear from the above, the molecules that can be used in the process of the present invention possess a donor group such as NH$_2$, OMe (methoxy) and NMe$_2$ and an acceptor group such as NO$_2$ and CF$_3$, as well as a group containing H$_2$N, HO—, HOOC—, ClOC—, OCH— and so on. In addition, the groups that participate in these chemical reactions may be linked with the main body of the molecule via a buffer such as —(CH$_2$-)$_m$— (where m is 0 or an integer). As a result, in addition to the degree of freedom of bonding and configuration between molecules being increased thereby promoting a polymerization reaction, the polymer film is also provided with greater flexibility. Moreover, the suitable arrangement of hydrophilic and hydrophobic groups is able to give orientation characteristics to the molecule.

In addition, conjugate bonding forms in the main chain due to the reaction between —NH$_2$ and —CHO. As a result, the wave function in the form of a long chain and the wave function due to addition groups can be controlled thereby allowing the realization of a highly functional polymer film. Moreover, one-dimensional polymer including LED and photo-diodes and so forth can also be realized. In addition, opto-electronic devices such as EL and ECD can be realized if EL molecules or electrochromic molecules, etc. are added.

Figure 29A:
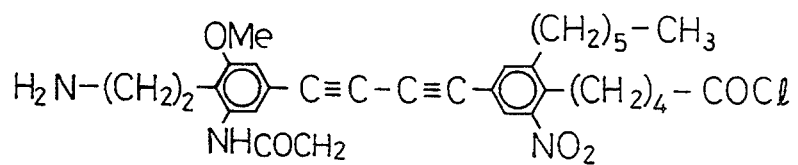
FIGS. 29 (A)–(C) are schematic diagrams indicating an example of deposition.
Figure 29B:
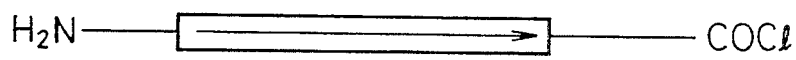
Figure 29C:
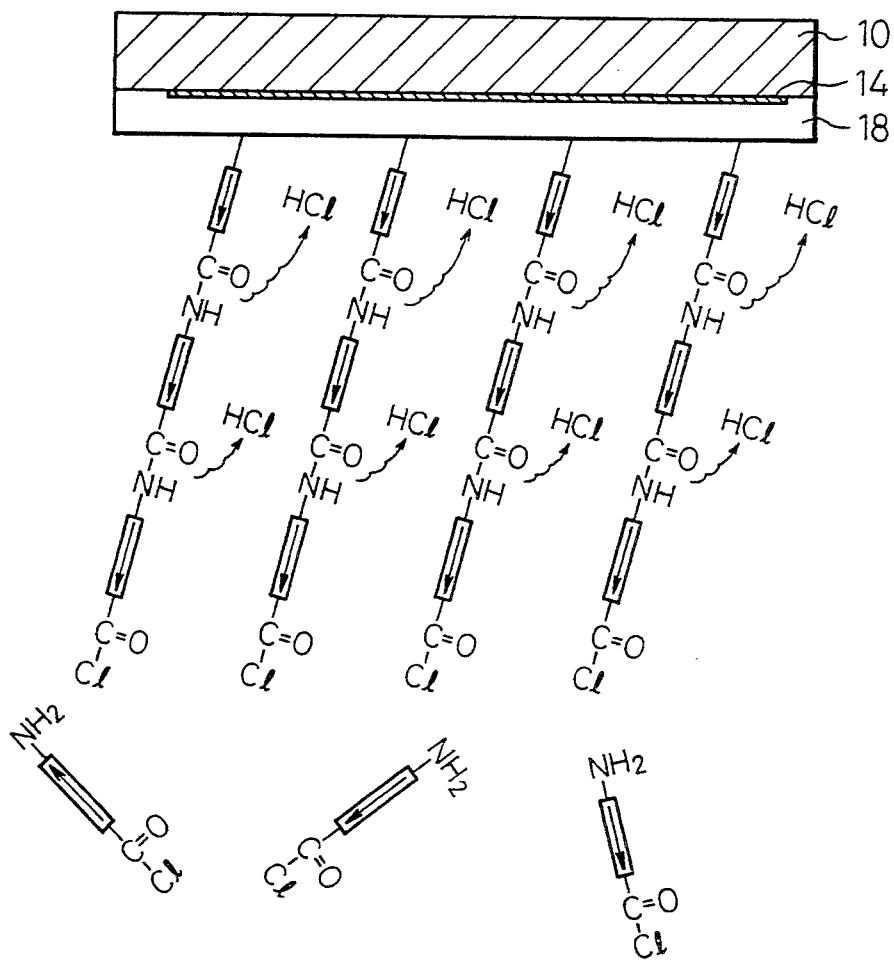

An example of deposition is indicated in FIG. 29. In this example, molecule (i), wherein $R_1$ is CH$_3$OCHN—, $R_2$ and $R_3$ are hydrogen atoms, $R_4$ is H$_2$N—(CH$_2$)$_3$—, $R_a$ is a hydrogen atoms, $R_b$ is CH$_3$—(CH$_2$)$_5$, $R_c$ is ClO-C—(CH$_2$)$_3$— and $R_d$ is a hydrogen atom, is used as the staring molecule. More specifically, as is indicated in the diagram, the donor group —OMe (Me: methyl group) is added to one side of the diacetylene molecules, while the acceptor group —NO$_2$ is added to the other side of the diacetylene molecule. H$_2$N—(CH$_2$)$_2$— and —(CH$_2$)$_4$—COCl are also added simultaneously. The hydrophilic group —NHCOCH$_3$ is located on the donor side, and the hydrophobic group —(CH$_2$-)$_5$—CH$_3$ is located on the acceptor side.

The substrate used in this example consists of substrate 10 and pattern electrode 14 and buffer layer 18 located above it as indicated by the cross-sectional view in FIG. 29 (C). If hydrophilic treatment is performed on the substrate side (buffer layer 18) in advance, the acceptor side tends to be aligned opposite the substrate. The terminal ClOC— group participates in a condensation polymerization reaction with the H$_2$N— group of the other molecule resulting in bonding accompanied by elimination of HCl. This process is repeated resulting in the formation of a polymer having directional characteristics.

Figure 30:
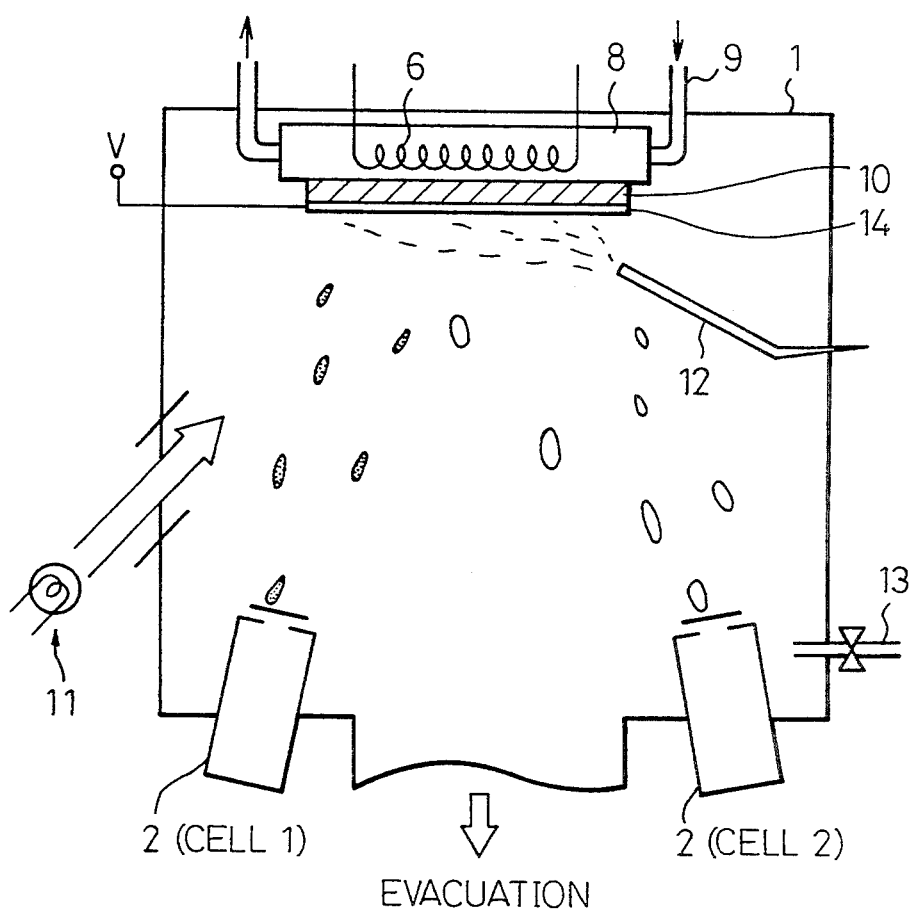
FIG. 30 is a cross-sectional view indicating the composition of a deposition system.

Although deposition does not necessarily have to be performed in a vacuum, it is advantageous to perform such deposition in vacuum chamber 1 as indicated in FIG. 30 due to improvement of uniformity and control of film structure (this applies similarly to the embodiments to follow). Furthermore, the deposition system of FIG. 30 has the same composition as the previously explained system of FIG. 3. Thus, the same numbers are used to represent the same components. Furthermore, in the case of this example, there are two types of K cells 2, consisting of cell 1 and cell 2. In this example, a grid may be placed in opposition to the substrate in place of the EB shower shown in the diagram, and a slit electrode may be provided on the substrate (see FIG. 4). In addition, as there are cases in which the effectiveness of control of orientation characteristics by hydrophilic or hydrophobic groups is not sufficiently strong, the technique of employing an electric field assist as indicated in FIG. 30 can be used to improve orientation characteristics.

Another example of deposition involves the use of molecule (j), wherein $R_1$ is CH$_3$OCHN—, $R_2$ and $R_3$ are hydrogen atoms, $R_4$ is H$_2$N—, $R_a$ and $R_b$ are hydrogen atoms, $R_c$ is CH$_3$—(CH$_2$)$_3$— and $R_d$ is H$_2$N—(CH$_2$)$_3$—, as the starting molecule. The polymer shown in the following table can be obtained from molecule (j) and molecule (h).

TABLE 13

| Molecule (j) | Molecule (h) |
| --- | --- |
| H$_2$N—[benzene ring with NMe$_2$, NHCOCH$_3$ substituents]—C=C—[benzene ring with CH$_3$—(CH$_2$)$_3$, NO$_2$, (CH$_2$)$_3$—NH$_2$ substituents] | ClOC—[benzene ring]—COCl |

| Resulting Polymer |
| --- |
| ⁺NH—[benzene ring with NMe$_2$, NHCOCH$_3$]—C=C—[benzene ring with CH$_3$—(CH$_2$)$_3$, NO$_2$, (CH$_2$)$_3$NHCO—[benzene ring]—CO$\frac{}{n}$] |

As can be understood from the above table, two types of molecules are used wherein one molecule has two $H_2N-$ groups and the other molecule has two $ClCO-$ groups. When these groups are mixed, a polymer is obtained with HCl being eliminated as the result of a condensation polymerization reaction. Although several bonding forms are possible at this time, orientation characteristics can be controlled by controlling the locations where hydrophilic and hydrophobic groups are added as well as by assisting the electric field during deposition. In addition, in order to improve control of film structure, rather than simultaneously projecting two types of molecules onto the substrate (in other words, mixing the two types of molecules), one type of molecule at a time can be alternately projected onto the substrate.

An example of deposition in the case two types of molecules both have a donor group and acceptor group is indicated in the following table. As can be understood from the following table, in one of the molecules (j), $R_1=CH_3OCHN-$, $R_2$ and $R_3=H$, $R_4=H_2N-(CH_2)_2-$, $R_a$ and $R_b=H-$, $R_c=CH_3-(CH_2)_3-$ and $R_d=H_2N-(CH_2)_2-$, while in the other molecule (j), $R_1=CH_3-(CH_2)_3-$, $R_2$ and $R_3=H-$, $R_4=ClOC-(CH_2)-_2-$, $R_a$ and $R_b=H-$, $R_c=CH_3OCHN-$ and $R_d=ClOC-(CH_2)_2-$.

A high-performance non-linear optical polymer can be obtained by the manufacturing process for an organic non-linear optical material as described above.

Finally, according to a third mode of the present invention, a fabrication process for an organic non-linear optical film is provided wherein deposition is performed in the presence of plasma.

At the time of fabrication of an organic non-linear optical film of the prior art, a polymer film prepared by spin coating is heated to its glass transition temperature ($T_g$) or higher followed by the application of a static electric field to orient the molecules. This is followed by freezing of the molecular orientation by cooling. However, in the process of the prior art, due to the occurrence of relaxation of molecular orientation and the dependency on thermal polling, this process had various problems including being unable to increase the degree of orientation.

As a result of earnest research in order to solve these problems, it was discovered that performing deposition in the presence of plasma as described above is effective. More specifically, in the fabrication of an organic non-linear optical film, the present invention is a fabrication process for an organic non-linear optical film wherein deposition is performed by generating plasma in a gas containing the raw material monomer, together

TABLE 14

| Molecule (j) | Molecule (j) |
|---|---|
| 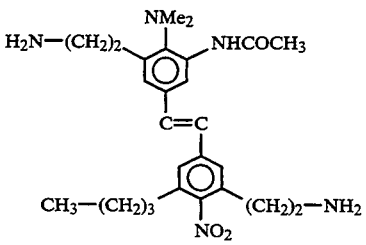 | 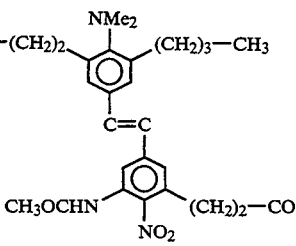 |
| Resulting Polymer | |
| 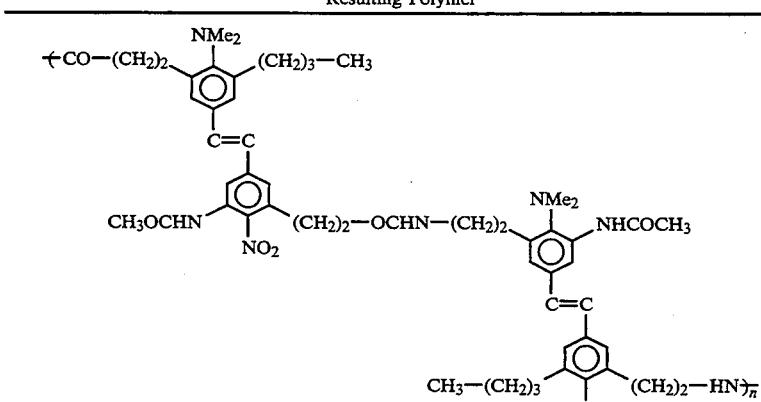 | |

In the two deposition examples indicated in the above tables, a favorable polymer film having ample stability and uniformity can be obtained by setting conditions by regulating substrate temperature such that each type of molecule alone is not deposited onto the substrate, while both types of molecules are deposited onto the substrate only when they are simultaneously present and bonded. In addition, the use of light is effective in promoting the above-mentioned polymerization reactions (including the first deposition example being equivalent to the case of FIG. 29).

with applying a voltage between a substrate and an opposing electrode or grid electrode arranged at a specified distance (gap) from said substrate. The gap between the substrate and the electrode is preferably approximately 2 μm–30 mm. Furthermore, although deposition is performed in the presence of plasma in this application for the present invention, this should be distinguished from plasma polymerization of the prior art in that the monomer to be formed into the polymer is not in the form of plasma (with the carrier gas being that which is in the form of plasma).

Figure 31:
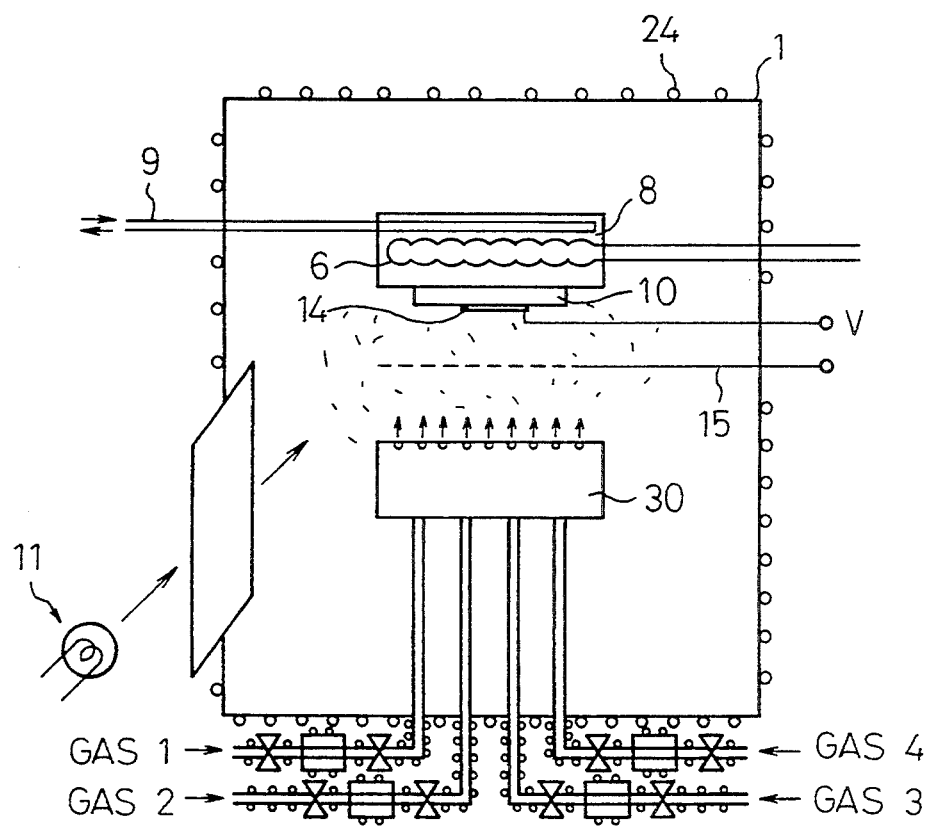
FIG. 31 is a cross-sectional view indicating the composition of a deposition system.

The process of the present invention can be carried out using, for example, a deposition system like that indicated in FIG. 31. Vacuum chamber 1 possesses gas shower 30 connected to gas 1, gas 2, gas 3 and gas 4 feed tubes (each equipped with mass flow controllers and heating/cooling devices) as indicated in the diagram. The system is also equipped with a heating/cooling device 24 for the periphery of the chamber body. Substrate holder 8 housing heater 6 and cooling medium circulation pipe 9 holds substrate 10. After gasifying the raw material monomer and polymerization initiator, the gas is introduced into chamber 1 via the feed pipes and plasma is generated in the chamber. When a voltage is applied between substrate 10 and opposing electrode 14, or between substrate 10 and grid electrode 15 at that time, the monomer is oriented on or in the vicinity of the substrate and is polymerized in that state. As there is no dependency of orientation on heating as in the prior art when deposition is performed using this process, it is difficult for orientational relaxation to occur. Moreover, the degree of orientation can be increased by cooling the substrate during polymerization. In addition, irradiation with light from light source 11 activates the bonding groups that participate in polymerization thereby serving to lower the temperature of the substrate even further.

Various monomers can be used as the raw material in carrying out the process of the present invention. Examples of these include combinations of the four types of monomers indicated below.

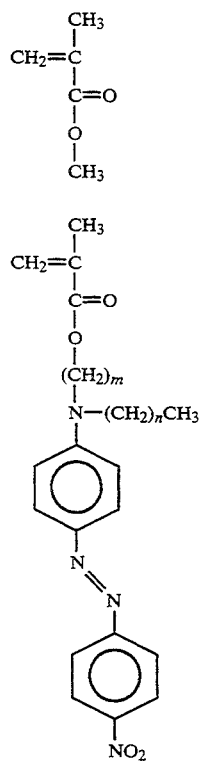

AIBN (α,α'-azobisisobutyronitrile; as a polymerization initiator)

Monomer 1:

Monomer 2:

Monomer 3:

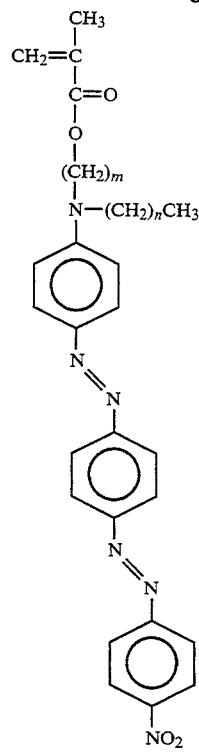

Monomer 4:

When monomer 1 and monomer 2 are introduced into the deposition system, a copolymer film of these monomers is obtained. In addition, when monomer 1 and monomer 4 are introduced, a copolymer film of these monomers is obtained. Depending on the particular case, monomer 3 may be gasified and introduced in the deposition system. In the case of using monomer 4 in particular, the degree of orientation can be improved remarkably in comparison to the process of the prior art by applying the process of the present invention. In addition, with respect to applying a voltage, increasing the level of the voltage together with increasing film thickness is effective.

According to the process of the present invention, as can be understood from that described above, performing deposition while applying an electric field in the presence of plasma allows relaxation to be reduced, performing orientation during polymer formation, while also allowing the degree of orientation to be increased by lowering the substrate temperature, thus obtaining a favorable organic non-linear optical film.

In addition to the organic non-linear optical film and its manufacturing process along with related modes that have been previously explained in detail, the present invention also relates to various types of an organic functional thin film (or more simply, an organic film), including a non-linear optical material, and its fabrication process. The following provides an explanation of this.

The fabrication process for an organic film of the present invention provides an organic film wherein the type of molecule is controlled for each molecular layer utilizing a reaction between a group such as a carbonyloxycarbonyl group, a carboxylic acid group, an acid halide group of a carboxylic acid, an —NCO group, a —CHO group and an epoxy group (these groups are to be referred to as group I), and a group such as an amino group, groups containing an amino proton, an alkylamino group, a silated alkylamino group and a hydroxide group (these groups are to be referred to as group II). In other words, although the reaction bonding strength between members of group I or between members of group II is weak, the reaction bonding strength between a member of group I and a member of group II is strong. Utilizing this fact, by adding specific members of these groups to a molecule, specific molecules can be deposited for each molecular layer. Incidentally, the following table indicates examples of reaction groups belonging to group I and group II in the form of several chemical formulae.

TABLE 15

| Group I | Group II |
|---|---|
| ![structure with two C=O groups bonded via O] *) | —NH$_2$ <br> —NHSi(CH$_3$)$_3$ <br> —OH |
| —COCl <br> —NCO <br> —CHO <br> —COOH | |
| ![cyclic carbonate structure] | |

* carbonyloxycarbonyl

Figure 32:
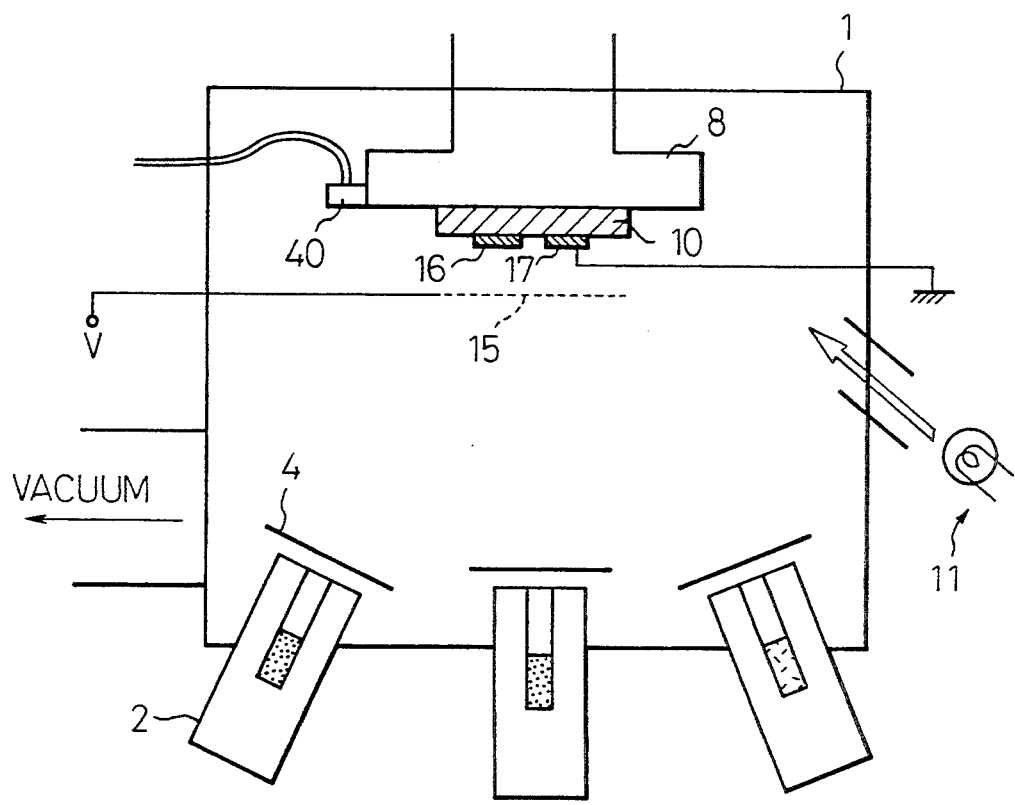
FIG. 32 is a cross-sectional view indicating the composition of a deposition system.

The process of the present invention can be carried out using various deposition systems. For example, the system indicated in abbreviated form in FIG. 32 is a MBD (molecular beam deposition) system. This system has a structure which resembles the system indicated in FIG. 3. In other words, this deposition system is equipped with three K cells 2 for molecule evaporation (equipped with shutters 4), and a light irradiation device 11 and so on. Substrate 10 held in position by substrate holder 8 can be heated and cooled, and a voltage can be applied between electrodes 16 and 17 formed on substrate 10 or between electrodes 16 and 17 formed on substrate 10 and opposing electrode (grid) 15. The film thickness of the organic film formed on substrate 10 can be monitored by monitor 40. Alternatively, the film thickness on the substrate can be measured directly using an optical film thickness monitor device utilizing optical interference.

The organic film can be fabricated using the deposition system indicated in the diagram in the following manner: For example, a molecule having two carbonyloxycarbonyl groups belonging to group I (molecule A) and a molecule having two or more amino groups belonging to group II (molecule B) are evaporated from separate cells. By alternately opening and closing the shutters, molecule A and molecule B can be alternately supplied to the substrate as indicated below.

(1) Molecule A is a deposited onto the substrate as the base.

(2) Molecule B is deposited on the substrate. Bonding occurs between molecule B and the base molecule A resulting in accumulation of molecule B on the substrate.

(3) Molecule A is deposited. Bonding occurs between molecule A and base molecule B resulting in accumulation of molecule A on the substrate.

(4) Molecule B is deposited. Bonding occurs between molecule B and base molecule A resulting in accumulation of molecule B on the substrate.

Steps (3) and (4) are then repeated.

If the conditions are set as previously indicated in FIG. 2, or in other words, if the substrate temperature is set such that a film will not form due to re-evaporation from the substrate in the case of only one type of molecule, but will form in the presence of two types of molecules, molecule A and molecule B are deposited onto the substrate one molecular layer at a time for each step. Film growth beyond that point is stopped automatically. In other words, this allows the carrying out of MLD (Molecular Layer Deposition) which resembles ALE in compound semiconductors.

Figure 33:
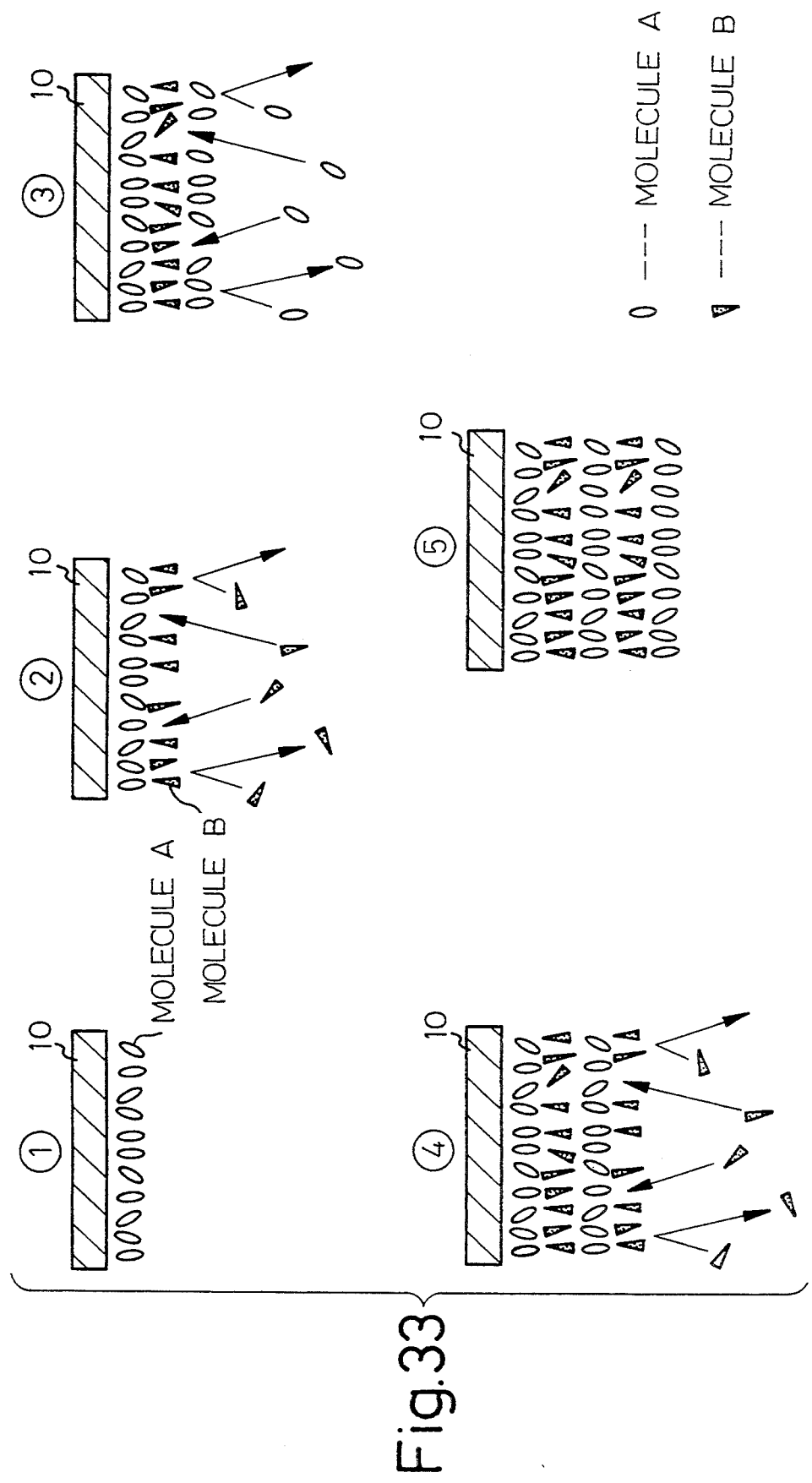
FIG. 33 is a cross-sectional view indicating the principle of MLD.
Figure 34:
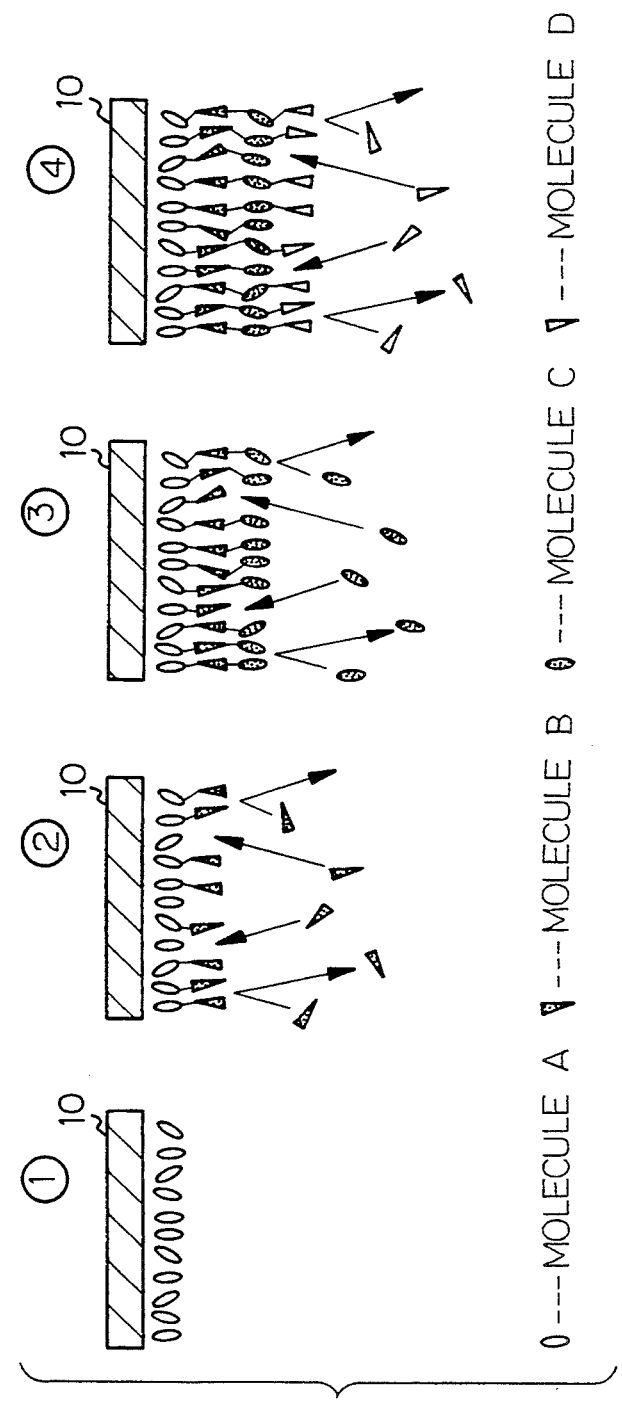
FIG. 34 is a cross-sectional view indicating the principle of MLD.
Figure 35:
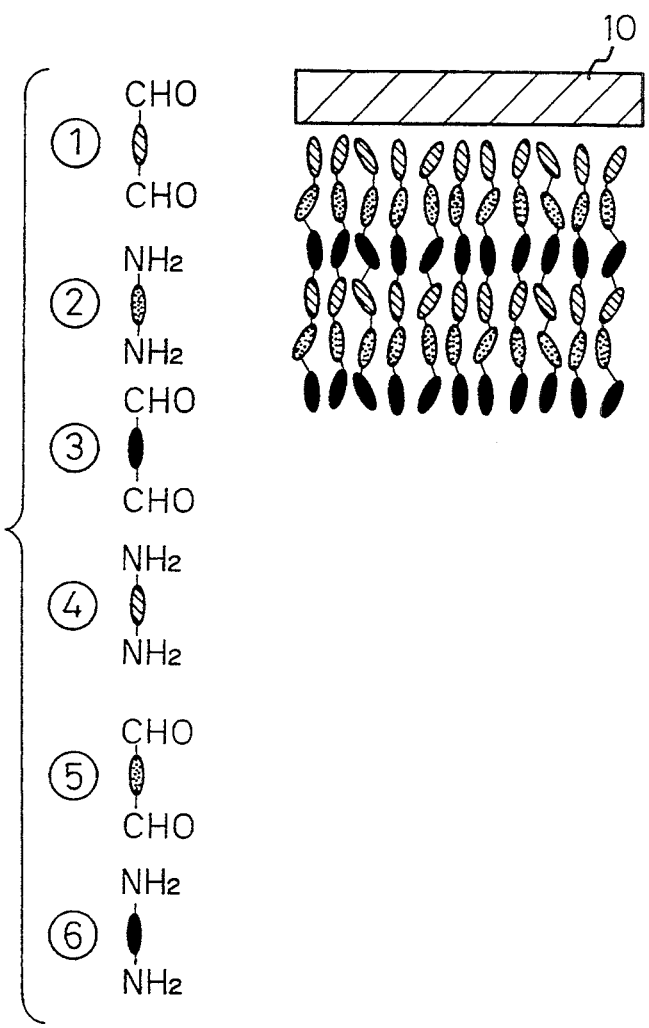
FIG. 35 is a cross-sectional view indicating the principle of MLD.
Figure 36:
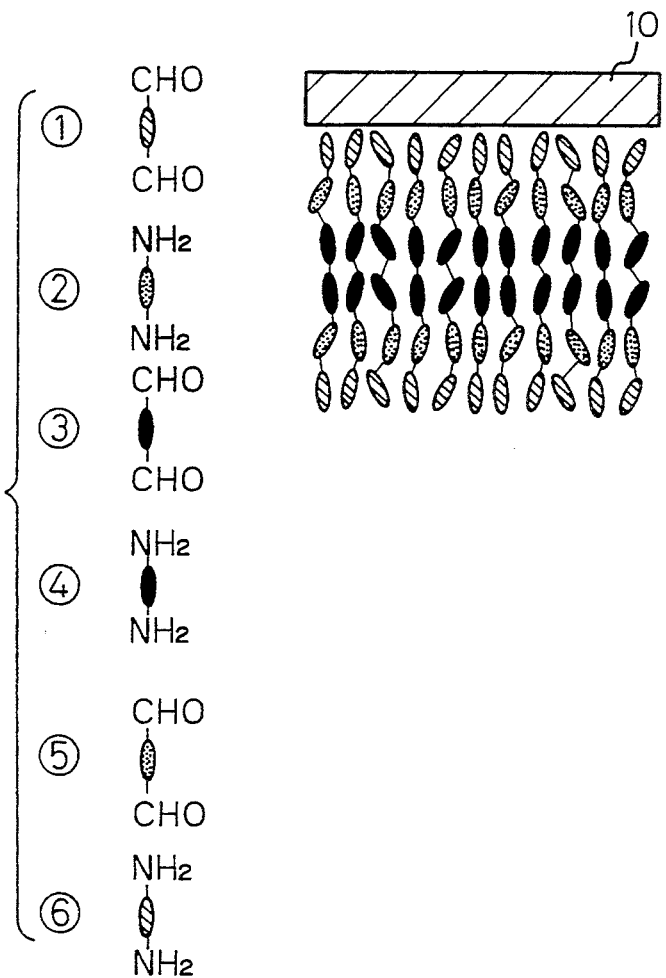
FIG. 36 is a cross-sectional view indicating the principle of MLD.

FIG. 33 provides a schematic representation of the principle of MLD. In this example, two types of molecules can be alternately deposited on substrate 10 one molecular layer at a time using molecules A and molecule B. In addition, the number of types of molecules is not limited to only two types, but may be three types or more. FIG. 34 indicates an example of alternately depositing four types of molecules on substrate 10 one molecular layer at a time using molecules A, B, C and D. In addition, the supply of molecules may be in a well-ordered or random sequence. FIG. 35 is a schematic indication of an example of the former, while FIG. 36 is a schematic indication of an example of the latter, with six types of molecules being used in both examples.

In the fabrication of an organic film according to the present invention, in the case of adding a donor group and acceptor group to a molecule, a film in which the molecules are oriented in the as-deposited state can be obtained by formation of said film while applying a voltage between electrodes formed on a substrate. Similarly, a film in which molecules are oriented in the direction of film thickness in the as-deposited state can be obtained by forming said film while applying a voltage between an electrode formed on a substrate and an opposing electrode (grid). In this case, the distance between the electrode and the opposing electrode is preferably 2 microns to 10 centimeters. In the case the distance between electrodes is particularly wide, it is desirable to efficiently apply voltage to the film by high frequency generation of plasma by introduction of a gas such as Ar, or by the generation of an electron beam. As was described previously, with respect to the electrode on the substrate, the substrate itself may be an electrode (such as a doped semiconductor substrate), or the electrode may be formed into the shape of a substrate. In addition, a UV cured resin or a buffer layer such as that of SiO$_2$ may be formed on the substrate. Moreover, curing may be performed, after the deposition of the film at a low temperature approximate or below room temperature, by heating or irradiation with light. Since thermal disturbance during film formation can be suppressed in this case, orientation by an electric field becomes easier thus allowing the attaining of a high level of performance.

Figure 37:
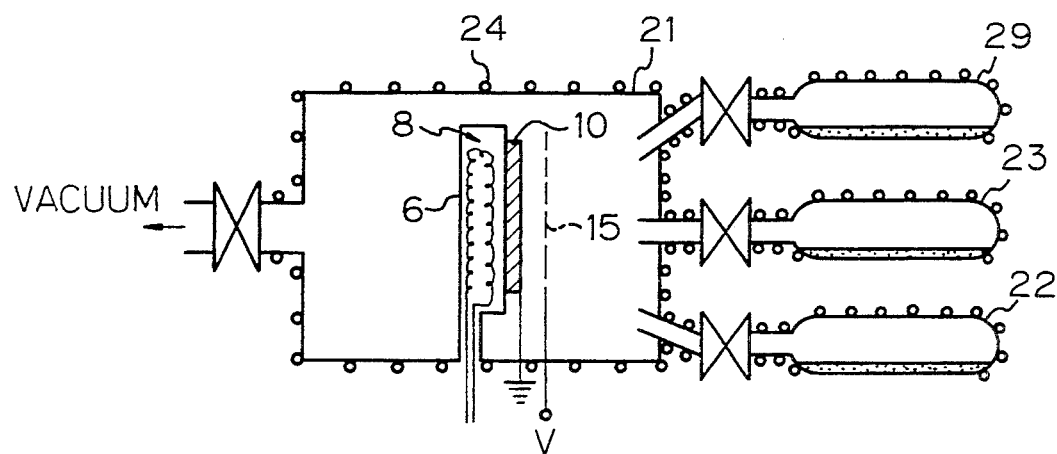
FIG. 37 is a cross-sectional view indicating the composition of a deposition system.

In addition to the system schematically indicated in FIG. 32, other types of systems may also be used for the deposition system. For example, the deposition device of FIG. 37 is a type of CVD (chemical vapor deposition) system having two or more monomer gas tanks (monomer gas feed cells) 29. The structure of the system is basically the same as the structure of the system of FIG. 6 previously described. By allowing the deposition system to have such a composition, the supply of molecules can be switched by opening and closing the valves of the gas inlets.

In the present invention, various molecules which satisfy the above-mentioned prerequisites can be used for molecule A and molecule B. The above-mentioned FIG. 8 conceptually indicates preferable examples of molecule A that can be used in the present invention. In addition, FIG. 9 conceptually indicates preferable examples of molecule B that can be used in the present invention (refer additionally to FIG. 7 which indicates the molecular framework of these molecules). Specific examples of molecule A include the above-mentioned molecules A1, A2, A3, A4, A5 and A6. As was mentioned previously, molecule A may also be a dianhydride of a tetravalent carboxylic acid having six or more carbon atoms, an acid halide of a divalent carboxylic acid having four or more carbon atoms, a dianhydride of an acid, a molecule having two or more —NCO groups of a molecule having two or more —CHO groups. Specific examples of molecule B include the above-mentioned molecules B1, B2, B3, B4, B5 and B6. As was mentioned previously, molecule B may also be molecules B7-B14 having a donor group and/or acceptor group, and at least two of the hydrogen atoms of the phenylene ring portion of said molecule may be substituted with an amino group and/or alkylamino group having 1-10 carbon atoms. If the addition groups for molecule A are selected from among the members of group I, it is not necessary for those groups to be the same group, and similarly, if the addition groups for molecule B are selected from among the members of group II, it is not necessary for those groups to be the same group. Moreover, in addition to molecules A and B, the above-mentioned molecule C may also be partially used for the molecule of the present invention.

Figure 38:
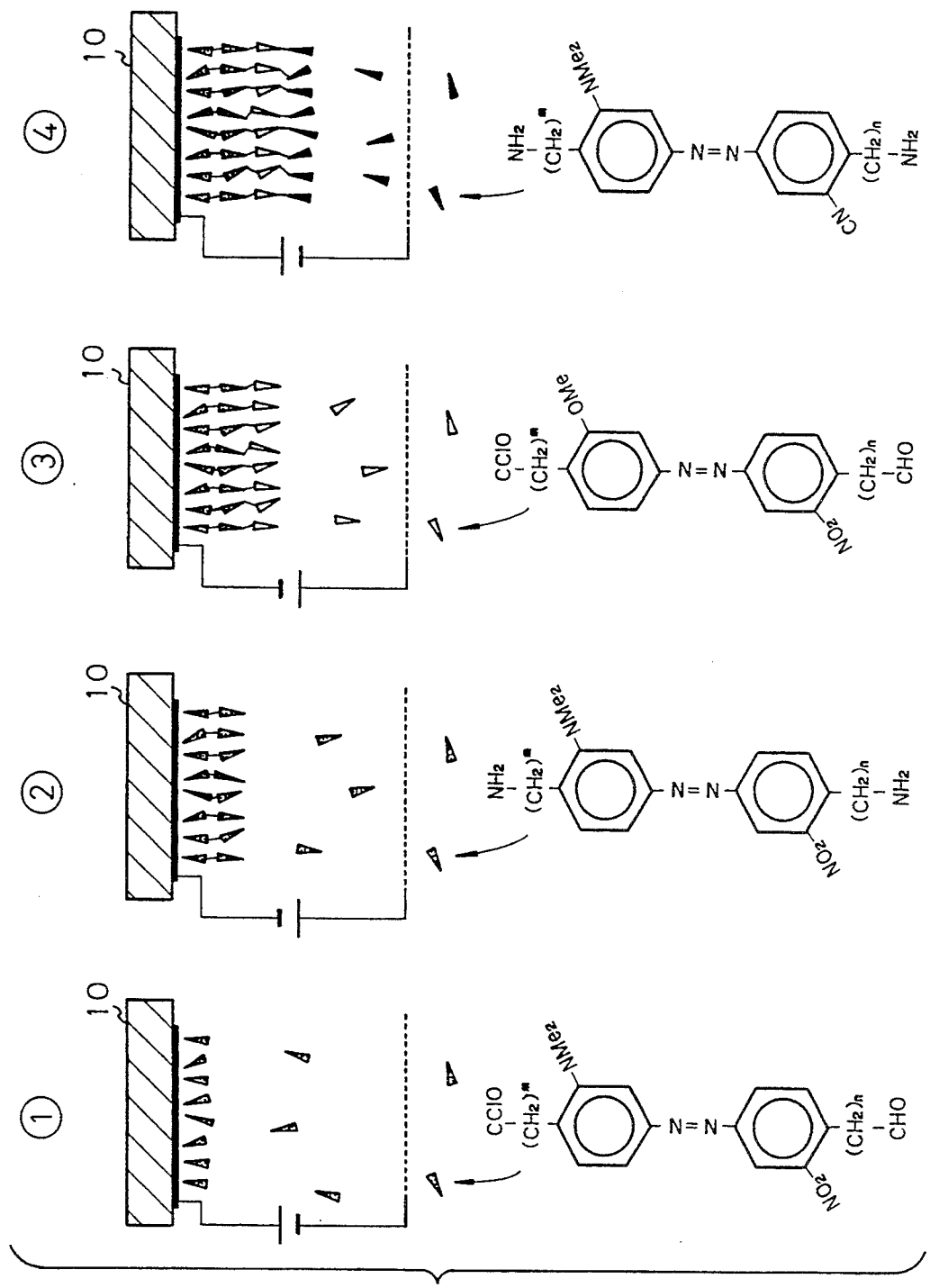
FIG. 38 is a schematic diagram of electric field assisted MLD.

FIG. 38 is a conceptual representation of an electric field assist MLD along with one example of molecules used. An electric field is applying during deposition of a single molecular layer to orient and deposit the molecules. The orientation of molecules can be controlled by synchronizing and changing the electric field for each molecular layer.

Figure 39:
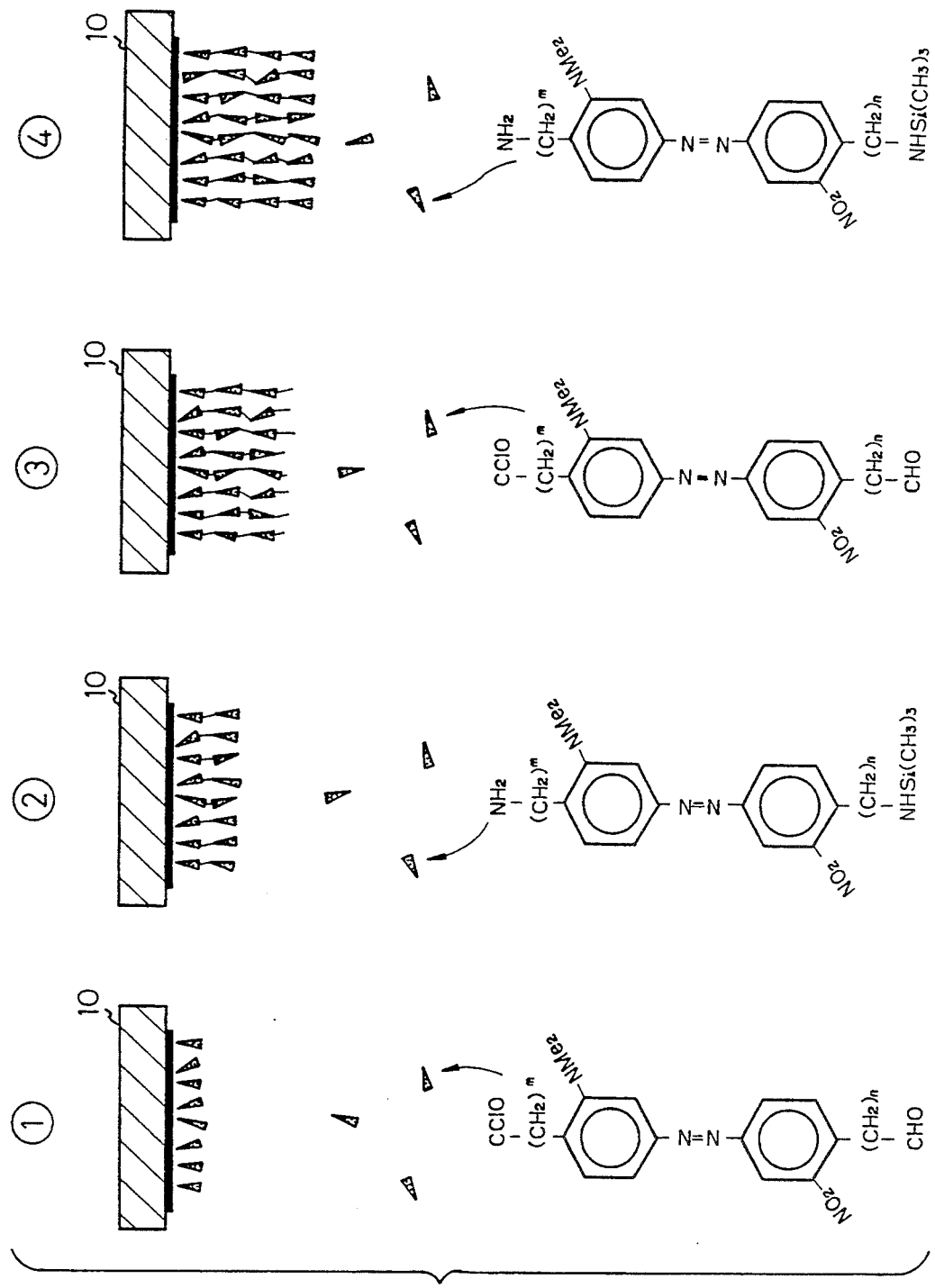
FIG. 39 is a schematic diagram of selective orientation MLD.

FIG. 39 is an example of selection of member groups having different reactivity from the same group and addition of those groups. In this case, orientation and deposition can be performed without an electric field. In other words, those groups having a high degree of reactivity selectively come to the substrate side.

Figure 40:
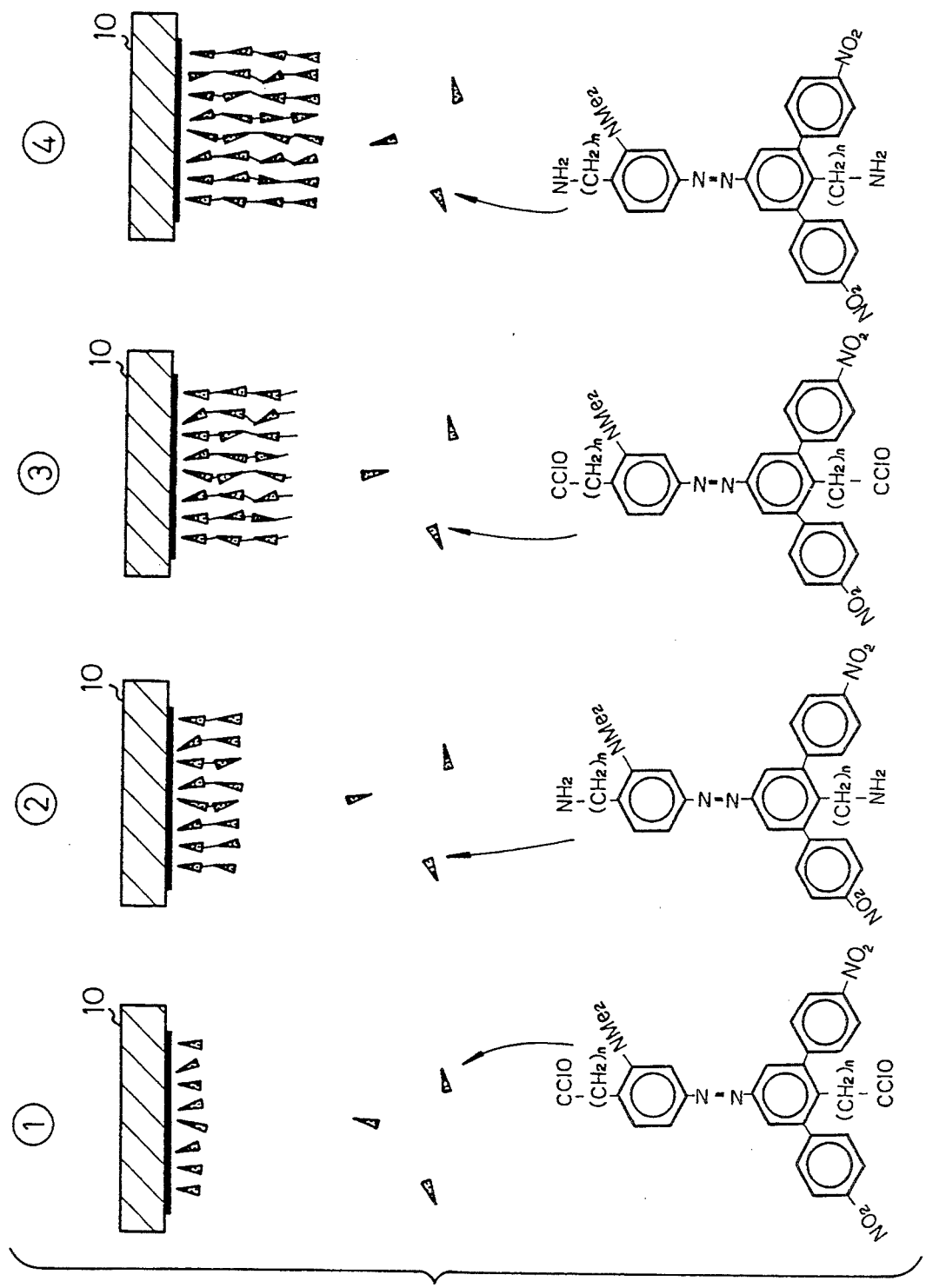
FIG. 40 is a schematic diagram of selective orientation MLD.

Similarly, FIG. 40 is an example performing orientation and deposition by creating a difference in the degree of steric hindrance. Those groups having a lower degree of steric hindrance selectively come to the substrate side.

Figure 41:
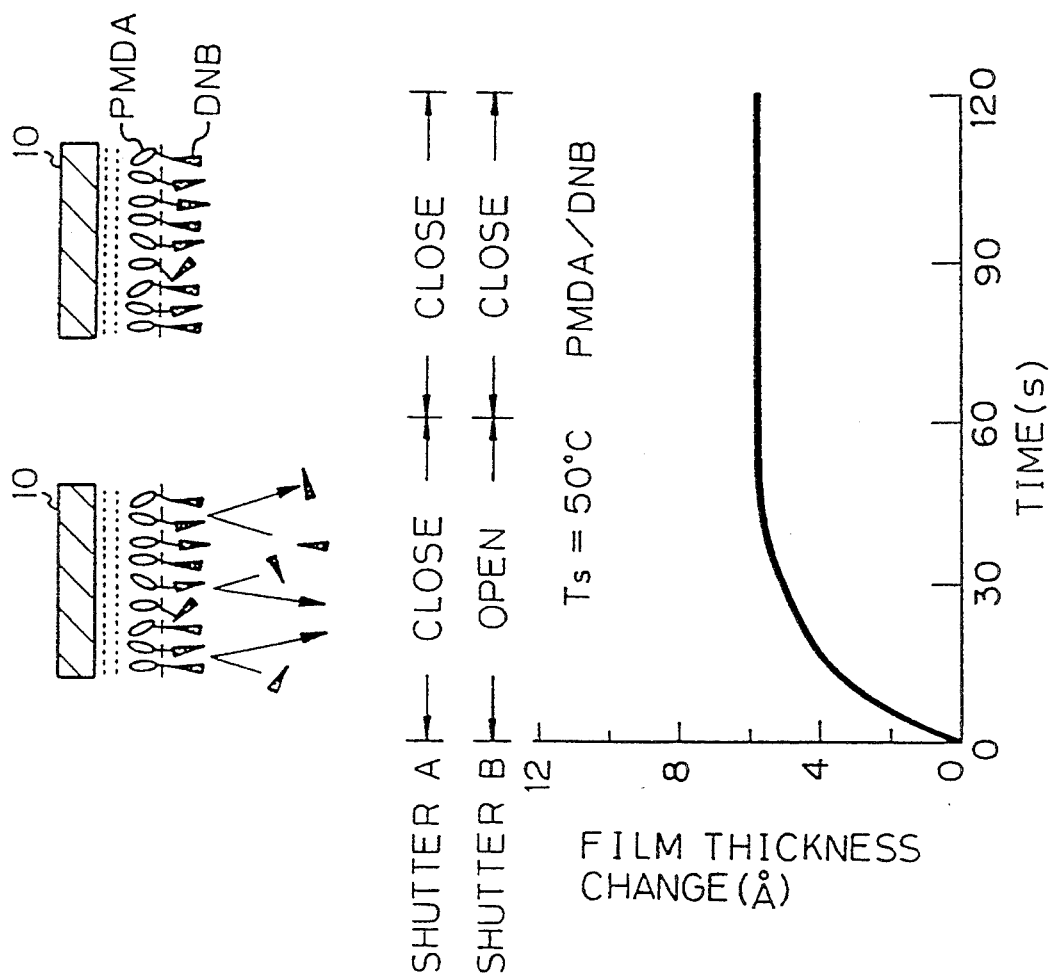
FIG. 41 is a schematic diagram indicating PMDA/DNB growth.

FIG. 41 depicts the data of a single molecular layer growth in the case of using the above-mentioned molecule A1 (PMDA: pyromellitic dianhydride) for molecule A and the above-mentioned molecule B4 (DNB: 2,4-diaminonitrobenzene) for molecule B. In the case of this example, film growth was performed on the quartz crystal plate of a monitor head. Growth of the DNB molecular layer on the PMDA molecular layer was performed at a substrate temperature ($T_s$) of approximately 50° C. In the case of this example, $T_s$ is expressed with the value on the surface of the substrate holder.

Film thickness data was measured with a crystal oscillator film thickness monitor. Although the monitor head was fixed to the substrate holder with an aluminum band, it is considered to be lower than the indicated temperature. Furthermore, shutter A is the shutter of the K cell for PMDA, while shutter B is the shutter of the K cell for DNB (to be treated similarly below). Film thickness increases rapidly following switching of the shutters, and then later becomes saturated. The saturation value is approximately 5 Å, which is near the size of the molecules. It can thus be seen that growth of a single molecular layer was realized.

Figure 42:
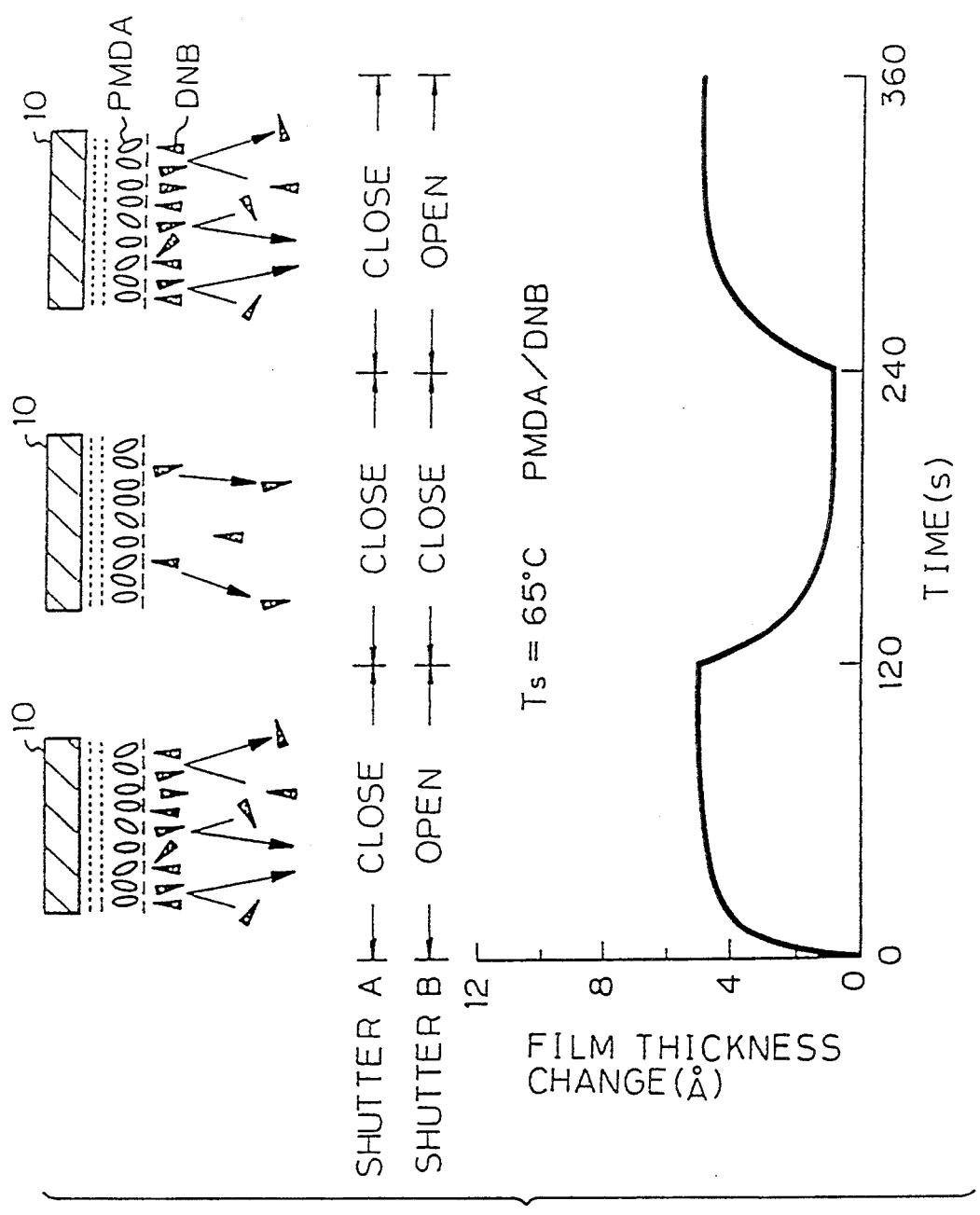
FIG. 42 is a schematic diagram indicating PMDA/DNB growth.

Moreover, the above-mentioned technique was repeated increasing the substrate temperature ($T_s$) to approximately 65° C. The data indicated in FIG. 42 was obtained. It can be understood from the data of FIG. 42 that re-evaporation occurs when the supply of molecule B is stopped due to the high value of $T_s$.

Figure 43:
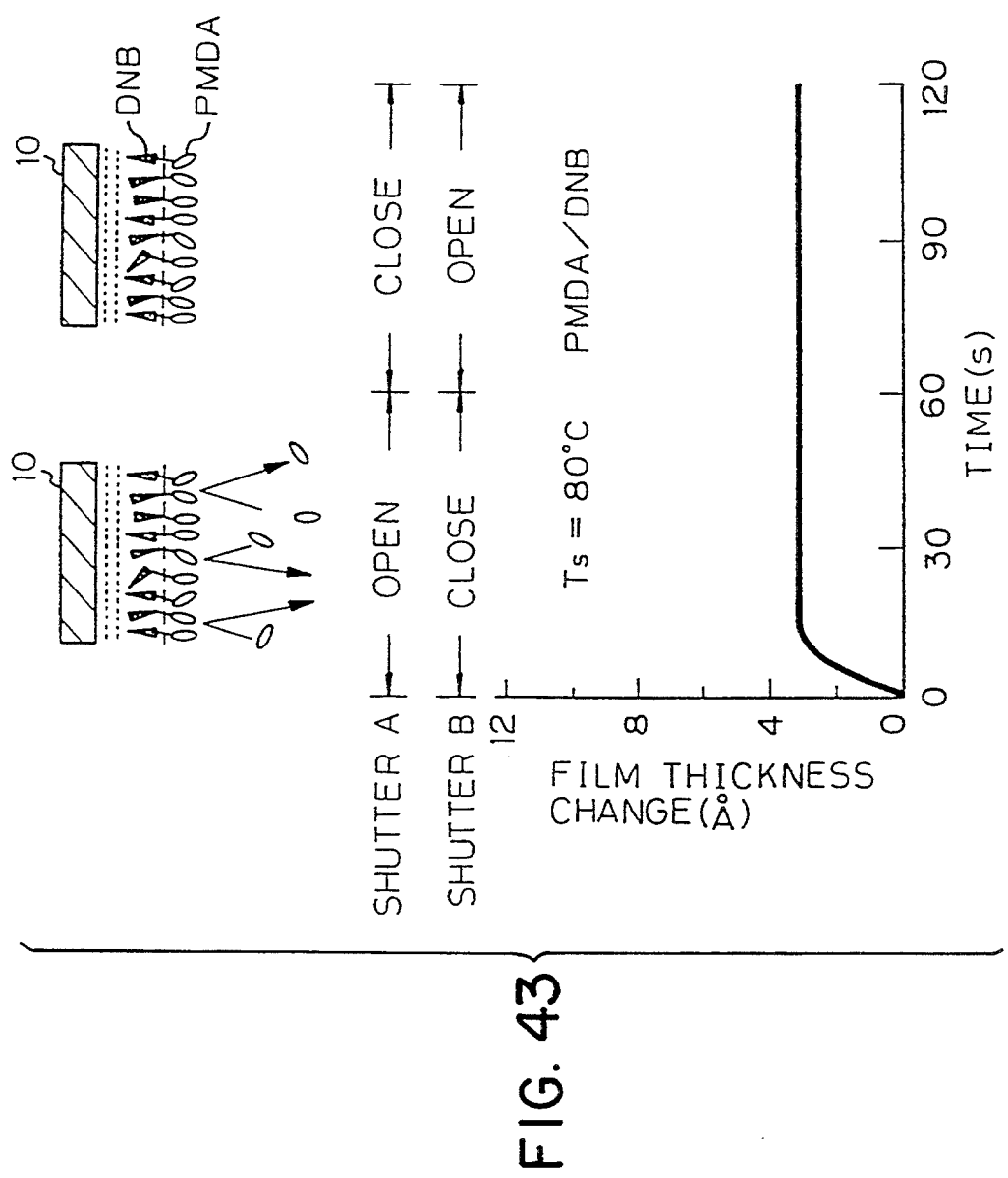
FIG. 43 is a schematic diagram indicating DNB/PMDA growth.

Growth of a PMDA molecular layer onto a DNB molecular layer was next performed at a substrate temperature ($T_s$) of approximately 80° C. The data that was obtained is indicated in FIG. 43. In this case also, single molecular growth was observed.

Figure 44:
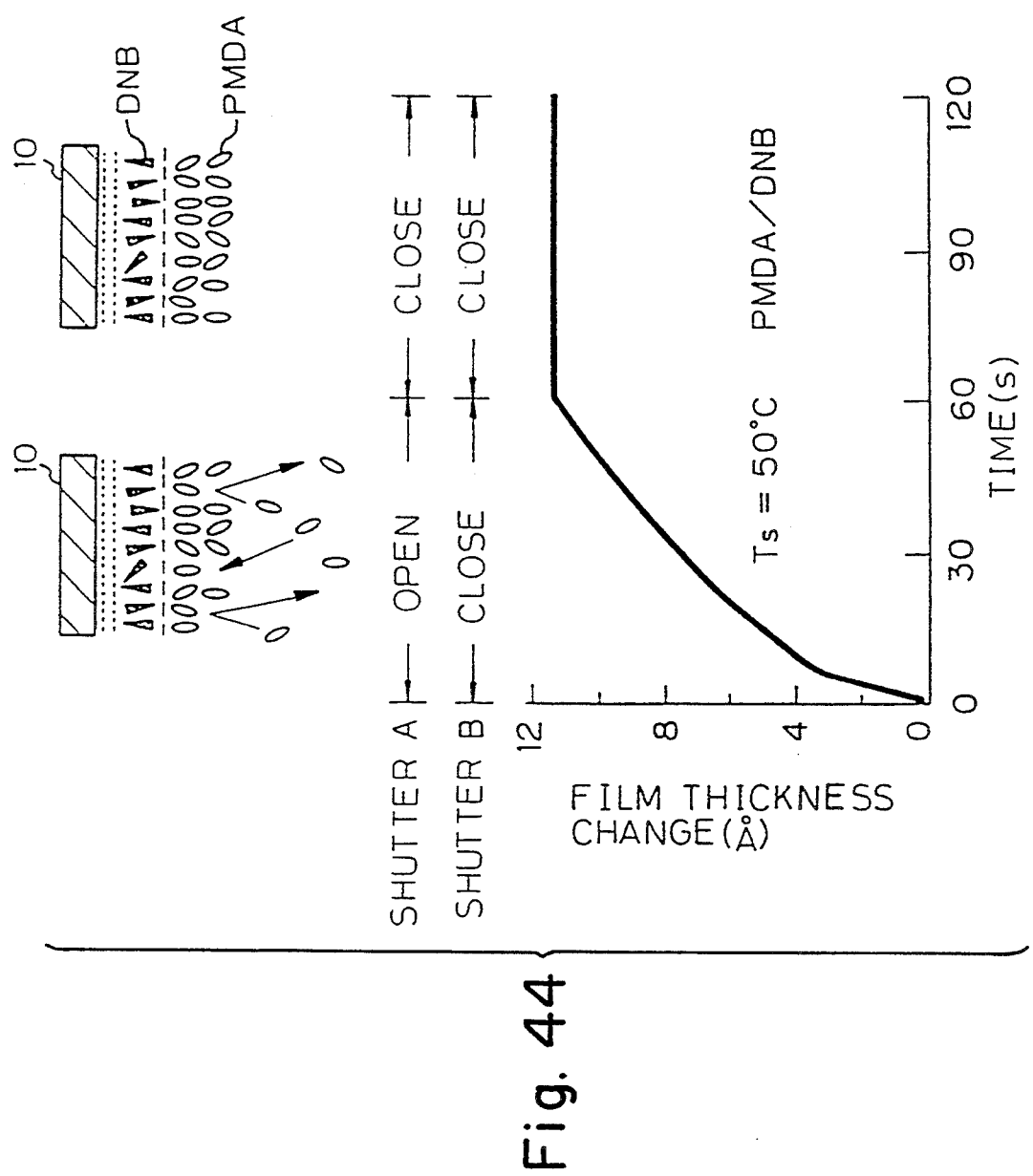
FIG. 44 is a schematic diagram indicating DNB/PMDA growth.

Moreover, the above-mentioned technique was repeated lowering the substrate temperature ($T_s$) to approximately 50° C. It can be understood from the data of FIG. 44 that molecule A continues to successively accumulate due to the low value of $T_s$. In this case, growth cannot be stopped automatically following growth of a single molecular layer.

It can be most likely be understood from the data of FIGS. 41–44 that when the substrate temperature is changed corresponding to the type of molecule supplied, single molecular layer growth can be performed effectively. A film in which layers of single molecules are grown one layer at a time can be obtained by repeatedly switching the supply of molecules while correspondingly raising or lowering the substrate temperature. In addition, deposition at a constant substrate temperature is also possible by selecting suitable molecules, such as using molecules that, for example, have similar vapor pressures.

As has been indicated above, optimization of substrate temperature is important for performing single molecular growth. In the case of using PMDA and DNB, MLD growth can be realized by raising or lowering $T_s$ in synchronization with the switching of molecules. In general, molecules having a high vapor pressure tend to have a lower optimum temperature in comparison with molecules having a low vapor pressure.

After carrying out deposition in the manner described above using PMDA for molecule A and DNB for molecule B, DDE (4,4'-diaminodiphenyl ether) having the chemical formula indicated below was substituted for DNB, and growth of a PMDA molecular layer on a DDE molecular layer along with growth of a DDE molecular layer on a PMDA molecular layer were performed at a substrate temperature ($T_s$) of approximately 80° C.

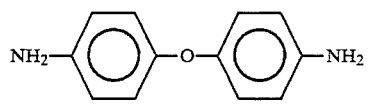

Figure 45:
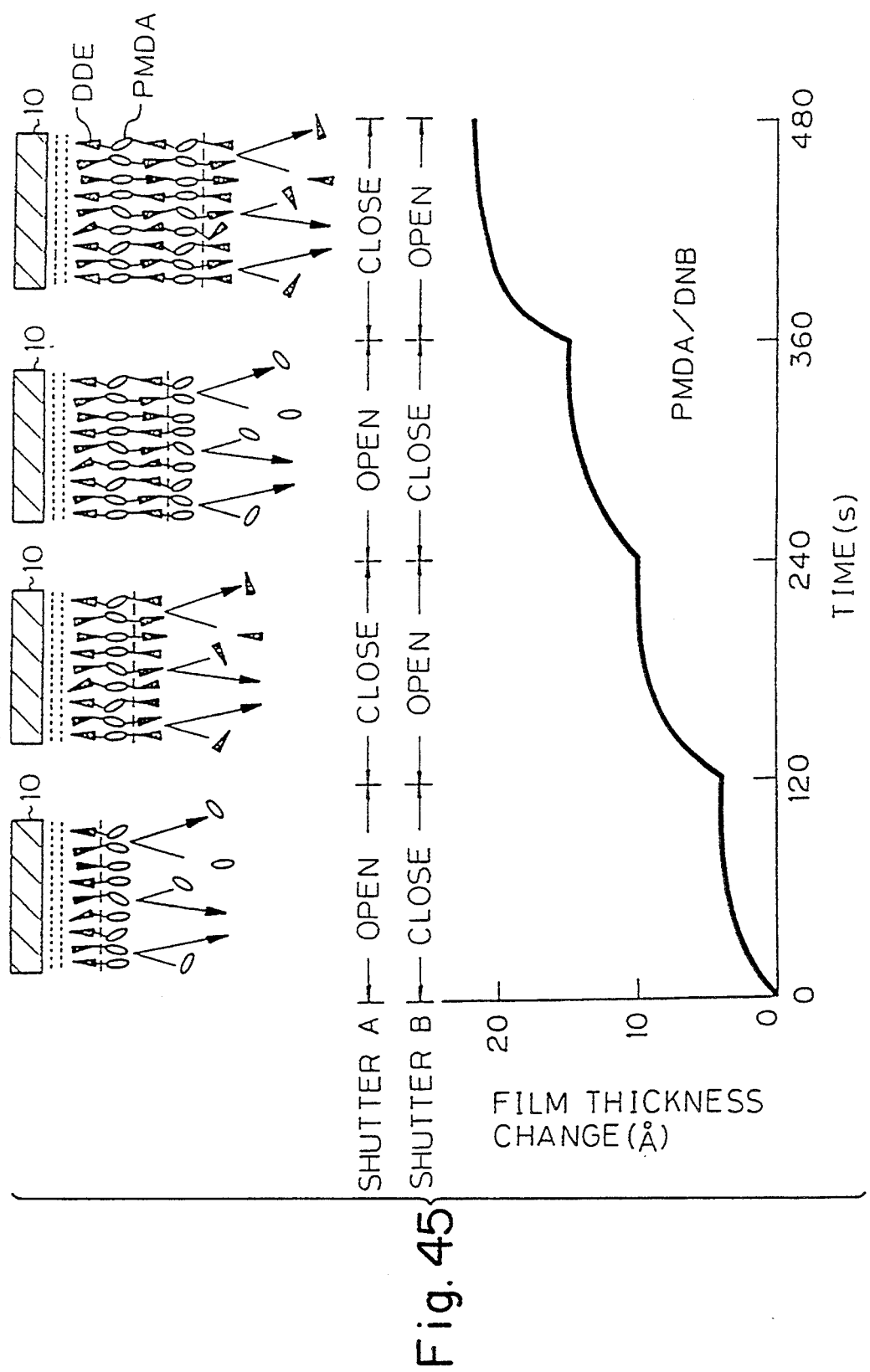
FIG. 45 is a schematic diagram indicating PMDA/DDE and DDE/PMDA growth.
Figures 46A, 46B, 46C:
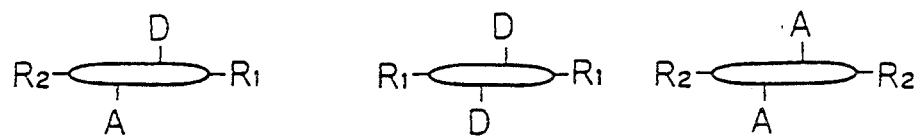
FIGS. 46 (A)–(F) are schematic diagrams of a conceptual indication of molecules.
Figures 46D, 46E, 46F:
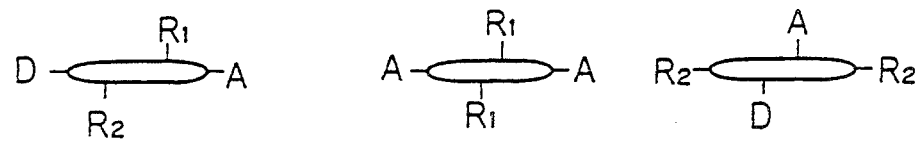
Figure 48A:
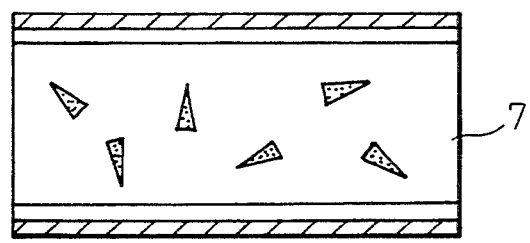
FIGS. 48 (A)–(D) are schematic diagrams of the deposition process of the prior art.
Figure 48B:
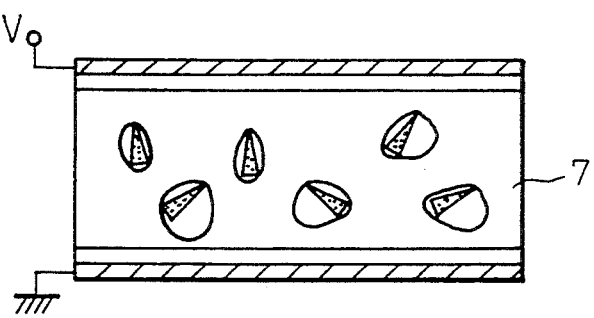
Figure 48C:
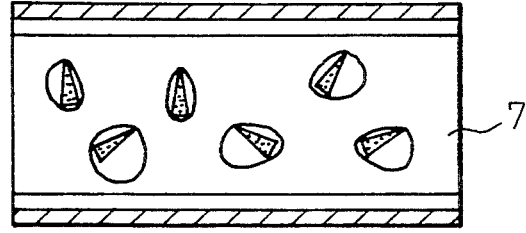
Figure 48D:
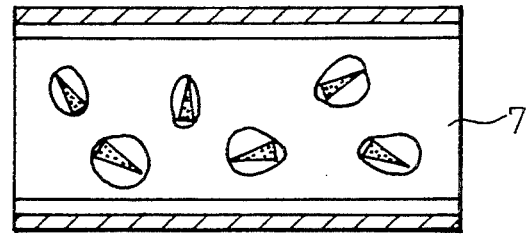

The data that was obtained is indicated in FIG. 45 for the first four layers. In the case of this example, as a result of switching over the projection of molecules over the course of 15 times, a film having a thickness of approximately 100 Å or less was able to be obtained.

Referring again to FIG. 39 and other diagrams, FIG. 39 is a schematic diagram of examples of molecules and the deposition states in the case of using molecule A, wherein different groups were selected from group I and used as addition groups, and molecule B, wherein different groups were selected from group II and used as addition groups. Since there is a difference of the reactivities between the addition groups of each molecule, the adsorbed molecules have specific directivity. Utilizing this fact, a non-linear optical film can be fabricated without performing polling as a result of giving directivity to the dipole moment of the molecules.

47). In FIGS. 46(A)-46(F) the ellipse symbolizes a molecular backbone, $R_1$ symbolizes a halogen such as Br or Cl, $R_2$ symbolizes H, Na or the like, D symbolizes a donor group and A symbolizes an acceptor group. When MLD is performed using such a molecule, a polymer can be fabricated in which a long conjugate chain is linked together as indicated in the following tables.

TABLE 16

| Molecule I | Molecule II |
|---|---|
| Br—C≡C—H | Br—C≡C—C—H |
| Resulting Polymer | |
| ${+}C{\equiv}C{)_n}$ | |

TABLE 17

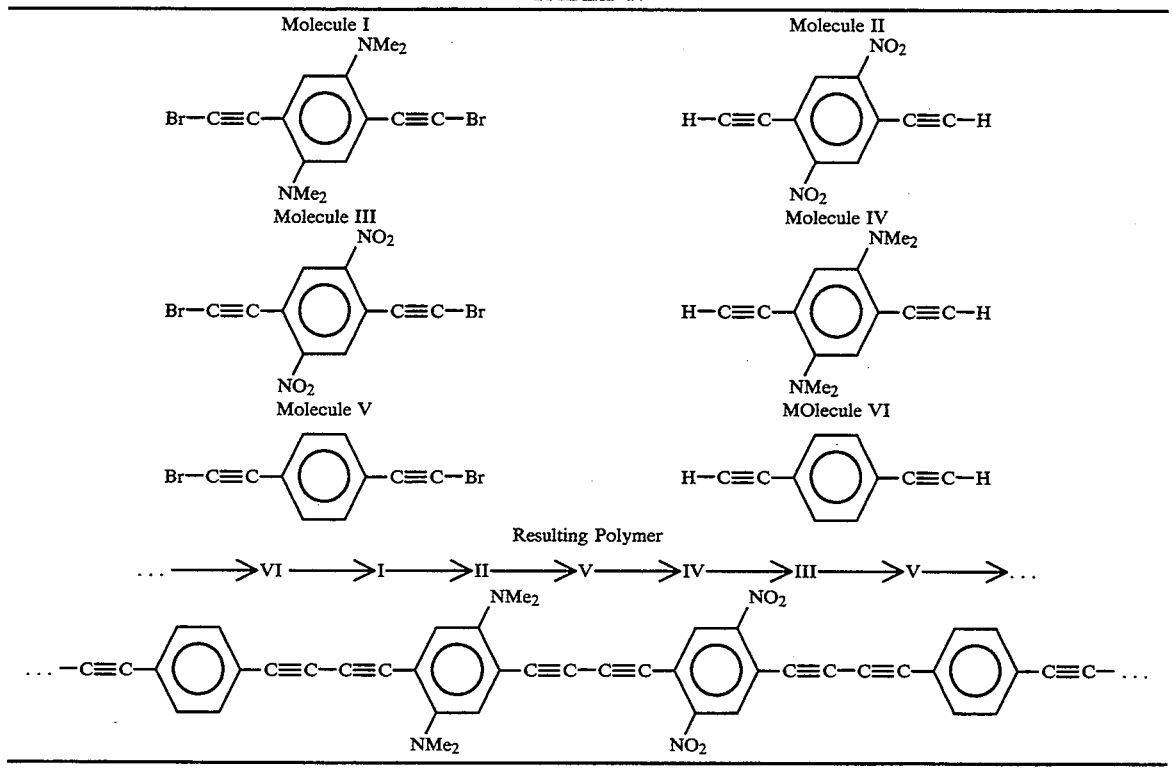

FIG. 40 is a schematic diagram of examples of molecules and deposition states in the case of using molecule A, wherein the same groups are selected from group I and used as addition groups, and molecule B wherein the same groups are selected from group II and used as addition groups, as well as giving different steric hindrances to the same groups of each molecule. In this case also, since differences in reactivity occur between the addition groups of each molecule in the same manner as the above-mentioned deposition of FIG. 39, the adsorbed molecules have specific directivity.

By forming a film while performing the above-mentioned electric field assist, a polymer film is obtained in which the molecules are oriented directly. In addition, the orientation of molecules can also be controlled by controlling the polarity of the voltage for each layer (FIG. 38).

In addition, as is indicated in FIGS. 46(A)-46(F), MLD can also be performed in the present invention using molecules such as those to which groups such as a halogen group or hydrogen have been added (an example of the molecular backbone is indicated in FIG.

As the locations of donor groups and acceptor groups in a polymer film obtained in this manner are precisely controlled, such a film demonstrates large non-linear optical effects. As was stated previously, polymers in which conjugate chains are linked together can also be fabricated by using a molecule having two or more —CHO groups and a molecule having two or more —NH₂ groups According to the present invention, an organic thin film can be obtained wherein the types of molecules are controlled for each molecular layer, thus being able to realize high-performance, multi-functional thin film materials including non-linear optical materials.

Further, the present invention provides an organic functional thin film comprised of a polymer of a plurality of types of molecules linked together in the manner of bonding with double or triple bonds, and possessing a portion in which the conjugate length between consecutive π electrons is 10 Å or more.

This polymer is preferably a polymer consisting of alternate bonding of molecules having a plurality of —CHO groups and molecules having a plurality of -NH2 groups, and sometimes may also be a microcrystalline substance.

The present invention provides also an organic functional thin film comprised of a polymer, consisting of a plurality of types of molecules linked together in the manner of bonding with double or triple bonds, wherein a portion of the conjugated system between molecular units participating in bonding is divided by single bonds.

The above-mentioned single bonds are preferably formed by bonding of groups contained in at least one portion of the above-mentioned plurality of types of unit molecules with other molecules, or introduced by copolymerization of molecules containing two or more consecutive single bonds.

The present invention provides further an organic functional thin film comprised of a polymer, consisting of a plurality of types of molecules in the manner of bonding with double or triple bonds, wherein at least one portion of the molecular units possesses donor and-/or acceptor characteristics.

These donor characteristics are provided by donor groups such as —NH2, —N(CH3)2, —OCH3 or —OH , and acceptor characteristics are provided by acceptor groups such as —NO2, —CN or —CF3. In addition, this polymer is a polymer formed by alternate bonding of molecules having a plurality of —CHO groups and molecules having a plurality of —NH2 groups, and may sometimes be a microcrystalline substance. Alternatively, this polymer is preferably a polymer wherein a portion of the conjugated system between molecular units participating in bonding is divided by single bonds, and these single bonds are either formed by bonding of groups contained in at least one portion of the above-mentioned plurality of types of unit molecules with other molecules, or introduced by copolymerization of molecules containing two or more consecutive single bonds.

The present invention provides further a process for fabrication of an organic functional thin film as mentioned above wherein molecules are either introduced in a vacuum or evaporated in a vacuum and bonded and/or polymerized on a substrate to form a thin film.

The organic functional thin film of the present invention can be used over a wide application range including non-linear optical materials, optical waveguides, p- or n-semiconductors, pn junctions, TFT, electronic devices and light emitting devices.

The following provides a detailed description of the preferred embodiments of the present invention. Examples of molecule useful for obtaining the polymer of the present invention are indicated below.

The following are examples of molecules having two or more —CHO groups having weak donor or acceptor characteristics or similar properties.

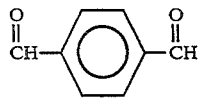

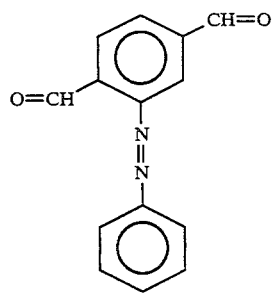

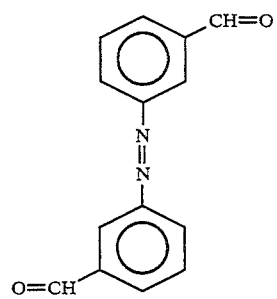

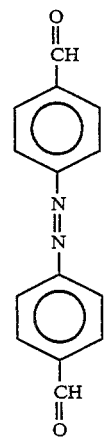

The following are examples of molecules having two or more —NH2 groups having weak donor or acceptor characteristics or similar properties.

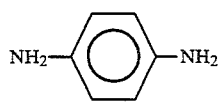

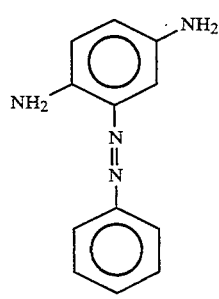

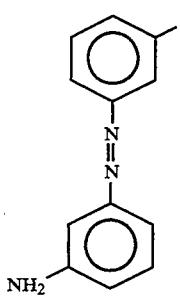

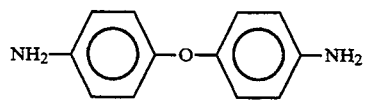

—O— may be replaced by —S—, —CH$_2$—, etc.

NH$_2$—(CH$_2$)n—NH$_2$

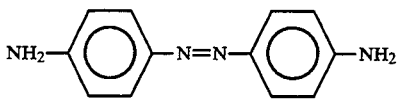

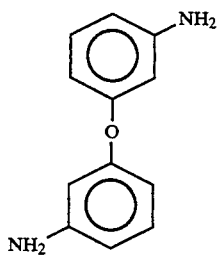

—O— may be replaced by —S—, —CH$_2$—, etc.

The following are examples of molecules having two or more —CHO groups and containing two or more consecutive single bonds.

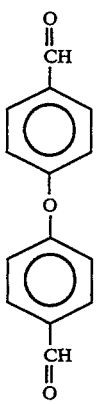

The following are examples of molecules having two or more —CHO groups as well as acceptor characteristics.

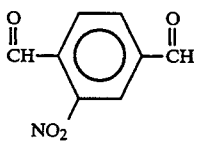

—O— may be replaced by —S—, —CH$_2$—, etc.

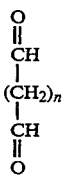

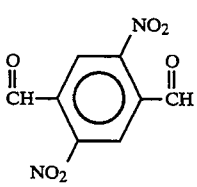

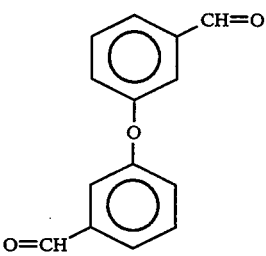

—O— may be replaced by —S—, —CH$_2$—, etc.

The following are examples of molecules having two or more —NH$_2$ groups and containing two or more consecutive single bonds.

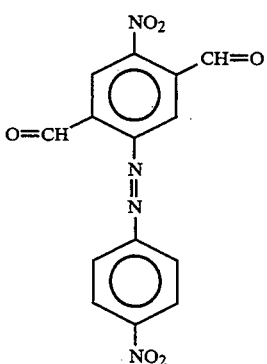

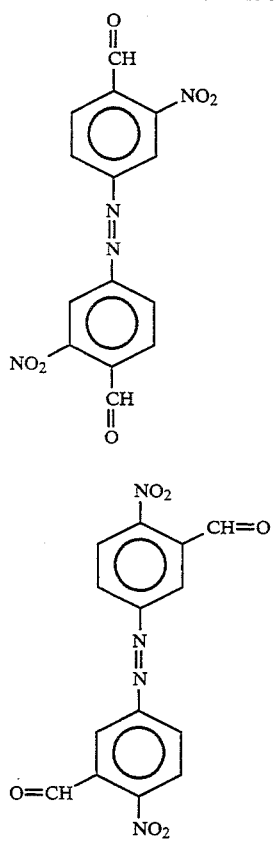
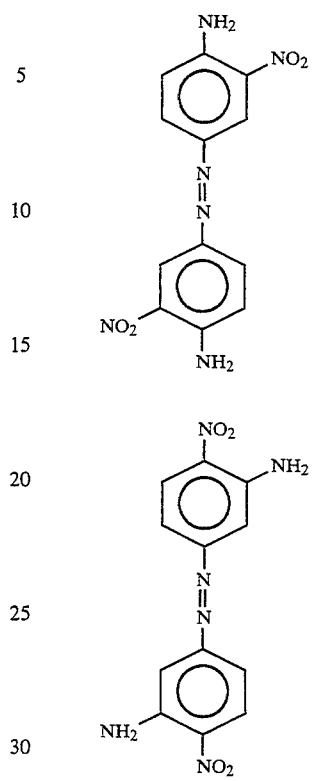
The following are examples of molecules having two or more NH₂ groups as well as acceptor characteristics.
The following are examples of molecules having two or more —CHO groups as well as donor characteristics.
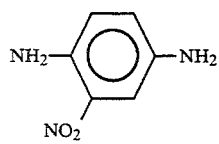
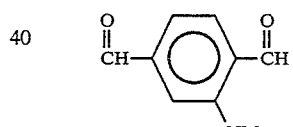
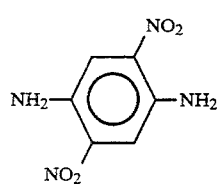
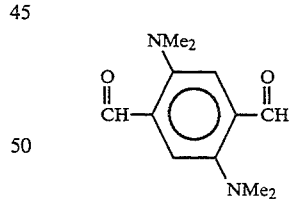
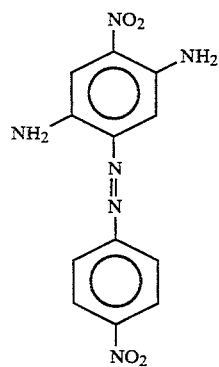
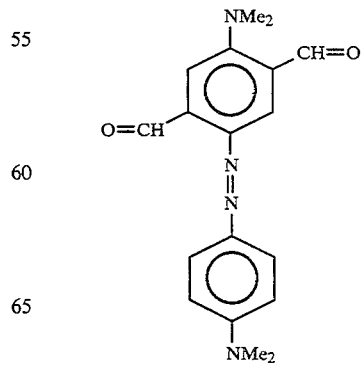

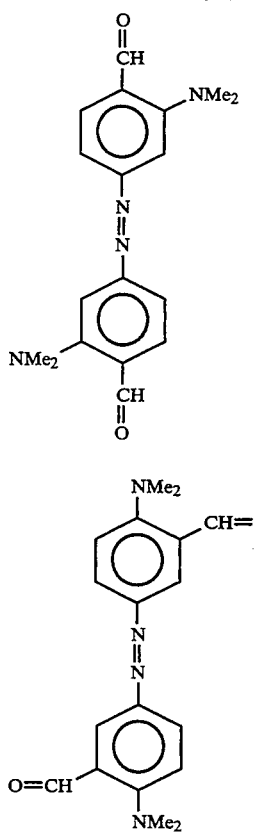
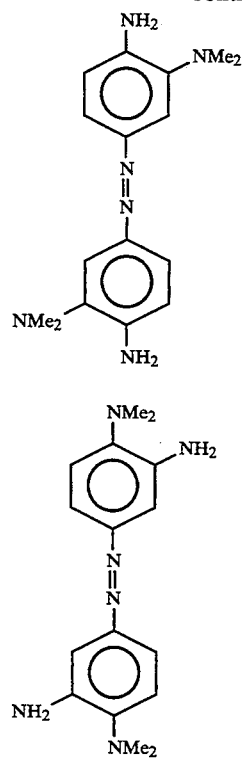
The following are examples of molecules having two or more —CHO groups as well as both acceptor and donor characteristics.
The following are examples of molecules having two or more —NH₂ groups as well as donor characteristics.
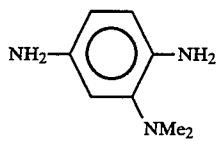
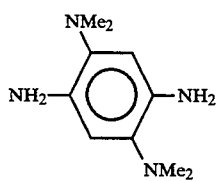
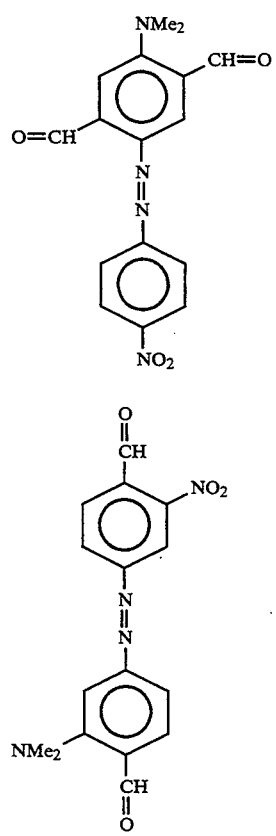
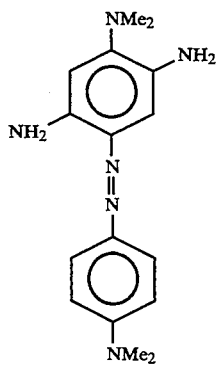

-continued

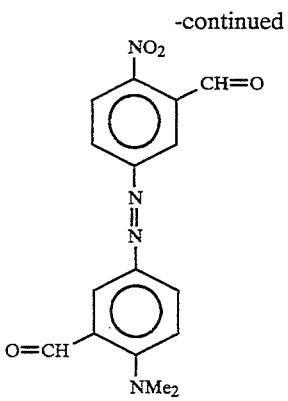

The following are examples of molecules having two or more —NH₂ groups as well as both acceptor and donor characteristics.

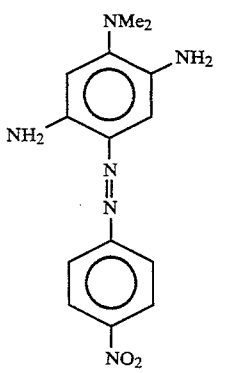

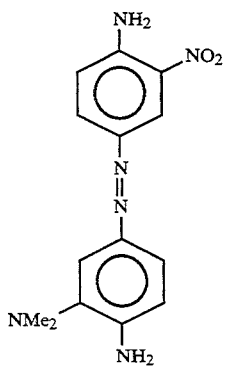

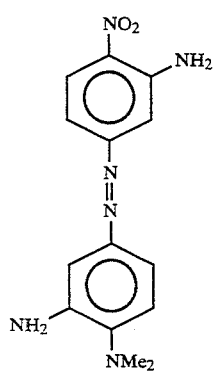

In addition, the following indicates examples of groups which form single bonds by reaction with another molecule in the manner mentioned above.

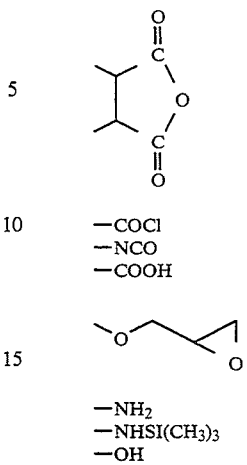

—COCl
—NCO
—COOH

—NH₂
—NHSI(CH₃)₃
—OH

Figure 49:
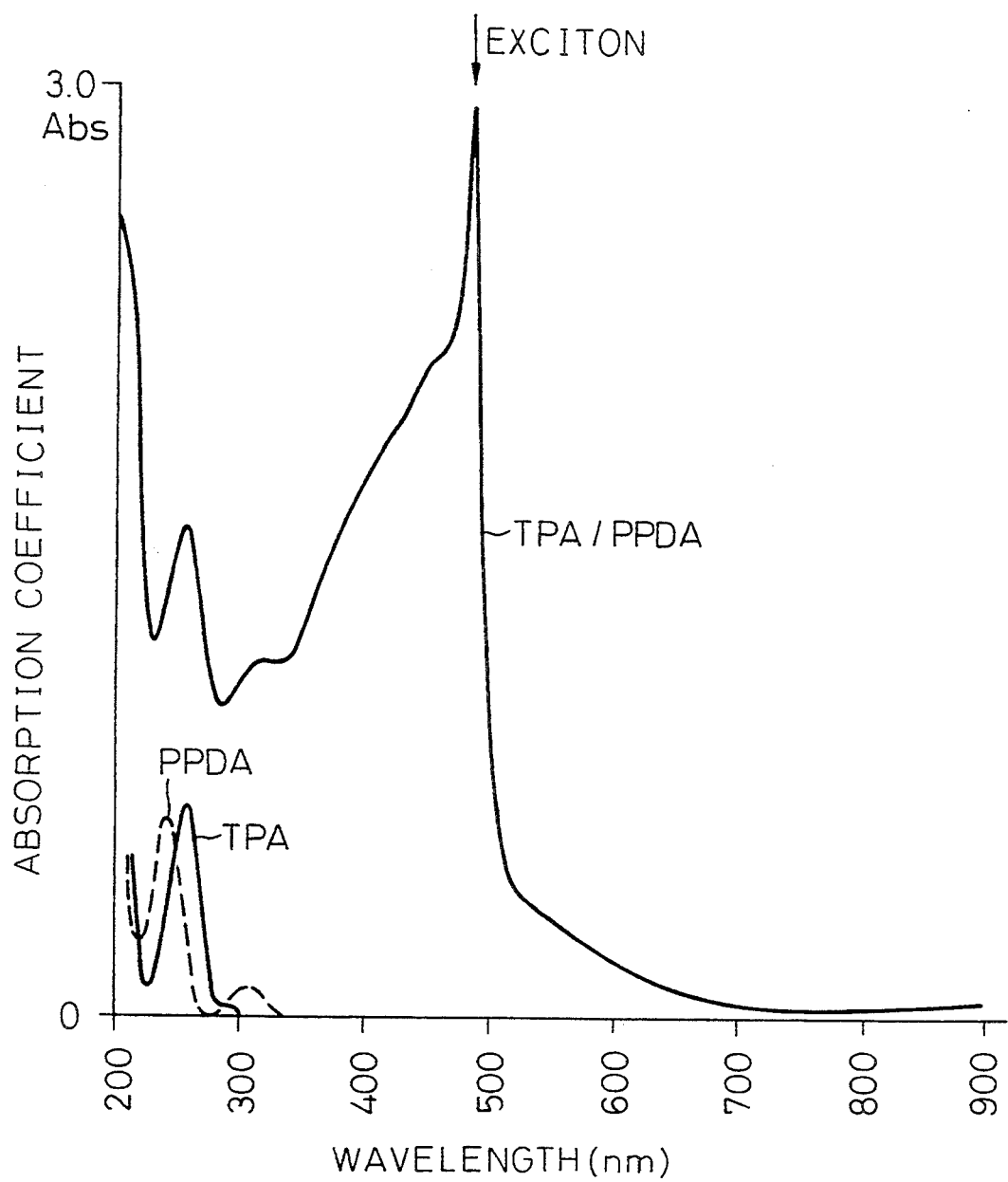
FIG. 49 is a diagram of the absorption spectrum of one example of the film according to the present invention.
Figure 52A:
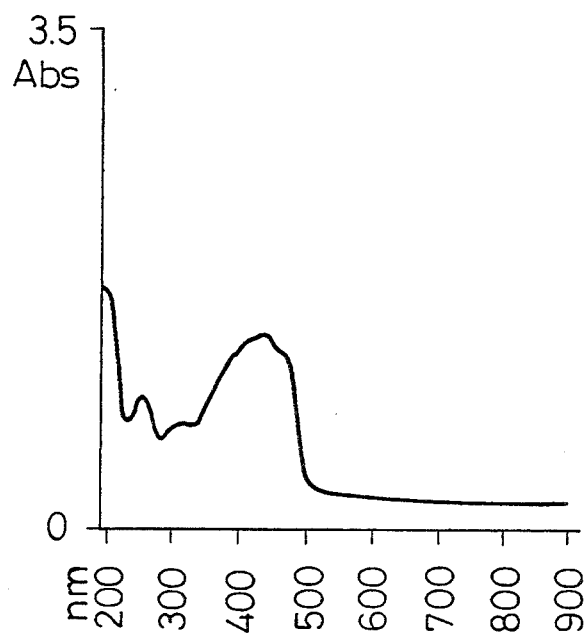
FIGS. 52 (a) and (b) are diagrams of the absorption spectra of another example of the film related to the present invention.
Figure 52B:
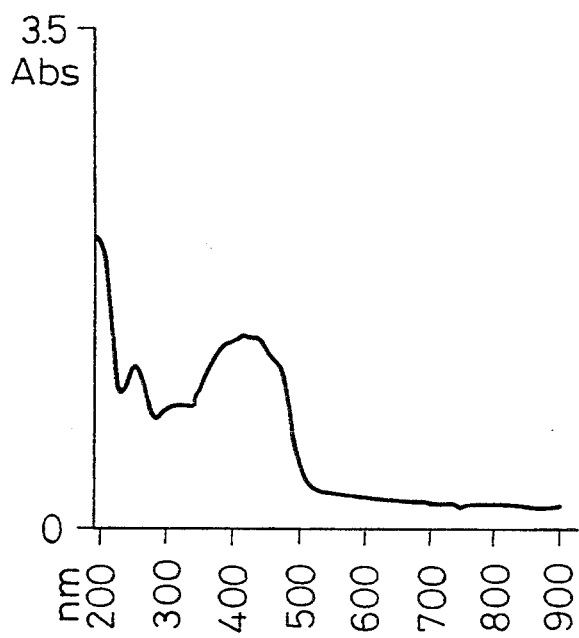
Figure 58:
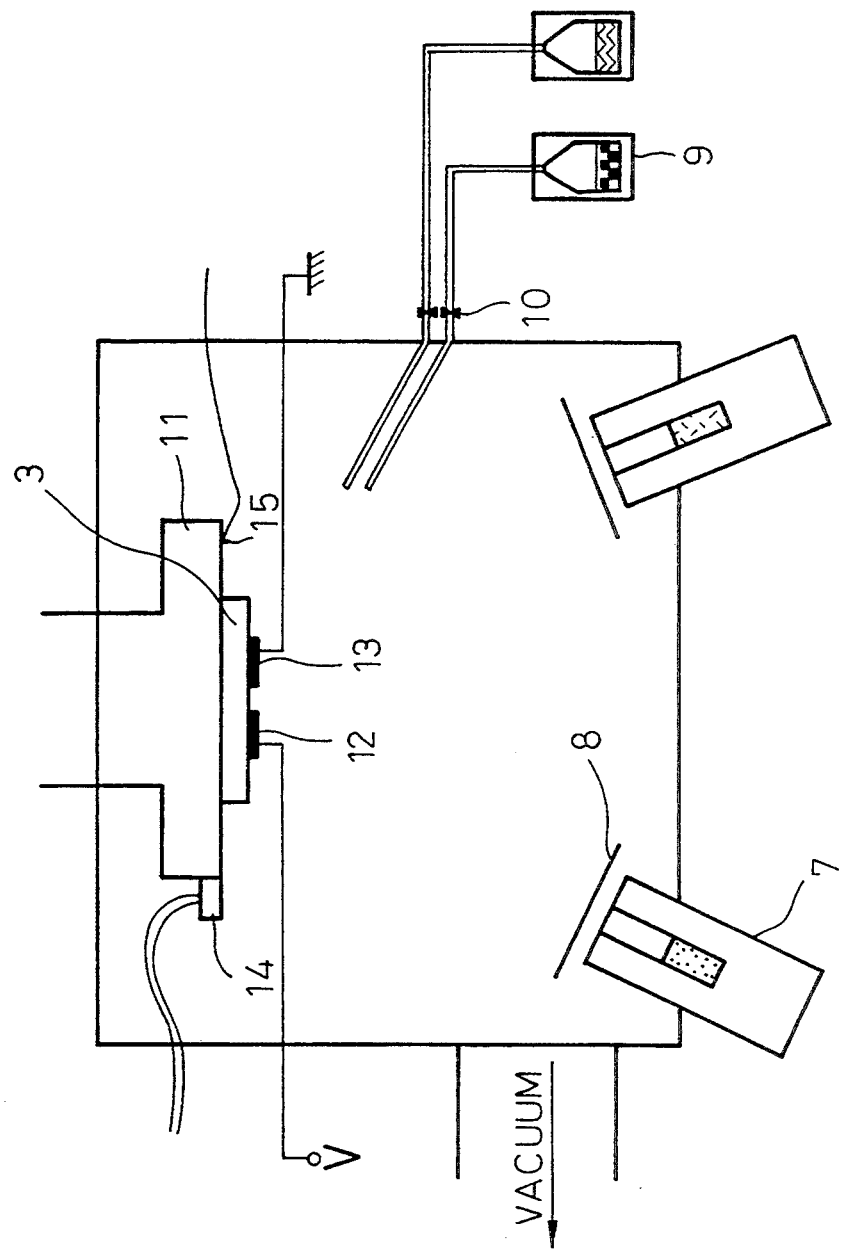
FIG. 58 is a schematic diagram indicating a deposition system useful for performing MLD.

The absorption spectra of films made from terephthal-aldehyde (TPA) and para-phenylenediamine (PPDA) by CVD (chemical vapor deposition) under various conditions using, for example, the deposition system shown in FIG. 58 are shown in FIGS. 49–52. FIG. 49 is the absorption spectrum of a film made at a gas pressure of $2-10 \times 10^{-3}$ torr, a substrate temperature of 24° C. and a rate of 100–300 Å/min. The absorption of methanol solutions of PPDA and TPA are also shown. PPDA or TPA alone are transparent in the visible region. On the other hand, the film demonstrates strong absorption in the region of 500–350 nm. This indicates that long conjugate bonds of 10 Å or more have been obtained. Moreover, excitons can be produced from the film of the present invention as can be confirmed by the sharp absorption peak in the vicinity of 480 nm. This finding also supports the formation of a long conjugate polymer. On the other hand, as is shown in FIG. 50, when the substrate is tilted towards the incident light during measurement of the absorption spectrum, absorption of excitons decreases as the incident angle θ of the light changes from 0° to 45° and 60° in the case of a rapid deposition rate on the order of 60–100 Å/min. This indicates that in the case of a rapid deposition rate, well-formed conjugate chains tend to grow in a direction parallel to the substrate. On the other hand, as is shown in FIG. 51, when deposition is performed at a rate of 20–60 Å/min., exciton absorption conversely increases remarkably when the angle of inclination of the substrate is increased. Thus, this indicates a tendency in which well-formed conjugated systems grow in a direction perpendicular to the substrate. In this manner, the present invention allows orientation to be controlled according to the deposition conditions. Furthermore, in the case of film thickness being thin or the deposition rate being extremely slow on the order of 0.5 Å/min. as in FIG. 52, there is virtually no production of excitons. In addition, when deposition is performed after cooling the substrate to a temperature of 0° C. or less, a sharp exciton absorption peak is observed. These findings reveal that the use of optimal deposition conditions is indispensable to the fabrication of conjugate polymers.

The following are examples of the polymer in the present invention wherein a portion of the conjugated system between molecular units is divided by single bonds.

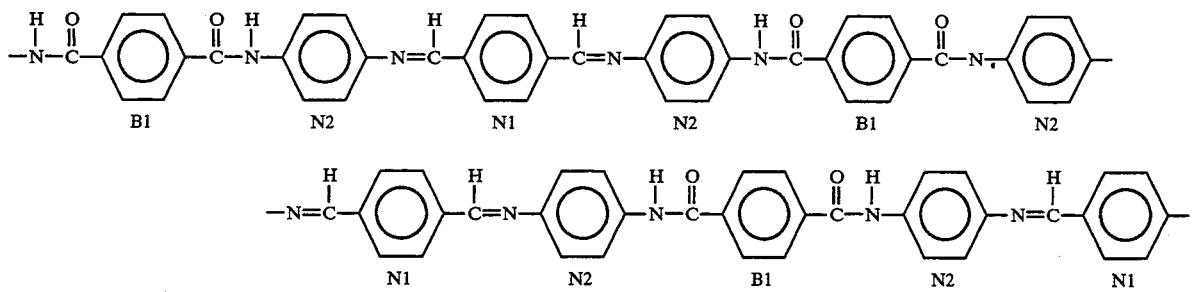

The polymer is obtained by bonding, for example, the following molecules in the proper order.

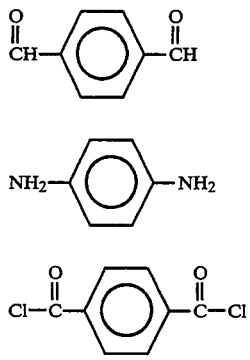

The following is another example of said polymer.

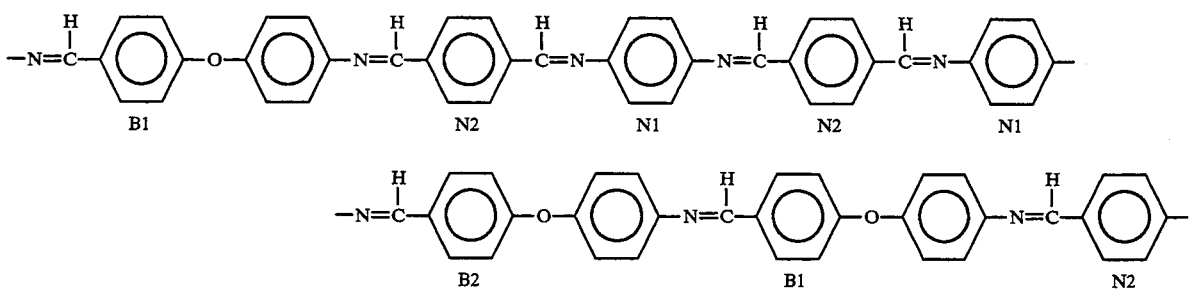

The polymer is obtained by bonding, for example, the following molecules in the proper order.

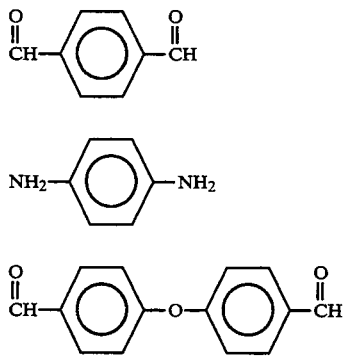

In addition, a polymer can also be obtained, for example, forming a quantum dot as shown in FIG. 53 by bonding these molecules in the proper order. Not only does such a polymer demonstrate quantum effects, but is also effective in making conjugate length uniform.

Figure 61:
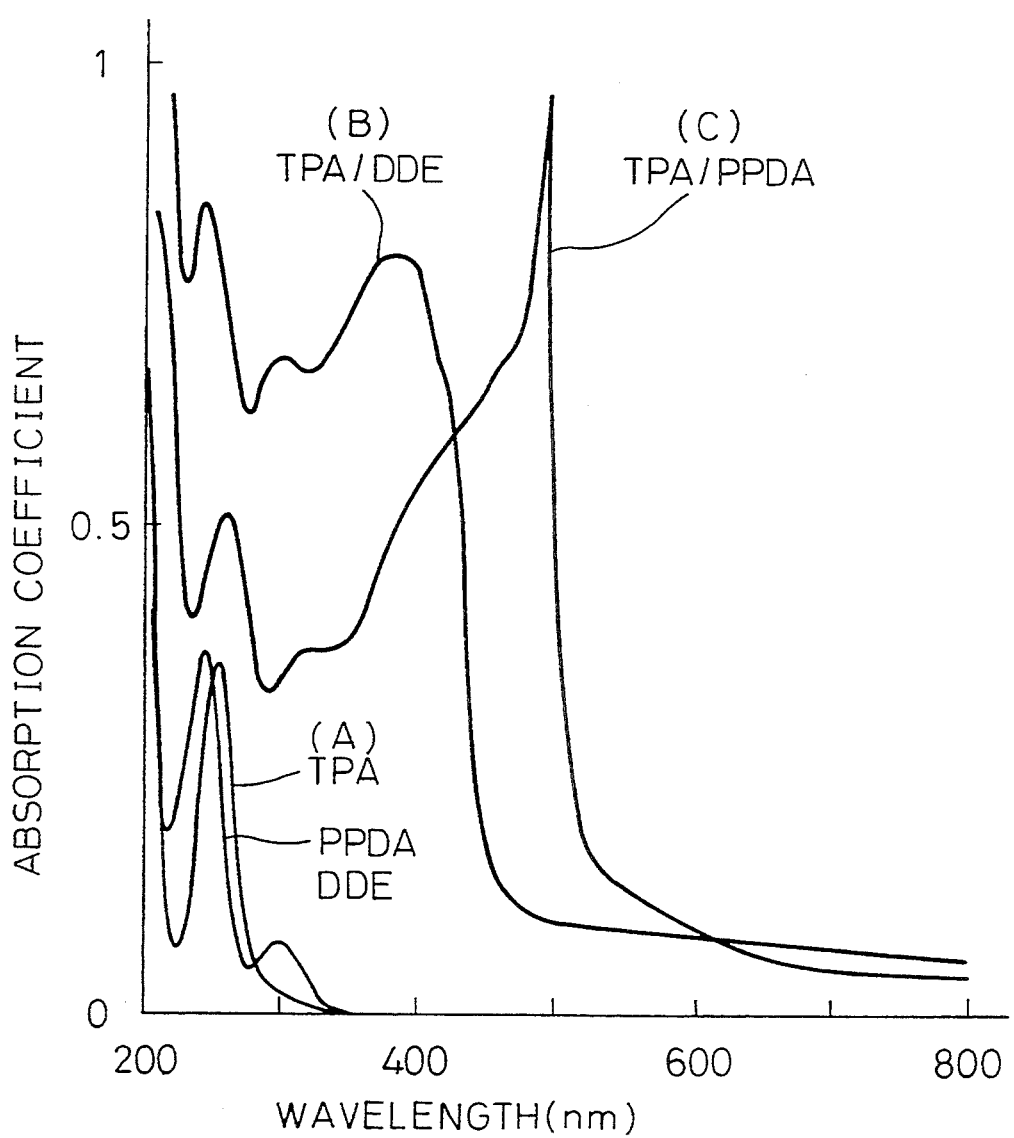
FIG. 61 is a diagram indicating the absorption curve measured for one example of the polymer related to the present invention.

FIG. 61 is a diagram indicating an absorption curve measured for one example of a polymer having a quantum dot structure according to the present invention. In the diagram, (A) indicates the respective absorptions of the molecules composing the measured polymers, or more specifically, terephthalaldehyde (TPA), para-phenylenediamine (PPDA) and 4,4'-diaminodiphenyl ether (DDE). (B) and (C) indicate the absorptions of the respective polymers. Quantum dot structure is not formed in the case of (C). In (B), a quantum dot having a length of roughly 20 Å is formed containing three benzene rings with —O— bonds functioning as barriers. (C) contains a quantum dot having a short well length comprised of a single benzene ring. The absorption bands shift towards shorter wavelengths in the order of (C), (B) and (A). This is considered to be due to electron confinement by quantum dots.

Figure 54:
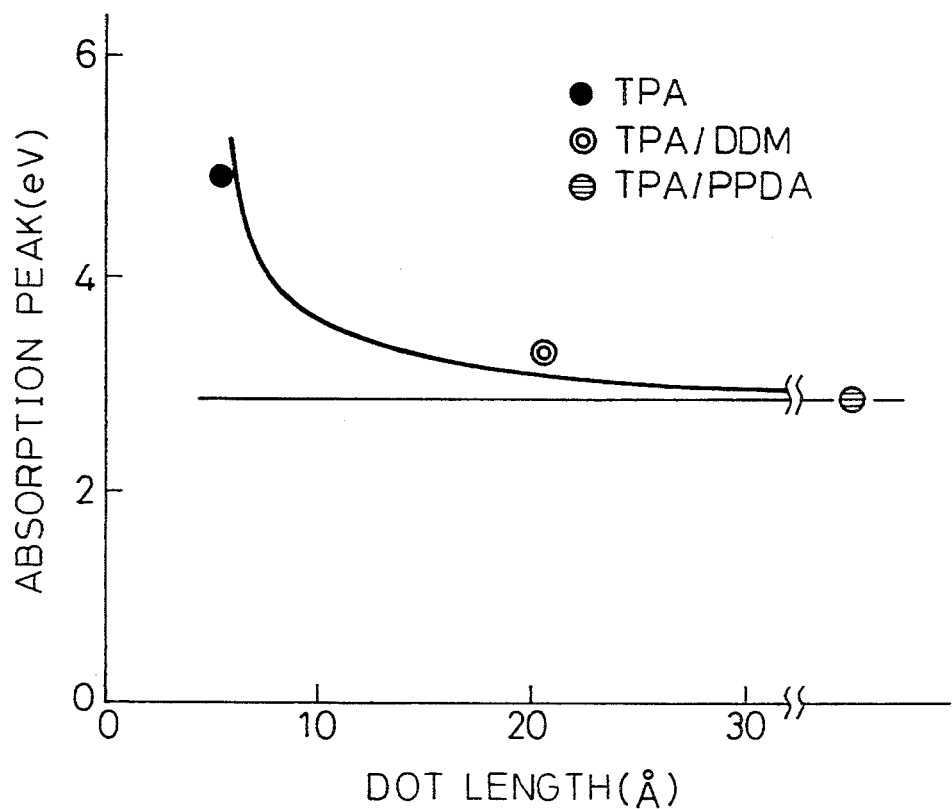
FIG. 54 is a diagram indicating the relationship between length of the well portion and absorption peak in the polymer molecule of the present invention.
Figure 55:
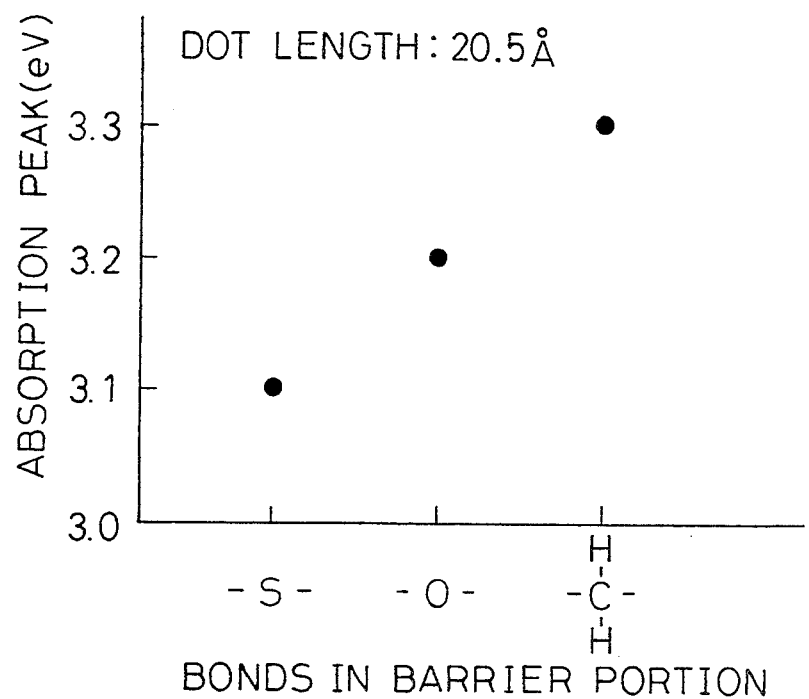
FIG. 55 is a diagram indicating absorption peaks resulting from differences in the bonding groups of the barrier portion in the polymer molecule of the present invention.
Figure 62A:
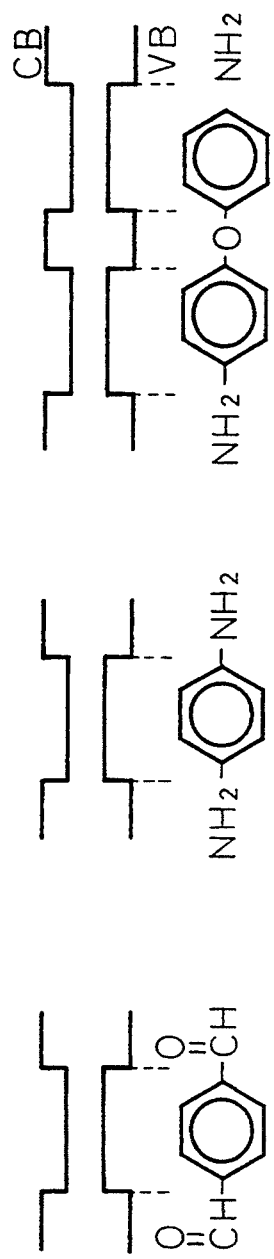
FIGS. 62 (A)–(C) are diagrams indicating the composition of the molecules with absorption spectra shown in FIG. 61.
Figure 62B:
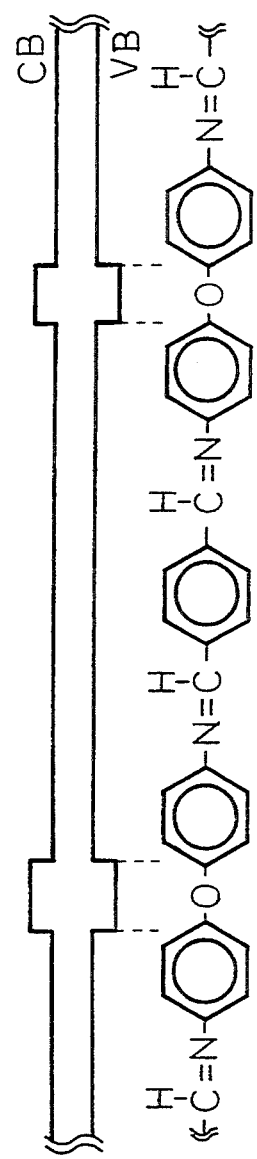
Figure 62C:
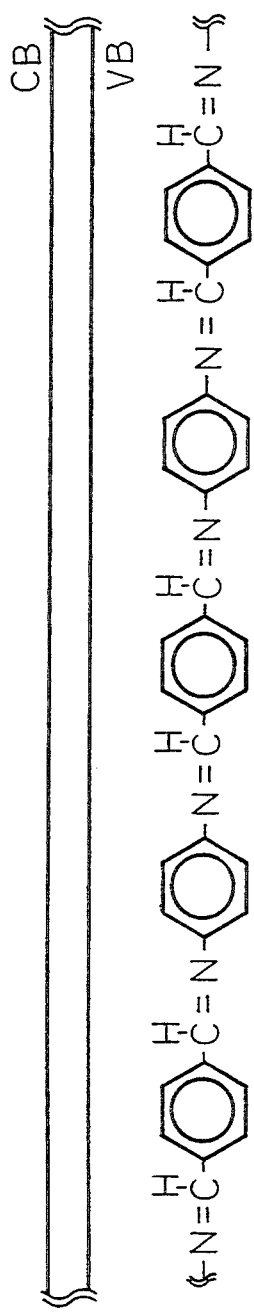

In addition, when absorption peaks resulting from differences in the bonding groups of the barrier portion of said polymer were measured, the results indicated in FIG. 55 were obtained. When molecules having —S— or —(CH$_2$)— groups instead of —O— are used, —O— changes to —S— or —(CH$_2$)— as indicated below. The locations of the absorption peaks (reflecting the energy gaps) shifted towards higher energy levels in the order of —S—, —O— and —(CH$_2$)—. This indicates that barrier height increases and electron confinement effects become greater in this order. When the relationship between the length of the dot portion and absorption peak were measured for the polymer molecule of the present invention, shown in FIG. 53 and in greater detail in FIG. 62, results were obtained in which the peak demonstrated a blue shift accompanying shorter dot length as shown in FIG. 54 (indicated with circles). These results closely coincide with the calculated curve of the well potential model. The formation of such quantum dots is effective for realizing various functional devices including third-order non-linear optical materials.

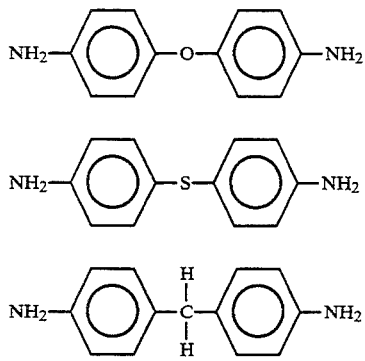

Figure 56:
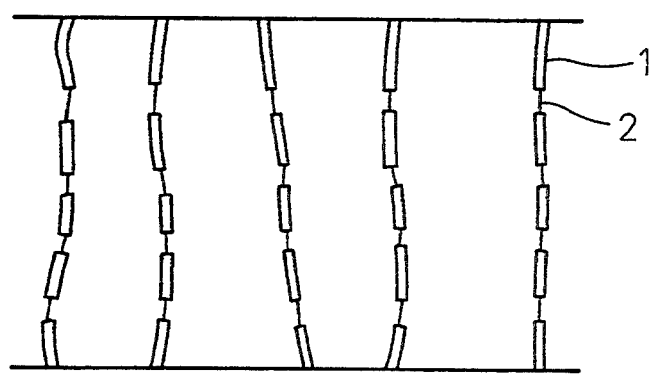
FIG. 56 is a schematic diagram of the structure of a cross-section of a film when the conjugate chain has been deliberately divided by single bonds.

FIG. 56 is a schematic diagram of the structure of a cross-section of a film when the conjugate chain is deliberately divided by two or more single bonds. In this diagram, 1 indicates a conjugate portion (dot portion) and 2 indicates a non-conjugate portion (barrier portion). The orientation of the molecules is not limited to the vertical orientation indicated in the diagram, but may also be in a horizontal or diagonal orientation as well as a mixture of all three.

Figure 57:
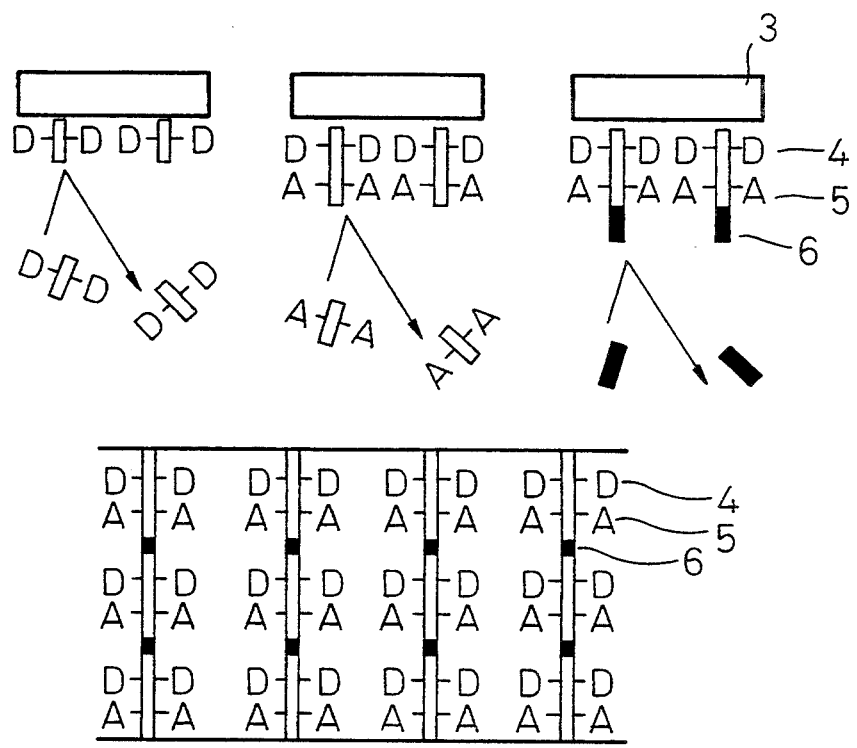
FIG. 57 is a diagram indicating the principle of MLD.

CVD or MBD has been used in the past as a process for fabricating a film like that described above. More advanced processes for the same purpose include MLD which has been previously proposed. The principle of MLD is shown in FIG. 57. As shown in this diagram, a film can be formed by sequentially depositing, for example, molecular layer 4 having donor characteristics, molecular layer 5 having acceptor characteristics and molecular layer 6 functioning as a barrier, on substrate 3 one molecular layer at a time. Naturally, the types of molecules, deposition sequence and number of layers are not limited to those shown in the diagram, but can be changed arbitrarily.

Figure 70:
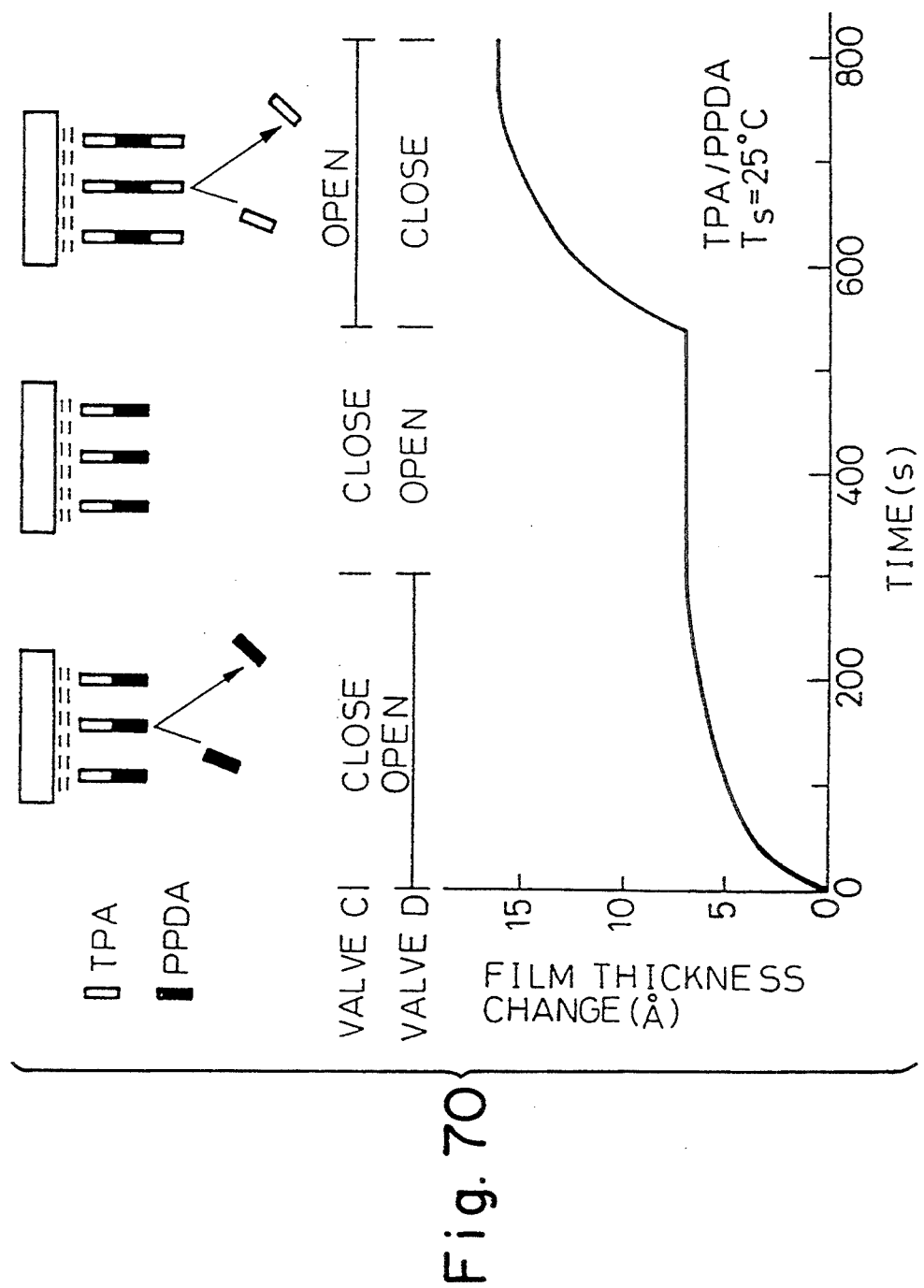
FIG. 70 is a diagram explaining an example of MLD using TPA and PPDA.

Said MLD can be performed using, for example, a deposition system like that indicated in FIG. 58. In addition, CVD and MBD can also be performed using a similar system. This system is equipped with two K cells 7 for molecule evaporation (equipped with shutters 8), and two monomer gas tanks or monomer gas supply cells 9 (equipped with valves 10). In this system, substrate 3 held in position by substrate holder 11 can be both heated and cooled, and a voltage can be applied between electrodes 12 and 13 formed on the substrate. However, electrode formation and application of an electric field are not necessarily required. In addition, the film thickness of the polymer film formed on substrate 3 can be monitored by film thickness monitor 14, and substrate temperature can be controlled by means of thermocouple 15. Naturally, the number of K cells for molecule evaporation along with the number of monomer gas tanks or monomer gas supply cells are not limited to those indicated in the diagram. In addition, it is desirable that various methods, such as that employing an optical monitor, be used in combination for monitoring of film thickness. FIG. 70 indicates an example of MLD using TPA and PPDA. The deposition process for each molecular layer deposited can be observed with the film thickness monitor by appropriate switching of gas molecule valves. The speed at which deposition is performed can be changed by adjusting substrate temperature, gas pressure and so on.

Figure 59A:
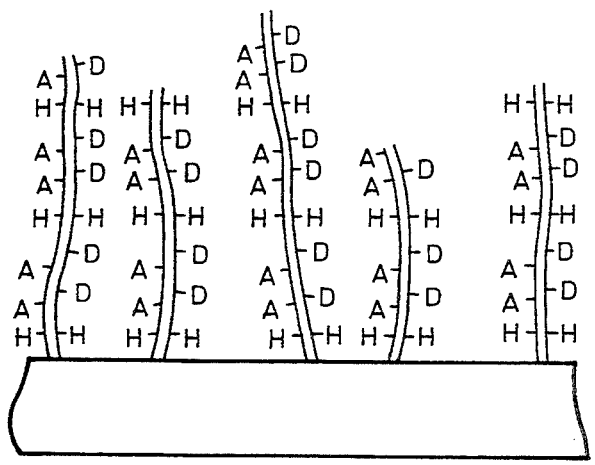
FIGS. 59 (a) and (b) are diagrams explaining one of the advantages of deposition by MLD.
Figure 59B:
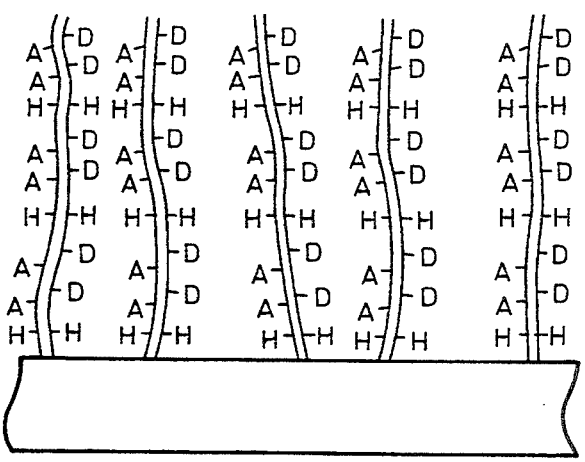

As MLD allows the fabrication of films on the order of single molecules as described above, not only is it extremely effective, but it also greatly contributes to improvement of film flatness as shown in FIG. 59. In other words, in the case of method (a) of the prior art, the surface is susceptible to roughing due to each molecular chain growing randomly at each location. In contrast, in the case of MLD (b), the surface tends to be smooth since each molecular chain grows simultaneously one molecule at a time.

Figure 60:
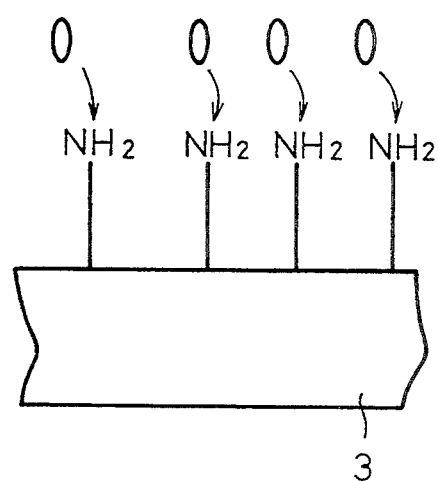
FIG. 60 is an explanatory diagram in the case a substrate is treated in advance with a silane-based surface active material having terminal amino protons.

Said MLD allows the orientation of polymer molecules to be controlled by treatment of the substrate. For example, if substrate 3 is treated in advance with a silane-based surface active material having terminal amino protons as indicated in FIG. 60, it becomes easy for the film above it to grow vertically from the substrate. In addition, it is known that if a film of 1,10-diaminodecane is formed in advance, the film above that film is oriented vertically (A. Kubono, N. Okui, K. Tanaka, S. Umemoto and T. Sakai, Thin Solid Films, 199, 385 (1991)), and the use of this technique is also one method to control the orientation of polymer molecules. These orientation treatment processes can also be applied to CVD as well as MLD.

Moreover, the following is an example of a polymer of the present invention having both donor groups and acceptor groups.

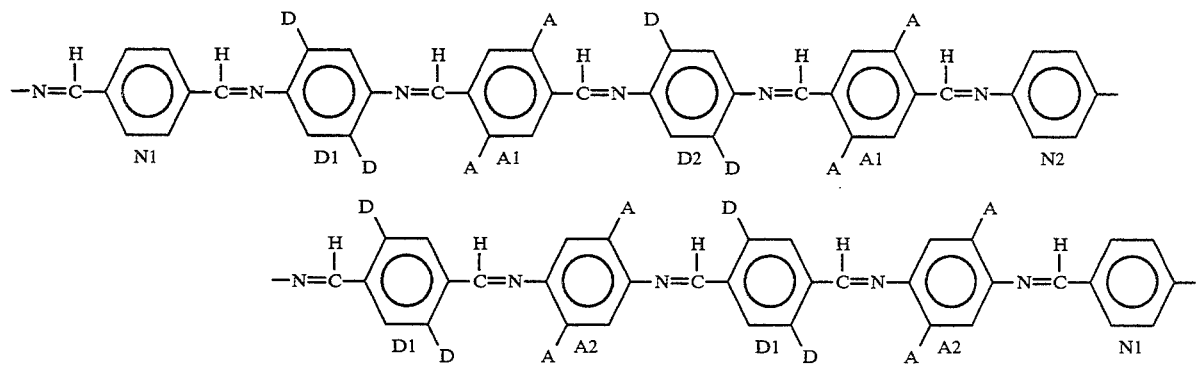

This polymer is obtained by bonding, for example, the following molecules in the proper order.

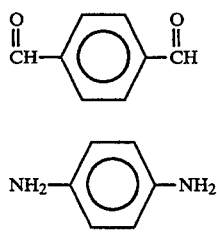
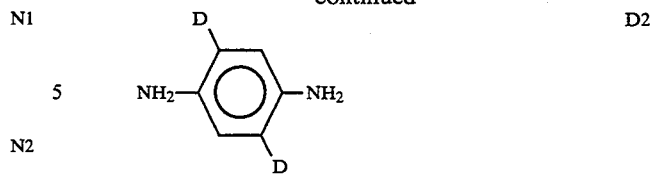
The following is another example of said polymer.
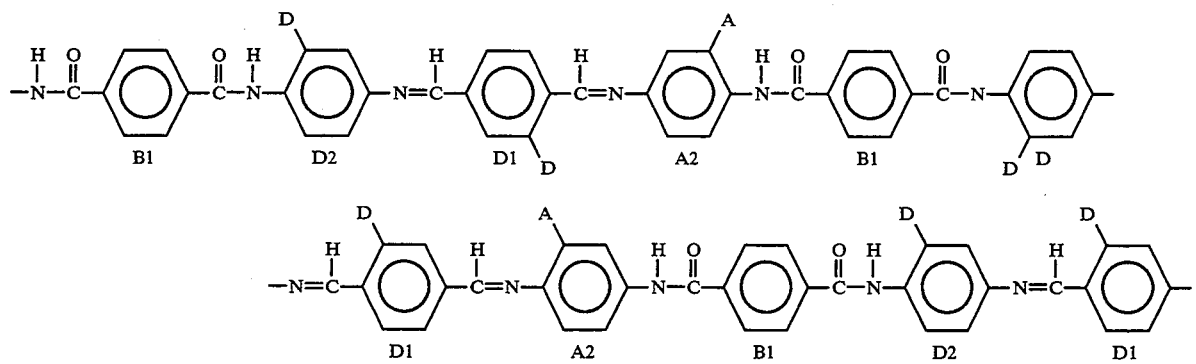
This polymer is obtained by bonding, for example, the following molecules in the proper order.
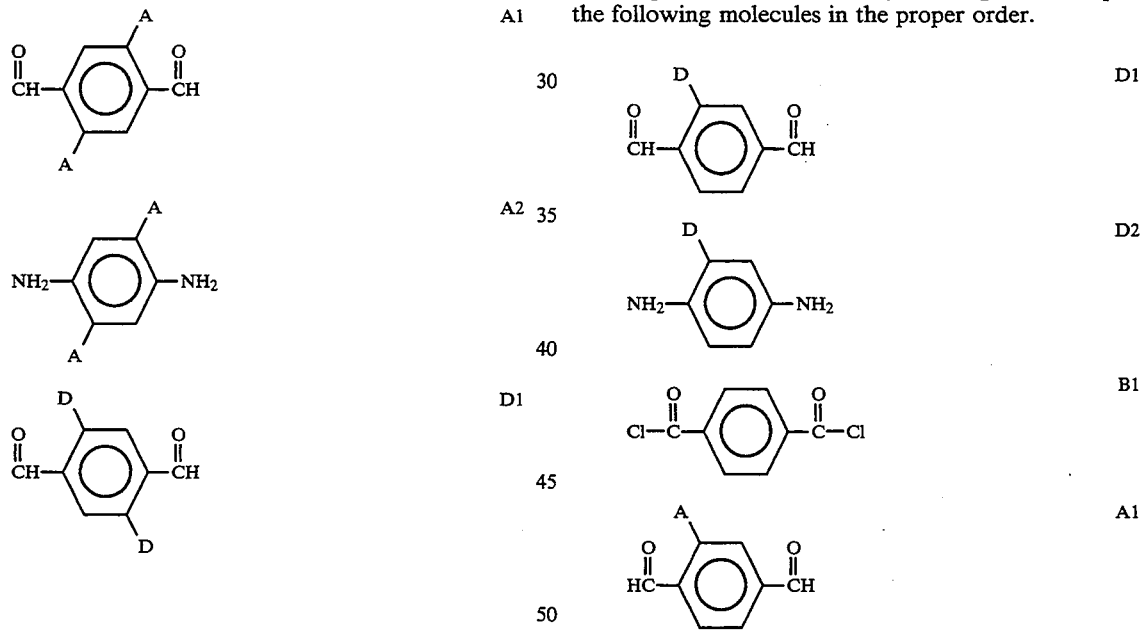
The following is another example of said polymer.
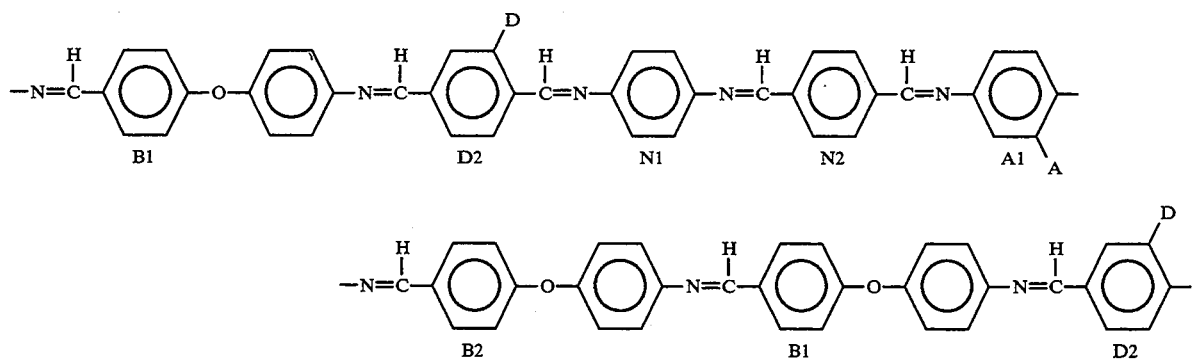

This polymer is obtained by bonding, for example, the following molecules in the proper order.

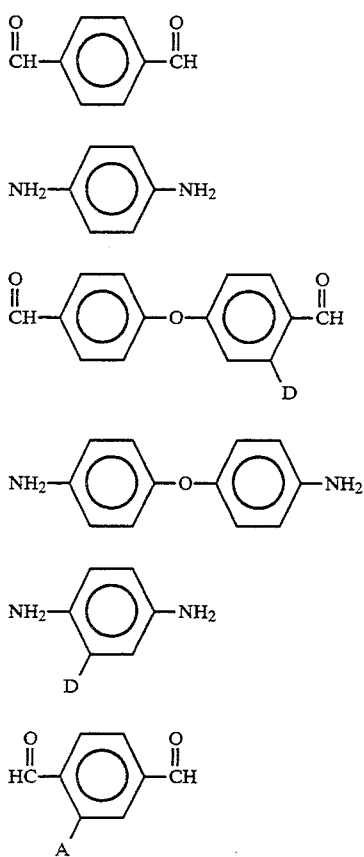

Figure 63:
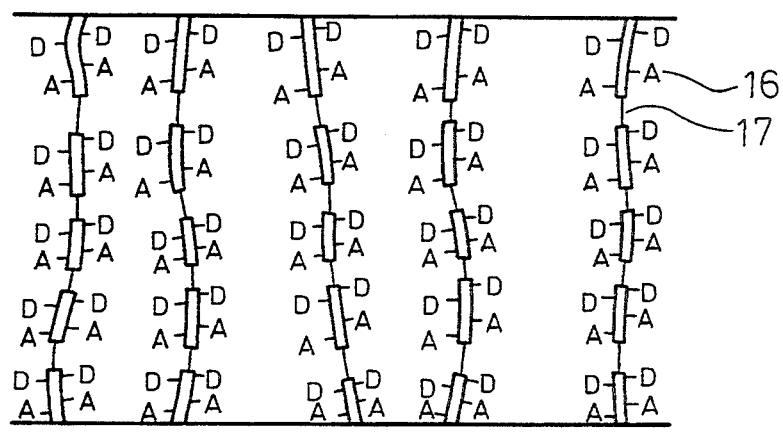
FIG. 63 is a schematic diagram indicating the structure of a cross-section of another example of a film when the conjugate chain is deliberately divided by single bonds.

FIG. 63 is a schematic diagram of the structure of a cross-section of a film when the conjugate chain is deliberately divided by single bonds. In this diagram, 16 indicates a conjugate portion (dot portion) and 17 indicates a non-conjugate portion (barrier portion). In this case, both donor groups (D) and acceptor groups (A) are present in the conjugate portion. This film shows a considerable Pockels effect. Furthermore, the orientation of the molecules is not limited to the vertical orientation indicated in the diagram, but may also be in a horizontal or diagonal orientation as well as a mixture of all three.

Figure 64:
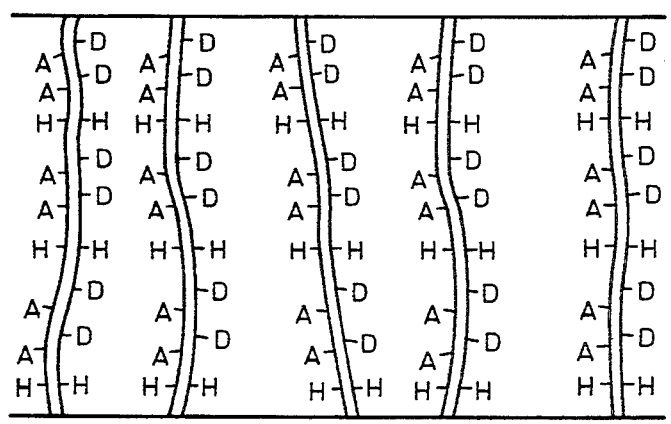
FIG. 64 is a schematic diagram of a polymer containing neutral molecular units having neither donor or acceptor characteristics.
Figure 65A:
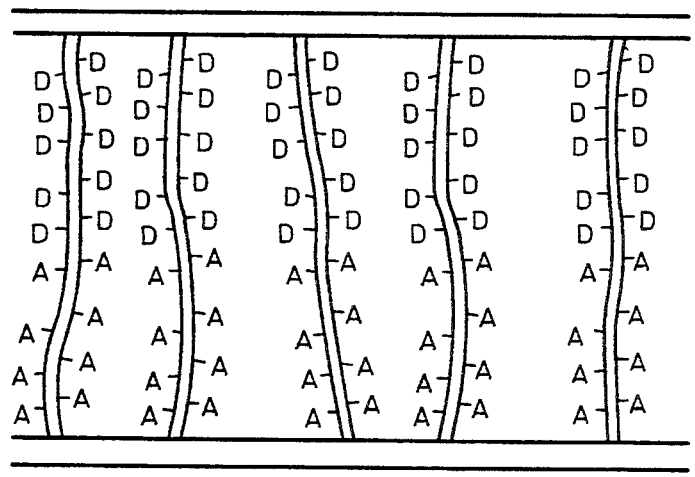
FIGS. 65 (a) and (b) are diagrams indicating examples of n- and p-type semiconductors using the polymer related to the present invention.
Figure 65B:
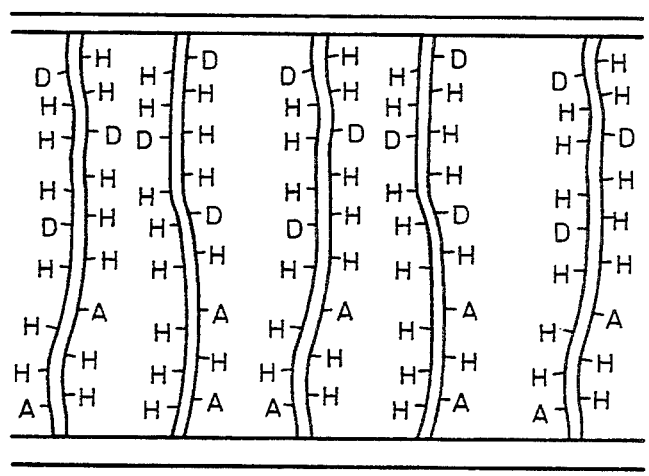

Although the conjugated system in the polymer depicted in the schematic diagram of FIG. 64 is connected, it contains neutral molecular units which have neither donor or acceptor characteristics (H). FIG. 65 shows examples of n- and p-semiconductors made by adding D and A groups to the conjugate chain. Electrons mainly flow along the conjugate chain. In addition, the strength of n and p can be adjusted by the amount of D and A groups added. In this example, a pn junction was formed. Individual n- and p-semiconductors can also be made. These devices function as photodiodes and LED. Moreover, laser generation is also possible by introducing a resonator structure.

Figure 66:
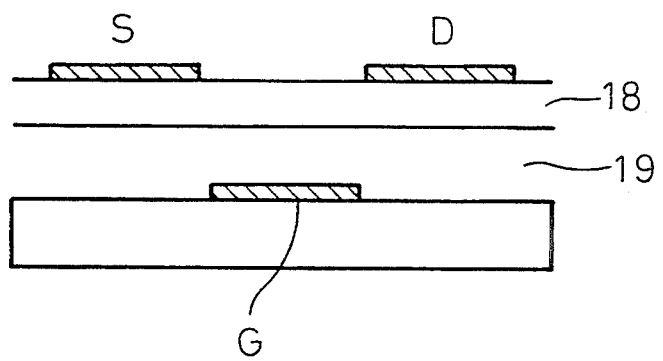
FIG. 66 is a diagram indicating an example of a TFT using the conjugate polymer related to the present invention.
Figure 67:
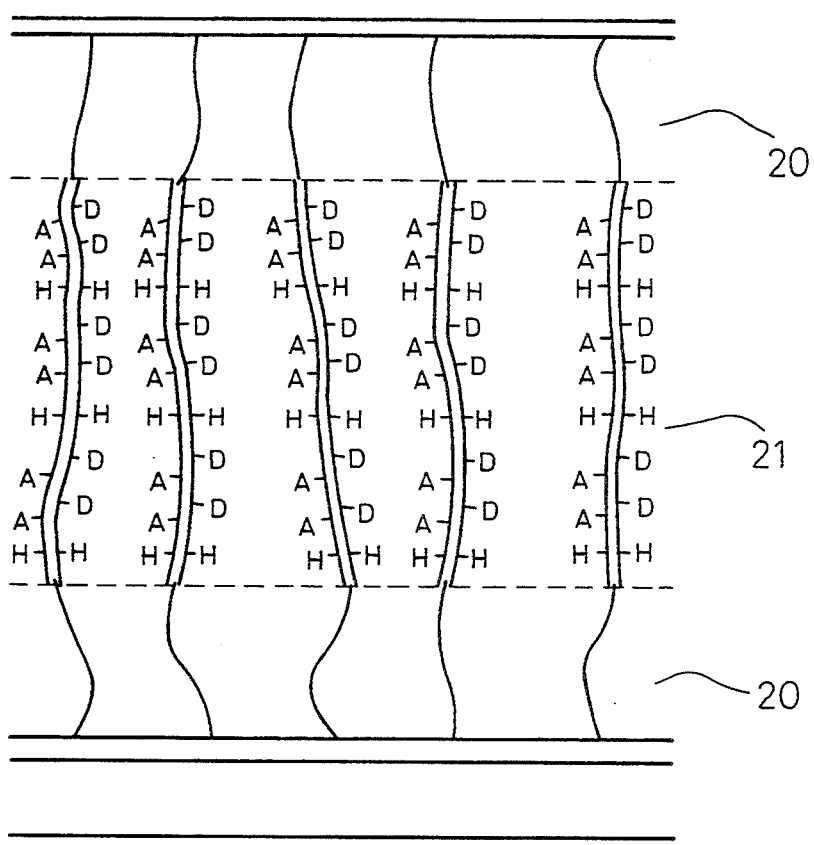
FIG. 67 is a diagram indicating an example of an optical waveguide using the conjugate polymer related to the present invention.

FIG. 66 is an example of a TFT using the conjugate polymer related to the present invention. A polymer having both D and A groups is used as the composite material of organic thin film layer 18. In this diagram, 19 represents a gate insulator. FIG. 67 is an example of an optical waveguide. This optical waveguide is made by having buffer layer 20, non-linear optical material layer 21 and buffer layer 20 appearing consecutively on the polymer chain. The buffer layer is mainly composed of single bonds and has a low refractive index. In this case, the buffer layer may be formed with a conjugate polymer. The difference between the refractive indices of the non-linear optical material layer and the buffer layer can be varied by adjusting the proportion of conjugate bonds and single bonds or by adjusting substitution groups.

Figure 68:
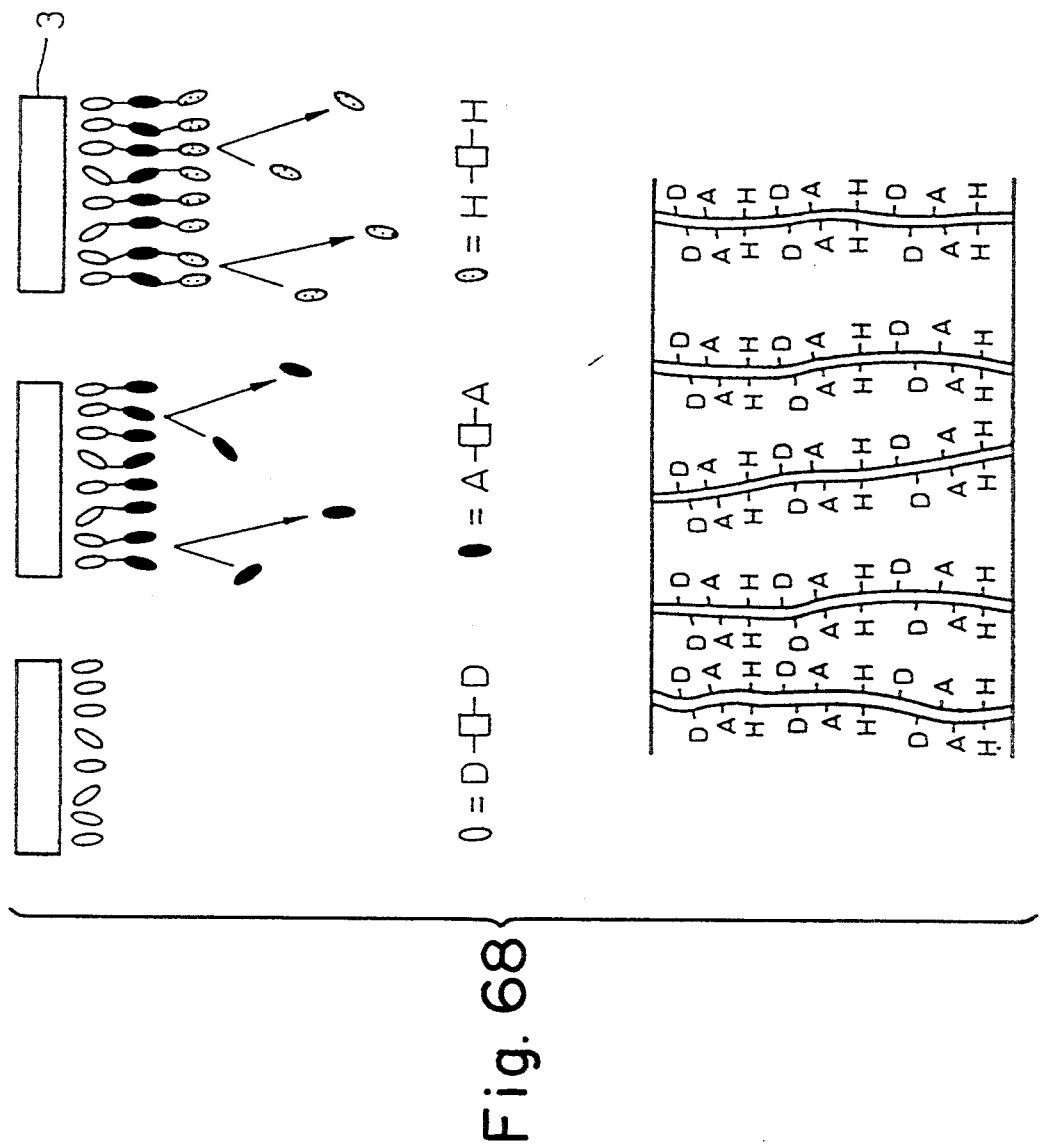
FIG. 68 is a schematic diagram of another example of the polymer of the present invention obtained by MLD.
Figure 69:
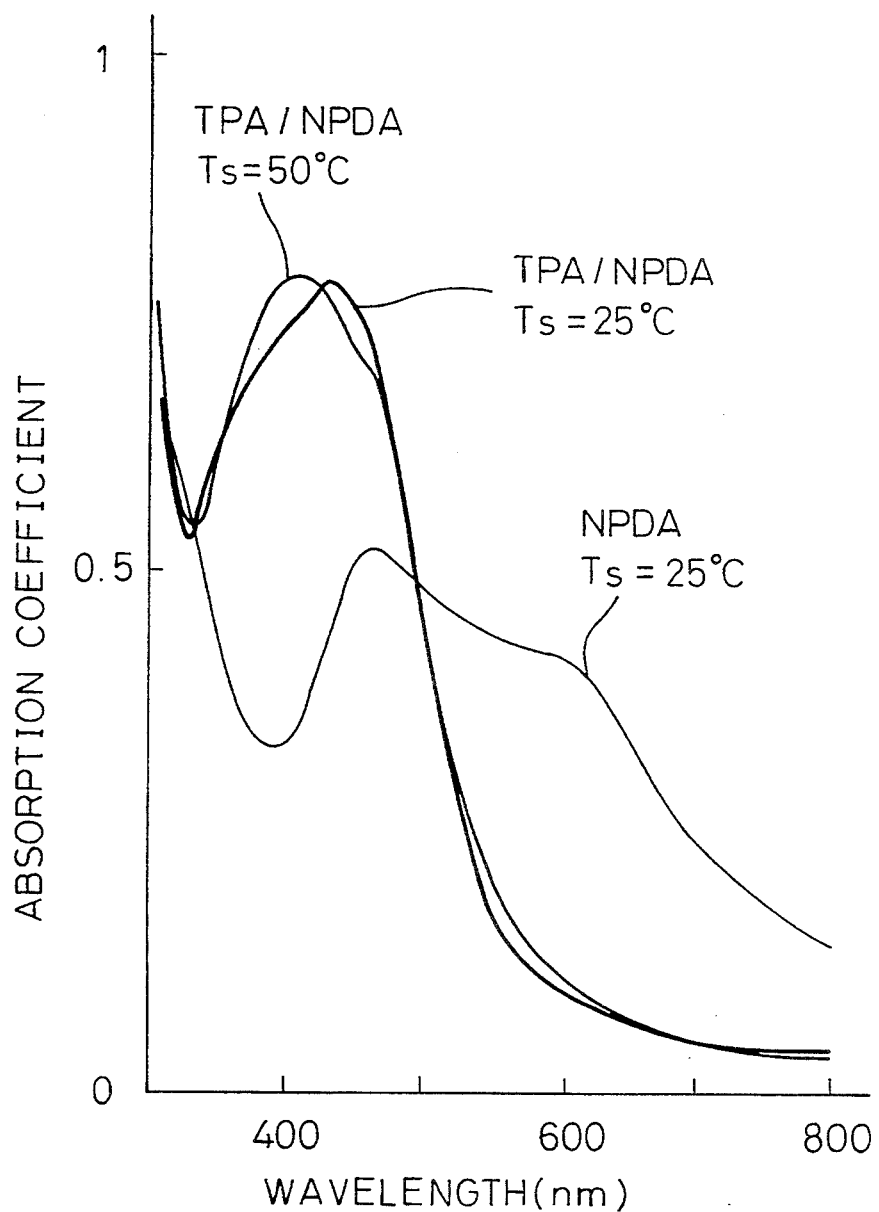
FIG. 69 is a diagram indicating an absorption curve measured for another example of the polymer related to the present invention.

Moreover, another example of the polymer of the present invention is shown in the schematic diagram of FIG. 68. In this diagram, 3 indicates the substrate. In addition, FIG. 69 is a diagram indicating an absorption curve measured for another example of the polymer related to the present invention. In this diagram, TPA represents terephthalaldehyde, NPDA represents 2-nitro-1,4-phenylenediamine, and $T_s$ indicates substrate temperature. The absorption of NPDA alone due to polymerization has been omitted. In addition to introduction of donors and/or acceptors and formation of quantum wells, devices using these can be formed by MLD. Naturally, these can also be formed using CVD while controlling film thickness.

As has been explained above, in addition to obtaining a conjugate polymer having a well-formed conjugate chain, the present invention allows the realization of a conjugate polymer wherein conjugate length is controlled and quantum wells are formed. In addition, the present invention also allows the realization of an organic functional thin film such as that of high-performance non-linear optical materials and organic semiconductor materials, as well as devices using those materials.

The present invention further provides an organic functional thin film comprised of a polymer of two or more different molecules selected from molecules having two or more different groups, formed by vapor-phase deposition, the polymer containing Si and/or Ge in the molecular chain. The polymer may be formed by a reaction as represented by the following formula.

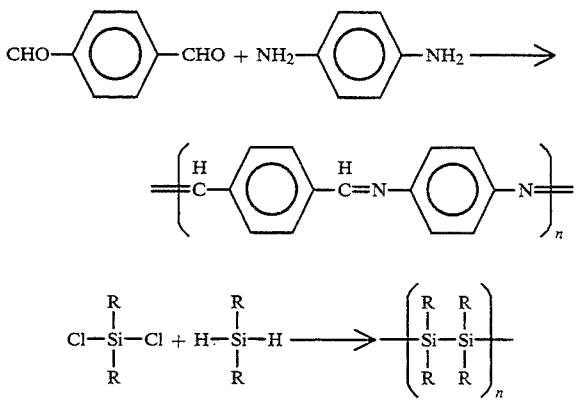

Examples of the molecules usable for the formation of this polymer may include the following molecules.

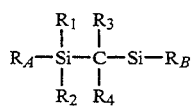

-continued
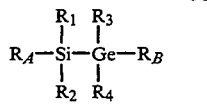
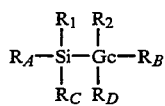
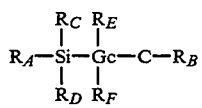
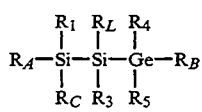
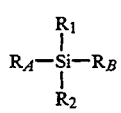
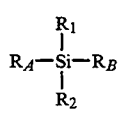
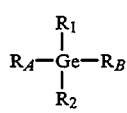
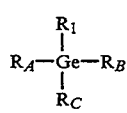
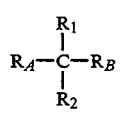
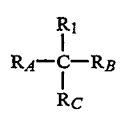
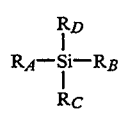
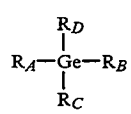
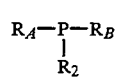
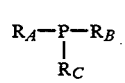
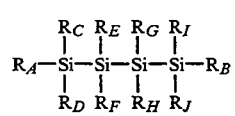
-continued
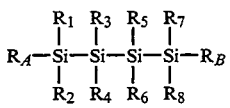
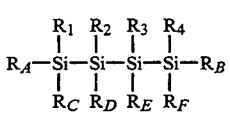
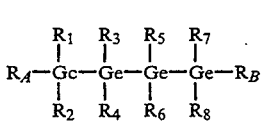
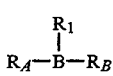
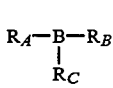
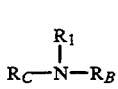
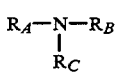
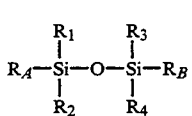
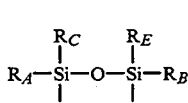
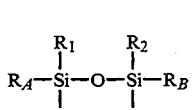
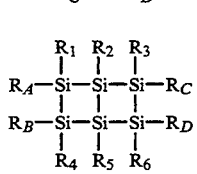
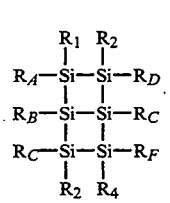
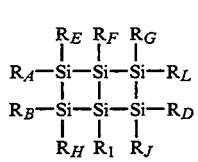

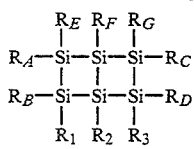

In the above formulae, $R_A$-$R_J$ represent groups participating in the formation of the polymer chain, and $R_1$-$R_8$ represent groups corresponding to the pendant groups of the resulting polymer.

Examples of groups $R_A$-$R_J$ may include —H, —Br, —Cl, —F,

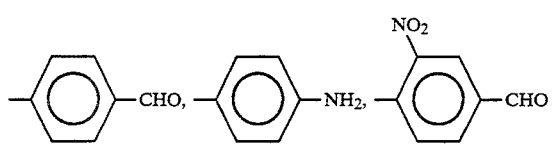

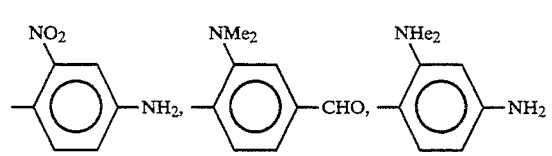

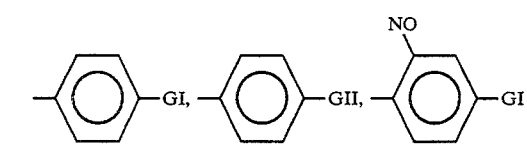

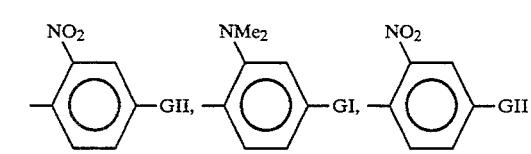

—CHO, GI, and GII and examples of groups $R_1$-$R_8$ may include

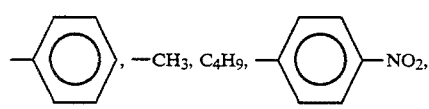

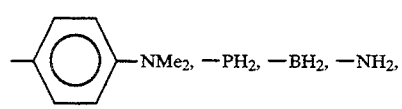

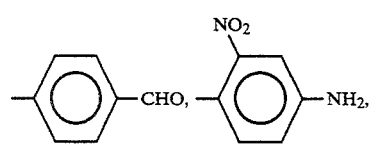

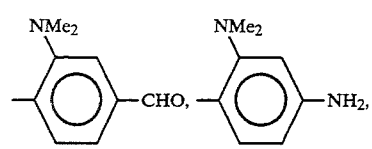

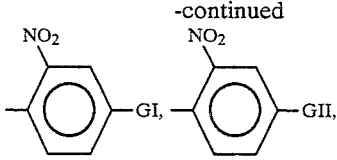

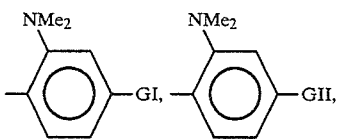

—CHO, GI, and GII in which GI may be, for example, selected from the following groups,

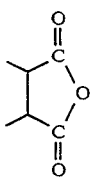

—COCl
—NCO
—COOH

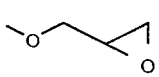

and GII may be selected from the following groups,

—NH$_2$

—NHSI(CH$_3$)$_3$

—OH

The formation of the polymer may be exemplified as follows.

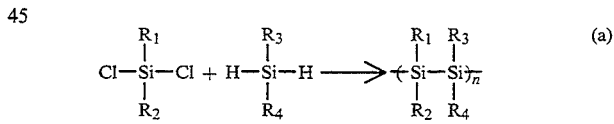 (a)

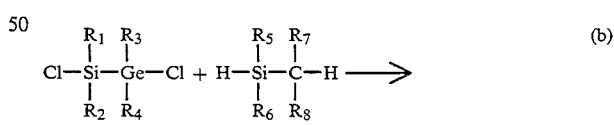 (b)

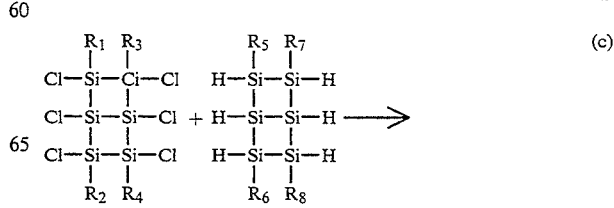 (c)

-continued
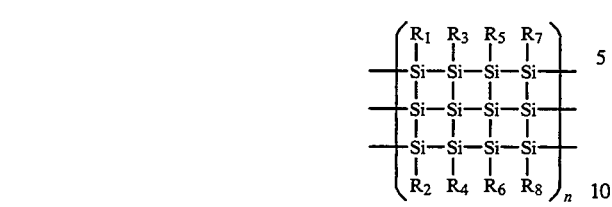
(d)
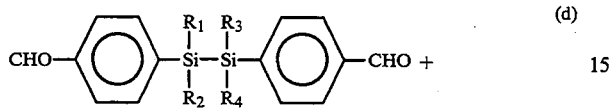
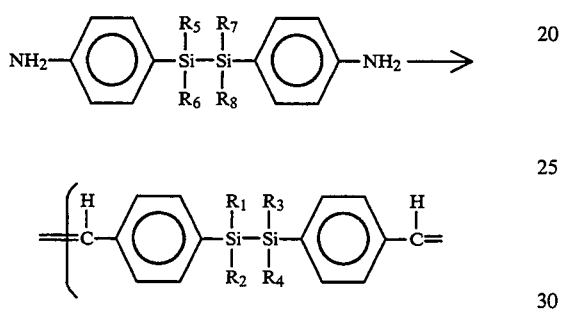
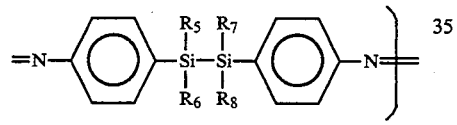
Molecule A
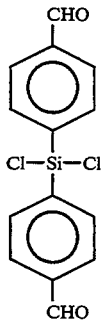
Molecule B
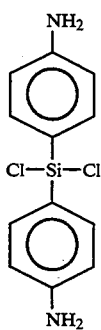
-continued
Molecule C
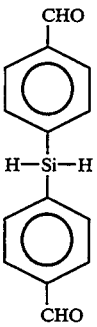
Molecule D
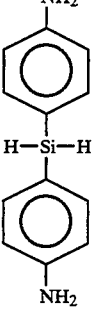
Molecule E
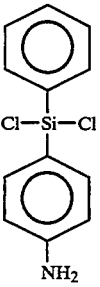
Molecule F
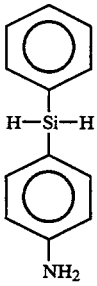
Molecule G
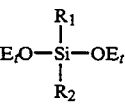
(e)
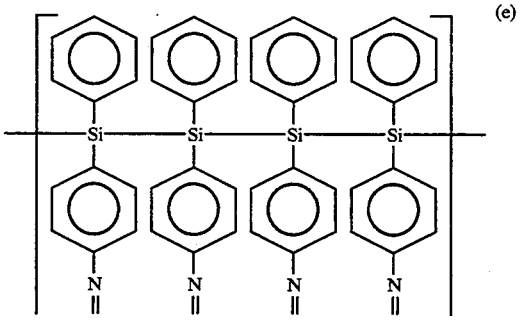

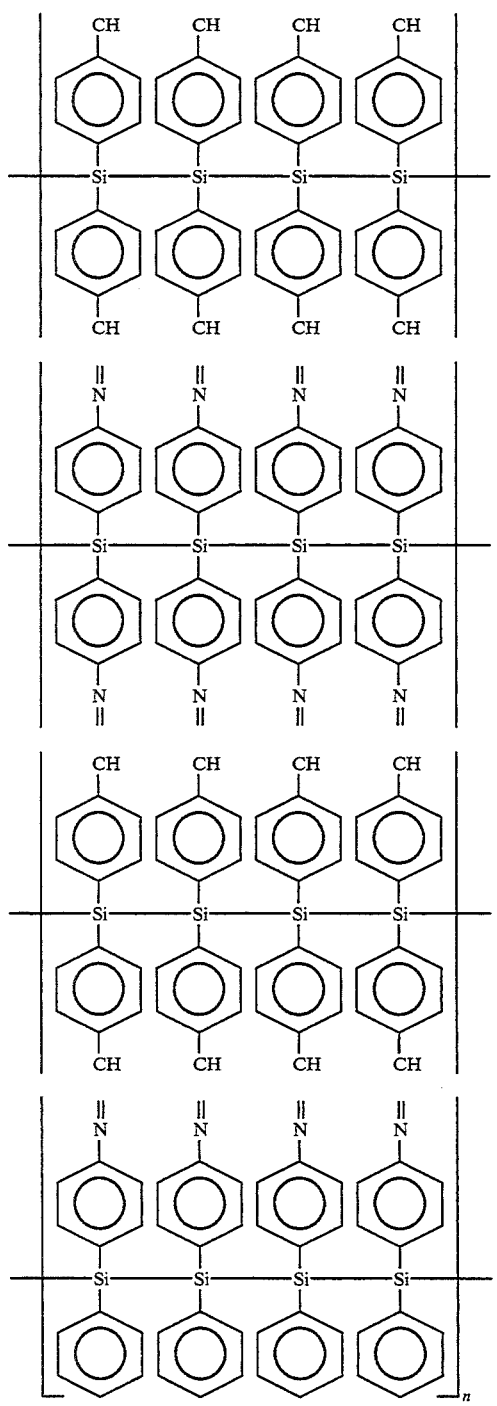

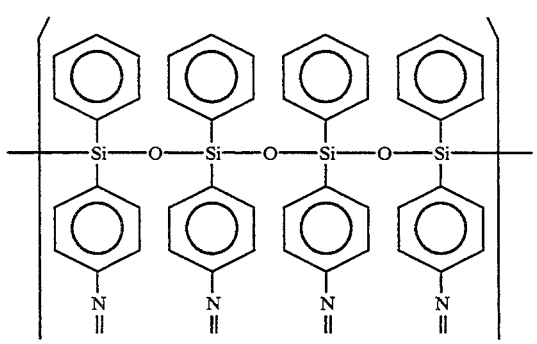

(f)

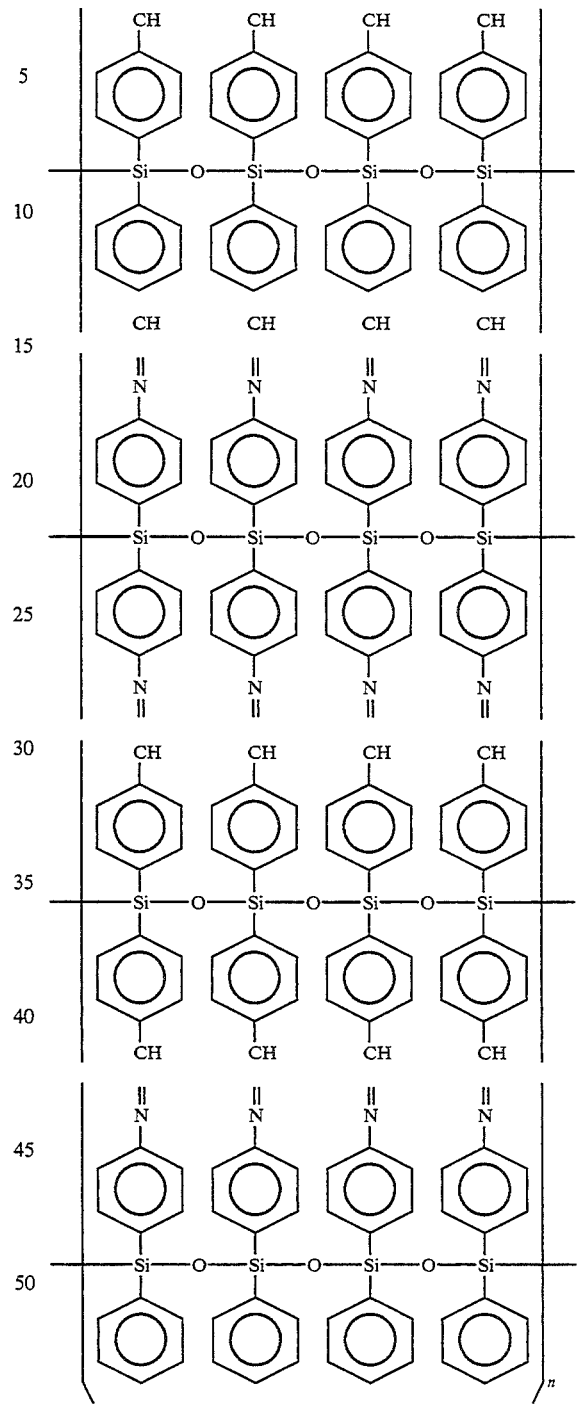

in which $R_1$–$R_8$ are as defined above.

Reactions (a) and (b) form a one molecule chain bond. For example, for reaction (a), molecule A in which $R_1$ and $R_2$ are phenyl and molecule B in which $R_3$ and $R_4$ are phenyl are projected from a cell heated to a temperature of 80° to 300° C. onto a substrate such as of silicon or quartz in a vacuum chamber. The vacuum chamber may be at a gas pressure of about $10^{-5}$–$10^{-2}$ torr and the substrate may be heated to a temperature of about 80° to 150° C. On the substrate, Cl of molecule A is reacted with H of molecule B to leave HCl and form an Si—Si bond. The reaction may be continued to form a bond such as —Si—Si—Si—Si—. Where ultraviolet rays are irradiated, this reaction is accelerated. This reaction is also accelerated where Ar is introduced into a chamber to a pressure of about $10^{-3}$ torr and an RF power of about 1 to 30 W is applied, for example. Reactions (b) and (c) may proceed at a slightly higher temperature. Reaction (c) forms a three molecule chain bond. In reaction (c), although the bonding of Cl and H may be caused at a point other than the point as indicated, the three molecule chain bond may occur at least partially. The reactions between the molecules may be performed by introducing the gas of the molecules into a vacuum chamber to form a polymer film. In reaction (a), (b) and (c), the polymer chain is formed through $\sigma$-bonds.

In reaction (d), the molecules are bonded through $\pi$ electrons since the reaction of —CHO and —$NH_2$ proceeds easily at room temperature. For example, molecule A in which $R_1$-$R_4$ are phenyl and molecule B in which $R_5$-$R_8$ are phenyl are projected from a cell heated to a temperature of 100° to 300° C. onto a substrate in a vacuum chamber. The vacuum chamber may be at a gas pressure of about $10^{-5}$-$10^{-2}$ torr and the substrate may be heated to a temperature of about 80° C. On the substrate, —CHO of molecule A is reacted with —$NH_2$ of molecule B to leave $H_2O$ and form a C=N bond. The reaction may be continued to form the conjugated polymer. As in reactions (a), (b) and (c), where ultraviolet rays are irradiated or a plasma is applied, this reaction is accelerated.

In reaction (e), a multi-molecule chain bond is formed. Molecules A, B, C and D participate in connecting the chains with conjugated bonds. Molecules E and F have only one —$NH_2$ group, and therefore, participate in terminating the inter-chain connection. Thus, if molecules E and F are fed in a specific proportion, a desired width or length of the polymer chain can be attained. For example, if molecules A, B, C, D, E and F are reacted in a mole ratio of 3:3:3:3:1:1, a polymer having an average chain width corresponding to 5 molecules can be obtained. Further, as shown in reaction (f), if a similar procedure is carried out while employing together a molecule containing oxygen such as molecule G which corresponds to a molecule A to F in which Cl and H are replaced by ethoxy, a siloxane type rigid polymer can be obtained. The decomposition reaction of ethoxy to form the siloxane type bonds may occur at room temperature, but it is effective to heat the substrate to about 150° C. or to apply a plasma.

The following are examples of a polymer chain structure in which the order of the constituting molecules is controlled.

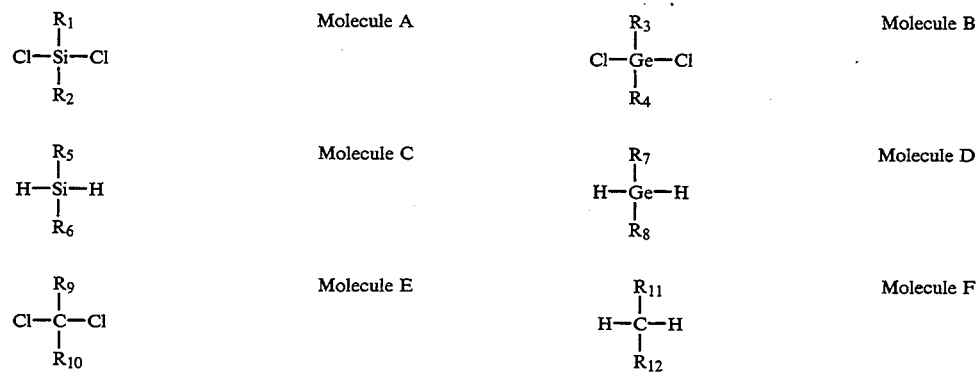

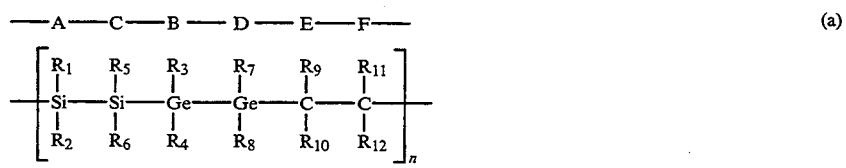

(a)

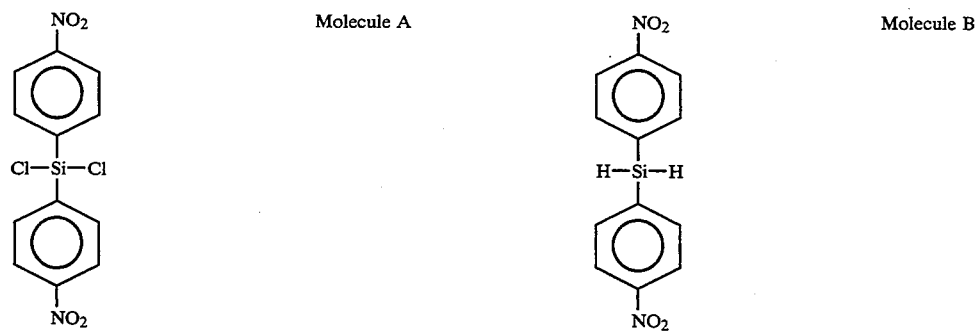

Molecule C 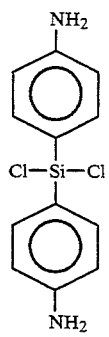

Molecule D 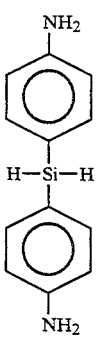

Molecule E 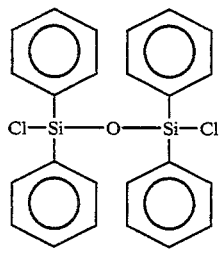

Molecule F 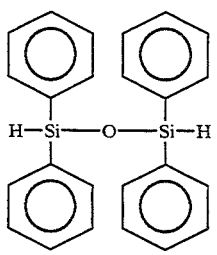

Molecule G 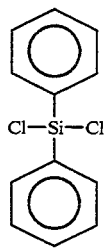

Molecule H 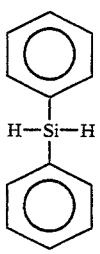

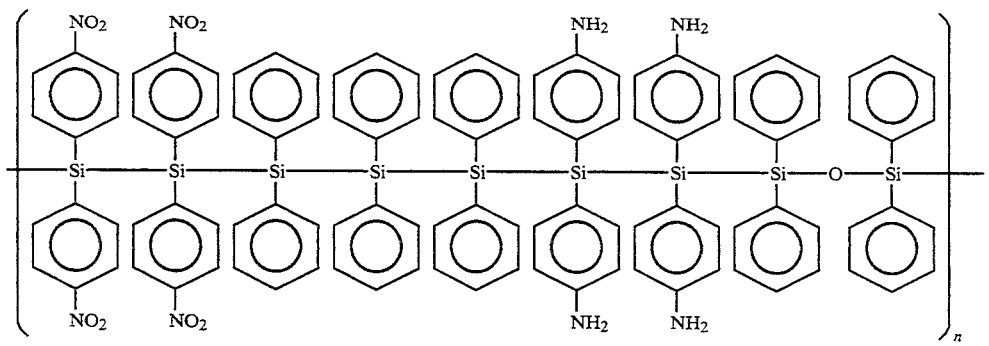

In the above polymer (a), the Si, Ge and C atoms are arranged in a controlled order to break the reversed symmetry of the polymer molecule. In polymer (b), donor and acceptor groups are introduced into the pendant groups of the molecule to break the reversed symmetry. Therefore, the polymers exhibit second-order non-linear optical characteristics such as the Pockels effect and the like. The reversed symmetry may also be broken by selective doping by a dopant. Further, in polymer (b), the lengths of the quantum dots is controlled by introducing O atoms to form barriers. Of course, the above polymers (a) and (b) are examples of the polymer of the present invention, and thus, the arrangement of the donor and acceptor groups and the lengths of the quantum dots can be widely selected as desired. Further, the oxygen atoms for the formation of barriers can be introduced by employing a molecule such as molecule G having ethoxy groups as mentioned above for polymer (f).

The cross-sectional structure of the polymer of the organic functional thin film according to this aspect of the invention having quantum dots provided may also be schematically shown by FIG. 63. The orientation of the polymer molecules may not only be vertical but also be horizontal or oblique, or may be in a combined state of such orientations. The polymer may have a structure as shown in FIG. 64. By using the polymer according to this aspect of the present invention, there may also be attained an n- and p-semiconductor as shown in FIG. 65, a TFT as shown in FIG. 66, and an optical waveguide as shown in FIG. 67. These devices may be attained by the doping of P, B or the like, instead of the introduction of the donor and acceptor groups.

The organic functional thin film according to this aspect of the present invention may be prepared by the processes as described hereinbefore, especially by the MLD as mentioned with reference to FIGS. 32, 34 and 37. Another example of the film may be as shown in FIG. 68. Again, the MLD allows the fabrication of films on the order of single molecules, not only it is extremely effective, but it also greatly contributes to improvement of film flatness as shown in FIG. 59. Likewise, as explained hereinbefore by referring to FIG. 60, where the substrate is treated in advance with a surface active molecule having halogen, H or OH or an LB film, it becomes easy for the film above it to glow vertically from the substrate. It may be effective to cover the substrate surface with a layer of Cl, H or OH. The OH layer may be formed by an oxygen plasma treatment, and the Cl layer may be formed by a light irradiation or plasma treatment under a chlorine atmosphere.

Furthermore, the present invention provides an epoxy polymer thin film comprised of a polymer of a molecule having one or more aliphatic amino groups and a molecule having two or more epoxy groups, formed by vapor-phase deposition.

Typical examples of the aliphatic amino group-containing molecule may include the following compounds,

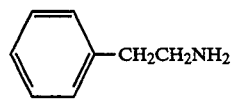 (1)

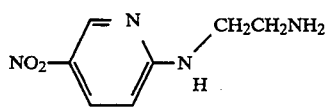 (2)

and typical examples of the epoxy group containing molecule may include the following compounds,

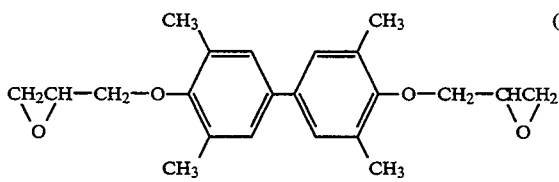 (3)

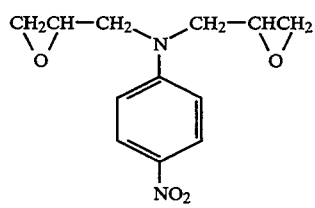 (4)

For example, by using the above compounds (2) and (3), the following polymer can be formed.

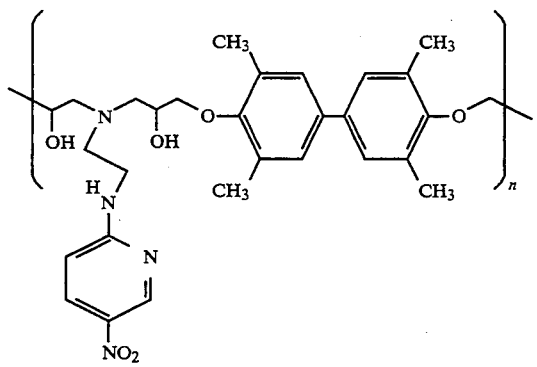

The polymer thin film may be formed by the hereinbefore-mentioned various methods including CVD, MBD and MLD. The polymer thin film may be used as materials for various applications such as insulating film, protective film, cores and claddings of optical waveguides, molecule-orientating film, lubricating film, substrates for electronic circuits, negative and positive resists, reflection-preventing film, and non-linear optical materials.

According to another aspect of the present invention, an EL element is attained by arranging a luminescent molecule between an n-type polymer chain and a p-type polymer chain in n- and p-polymers as mentioned hereinbefore. Also, an electrochromic polymer may be obtained by alternately arranging electron-donating molecules and electron-accepting molecules one by one in a plurality of layers. Further, an electrochromic polymer may be obtained by arranging combinations of an electron-donating molecule and an electron-accepting molecule through an electron-blocking molecule in a plurality of layers. In such a polymer, a barrier molecule may be employed as the electron-blocking molecule. By adopting these polymers having a controlled molecular arrangement, there can be attained a high brightness and long life in EL elements as well as a high speed operation and long life in electrochromic and photochromic polymers.

Figure 71A:
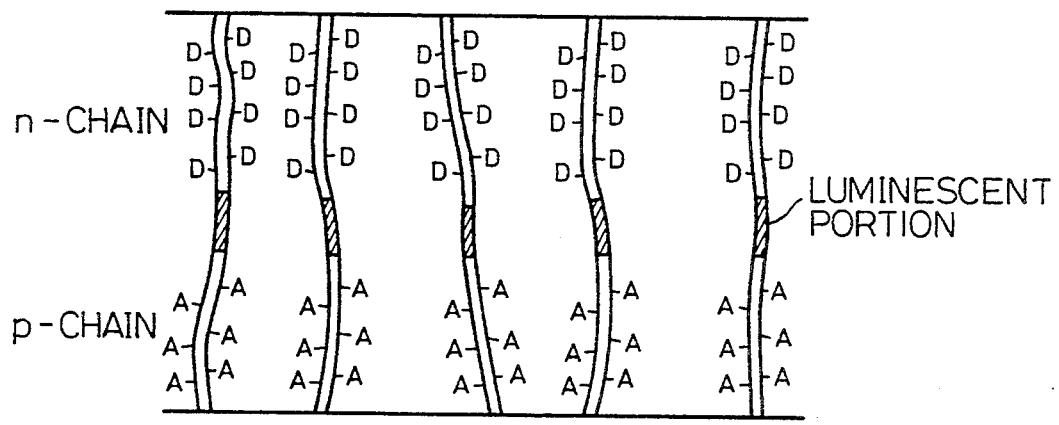
FIGS. 71 (a) and (b) are schematic diagrams illustrating an embodiment of the EL element of the present invention.
Figure 71B:
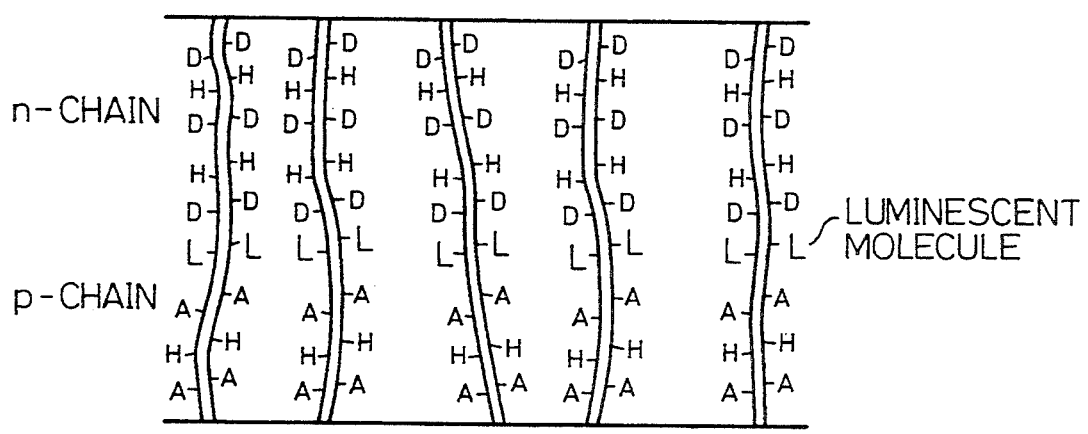

An EL element according to this aspect of the present invention is schematically shown in FIG. 71. The n-type and p-type chains are formed by adding donor and acceptor groups to the conjugate chain. The formation of the conjugate polymer and the monomers usable for the polymer formation may be as described hereinbefore in detail. Between the n-type chain and the p-type chain, a luminescent molecule represented by the following formula,

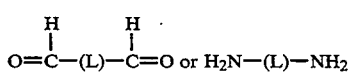

in which (L) represents a skeleton structure of the luminescent molecule, is introduced. The skeleton structure of the luminescent molecule is introduced into the conjugate polymer through a conjugate bond formed by the reaction of the —CHO group with the —NH₂ group. Examples of the skeleton structure of the luminescent molecule may include those represented by the following formulae.

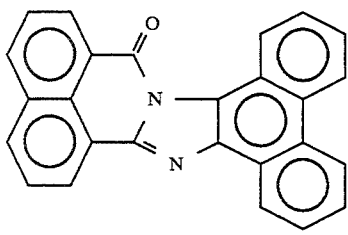

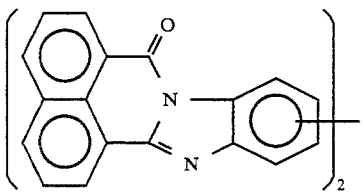

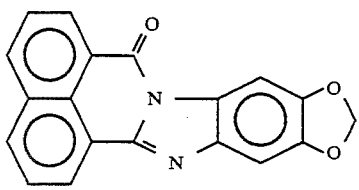

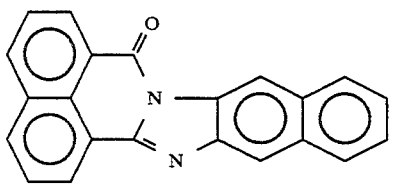

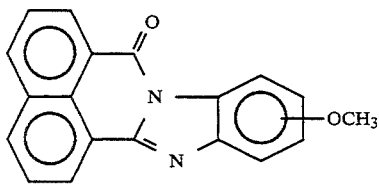

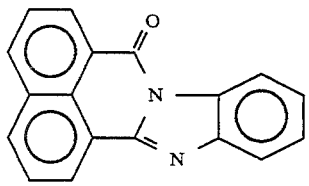

Figure 72A:
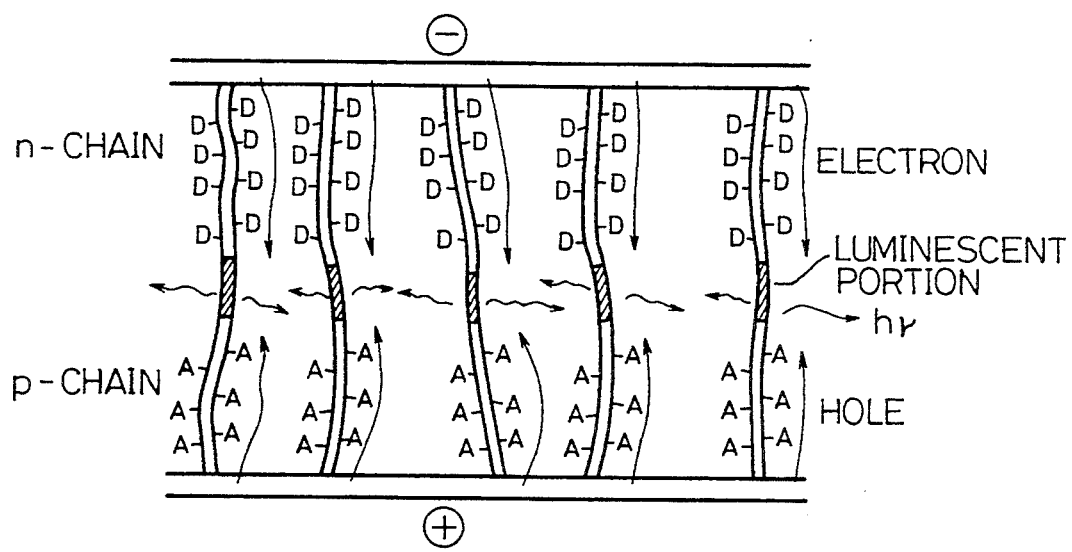
FIGS. 72 (a) and (b) are schematic diagrams illustrating an operation of the EL element as shown in FIGS. 71 (a) and (b).
Figure 72B:
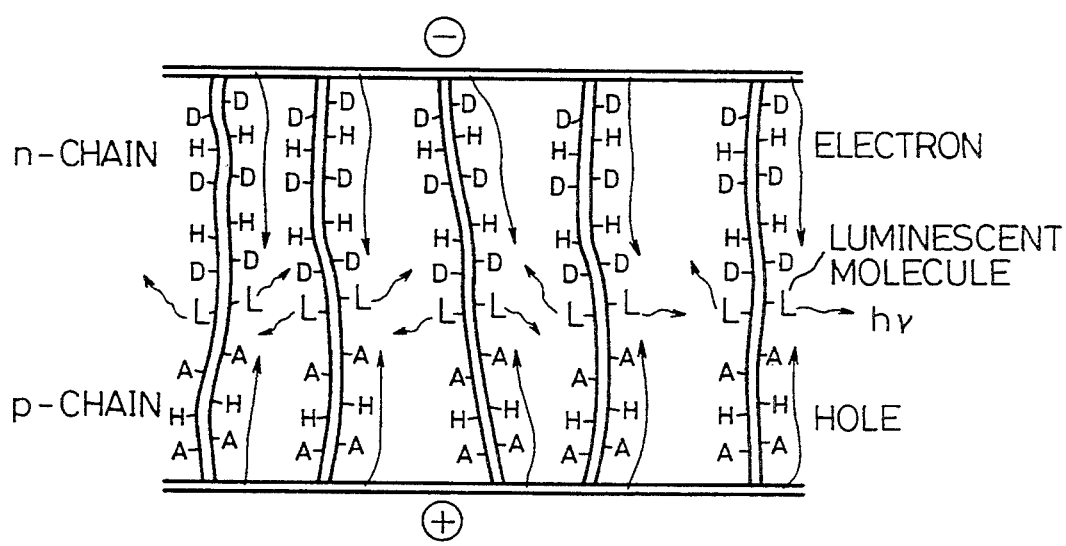

As shown in FIG. 72, if a minus voltage is applied to the n-side, a forward current flows, an electron combines with a hole at the luminescent portion to cause luminescence.

Figure 73:
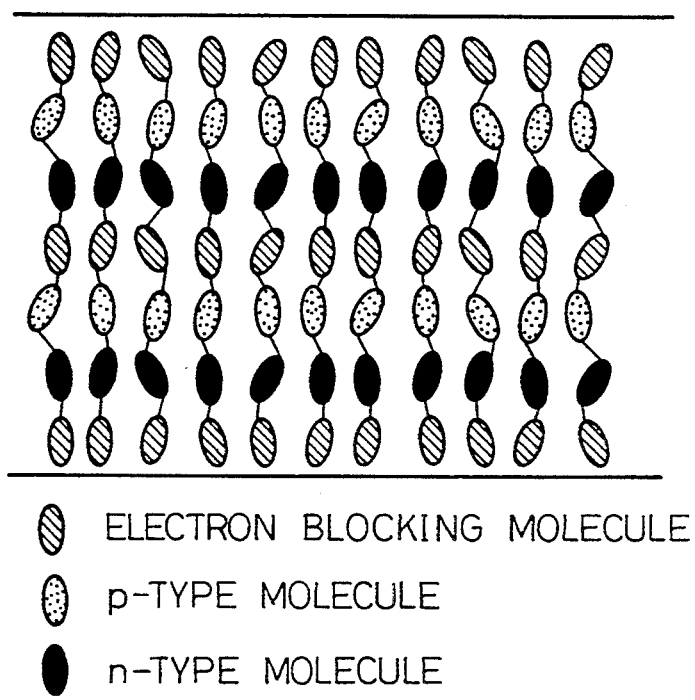
FIG. 73 is a schematic diagram illustrating an embodiment of the electrochromic element of the present invention.
Figure 74:
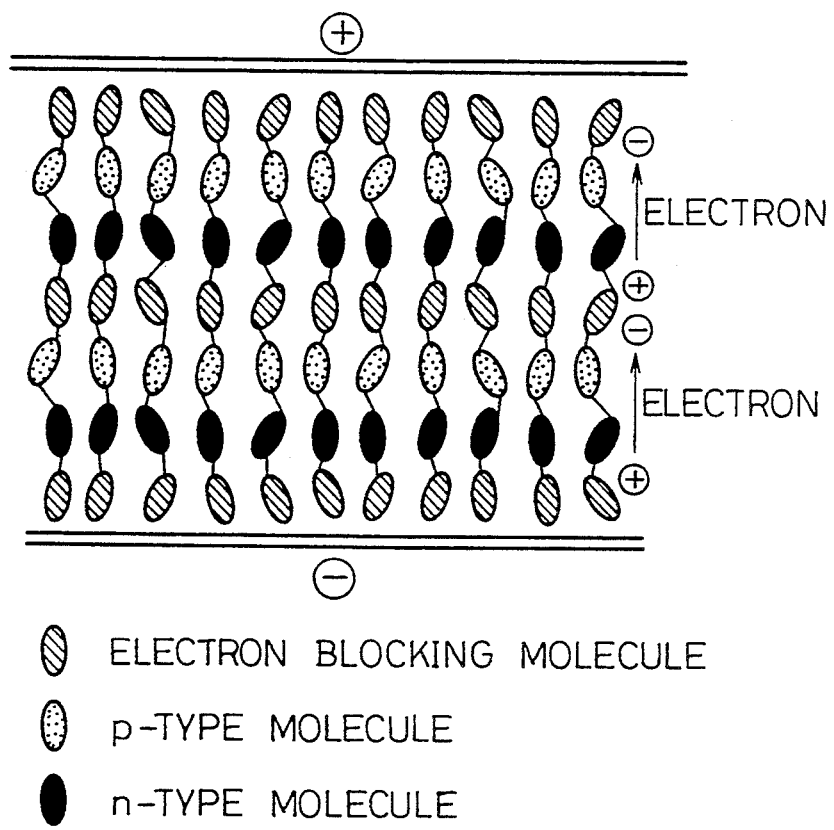
FIG. 74 is a schematic diagram illustrating an operation of the electrochromic element as shown in FIG. 73.
Figure 75E:
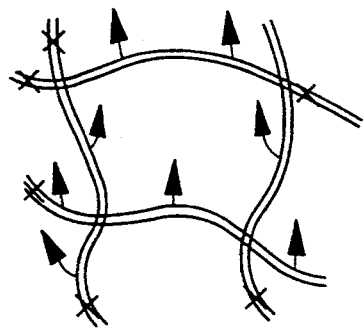
FIGS. 75 (a)–(f) are schematic diagrams illustrating structures of the photo-refractive polymers of the present invention.
Figure 75F:
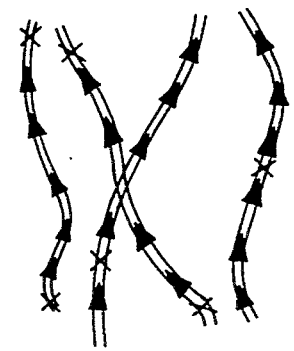
Figure 75C:
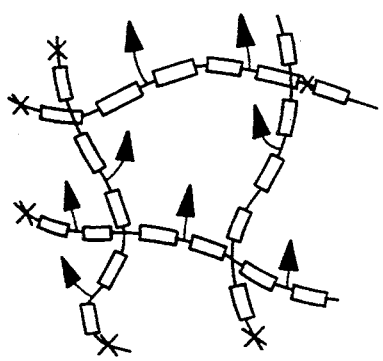
Figure 75D:
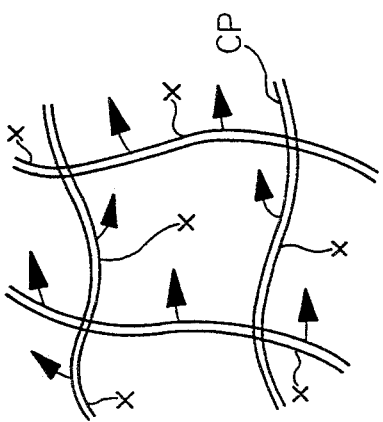
Figure 75A:
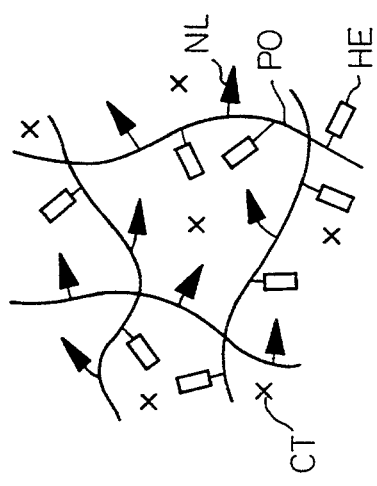
Figure 75B:
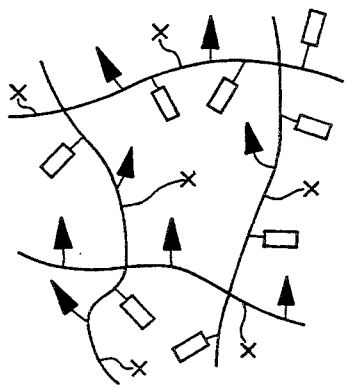
Figure 76A:
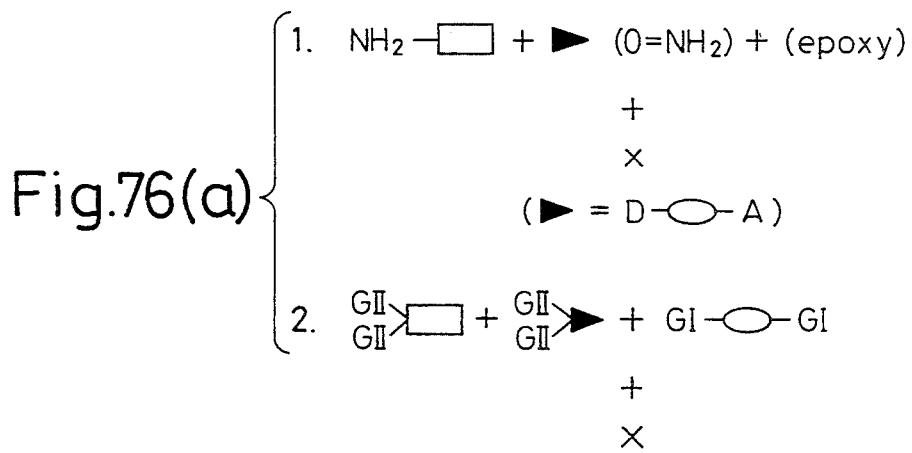
FIGS. 76 (a)–(f) are schematic diagrams illustrating examples of the combination of elements usable for the formation of the structures as shown in FIGS. 75 (a)–(f).
Figure 76B:
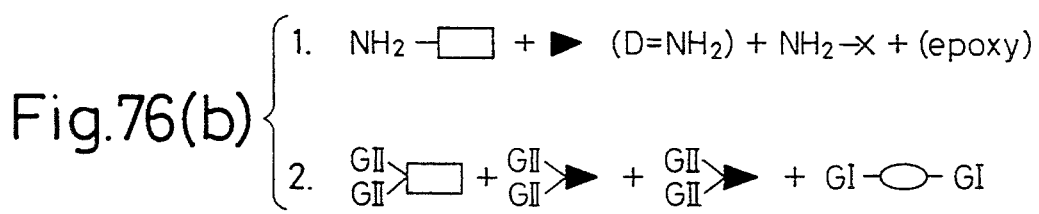
Figure 76C:
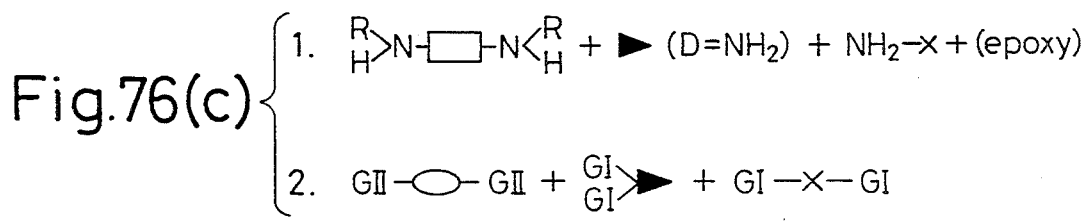
Figure 76D:
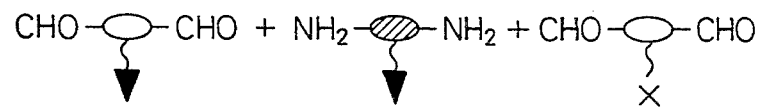
Figure 76E:
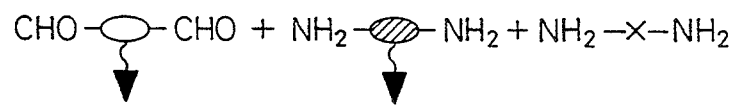

An electrochromic element is schematically shown in FIG. 73. As shown in FIG. 74, if a plus voltage is applied to the electron-accepting molecule side and a minus voltage is applied to the electro-donating molecule side, electrons appear on the electron-accepting molecule side and holes appear on the electro-donating molecule side. Thus, an oxidized state is caused on the electron accepting molecule side and a reduced state is caused on the electron-donating molecule side, so that the light absorption spectrum of the polymer is changed. Examples of the electron-accepting molecule, electron-donating molecule, electron-blocking molecule and electrochromic molecule may include those represented by the following formulae,

OHC—(A)—CHO

OHC—(D)—CHO

OHC—(B)—CHO

OHC—(EC)—CHO $H_2N$—(A)—$NH_2$ $H_2N$—(D)—$NH_2$ $H_2N$—(B)—$NH_2$ $H_2N$—(EC)—$NH_2$ in which (A), (B), (D) and (EC) respectively represent skeleton structures of the electron-accepting molecule, electron-donating molecule, electron-blocking molecule and electrochromic molecule. Examples of the skeleton structures of the electron-accepting molecule, electron-donating molecule, electron-blocking molecule and electro chromic molecule may include the following.

Electron-accepting molecule (A):
Tetracyanoquinodimethane
Tetracyanoethylene
Tetrafluorotetracyanoquinodimethane
Electron-donating molecule (D):
Tetrathiafulvalene
Bis-(ethylenedithio)-tetrathiafulvalene
Bis-(methylenedithio)-tetrathiafulvalene
Tetrakis-(methylthio)-tetrathiafulvalene
Tetrakis-(octadecylthio)-tetrathiafulvalene
Bis-(propylenedithio)-tetrathiafulvalene
Electron-blocking molecule (B):
Diphenyl ether
Diphenylmethane
Electro-chromic substance (EC):
Viologens
Phthalocianine complexes
Pyrazolines
Where molecules having the following structures,

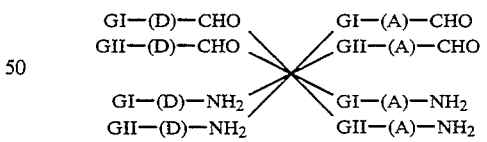

in which (A) and (D) are as defined above, and GI may be selected from the following groups,

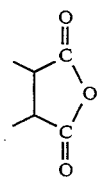

—COCl
—NCO
—COOH

-continued

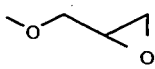

and GII may be selected from the following groups,

—NH₂

—NHSi(CH₃)₃

—OH are employed, an electrochromic polymer can be obtained without employing an electron-blocking molecule since two successive single bonds separate an electron-accepting group from an electron-donating group.

In the above-mentioned embodiments, the polymers are oriented vertically with respect to the substrates, but the orientation of the polymer molecules may be horizontal or oblique or of amorphous. As the material of the electrode for applying voltage, there may be used metals, transparent electrode materials such as ITO, conductive polymers and charge-transfer complexes, with organic conductive materials being particularly useful for preventing migration.

These elements can of course be prepared by utilizing the CVD, MBD and MLD methods as mentioned hereinbefore.

According to a further aspect of the present invention, there is provided a photo-refractive polymer comprising units of a molecule having second-order non-linear optical characteristics and of a hole and/or electron-carrying molecule added to a polymer chain. There are provided further photo-refractive polymers comprising units of a molecule having second-order non-linear optical characteristics added to a polymer chain containing units of a hole and/or electron-carrying molecule, comprising units of a molecule having second-order non-linear optical characteristics added to a conjugate polymer chain, or comprising a conjugate polymer chain having second-order non-linear optical characteristics. These photo-refractive polymers have drastically improved photo-refractive characteristics.

Structures of the photo-refractive polymers of the invention are schematically shown in FIG. 75. In (a), hole and/or electron-carrying molecule units HE are added to a polymer chain PO containing non-linear optical molecule units NL, while carrier-trapping units CT being dispersed, to increase the density of the hole and/or electron-carrying molecule units and improve the sensitivity of the resulting polymer. In (b), carrier-trapping units are also introduced into the polymer chain to attain a stable trapping effect. In (c), hole and/or electron-carrying molecule units are introduced into the polymer chain containing non-linear optical molecule units to increase the carrying efficiency and improve the sensitivity of the resulting polymer. In (d) and (e), it is intended to further increase the carrying efficiency by introducing non-linear optical molecule units and carrier-trapping units to a conjugate polymer chain CP. In (f), non-linear optical characteristics and carrier-trapping characteristics are introduced into a conjugate polymer chain to improve the carrying efficiency.

Examples of the combination of elements usable for the formation of the structures as shown in FIG. 75 may be indicated by FIG. 76.

The skeleton structure of the electron-carrying molecule may be derived from the following compounds.

Bis(1,8-naphthalenedicarboxylic)-3,3'-benzidineimidazole

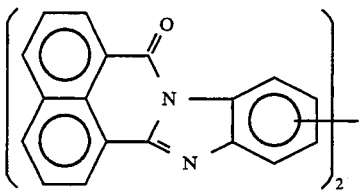

1,8-Naphthalenedicarboxylic-9,10-phenanthreneimidazole

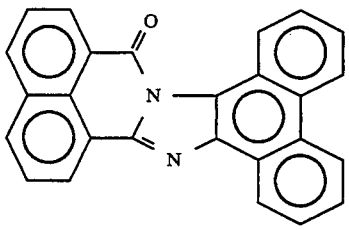

BPLA

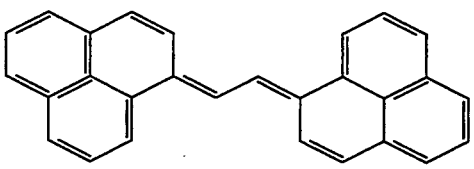

Tris(8-hydroxyquinoline)aluminum

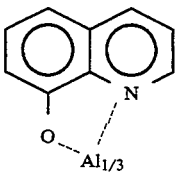

3,4,9,10-Perylene tetracarboxylic bisbenzimidazole

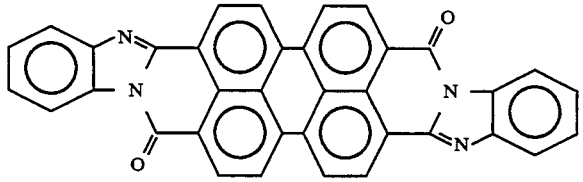

N,N-Diphenyl-3,4,9,10-perylenetetracarboxylicdiimide

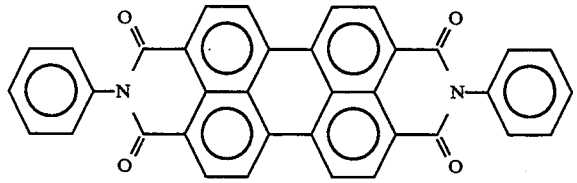

The skeleton structure of the hole-carrying molecule may be derived from the following compounds.

N,N'-Diphenyl-N,N'-Bis(3-methylphenyl)-1,1'-biphenyl-4,4'-diamine

-continued
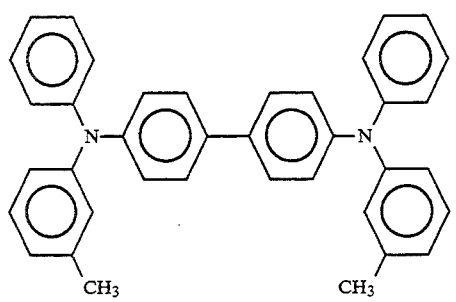
p-Methyl-TPD
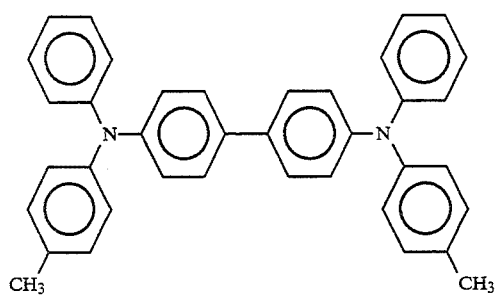
(p-Methyl)-TPD
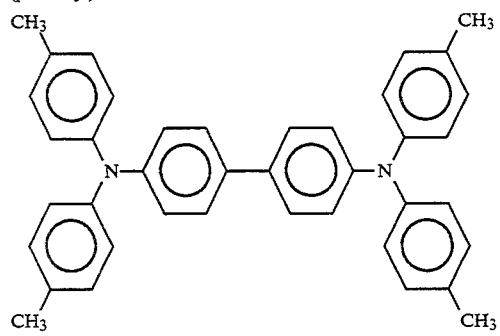
N,N-Tetraphenyl-3,3'-dimethylbenzidine
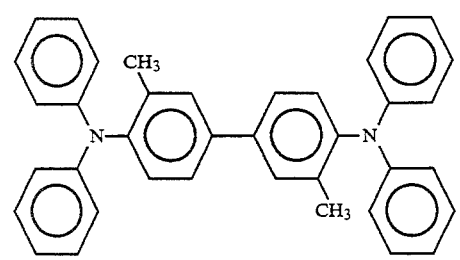
N,N-Tetraphenyl-3-3'-dinitrobenzidine
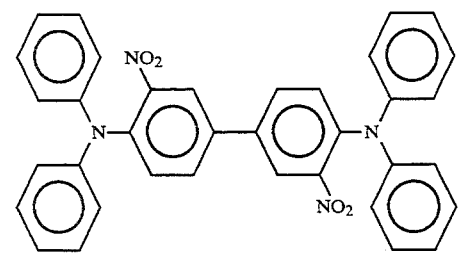
(p-Nitro)₂-TPD
-continued
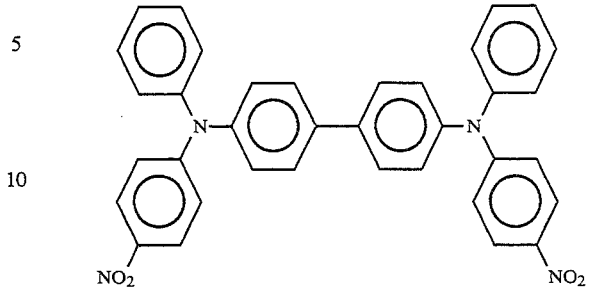
N,N,N',N'-Tetraphenyl-4,4'-diaminostilbene
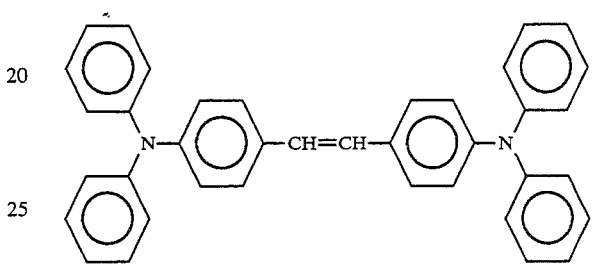
N,N,N'-N'-Tetratolyl-4,4'-diaminostilbene
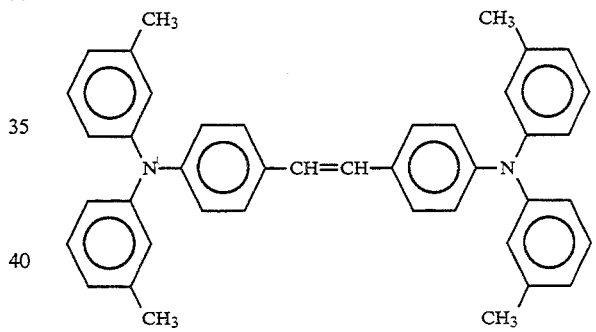
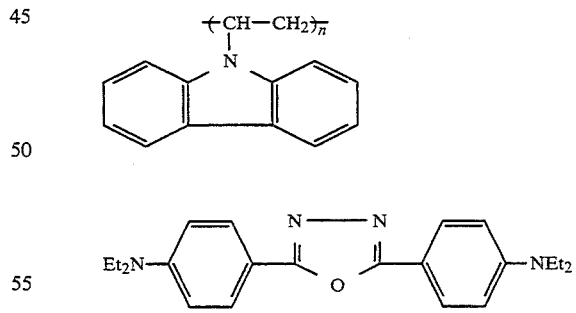
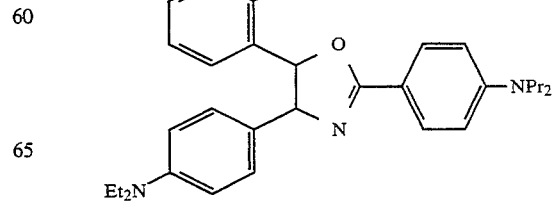

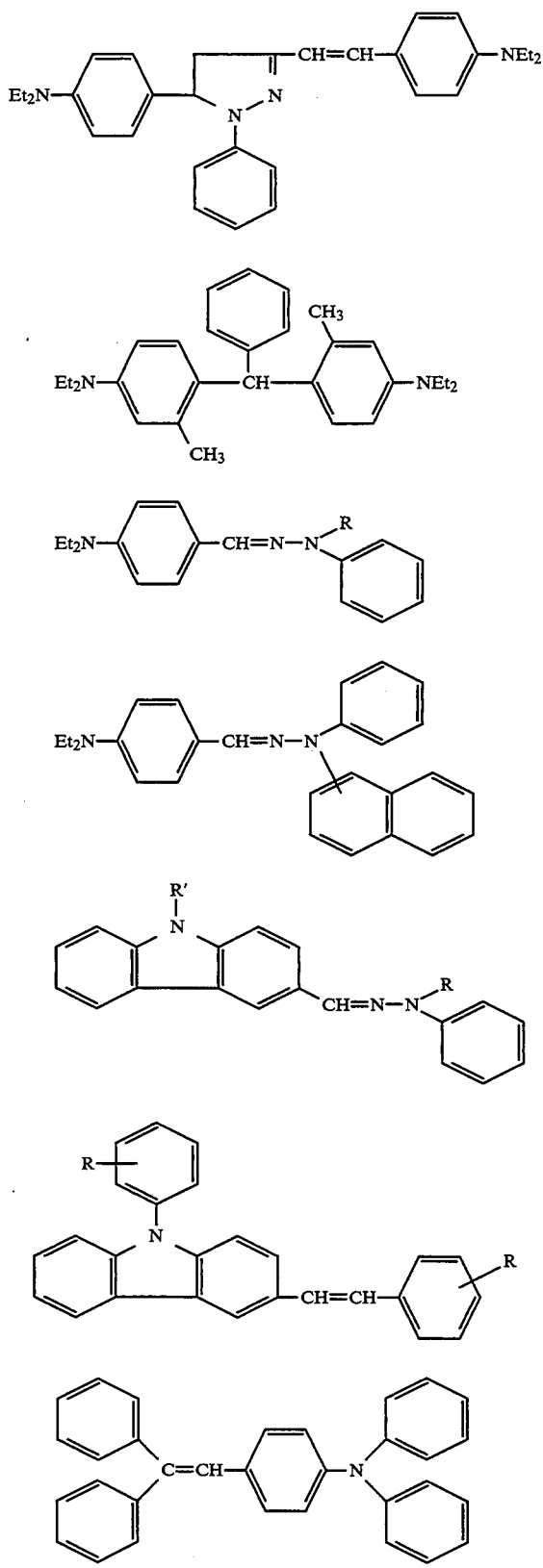

The structures (a)–(f) may preferably be prepared by the various methods of CVD, MBD, MLD and others as mentioned hereinbefore.

In the embodiment as shown in FIG. 76, (b), 1, the structure is formed by the reaction between a car- bonyloxycarbonyl group, a carboxylic acid halide group, a —NCO group, an —NCO group or the like and an amino group, a group containing at least one amino proton, an alkylamino group, a silylated alkylamino group or the like. For example, the molecules having such groups as described hereinbefore with respect to the first aspect of the present invention as well as hole-carrying molecules derived from (p-methyl)$_4$-TPD by replacing the two methyl groups thereof by amino groups are projected in vacuum, while applying a voltage, onto a substrate successively one by one to form a polymer. In the embodiment as shown in FIG. 76, (f), 1, the carrier-trapping units are formed by using a molecule obtained by adding a nitro group (acceptor A) to terephthalaldehyde, by adding a dimethylamino group (donor D) to paraphenylene diamine, or if desirable by adding two nitro groups (acceptor A) to terephthalaldehyde or by adding two dimethylamino groups (donor D) to paraphenylene diamine.

We claim:

1. An organic functional thin film comprising a polymer of a molecule having two or more identical or different groups selected from the group consisting of a carbonyloxycarbonyl group, a carboxylic acid group, a carboxylic acid halide group, a carboxyl group, a —COCl group, an —NCO group and an epoxy group and a molecule having two or more identical or different groups selected from the group consisting of an amino group, groups containing at least one amino proton, an alkylamino group, a silylated alkylamino group and a hydroxyl group, formed by vapor-phase deposition, said polymer having a donor group or an acceptor group or a donor group and an acceptor group thereon, and wherein at least one portion of the groups contained in a molecule is separated from a conjugate π electron system that composes the backbone of the molecule by two or more single bonds.

2. A thin film as set forth in claim 1, wherein at least one of the donor groups is a group other than an amino group.

3. A thin film as set forth in claim 1, which is formed by combining an epoxy monomer having two or more epoxy rings with a non-linear optical molecule having two or more amino protons.

4. A thin film as set forth in claim 3, wherein the non-linear organic molecule also possesses an acceptor group.

5. A thin film as set forth in claim 1, which is formed by combining a dianhydride of a tetravalent carboxylic acid having at least 6 carbon atoms or a halide of a divalent carboxylic acid having at least 4 carbon atoms with a molecule having at least 2 amino groups and/or alkylamino groups having 1 to 10 carbon atoms and a donor and/or acceptor group.

6. A thin film as set forth in claim 1, further having a hydrophilic group and/or hydrophobic group added.

7. An organic functional thin film comprising a polymer of a molecule having one or more groups selected from the group consisting of a carbonyloxycarbonyl group, a carboxylic acid group, a carboxylic acid halide group, a carboxyl group, a —COCl group, an —NCO group and an epoxy group, and one or more groups consisting of an amino group, groups containing at least one amino proton, an alkylamino group, a silylated alkylamino group and a hydroxyl group, formed by vapor-phase deposition, said polymer having a donor group or an acceptor group or a donor group and an acceptor group thereon, and wherein at least one portion of the groups contained in a molecule is separated from a conjugate π electron system that composes the backbone of the molecule by two or more single bonds.

8. A thin film as set forth in claim 7, wherein at least one of the groups added as a donor group is a group other than an amino group.

9. A thin film as set forth in claim 7, which is formed by combining a monomer having two or more epoxy rings with a monomer having two or more amino protons and an acceptor group.

10. A thin film as set forth in claim 7, which is formed by combining a dianhydride of a tetravalent carboxylic acid having at least 6 carbon atoms or a halide of a divalent carboxylic acid having at least 4 carbon atoms with a molecule having at least 2 amino groups and/or alkylamino groups having 1 to 10 carbon atoms and a donor and/or acceptor group.

11. A thin film as set forth in claim 7, further having a hydrophilic group and/or hydrophobic group added.

12. A process for preparing an organic functional thin film, said film comprising a polymer of a molecule having two or more identical or different groups selected from the group consisting of a carbonyloxycarbonyl group, a carboxylic acid group, a carboxylic acid halide group, a carboxyl group, a —COCl group, an —NCO group and an epoxy group and a molecule having two or more identical or different groups selected from the group consisting of an amino acid, groups containing at least one amino proton, an alkylamino group, a silylated alkylamino group and a hydroxyl group, said polymer having a donor group or an acceptor group or a donor and an acceptor group thereon, said process comprising introducing or evaporating the molecules in vacuum followed by at least one of combining and polymerization whereby to form a thin film of said polymer by vapor-phase deposition, and wherein a molecule able to act as a curing agent is introduced in vacuum to deposit the film.

13. A process according to claim 12, wherein the film is deposited by alternately projecting various types of the molecules onto a substrate.

14. A process according to claim 12, wherein during the film deposition, the substrate temperature is set to a temperature such that the molecule re-evaporation rate is higher than the molecule projection rate in the case of performing film deposition with each of the molecules individually.

15. A process according to claim 12, wherein the substrate temperature during the film deposition is set at or below room temperature.

16. A process according to claim 12, wherein the deposition is performed while irradiating with light.

17. A process according to claim 12, wherein the deposition is performed while irradiating with an electron beam.

18. A process according to claim 12, wherein the molecules are polymerized by heating or irradiation with light following deposition.

19. A process according to claim 12, wherein the deposition is performed while applying a voltage to pattern electrodes formed on a substrate.

20. A process according to claim 12, wherein the deposition is performed while applying a voltage between an electrode provided on or in the vicinity of a substrate and an electrode provided in opposition to the substrate.

21. A process according to claim 20, wherein the electrode provided in opposition to the substrate has a porous or mesh structure.

22. A process according to claim 20, wherein the electrode provided on or in the vicinity of the substrate and/or the electrode provided in opposition to the substrate are formed into patterns.

23. A process according to claim 12, wherein the deposition is performed in the presence of generated plasma.

24. A process for preparing an organic functional thin film, comprising projecting a plurality of types of molecules having two or more addition groups, in which the addition groups of the molecules of the same type have a weak reaction bonding strength while the addition groups of the molecules of different types have a reaction bonding strength greater than the reaction bonding strength between the addition groups of the molecules of the same type onto a substrate in vacuum in a specified sequence, wherein the substrate temperature during the projection to a temperature such that the molecule re-evaporation rate is higher than the molecule projection rate in the case of performing the film deposition with each of the molecules individually and a film is deposited on the substrate during the formation of reaction bonds with the molecules of different types.

25. A process according to claim 24, Wherein a molecule having two or more identical or different groups selected from the group consisting of a carbonyloxycarbonyl group, a carboxylic acid group, a carboxylic acid halide group, a carboxyl group, a —COCl group, an —NCO group and an epoxy group and a molecule having two or more identical or different groups selected from the group consisting of an amino group, groups containing at least one amino proton, an alkylamino group, a silylated alkylamino group, a carboxylic acid group and a hydroxyl group are used, and two or more types of the molecules are used.

26. A process according to claim 24, wherein a molecule having two or more halogen groups and a molecule having two or more groups selected from hydrogen, alkali metals and copper are used, and two or more types of the molecules are used.

27. A process according to claim 24, wherein at least one portion of the molecules has a donor group and/or acceptor group.

28. A process according to claim 27, wherein at least one of the groups added as a donor group is a group other than an amino group.

29. A process according to claim 24, wherein at least one portion of the groups contained in a molecule is separated from a conjugate π electron system that composes the backbone of the molecule by two or more single bonds.

30. A process according to claim 24, wherein the deposition is performed while irradiating with light.

31. A process according to claim 24, wherein the deposition is performed while irradiating with an electron beam.

32. A process according to claim 24, wherein the molecules are polymerized by heating or irradiation with light following deposition.

33. A process according to claim 24, wherein the deposition is performed while applying a voltage to pattern electrodes formed on a substrate.

34. A process according to claim 24, wherein the deposition is performed while applying a voltage between an electrode provided on or in the vicinity of a substrate and an electrode provided in opposition to the substrate.

35. A process according to claim 34, wherein the electrode provided in opposition to the substrate has a porous or mesh structure.

36. A process according to claim 34, wherein the electrode provided on or in the vicinity of the substrate and/or the electrode provided in opposition to the substrate are formed into patterns.

37. A process according to claim 24, wherein the deposition is performed in the presence of generated plasma.

38. An organic functional thin film comprising a polymer of a plurality of types of molecules linked together in the manner of bonding with double or triple bonds, and possessing a portion in which the conjugate length between consecutive $\pi$ electrons is 10 Å or more, wherein the molecules are either introduced into a vacuum or evaporated in a vacuum, and are at least one of bonded and polymerized on a substrate to form a thin film.

39. A thin film according to claim 38, wherein the polymer is a polymer comprised of the alternate bonding of molecules having a plurality of —CHO groups and molecules having a plurality of —NH$_2$ groups.

40. A thin film according to claim 38, wherein the polymer is a microcrystalline substance.

41. An organic functional thin film comprising a polymer of a plurality of types of molecules linked together in the manner of bonding with double or triple bonds, wherein a portion of the conjugated system between molecular units participating in bonding is divided by single bonds.

42. A thin film according to claim 41, wherein the single bonds are formed by bonding of groups contained in at least one portion of the plurality of types of unit molecules with other molecules.

43. A thin film according to claim 41, wherein the single bonds are introduced by copolymerization of molecules containing two or more consecutive single bonds.

44. A process for preparing an organic functional thin film comprising a polymer of a plurality of types of molecules linked together in the manner of bonding with double or triple bonds, and possessing a portion in which the conjugate length between consecutive $\pi$ electrons is 10 Å or more, wherein said process comprises either introducing the molecules in a vacuum or evaporating the molecules in a vacuum and bonding and/or polymerizing the molecules on a substrate to thereby form a thin film of said polymer, and wherein the film formation is performed by. Sequentially projecting the molecules to be polymerized onto a substrate using MLD.

45. A process according to claim 44, wherein the film formation is performed by sequentially projecting the molecules to be polymerized onto a substrate using MLD.

46. A process according to claim 44, wherein the substrate is treated in advance with a silane-based surface active material having terminal amino protons.

47. A process according to claim 44, wherein a film of the molecules having amino protons is formed in advance.

48. A process according to claim 47 wherein the molecule is 1,10-diaminodecane.

49. A non-liner optical material comprising an organic functional thin film comprising a polymer of a plurality of types of molecules linked together in the manner of bonding with double or triple bonds, and possessing a portion in which the conjugate length between consecutive $\pi$ electrons is 10 Å or more, wherein the molecules are either introduced into a vacuum or evaporated in a vacuum, and are at least one of bonded and polymerized on a substrate to form a thin film.

50. An optical waveguide comprising an organic functional thin film comprising a polymer of a plurality of types of molecules linked together in the manner of bonding with double or triple bonds, and possessing a portion in which the conjugate length between consecutive $\pi$ electrons is 10 Å or more, wherein the molecules are either introduced into a vacuum or evaporated in a vacuum, and are at least one of bonded and polymerized on a substrate to form a thin film.

51. A p- or n- semiconductor comprising an organic functional thin film comprising a polymer of a plurality of types of molecules linked together in the manner of bonding with double or triple bonds, and possessing a portion in which the conjugate length between consecutive $\pi$ electrons is 10 Å or more, wherein the molecules are either introduced into a vacuum or evaporated in a vacuum, and are at least one of bonded and polymerized on a substrate to form a thin film.

52. A pn junction comprising an organic functional thin film comprising a polymer of a plurality of types of molecules linked together in the manner of bonding with double or triple bonds, and possessing a portion in which the conjugate length between consecutive $\pi$ electrons is 10 Å or more, wherein the molecules are either introduced into a vacuum or evaporated in a vacuum, and are at least one of bonded and polymerized on a substrate to form a thin film.

53. A TFT comprising an organic functional thin film comprising a polymer of a plurality of types of molecules linked together in the manner of bonding with double or triple bonds, and possessing a portion in which the conjugate length between consecutive $\pi$ electrons is 10 Å or more, wherein the molecules are either introduced into a vacuum or evaporated in a vacuum, and are at least one of bonded and polymerized on a substrate to form a thin film.

54. A light emitting device comprising an organic functional thin film comprising a polymer of a plurality of types of molecules linked together in the manner of bonding with double or triple bonds, and possessing a portion in which the conjugate length between consecutive $\pi$ electrons is 10 Å or more, wherein the molecules are either introduced into a vacuum or evaporated in a vacuum, and are at least one of bonded and polymerized on a substrate to form a thin film.

55. A non-linear optical material comprising an organic functional thin film comprising a polymer of two or more different molecules selected from molecules having two or more different groups, formed by vapor-phase deposition, the polymer containing at least one of Si and Ge in the molecular chain.

56. An optical waveguide comprising an organic functional thin film comprising a polymer of two or more different molecules selected from molecules having two or more different groups, formed by vapor-phase deposition, the polymer containing at least one of Si and Ge in the molecular chain.

57. A p- or n- semiconductor comprising an organic functional thin film comprising a polymer of two or more different molecules selected from molecules having two or more different groups, formed by vapor-phase deposition, the polymer containing at least one of Si and Ge in the molecular chain.

58. A pn junction comprising an organic functional thin film comprising a polymer of two or more different molecules selected from molecules having two or more different groups, formed by vapor-phase deposition, the polymer containing at least one of Si and Ge in the molecular chain.

59. A light-emitting device comprising an organic functional thin film comprising a polymer of two or more different molecules selected from molecules having two or more different groups, formed by vapor-phase deposition, the polymer containing at least one of Si and Ge in the molecular chain.

60. A light-receiving device comprising an organic functional thin film comprising a polymer of two or more different molecules selected from molecules having two or more different groups, formed by vapor-phase deposition, the polymer containing at least one of Si and Ge in the molecular chain.

61. A core of an optical waveguide comprising an epoxy polymer thin film comprising a polymer of a molecule having one or more aliphatic amino group and a molecule having two or more epoxy groups, formed by vapor-phase deposition.

62. A cladding of an optical waveguide comprising an epoxy polymer thin film comprising a polymer of a molecule having one or more aliphatic amino group and a molecule having two or more epoxy groups, formed by vapor-phase deposition.

63. A non-linear optical material comprising an epoxy polymer thin film comprising a polymer of a molecule having one or more aliphatic amino group and a molecule having two or more epoxy groups, formed vapor-phase deposition.

64. A process for preparing an organic functional thin film, comprising a polymer of a molecule having one or more groups selected from the group consisting of a carbonyloxycarbonyl group, a carboxylic acid group, a carboxylic acid halide group, a carboxyl group, a —COCl group, an —NCO group and an epoxy group, and one or more groups consisting of an amino group, groups containing at least one amino proton, an alkylamino group, a silylated alkylamino group and a hydroxyl group, formed by vapor-phase deposition, said polymer having a donor group or an acceptor group or a donor group and an acceptor group thereon, and wherein at least one portion of the groups contained in a molecule is separated from a conjugate $\pi$ electron system that composes the backbone of the molecule by two or more single bonds, comprising introducing or evaporating the molecules in vacuum followed by combining and/or polymerization to form a thin film.

65. A process for preparing an organic functional thin film comprising a polymer of a plurality of types of molecules linked together in the manner of bonding with double or triple bonds, wherein a portion of the conjugated system between molecular units participating in bonding is divided by single bonds, wherein the molecules are either introduced in a vacuum or evaporated in a vacuum and bonded and/or polymerized on a substrate to form a thin film.

66. A non-linear optical material using a film according to claim 41.

67. A non-linear optical material comprising an organic functional thin film comprising a polymer of a plurality of types of molecules in the manner of bonding with double or triple bonds, wherein at least one portion of the molecular units possesses at least one of donor and acceptor characteristics.

68. An optical waveguide using a film according to claim 41.

69. An optical waveguide comprising an organic functional thin film comprising a polymer of a plurality of types of molecules in the manner of bonding with double or triple bonds, wherein at least one portion of the molecular units possesses at least one of donor and acceptor characteristics.

70. A p- or n-semiconductor using a film according to claim 41.

71. A p- or n-semiconductor comprising an organic functional thin film comprising a polymer of a plurality of types of molecules in the manner of bonding with double or triple bonds, wherein at least one portion of the molecular units possesses at least one of donor and acceptor characteristics.

72. A pn junction using a film according to claim 41.

73. A pn junction comprising an organic functional thin film comprising a polymer of a plurality of types of molecules in the manner of bonding with double or triple bonds, wherein at least one portion of the molecular units possesses at least one of donor and acceptor characteristics.

74. A TFT using a film according to claim 41.

75. A TFT comprising an organic functional thin film comprising a polymer of a plurality of types of molecules in the manner of bonding with double or triple bonds, wherein at least one portion of the molecular units possesses at least one of donor and acceptor characteristics.

76. A light emitting device using a film according to claim 41.

77. A light emitting device comprising an organic functional thin film comprising a polymer of a plurality of types of molecules in the manner of bonding with double or triple bonds, wherein at least one portion of the molecular units possesses at least one of donor and acceptor characteristics.

78. A process according to claim 64, wherein the film is deposited by alternatively projecting various types of the molecules onto a substrate.

79. A process according to claim 64, wherein during the film deposition, the substrate temperature is set to a temperature such that the molecule re-evaporation rate is higher than the molecule projection rate in the case of performing film deposition with each of the molecules individually.

80. A process according to claim 64, wherein the substrate temperature during the film deposition is set at or below room temperature.

81. A process according to claim 64, wherein the deposition is performed while irradiating with light.

82. A process according to claim 64, wherein the deposition is performed while irradiating with an electron beam.

83. A process according to claim 64, wherein the molecules are polymerized by heating or irradiation with light following deposition.

84. A process according to claim 64, wherein the deposition is performed while applying a voltage to pattern electrodes formed on a substrate.

85. A process according to claim 64, wherein the deposition is performed while applying a voltage between an electrode provided on or in the vicinity of a substrate and an electrode provided in opposition to the substrate.

86. A process according to claim 85, wherein the electrode provided in opposition to the substrate has a porous or mesh structure.

87. A process according to claim 85, wherein the electrode provided on or in the vicinity of the substrate and/or the electrode provided in opposition to the substrate are formed into patterns.

88. A process according to claim 64, wherein the deposition is performed in the presence of generated plasma.

* * * * *

UNITED STATES PATENT AND TRADEMARK OFFICE
CERTIFICATE OF CORRECTION

PATENT NO. : 5,444,811
DATED : August 22, 1995
INVENTOR(S) : TETSUZO YOSHIMURA et al.

It is certified that error appears in the above-indentified patent and that said Letters Patent is hereby corrected as shown below:

Column 3, line 16, after "boxyl" insert --group,--;
Column 6, line 20, after "Donor Group" insert --D--;
Column 39, between lines 45 and 46, insert --$H_2N-R-NH_2$--;
Column 49, at lines 35-47, delete the following (I)
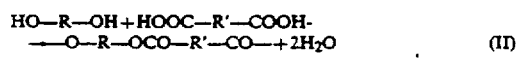  (II)
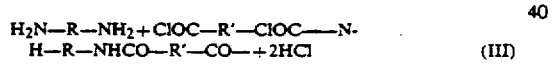  (III)
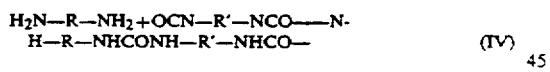  (IV)
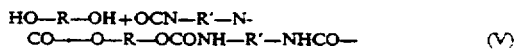  (V)

and substitute (I) 
(II) 
(III) 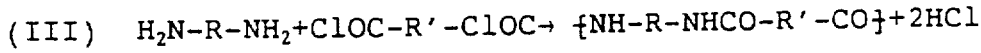
(IV) 
(V) 

UNITED STATES PATENT AND TRADEMARK OFFICE
CERTIFICATE OF CORRECTION

PATENT NO. : 5,444,811
DATED : August 22, 1995
INVENTOR(S) : TETSUZO YOSHIMURA et al.

It is certified that error appears in the above-indentified patent and that said Letters Patent is hereby corrected as shown below:

Column 53, line 33, delete "to-the" and substitute --to the--;
* Column 53, line 50, delete "staring" and substitute --starting--;
* Column 59, line 63, delete "a";
Column 64, line 12, delete "Br-C≡C-C-H" and substitute --Br-C≡C-H--;
Column 64, in TABLE 17, delete "MOlecule VI" and substitute --Molecule VI--;

UNITED STATES PATENT AND TRADEMARK OFFICE
CERTIFICATE OF CORRECTION

PATENT NO. : 5,444,811
DATED : August 22, 1995
INVENTOR(S) : TETSUZO YOSHIMURA et al.

It is certified that error appears in the above-indentified patent and that said Letters Patent is hereby corrected as shown below:

Columns 63 and 64, in TABLE 17, Resulting Polymer, delete the

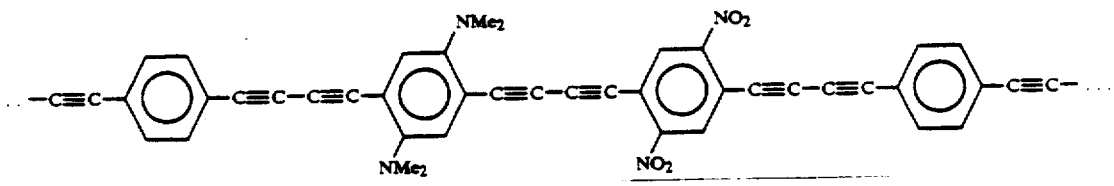

and substitute --

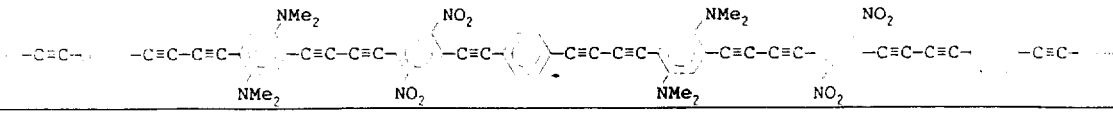

UNITED STATES PATENT AND TRADEMARK OFFICE
CERTIFICATE OF CORRECTION

PATENT NO. : 5,444,811
DATED : August 22, 1995
INVENTOR(S) : TETSUZO YOSHIMURA et al.

It is certified that error appears in the above-indentified patent and that said Letters Patent is hereby corrected as shown below:

Columns 77 and 78, in the formula, delete "D1" first occurrence and substitute --D2--.
Columns 79 and 80, between lines 5 and 30, delete

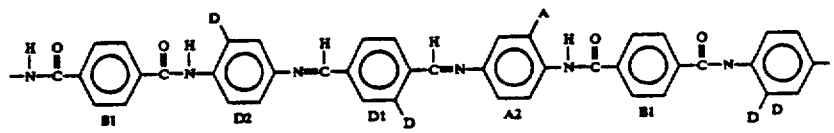

and substitute --

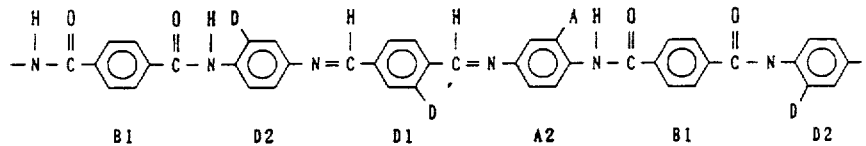

UNITED STATES PATENT AND TRADEMARK OFFICE
CERTIFICATE OF CORRECTION

PATENT NO. : 5,444,811
DATED : August 22, 1995
INVENTOR(S) : TETSUZO YOSHIMURA et al.

It is certified that error appears in the above-indentified patent and that said Letters Patent is hereby corrected as shown below:

Column 82, line 41, after "chain." start new paragraph.

Column 84, line 32, delete "$R_A-C\equiv R_B$" and substitute

--$R_A-C\equiv C-R_B$--;

Column 85, line 29, delete "NO" and substitute --$NO_2$--

Column 90, line 63, delete "tort" and substitute --torr--;

* Column 95, line 9, delete "it is" and substitute --is it--;

Column 95, line 19, delete "0H" and substitute --OH--;

Column 99, line 11, delete "-OH" and substitute --OH--;

Column 100, line 35, delete "8-hydroxyquinoline" and substitute --8-hydroxyquinolinol--;

UNITED STATES PATENT AND TRADEMARK OFFICE
CERTIFICATE OF CORRECTION

PATENT NO. : 5,444,811
DATED : August 22, 1995
INVENTOR(S) : TETSUZO YOSHIMURA et al.

It is certified that error appears in the above-indentified patent and that said Letters Patent is hereby corrected as shown below:

Column 107, line 52, delete "by. Sequentially" and substitute --by sequentially--;

Column 109, line 34, after "formed" insert --by--.

Signed and Sealed this

Sixteenth Day of January, 1996

BRUCE LEHMAN

Attest:

Attesting Officer

Commissioner of Patents and Trademarks